US012777834B2

(12) United States Patent
Oh et al.

(10) Patent No.: US 12,777,834 B2
(45) Date of Patent: Oct. 27, 2026

(54) ORGANIC ELECTROLUMINESCENCE DEVICE AND FUSED POLYCYCLIC COMPOUND FOR ORGANIC ELECTROLUMINESCENCE DEVICE

(71) Applicant: Samsung Display Co., Ltd., Yongin-si (KR)

(72) Inventors: Chanseok Oh, Seoul (KR); Taeil Kim, Hwaseong-si (KR); Sun Young Pak, Suwon-si (KR); Junha Park, Gwacheon-si (KR); Jang Yeol Baek, Yongin-si (KR); Kyoung Sunwoo, Hwaseong-si (KR); Mun-Ki Sim, Seoul (KR); Minjung Jung, Hongcheon-gun (KR)

(73) Assignee: Samsung Display Co., Ltd., Yongin-si (KR)

( * ) Notice: Subject to any disclaimer, the term of this patent is extended or adjusted under 35 U.S.C. 154(b) by 1029 days.

(21) Appl. No.: 17/731,441

(22) Filed: Apr. 28, 2022

(65) Prior Publication Data

US 2023/0121704 A1 Apr. 20, 2023

(30) Foreign Application Priority Data

Jul. 29, 2021 (KR) ........................ 10-2021-0099879

(51) Int. Cl.
*H01L 51/50* (2006.01)
*C07F 5/02* (2006.01)
(Continued)

(52) U.S. Cl.
CPC ........... *H10K 85/322* (2023.02); *C07F 5/027* (2013.01); *C09K 11/06* (2013.01);
(Continued)

(58) Field of Classification Search
None
See application file for complete search history.

(56) References Cited

U.S. PATENT DOCUMENTS 6,602,618 B2 * 8/2003 Watanabe .............. H10K 85/40 428/917
10,374,166 B2 8/2019 Hatakeyama et al.
(Continued)

FOREIGN PATENT DOCUMENTS

KR 10-2016-0119683 10/2016
KR 10-2017-0040418 A 4/2017
(Continued)

OTHER PUBLICATIONS

Anton Pershin et al., "Highly emissive excitons with reduced exchange energy in thermally activated delayed fluorescent molecules", Nature Communications, Feb. 5, 2019, pp. 1-5, vol. 10, No. 597.

*Primary Examiner* — Gregory D Clark
(74) *Attorney, Agent, or Firm* — Womble Bond Dickinson (US) LLP

(57) ABSTRACT

An organic electroluminescence device of an embodiment includes a first electrode, a second electrode facing the first electrode, and multiple organic layers disposed between the first electrode and the second electrode, wherein the organic
(Continued)

layers include at least one organic layer including a fused polycyclic compound represented by Formula 1, thereby showing improved emission efficiency.

[Formula 1]

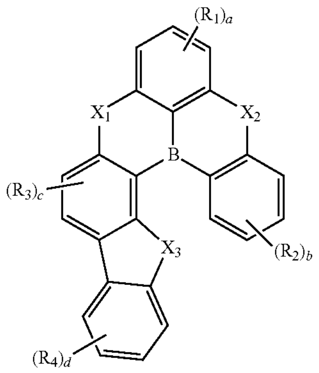

20 Claims, 6 Drawing Sheets

(51) Int. Cl.

| | |
|---|---|
| ***C09K 11/06*** | (2006.01) |
| ***H10K 85/30*** | (2023.01) |
| *H10K 50/11* | (2023.01) |
| *H10K 50/15* | (2023.01) |
| *H10K 101/10* | (2023.01) |
| *H10K 101/30* | (2023.01) |

(52) U.S. Cl.

CPC ...... *C09K 2211/1018* (2013.01); *H10K 50/11* (2023.02); *H10K 50/15* (2023.02); *H10K 2101/10* (2023.02); *H10K 2101/30* (2023.02)

(56) References Cited

U.S. PATENT DOCUMENTS

| | | | | |
|---|---|---|---|---|
| 10,790,337 | B2 | 9/2020 | Jeong et al. | |
| 10,981,938 | B2 | 4/2021 | Joo et al. | |
| 12,522,764 | B2 | 1/2026 | Kim et al. | |
| 2010/0001301 | A1* | 1/2010 | Karg | H10K 50/86<br>257/40 |
| 2017/0250232 | A1* | 8/2017 | Wang | H10K 50/125 |
| 2019/0393419 | A1 | 12/2019 | Hatakeyama et al. | |
| 2020/0098991 | A1 | 3/2020 | Kim et al. | |
| 2020/0190115 | A1 | 6/2020 | Hatakeyama et al. | |
| 2020/0403160 | A1 | 12/2020 | Sakamoto | |
| 2022/0263027 | A1 | 8/2022 | Kim et al. | |

FOREIGN PATENT DOCUMENTS

| | | | | |
|---|---|---|---|---|
| KR | 10-1886773 | | 8/2018 | |
| KR | 10-1955648 | | 3/2019 | |
| KR | 10-2094830 | | 3/2020 | |
| KR | 10-2020-0034899 | | 4/2020 | |
| KR | 10-2020-0047400 | | 5/2020 | |
| KR | 10-2128687 | | 6/2020 | |
| KR | 10-2020-0145888 | | 12/2020 | |
| KR | 10-2021-0010622 | | 1/2021 | |
| KR | 1020210016294 | A | 2/2021 | |
| KR | 10-2021-0067866 | A | 6/2021 | |
| WO | 2018/212169 | | 11/2018 | |
| WO | 2020251049 | A1 | 12/2020 | |
| WO | WO2021/107711 | * | 6/2021 | H01L 51/00 |

* cited by examiner

ORGANIC ELECTROLUMINESCENCE DEVICE AND FUSED POLYCYCLIC COMPOUND FOR ORGANIC ELECTROLUMINESCENCE DEVICE

CROSS-REFERENCE TO RELATED APPLICATION(S)

This application claims priority to and benefits of Korean Patent Application No. 10-2021-0099879 under 35 U.S.C. § 119, filed on Jul. 29, 2021 in the Korean Intellectual Property Office, the entire contents of which are incorporated herein by reference.

BACKGROUND

1. Technical Field

The disclosure herein relates to an organic electroluminescence device including a fused polycyclic compound as a light-emitting material.

2. Description of the Related Art

Active development continues for an organic electroluminescence display as an image display. The organic electroluminescence display is different from a liquid crystal display and is a so-called self-luminescent display in which holes and electrons respectively injected from a first electrode and a second electrode recombine in an emission layer so that a light-emitting material including an organic compound in the emission layer emits light to achieve display.

In the application of an organic electroluminescence device to a display, there is a demand for decreasing driving voltage, increasing emission efficiency, and increasing the life of the organic electroluminescence device, and continuous development is required on materials for an organic electroluminescence device which is capable of stably achieving such characteristics.

Recently, in order to implement an organic electroluminescence device with high efficiency, techniques on phosphorescence emission which uses energy in a triplet state or delayed fluorescence emission which uses the generating phenomenon of singlet excitons by the collision of triplet excitons (triplet-triplet annihilation, TTA) are being developed, and development on a material for thermally activated delayed fluorescence (TADF) using delayed fluorescence phenomenon is being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides an organic electroluminescence device with improved emission efficiency and a fused polycyclic compound included in the emission layer of an organic electroluminescence device.

An embodiment a fused polycyclic compound which may be represented by Formula 1.

[Formula 1]

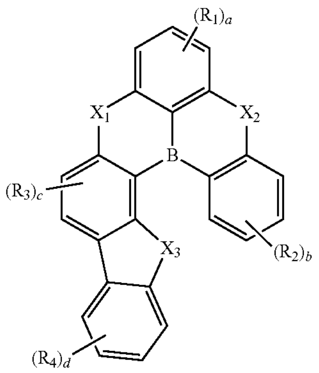

In Formula 1, $X_1$ and $X_2$ may each independently be $N(R_5)$, O, S, or Se, $X_3$ may be O or S, $R_1$ to $R_4$ may each independently be a hydrogen atom, a deuterium atom, a halogen atom, a cyano group, a trifluoromethyl group, a substituted or unsubstituted silyl group, a substituted or unsubstituted amino group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, $R_5$ may be a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, a may be an integer from 0 to 3, b and d may each independently be an integer from 0 to 4, and c may be an integer from 0 to 2.

In an embodiment, the fused polycyclic compound represented by Formula 1 may be represented by Formula 2-1 or Formula 2-2.

[Formula 2-1]

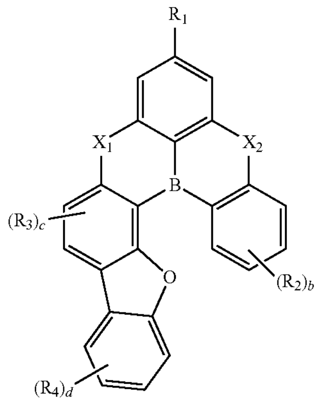

-continued

[Formula 2-2]

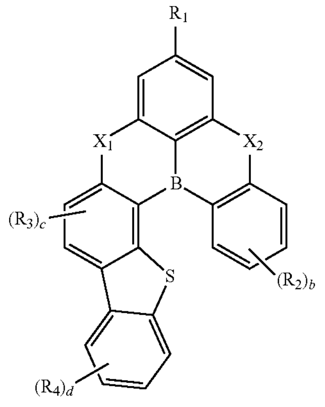

In Formula 2-1 and Formula 2-2, $R_1$ may be a deuterium atom, a halogen atom, a cyano group, a trifluoromethyl group, a substituted or unsubstituted silyl group, a substituted or unsubstituted amino group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, and $X_1$, $X_2$, $R_2$ to $R_4$, and b to d may be the same as defined in Formula 1.

In an embodiment, the fused polycyclic compound represented by Formula 1 may be represented by Formula 3-1 or Formula 3-2.

[Formula 3-1]

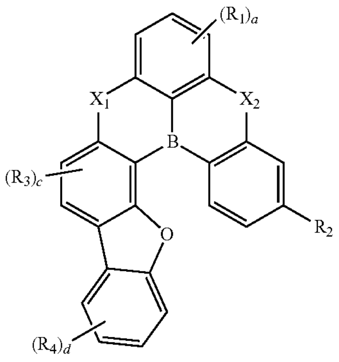

[Formula 3-2]

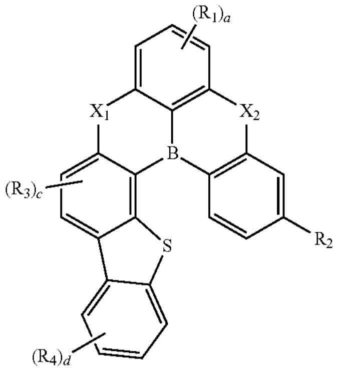

In Formula 3-1 and Formula 3-2, $R_2$ may be a deuterium atom, a halogen atom, a cyano group, a trifluoromethyl group, a substituted or unsubstituted silyl group, a substituted or unsubstituted amino group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, and $X_1$, $X_2$, $R_1$, $R_3$, $R_4$, a, c, and d may be the same as defined in Formula 1.

In an embodiment, the fused polycyclic compound represented by Formula 1 may be represented by Formula 4-1 or Formula 4-2.

[Formula 4-1]

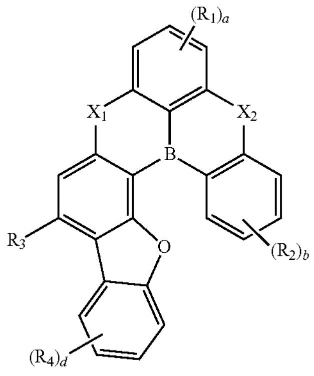

[Formula 4-2]

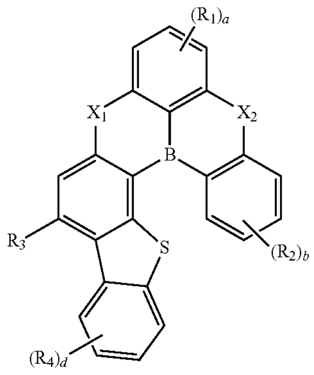

In Formula 4-1 and Formula 4-2, $R_3$ may be a deuterium atom, a halogen atom, a cyano group, a trifluoromethyl group, a substituted or unsubstituted silyl group, a substituted or unsubstituted amino group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, and $X_1$, $X_2$, $R_1$, $R_2$, $R_4$, a, b, and d may be the same as defined in Formula 1.

In an embodiment, the fused polycyclic compound represented by Formula 1 may be represented by Formula 5-1 or Formula 5-2.

[Formula 5-1]

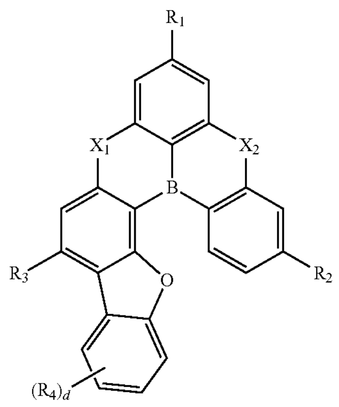

[Formula 5-2]

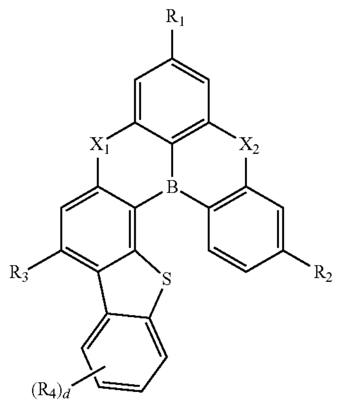

In Formula 5-1 and Formula 5-2, $R_1$ to $R_3$ may each independently be a deuterium atom, a halogen atom, a cyano group, a trifluoromethyl group, a substituted or unsubstituted silyl group, a substituted or unsubstituted amino group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, and $X_1$, $X_2$, $R_4$, and d may be the same as defined in Formula 1.

In an embodiment, $R_4$ may be a hydrogen atom, and at least one of $R_1$ to $R_3$ may be an arylamine group or a substituted or unsubstituted carbazole group.

In an embodiment, b and c may each be 1, and $R_2$ and $R_3$ may be the same.

In an embodiment, the fused polycyclic compound represented by Formula 1 may be one selected from Compound Group 1, which is explained below.

An embodiment provides an organic electroluminescence device which may include a first electrode, a second electrode facing the first electrode, and multiple organic layers disposed between the first electrode and the second electrode, wherein the organic layers may include at least one organic layer including a fused polycyclic compound of an embodiment, and at least one organic layer including an amine compound represented by Formula H-1.

[Formula H-1]

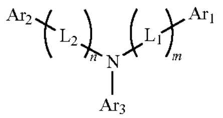

In Formula H-1, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms, m and n may each independently be an integer from 0 to 10, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms, and $Ar_3$ may be a substituted or unsubstituted aryl group of 6 to 30 ring-forming carbon atoms.

In an embodiment, the organic layers may include a hole transport region disposed on the first electrode, an emission layer disposed on the hole transport region, and an electron transport region disposed on the emission layer, and the emission layer may include the fused polycyclic compound of an embodiment.

In an embodiment, the emission layer may emit delayed fluorescence.

In an embodiment, the emission layer may be a delayed fluorescence emission layer including a first compound and a second compound, and the first compound may include the fused polycyclic compound of an embodiment.

In an embodiment, the hole transport region may include a hole injection layer disposed on the first electrode, a hole transport layer disposed on the hole injection layer, and an electron blocking layer disposed on the hole transport layer, and at least one of the hole injection layer, the hole transport layer, and the electron blocking layer may include the amine compound represented by Formula H-1.

In an embodiment, a maximum external quantum efficiency of the organic electroluminescence device may be equal to or greater than about 20%.

In an embodiment, the organic electroluminescence device may further include a capping layer disposed on the second electrode, wherein the capping layer may have a refractive index equal to or greater than about 1.6.

In an embodiment, the fused polycyclic compound of an embodiment may be at least one selected from Compound Group 1, which is explained below.

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
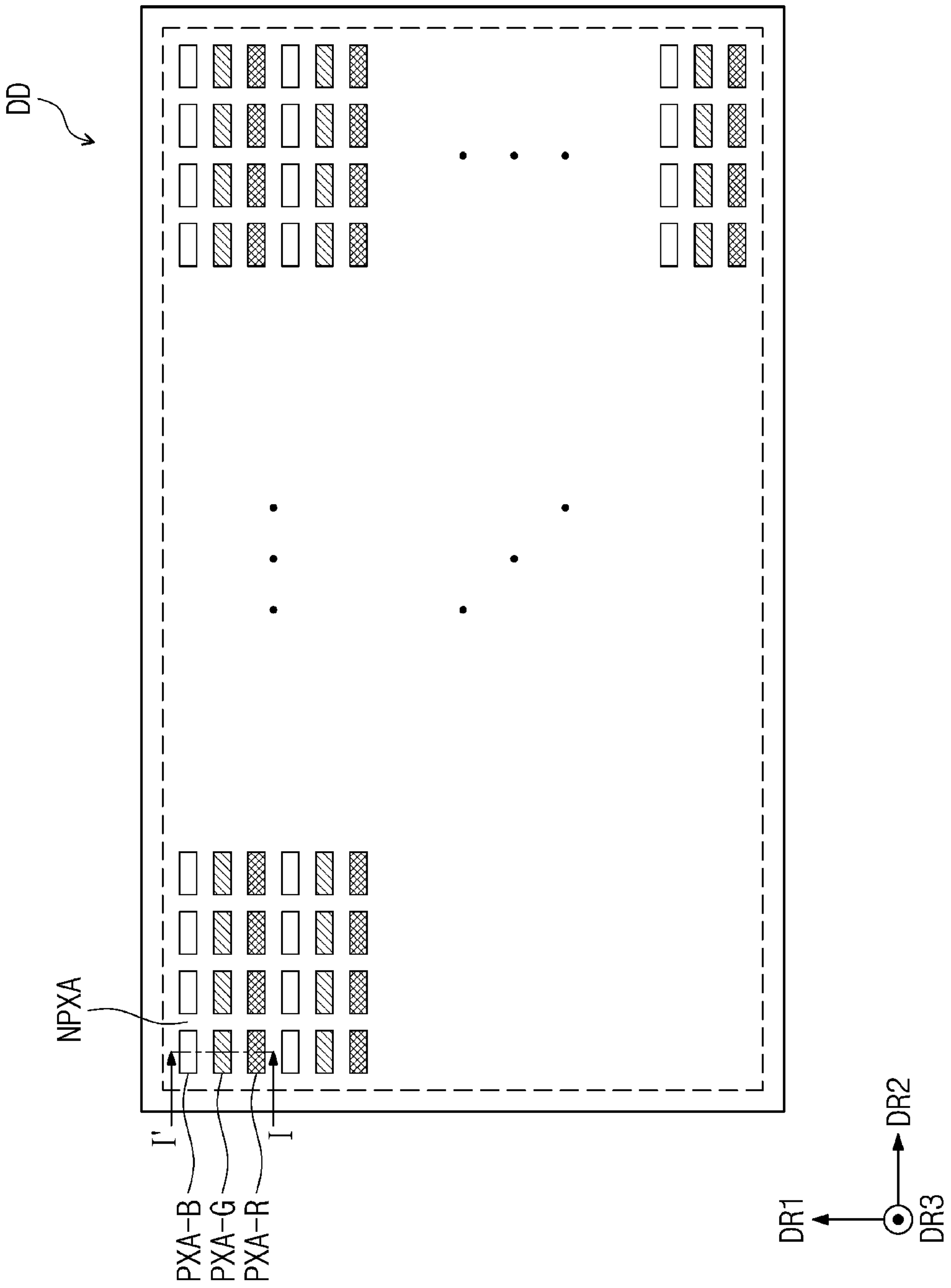
FIG. 1 is a plan view showing a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the specification, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the specification, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device.

Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments will be explained referring to the drawings.

Hereinafter, an organic electroluminescence device according to an embodiment will be explained with reference to the drawings.

Figure 2:
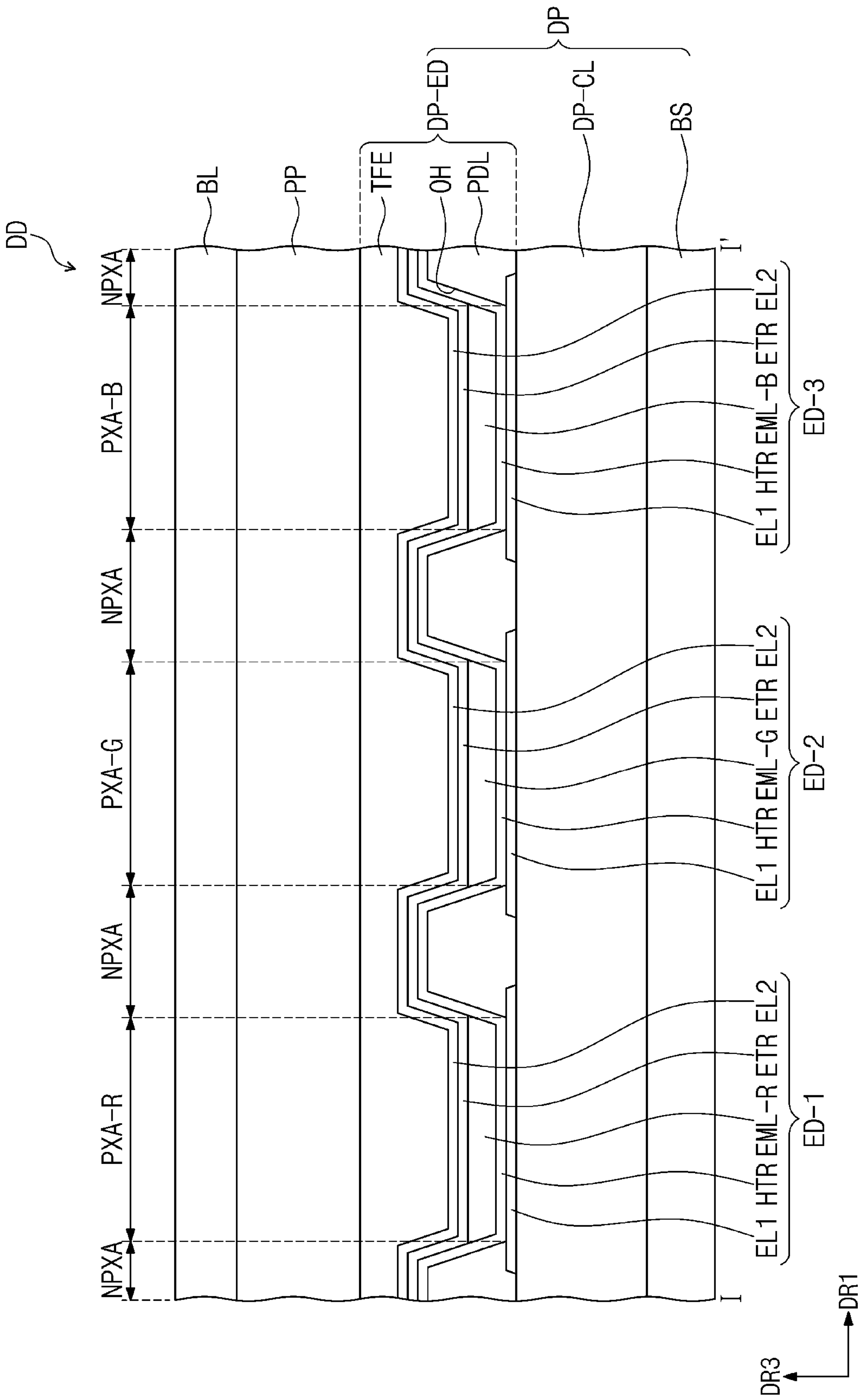
FIG. 2 is a schematic cross-sectional view showing a display apparatus according to an embodiment.

FIG. 1 is a plan view showing an embodiment of a display apparatus DD. FIG. 2 is a schematic cross-sectional view of a display apparatus DD of an embodiment. FIG. 2 is a schematic cross-sectional view showing a part corresponding to line I-I' of FIG. 1.

The display apparatus DD may include a display panel DP and an optical layer PP disposed on the display panel DP. The display panel DP includes organic electroluminescence devices ED-1, ED-2, and ED-3. The display apparatus DD may include multiples of each of the organic electroluminescence devices ED-1, ED-2, and ED-3. The optical layer PP may be disposed on the display panel DP and may control light reflected at the display panel DP from an external light. The optical layer PP may include, for example, a polarization layer or a color filter layer. Although not shown in the drawings, in an embodiment, the optical layer PP may be omitted from the display apparatus DD.

A base substrate BL may be disposed on the optical layer PP. The base substrate BL may provide a base surface where the optical layer PP is disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

The display apparatus DD according to an embodiment may further include a plugging layer (not shown). The plugging layer (not shown) may be disposed between a display device layer DP-ED and a base substrate BL. The plugging layer (not shown) may be an organic layer. The plugging layer (not shown) may include at least one of an acrylic resin, a silicon-based resin, or an epoxy-based resin.

The display panel DP may include a base layer BS, a circuit layer DP-CL provided on the base layer BS, and a display device layer DP-ED. The display device layer DP-ED may include a pixel definition layer PDL, organic electroluminescence devices ED-1, ED-2 and ED-3 disposed in the pixel definition layer PDL, and an encapsulating layer TFE disposed on the organic electroluminescence devices ED-1, ED-2, and ED-3.

The base layer BS may provide a base surface on which the display device layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL is disposed on the base layer BS, and the circuit layer DP-CL may include transistors (not shown). Each of the transistors (not shown) may include a control electrode, an input electrode, and an output electrode. For example, the circuit layer DP-CL may include switching transistors and driving transistors for driving the organic electroluminescence devices ED-1, ED-2, and ED-3 of the display device layer DP-ED.

Each of the organic electroluminescence devices ED-1, ED-2, and ED-3 may have a structure of an organic electroluminescence device ED of an embodiment according to FIG. 3 to FIG. 6, which will be explained later. Each of the organic electroluminescence devices ED-1, ED-2, and ED-3 may include a first electrode EL1, a hole transport region HTR, emission layers EML-R, EML-G, and EML-B, an electron transport region ETR, and a second electrode EL2.

FIG. 2 shows an embodiment where the emission layers EML-R, EML-G, and EML-B of organic electroluminescence devices ED-1, ED-2, and ED-3, are disposed in openings OH defined in a pixel definition layer PDL, and a hole transport region HTR, an electron transport region ETR, and a second electrode EL2 are each provided as a common layer in all organic electroluminescence devices ED-1, ED-2, and ED-3. However, embodiments are not limited thereto. Although not shown in FIG. 2, in an embodiment, the hole transport region HTR and the electron transport region ETR may each be patterned and provided in the openings OH defined in the pixel definition layer PDL. For example, in an embodiment, the hole transport region HTR, the emission layers EML-R, EML-G, and EML-B, and the electron transport region ETR of the organic electroluminescence devices ED-1, ED-2, and ED-3 may each be patterned by an ink jet printing method and provided.

An encapsulating layer TFE may cover the organic electroluminescence devices ED-1, ED-2, and ED-3. The encapsulating layer TFE may encapsulate the display device layer DP-ED. The encapsulating layer TFE may be a thin film encapsulating layer. The encapsulating layer TFE may be a single layer or a stack of multiple layers. The encapsulating layer TFE may include at least one insulating layer. The encapsulating layer TFE according to an embodiment may include at least one inorganic layer (hereinafter, encapsulating inorganic layer). The encapsulating layer TFE according to an embodiment may include at least one organic layer (hereinafter, encapsulating organic layer) and at least one encapsulating inorganic layer.

The encapsulating inorganic layer may protect the display device layer DP-ED from moisture and/or oxygen, and the encapsulating organic layer may protect the display device layer DP-ED from foreign materials such as dust particles. The encapsulating inorganic layer may include silicon nitride, silicon oxy nitride, silicon oxide, titanium oxide, or aluminum oxide, without limitation. The encapsulating organic layer may include an acrylic compound, an epoxy-based compound, etc. The encapsulating organic layer may include a photopolymerizable organic material, without limitation.

The encapsulating layer TFE may be disposed on the second electrode EL2 and may be disposed to fill the openings OH.

Referring to FIG. 1 and FIG. 2, the display apparatus DD may include non-luminous areas NPXA and luminous areas PXA-R, PXA-G, and PXA-B. The luminous areas PXA-R, PXA-G, and PXA-B may be areas emitting light produced from the organic electroluminescence devices ED-1, ED-2, and ED-3, respectively. The luminous areas PXA-R, PXA-G, and PXA-B may be separated from each other on a plane.

The luminous areas PXA-R, PXA-G, and PXA-B may be areas separated by the pixel definition layer PDL. The non-luminous areas NPXA may be areas between neighboring luminous areas PXA-R, PXA-G, and PXA-B and may correspond to the pixel definition layer PDL. For example, in an embodiment, each of the luminous areas PXA-R, PXA-G, and PXA-B may correspond to a pixel. The pixel definition layer PDL may separate the organic electroluminescence devices ED-1, ED-2, and ED-3. The emission layers EML-R, EML-G, and EML-B of the organic electroluminescence devices ED-1, ED-2, and ED-3 may be disposed in the openings OH defined in the pixel definition layer PDL and separated from each other.

The luminous areas PXA-R, PXA-G, and PXA-B may be divided into groups according to the color of light produced from each of the organic electroluminescence devices ED-1, ED-2, and ED-3. In the display apparatus DD of an embodiment, shown in FIG. 1 and FIG. 2, three luminous areas PXA-R, PXA-G, and PXA-B respectively emitting red light, green light, and blue light are illustrated as an embodiment. For example, the display apparatus DD of an embodiment may include a red luminous area PXA-R, a green luminous area PXA-G, and a blue luminous area PXA-B, which are separated from each other.

In the display apparatus DD according to an embodiment, organic electroluminescence devices ED-1, ED-2, and ED-3 may each emit light having different wavelength regions. For example, in an embodiment, the display apparatus DD may include a first organic electroluminescence device ED-1 emitting red light, a second organic electroluminescence device ED-2 emitting green light, and a third organic electroluminescence device ED-3 emitting blue light. For example, each of the red luminous area PXA-R, the green luminous area PXA-G, and the blue luminous area PXA-B of the display apparatus DD may respectively correspond to the first organic electroluminescence device ED-1, the second organic electroluminescence device ED-2, and the third organic electroluminescence device ED-3.

However, embodiments are not limited thereto, and the first to third organic electroluminescence devices ED-1, ED-2 and ED-3 may emit light in a same wavelength region, or at least one thereof may emit light in a different wavelength region. For example, all the first to third organic electroluminescence devices ED-1, ED-2 and ED-3 may emit blue light.

The luminous areas PXA-R, PXA-G and PXA-B in the display apparatus DD according to an embodiment may be arranged in a stripe shape. Referring to FIG. 1, the red luminous areas PXA-R, the green luminous areas PXA-G, and the blue luminous areas PXA-B may be arranged in a repeating sequence along a second direction axis DR2. In another embodiment, the red luminous area PXA-R, the green luminous area PXA-G, and the blue luminous area PXA-B may be arranged in a repeating sequence along a first direction axis DR1.

In FIG. 1 and FIG. 2, the areas of the luminous areas PXA-R, PXA-G, and PXA-B are shown as having a similar size, but embodiments are not limited thereto. The areas of the luminous areas PXA-R, PXA-G, and PXA-B may be different from each other according to a wavelength region of light emitted. The areas of the luminous areas PXA-R, PXA-G, and PXA-B may be areas in a plan view that are defined by the first direction axis DR1 and the second direction axis DR2.

The arrangement type of the luminous areas PXA-R, PXA-G, and PXA-B is not limited to the configuration shown in FIG. 1, and the arrangement order of the red luminous areas PXA-R, the green luminous areas PXA-G, and the blue luminous areas PXA-B may be provided in various combinations according to the display quality characteristics which are required for the display apparatus DD. For example, the arrangement type of the luminous areas PXA-R, PXA-G, and PXA-B may be a PENTILE® arrangement type, or a diamond arrangement type.

In an embodiment, the areas of the luminous areas PXA-R, PXA-G, and PXA-B may be different in size from each other. For example, in an embodiment, an area of the green luminous area PXA-G may be smaller than an area of the blue luminous area PXA-B, but embodiments are not limited thereto.

Hereinafter, FIG. 3 to FIG. 6 are each a schematic cross-sectional view showing an organic electroluminescence device according to embodiments. In the organic electroluminescence device ED of an embodiment, a first electrode EL1 and a second electrode EL2 are oppositely disposed (e.g., the second electrode may face the first electrode), and organic layers may be disposed between the first electrode EL1 and the second electrode EL2. The organic layers may include a hole transport region HTR, an emission layer EML, and an electron transport region ETR. For example, the organic electroluminescence device ED according to an embodiment may include a first electrode EL1, a hole transport region HTR, an emission layer EML, an electron transport region ETR and a second electrode EL2 stacked in the stated order.

The organic electroluminescence device ED of an embodiment may include a fused polycyclic compound of an embodiment, which will be explained later, in at least one organic layer among the organic layers disposed between the first electrode EL1 and the second electrode EL2. For example, the organic electroluminescence device ED of an embodiment may include a fused polycyclic compound of an embodiment, which will be explained later in an emission layer EML disposed between the first electrode EL1 and the second electrode EL2. However, embodiments are not limited thereto. The organic electroluminescence device ED of an embodiment may include the fused polycyclic compound according to an embodiment, which will be explained later, in at least one organic layer included in a hole transport region HTR or an electron transport region ETR, which are among the organic layers disposed between the first electrode EL1 and the second electrode EL2 in addition to the emission layer EML, or the organic electroluminescence device ED of an embodiment may include the fused polycyclic compound according to an embodiment, which will be explained later, in a capping layer CPL disposed on the second electrode EL2.

Figure 3:
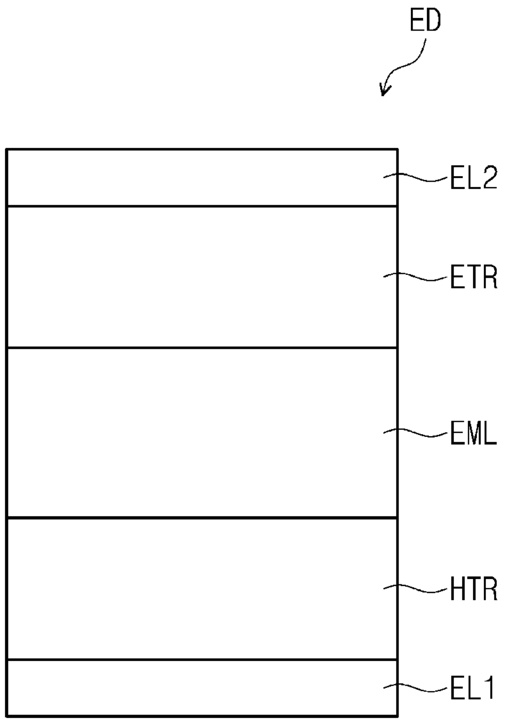
FIG. 3 is a schematic cross-sectional view showing an organic electroluminescence device according to an embodiment.
Figure 4:
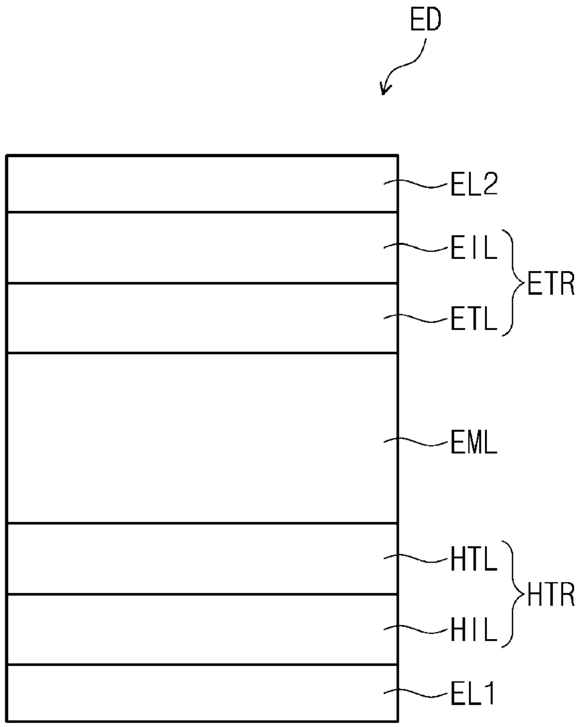
FIG. 4 is a schematic cross-sectional view showing an organic electroluminescence device according to an embodiment.
Figure 5:
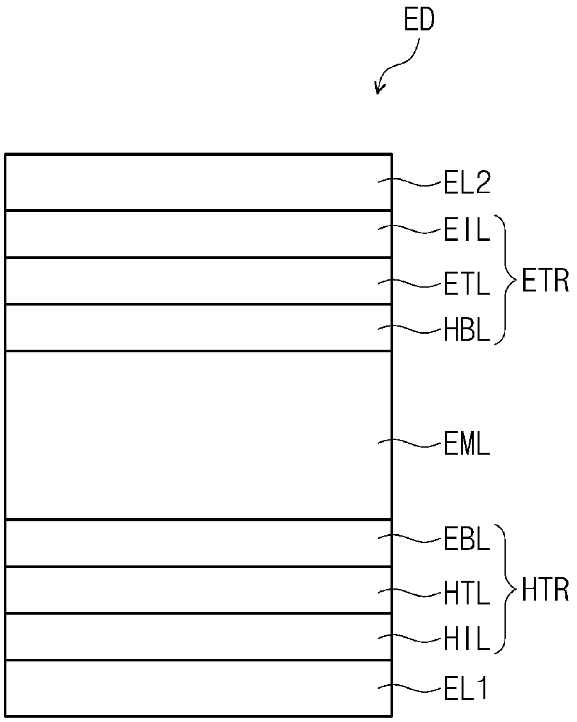
FIG. 5 is a schematic cross-sectional view showing an organic electroluminescence device according to an embodiment.
Figure 6:
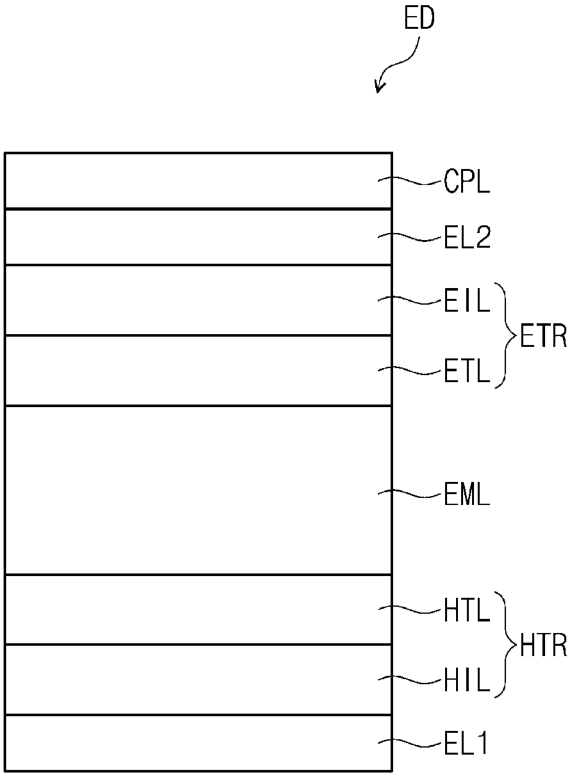
FIG. 6 is a schematic cross-sectional view showing an organic electroluminescence device according to an embodiment.

In comparison to FIG. 3, FIG. 4 shows a schematic cross-sectional view of an organic electroluminescence device ED of an embodiment, wherein a hole transport region HTR includes a hole injection layer HIL and a hole transport layer HTL, and an electron transport region ETR includes an electron injection layer EIL and an electron transport layer ETL. In comparison to FIG. 3, FIG. 5 shows a schematic cross-sectional view of an organic electroluminescence device ED of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 4, FIG. 6 shows a schematic cross-sectional view of an organic electroluminescence device ED of an embodiment that includes a capping layer CPL disposed on a second electrode EL2.

Hereinafter, in the explanation on the organic electroluminescence device ED of an embodiment, the emission layer EML will be explained to include the fused polycyclic compound according to an embodiment, which will be explained later, but embodiments are not limited thereto. The fused polycyclic compound according to an embodiment, which will be explained later, may be included in a hole transport region HTR, an electron transport region ETR, or a capping layer CPL.

In the specification, the term "substituted or unsubstituted" may mean a group that is substituted or unsubstituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boryl group, a phosphine oxide group, a phosphine sulfide group, an alkyl group, an alkenyl group, an alkoxy group, a hydrocarbon ring group, an aryl group, and a heterocyclic group. Each of the substituents recited above may itself be substituted or unsubstituted. For example, a biphenyl group may be interpreted as an aryl group, or may be interpreted as a phenyl group substituted with a phenyl group.

In the specification, examples of a halogen atom may include a fluorine atom, a chlorine atom, a bromine atom, or an iodine atom.

In the specification, an alkyl group may be a linear, a branched, or a cyclic type. The number of carbon atoms in the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the specification, an alkenyl group may be a hydrocarbon group including one or more carbon-carbon double bonds in the middle or at a terminus of an alkyl group having two or more carbon atoms. The alkenyl group may be a linear chain or a branched chain. The number of carbon atoms in the alkenyl group is not specifically limited but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the specification, an alkynyl group may be a hydrocarbon group including one or more carbon-carbon triple bonds in the middle or at a terminus of an alkyl group having two or more carbon atoms. The alkynyl group may be a linear chain or a branched chain. The number of carbon atoms in the alkynyl group is not specifically limited but may be 2 to 30, 2 to 20, or 2 to 10. Examples of the alkynyl group may include an ethynyl group, a propynyl group, etc., without limitation.

In the specification, a hydrocarbon ring may be any functional group or substituent derived from an aliphatic hydrocarbon ring or any functional group or substituent derived from an aromatic hydrocarbon ring. The number ring-forming carbon atoms in the hydrocarbon ring may be 5 to 60, 6 to 30, or 5 to 20.

In the specification, an aryl group may be any functional group or substituent derived from an aromatic hydrocarbon ring. The aryl group may be a monocyclic aryl group or a polycyclic aryl group. The number of ring-forming carbon atoms in the aryl group may be 6 to 60, 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

In the specification, a fluorenyl group may be substituted, and two substituents may be combined with each other to form a spiro structure. Examples of substituted fluorenyl groups are as follows. However, embodiments are not limited thereto.

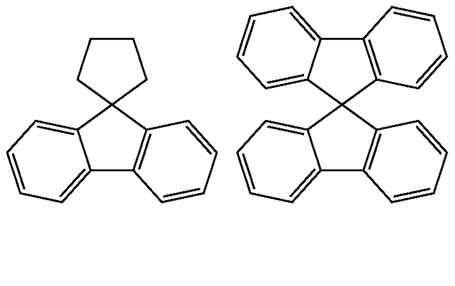

-continued

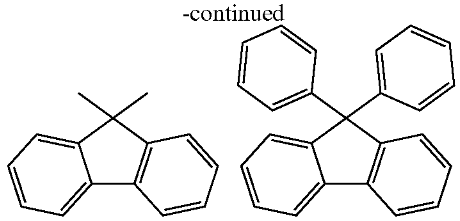

In the specification, a heterocyclic group may be any functional group or substituent derived from a ring including one or more of B, O, N, P, Si, or S as heteroatoms. The heterocyclic group may be an aliphatic heterocyclic group or an aromatic heterocyclic group. The aromatic heterocyclic group may be a heteroaryl group. The aliphatic heterocycle and aromatic heterocycle may each independently be monocyclic or polycyclic.

In the specification, a heterocyclic group may include one or more of B, O, N, P, Si, or S as heteroatoms. If the heterocyclic group includes two or more heteroatoms, the two or more heteroatoms may be the same as each other or different from each other. The heterocyclic group may be a monocyclic heterocyclic group or a polycyclic heterocyclic group, and the heterocyclic group may be a heteroaryl group. The number of ring-forming carbon atoms in the heterocyclic group may be 2 to 30, 2 to 20, or 2 to 10.

In the specification, a heteroaryl group may include one or more of B, O, N, P, Si, or S as heteroatoms. If the heteroaryl group includes two or more heteroatoms, the two or more heteroatoms may be the same as each other or different from each other. The heteroaryl group may be a monocyclic heterocyclic group or polycyclic heterocyclic group. The number of ring-forming carbon atoms in the heteroaryl group may be 2 to 60, 2 to 30, 2 to 20, or 2 to 10. Examples of the heteroaryl group may include thiophene, furan, pyrrole, imidazole, triazole, pyridine, bipyridine, pyrimidine, pyrazine, triazine, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofurane, phenanthroline, thiazole, isooxazole, oxazole, oxadiazole, thiadiazole, phenothiazine, dibenzosilole, dibenzofuran, etc., without limitation.

In the specification, a silyl group may be an alkyl silyl group or an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., without limitation.

In the specification, a thio group may be an alkyl thio group or an aryl thio group. The thio group may be a sulfur atom that is bonded to an alkyl group or to an aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., without limitation.

In the specification, an oxy group may be an oxygen atom that is bonded to an alkyl group or to an aryl group as defined above. The oxy group may be an alkoxy group or an aryl oxy group. The alkoxy group may be a linear, a branched, or a cyclic chain. The number of carbon atoms in the alkoxy group is not specifically limited but may be, for example, 1 to 20, or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc. However, embodiments are not limited thereto.

In the specification, the number of carbon atoms in an amine group is not specifically limited, but may be 1 to 30. The amine group may be an alkyl amine group, an aryl amine group, or a heteroaryl amine group. Examples of the amine group may include a methylamine group, a dimethylamine group, a phenylamine group, a diphenylamine group, a naphthylamine group, a 9-methyl-anthracenylamine group, etc., without limitation.

In the specification, an alkyl group in an alkyl silyl group, an alkyl thio group, an alkyl aryl group, or an alkyl amine group may be the same as the above-described alkyl group.

In the specification, an aryl group in an aryl oxy group, an aryl thio group, an aryl amine group, or an aryl silyl group may be the same as the above-described aryl group.

In the specification, a direct linkage may be a single bond.

A first electrode EL1 has conductivity. The first electrode EL1 may be formed of a metal material, a metal alloy, or a conductive compound. The first electrode EL1 may be an anode or a cathode. However, embodiments are not limited thereto. For example, the first electrode EL1 may be a pixel electrode. The first electrode EL1 may be a transmissive electrode, a transflective electrode, or a reflective electrode. If the first electrode EL1 is a transmissive electrode, the first electrode EL1 may include a transparent metal oxide such as indium tin oxide (ITO), indium zinc oxide (IZO), zinc oxide (ZnO), and indium tin zinc oxide (ITZO). If the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, compounds thereof, or mixtures thereof (for example, a mixture of Ag and Mg). In another embodiment, the first electrode EL1 may have a structure of multiple layers including a reflective layer or a transflective layer formed of the above materials, and a transmissive conductive layer formed of ITO, IZO, ZnO, or ITZO. For example, the first electrode EL1 may include a three-layer structure of ITO/Ag/ITO. However, embodiments are not limited thereto. The first electrode EL1 may include the above-described metal materials, combinations of two or more metal materials selected from the above-described metal materials, or oxides of the above-described metal materials. A thickness of the first electrode EL1 may be in a range of about 700 Å to about 10,000 Å. For example, the thickness of the first electrode EL1 may be in a range of about 1,000 Å to about 3,000 Å.

A hole transport region HTR is provided on the first electrode EL1. The hole transport region HTR may include at least one of a hole injection layer HIL, a hole transport layer HTL, a buffer layer (not shown), an emission auxiliary layer (not shown), or an electron blocking layer EBL. A thickness of the hole transport region HTR may be in a range of about 50 Å to about 15,000 Å.

The hole transport region HTR may be a layer formed of a single material, a layer formed of different materials, or a multilayer structure including layers formed of different materials.

For example, the hole transport region HTR may have the structure of a single layer of a hole injection layer HIL or of a hole transport layer HTL, or may have a structure of a single layer formed of a hole injection material and a hole transport material. In other embodiments, the hole transport region HTR may have a structure of a single layer formed of different materials, or may have a structure in which a hole injection layer HIL/hole transport layer HTL, a hole injection layer HIL/hole transport layer HTL/buffer layer (not shown), a hole injection layer HIL/buffer layer (not shown), a hole transport layer HTL/buffer layer (not shown), or a hole injection layer HIL/hole transport layer HTL/electron blocking layer EBL, are stacked in its respective stated order from the first electrode EL1, but embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-1. In an embodiment, the hole transport region HTR may include a hole injection layer HIL disposed on the first electrode EL1, a hole transport layer HTL disposed on the hole injection layer HIL, and an electron blocking layer EBL disposed on the hole transport layer HTL, wherein at least one of the hole injection layer HIL, the hole transport layer HTL, and the electron blocking layer EBL may include the compound represented by Formula H-1. For example, in the case where the hole transport region HTR includes a hole injection layer HIL and a hole transport layer HTL, the hole transport layer HTL may include a compound represented by Formula H-1.

[Formula H-1]

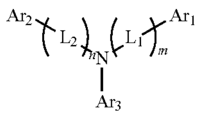

In Formula H-1, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms. In Formula H-1, m and n may each independently be an integer from 0 to 10. When m or n is 2 or more, multiple $L_1$ groups or multiple $L_2$ groups may each independently be a substituted or unsubstituted arylene group of 6 to 30 ring-forming carbon atoms, or a substituted or unsubstituted heteroarylene group of 2 to 30 ring-forming carbon atoms.

In Formula H-1, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. In Formula H-1, $Ar_3$ may be a substituted or unsubstituted aryl group of 6 to 30 ring-forming carbon atoms. In an embodiment, $Ar_3$ may be a substituted or unsubstituted phenyl group, a substituted or unsubstituted naphthyl group, a substituted or unsubstituted biphenyl group, a substituted or unsubstituted triphenyl group, or a substituted or unsubstituted fluorenyl group.

In an embodiment, the compound represented by Formula H-1 may be a monoamine compound. In another embodiment, the compound represented by Formula H-1 may be a diamine compound in which at least one of $Ar_1$ to $Ar_3$ includes an amine group as a substituent. In yet another embodiment, the compound represented by Formula H-1 may be a carbazole-based compound in which at least one of $Ar_1$ to $Ar_3$ includes a substituted or unsubstituted carbazole group, or a fluorene-based compound in which at least one of $Ar_1$ to $Ar_3$ includes a substituted or unsubstituted fluorene group.

The compound represented by Formula H-1 may be any one selected from Compound Group H. However, the compounds shown in Compound Group H are only examples, and the compound represented by Formula H-1 is not limited to the compounds listed in Compound Group H.

[Compound Group H]

H-1-1

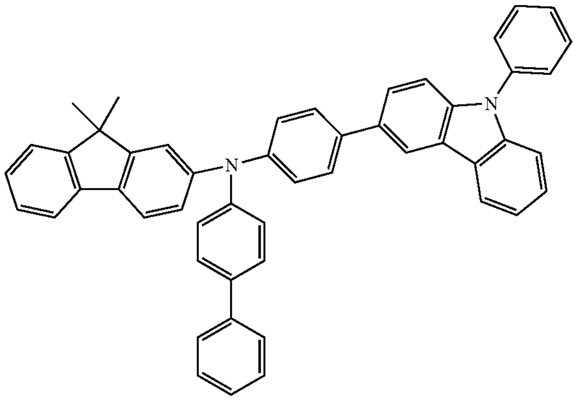

H-1-2

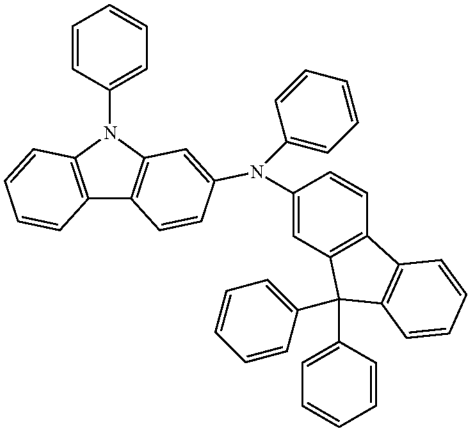

H-1-3

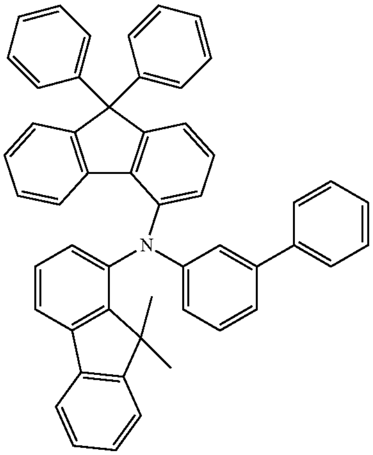

-continued

H-1-4

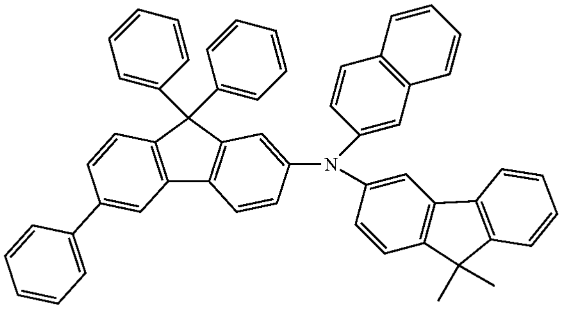

H-1-5

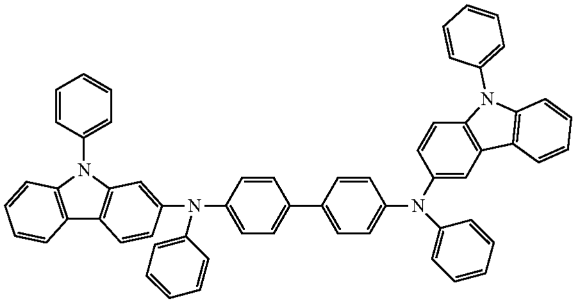

H-1-6

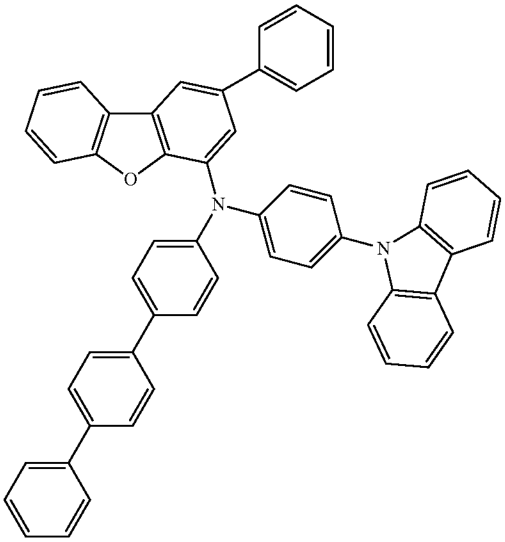

-continued
H-1-7
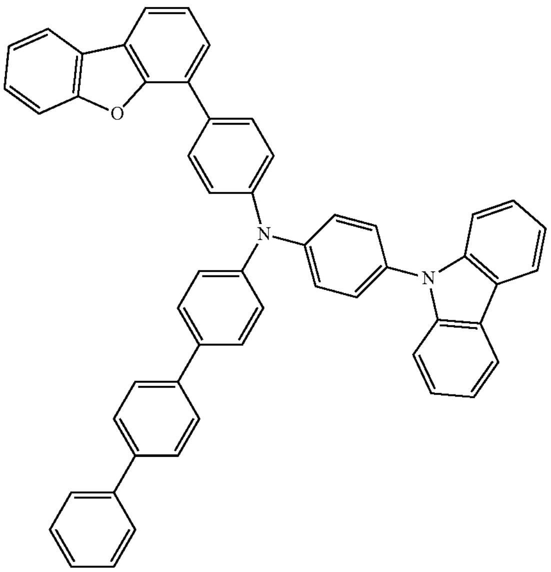
H-1-8
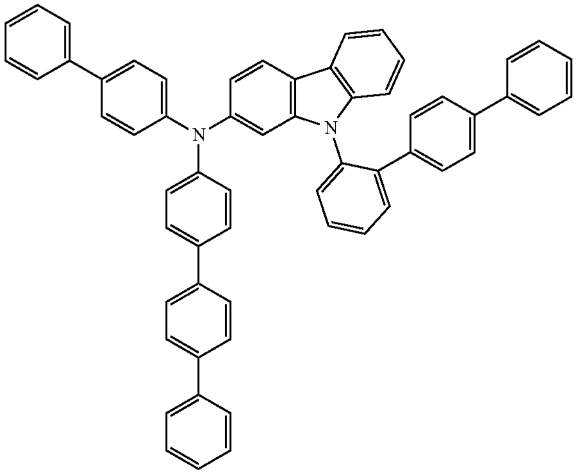
H-1-9
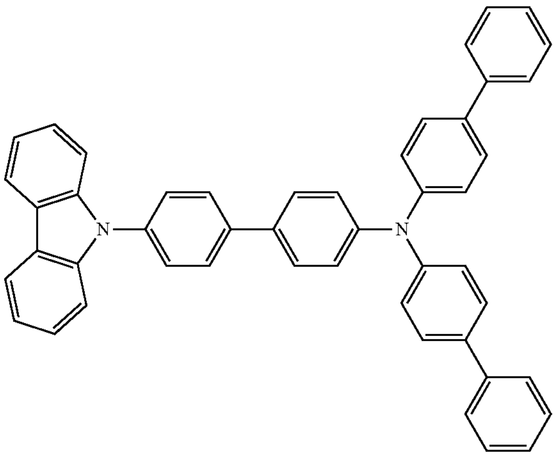
-continued
H-1-10
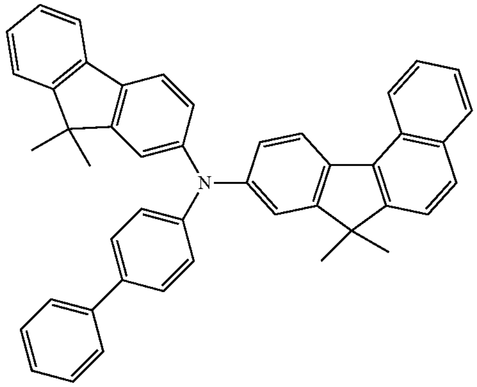
H-1-11
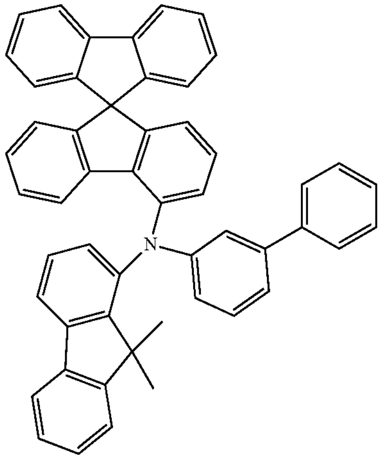
H-1-12
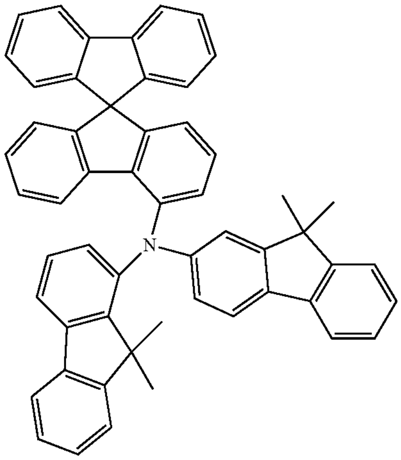
H-1-13
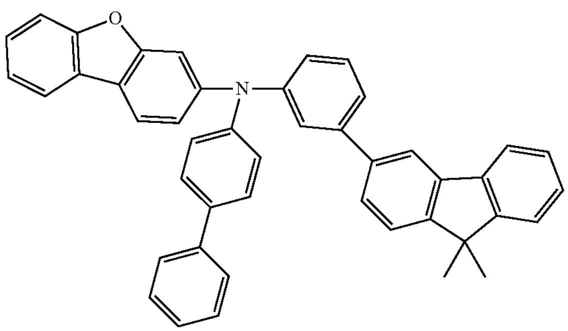

-continued
H-1-14
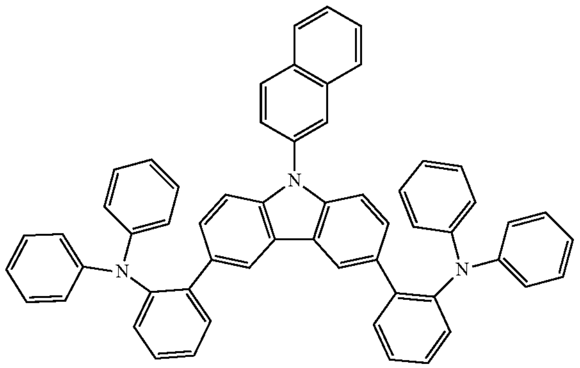
H-1-15
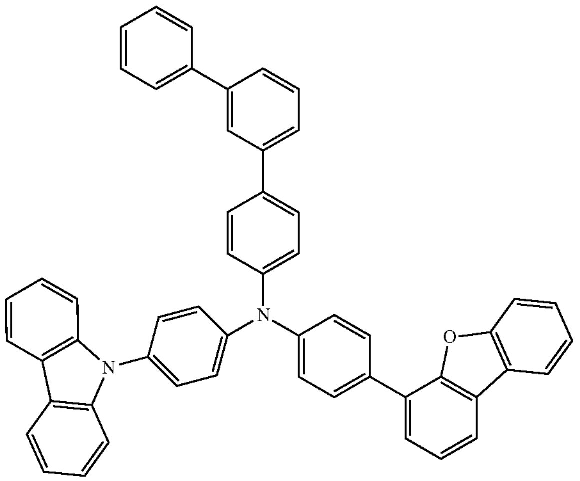
H-1-16
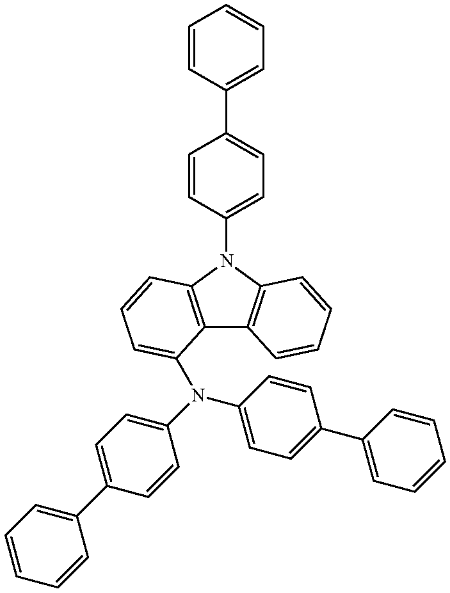
-continued
H-1-17
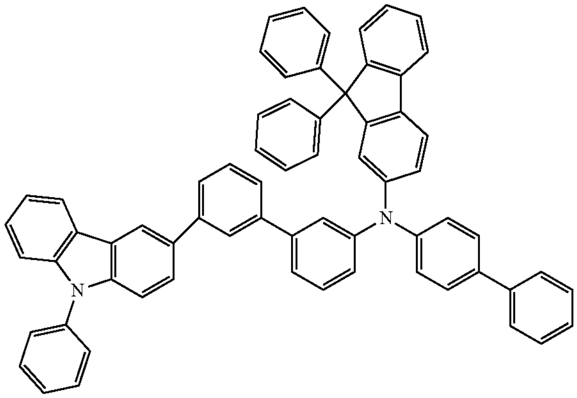
H-1-18
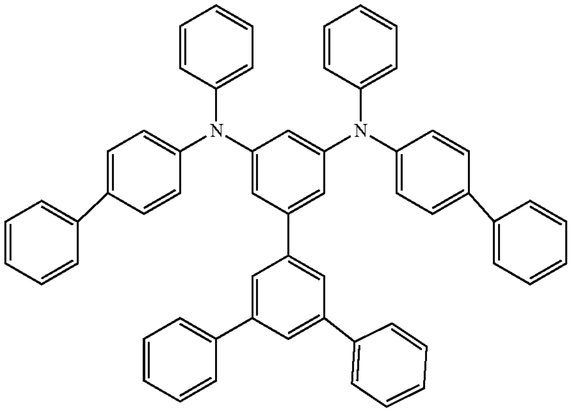
H-1-19
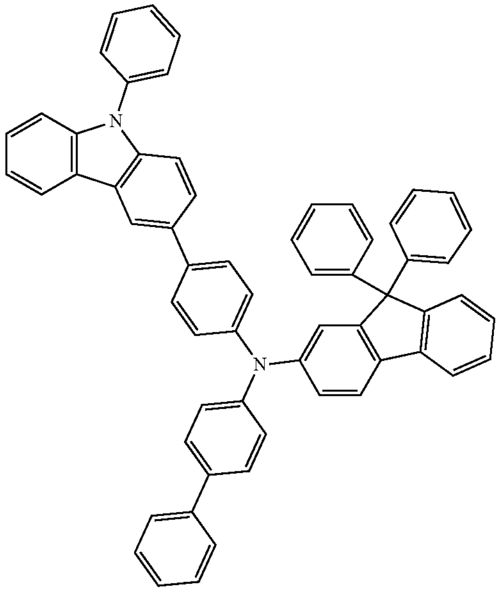

-continued

H-1-20

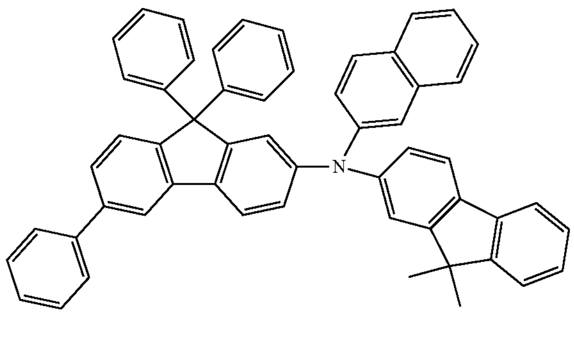

The hole transport region HTR may include a phthalocyanine compound such as copper phthalocyanine, $N^1,N^{1'}$—([1,1'-biphenyl]-4,4'-diyl)bis($N^1$-phenyl-$N^4,N^4$-di-m-tolyl-benzene-1,4-diamine) (DNTPD), 4,4',4"-[tris(3-methylphenyl)phenylamino]triphenylamine (m-MTDATA), 4,4',4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-4899-9199-1227; v. 1 isopropyl-4'-methyldiphenyliodonium [tetrakis(pentafluorophenyl) borate], and dipyrazino[2,3-f: 2',3'-h]quinoxaline-2,3,6,7,10,11-hexacarbonitrile (HAT-CN).

The hole transport region HTR may include carbazole derivatives such as N-phenyl carbazole and polyvinyl carbazole, fluorene-based derivatives, N,N'-bis(3-methylphenyl)-N,N'-diphenyl-[1,1'-biphenyl]-4,4'-diamine (TPD), triphenylamine-based derivatives such as 4,4',4"-tris(N-carbazolyl)triphenylamine (TCTA), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 1,3-bis(N-carbazolyl)benzene (mCP), etc.

The hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region in at least one of the hole injection layer HIL, hole transport layer HTL, or electron blocking layer EBL.

A thickness of the hole transport region HTR may be in a range of about 100 Å to about 10,000 Å. For example, the thickness of the hole transport region HTR may be in a range of about 100 Å to about 5,000 Å. A thickness of the hole injection region HIL may be, for example, in a range of about 30 Å to about 1,000 Å. A thickness of the hole transport layer HTL may be in a range of about 30 Å to about 1,000 Å. A thickness of the electron blocking layer EBL may be in a range of about 10 Å to about 1,000 Å. If the thicknesses of the hole transport region HTR, the hole injection layer HIL, the hole transport layer HTL, and the electron blocking layer EBL satisfy the above-described ranges, satisfactory hole transport properties may be achieved without a substantial increase of driving voltage.

The hole transport region HTR may further include a charge generating material to increase conductivity, in addition to the above-described materials. The charge generating material may be dispersed uniformly or non-uniformly in the hole transport region HTR. The charge generating material may be, for example, a p-dopant. The p-dopant may include at least one of quinone derivatives, metal oxides, and cyano group-containing compounds, without limitation. For example, non-limiting examples of the p-dopant may include quinone derivatives such as tetracyanoquinodimethane (TCNQ) and 2,3,5,6-tetrafluoro-7,7',8,8-tetracyanoquinodimethane (F4-TCNQ), metal oxides such as tungsten oxide and molybdenum oxide, etc., without limitation.

As described above, the hole transport region HTR may further include at least one of a buffer layer (not shown) or an electron blocking layer EBL in addition to the hole injection layer HIL and the hole transport layer HTL. The buffer layer (not shown) may increase light emitting efficiency by compensating for a resonance distance according to a wavelength of light emitted from an emission layer EML. As materials included in the buffer layer (not shown), materials which may be included in the hole transport region HTR may be used. The electron blocking layer EBL may block the injection of electrons from an electron transport region ETR to a hole transport region HTR.

The emission layer EML is provided on the hole transport region HTR. The emission layer EML may have a thickness, for example, in a range of about 100 Å to about 1,000 Å. For example, the emission layer EML may have a thickness in a range of about 100 Å to about 300 Å. The emission layer EML may be a layer formed of a single material, a layer formed of different materials, or a multilayer structure having layers formed of different materials.

In the organic electroluminescence device ED of an embodiment, the emission layer EML may emit delayed fluorescence.

In the organic electroluminescence device ED of an embodiment, the emission layer EML may include the fused polycyclic compound of an embodiment.

The fused polycyclic compound of an embodiment may be represented by Formula 1.

[Formula 1]

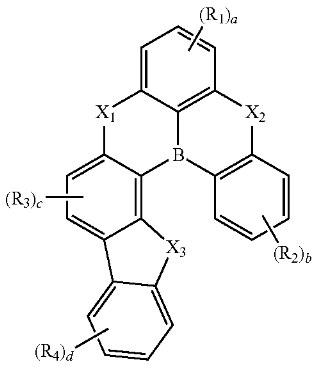

In Formula 1, $X_1$ and $X_2$ may each independently be $N(R_5)$, O, S, or Se, and $X_3$ may be O or S.

In Formula 1, $R_1$ to $R_4$ may each independently be a hydrogen atom, a deuterium atom, a halogen atom, a cyano group, a trifluoromethyl group (—$CF_3$), a substituted or unsubstituted silyl group, a substituted or unsubstituted amino group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms.

In Formula 1, $R_5$ may be a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms.

In an embodiment, $R_4$ may be a hydrogen atom, and at least one of $R_1$ to $R_3$ may be an arylamine group or a substituted or unsubstituted carbazole group.

In Formula 1, a may be an integer from 0 to 3. If a is 2 or more, multiple $R_1$ groups may be the same as or different from each other.

In Formula 1, b and d may each independently be an integer from 0 to 4. If b is 2 or more, multiple $R_2$ groups may be the same as or different from each other, and if d is 2 or more, multiple $R_4$ groups may be the same as or different from each other.

In Formula 1, c may be an integer from 0 to 2. If c is 2, multiple $R_3$ groups may be the same as or different from each other.

In an embodiment, a to c of Formula 1 may each be 1, wherein a case where $R_1$ to $R_3$ are all hydrogen atoms at the same time is excluded.

In an embodiment, a to c of Formula 1 may each be 1, and $R_1$ to $R_3$ may each independently be a deuterium atom, a halogen atom, a cyano group, a trifluoromethyl group ($—CF_3$), a substituted or unsubstituted silyl group, a substituted or unsubstituted amino group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms.

In an embodiment, b and c of Formula 1 may each be 1, and $R_2$ and $R_3$ may be the same.

In an embodiment, the fused polycyclic compound according to embodiments may further include at least one donor functional group bonded at a para position to boron, for example, as in the fused polycyclic compounds represented by Formula 2-1 to 6-2.

In an embodiment, the fused polycyclic compound represented by Formula 1 may be represented by Formula 2-1 or Formula 2-2.

[Formula 2-1]

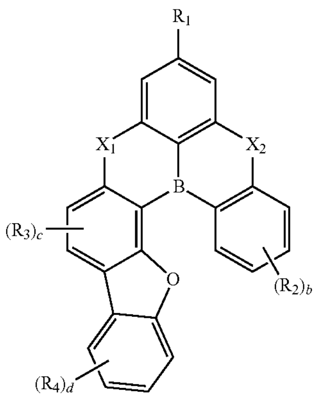

-continued

[Formula 2-2]

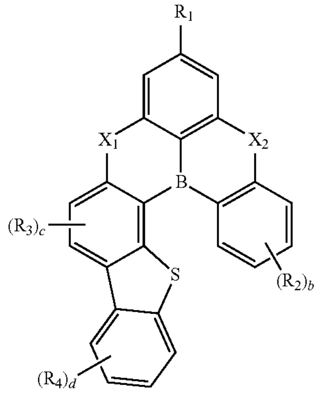

In Formula 2-1 and Formula 2-2, $R_1$ may be a deuterium atom, a halogen atom, a cyano group, a trifluoromethyl group, a substituted or unsubstituted silyl group, a substituted or unsubstituted amino group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms.

In Formula 2-1 and Formula 2-2, $X_1$, $X_2$, $R_2$ to $R_4$, and b to d may be the same as defined in Formula 1.

In an embodiment, the fused polycyclic compound represented by Formula 1 may be represented by Formula 3-1 or Formula 3-2.

[Formula 3-1]

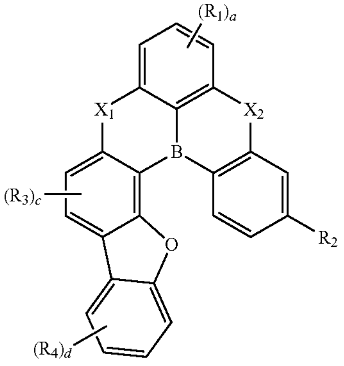

[Formula 3-2]

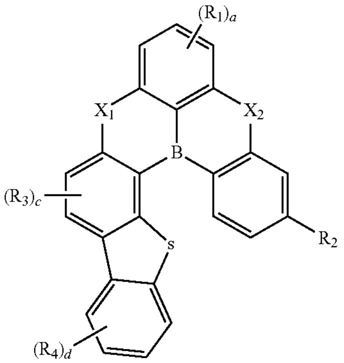

In Formula 3-1 and Formula 3-2, $R_2$ may be a deuterium atom, a halogen atom, a cyano group, a trifluoromethyl group, a substituted or unsubstituted silyl group, a substituted or unsubstituted amino group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms.

In Formula 3-1 and Formula 3-2, $X_1$, $X_2$, $R_1$, $R_3$, $R_4$, a, c, and d may be the same as defined in Formula 1.

In an embodiment, the fused polycyclic compound represented by Formula 1 may be represented by Formula 4-1 or Formula 4-2.

[Formula 4-1]

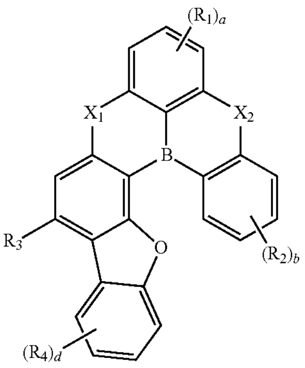

[Formula 4-2]

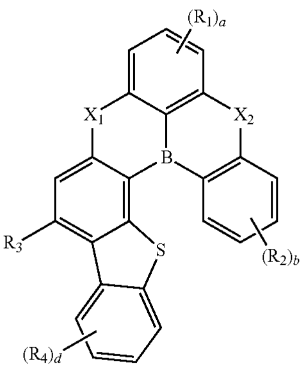

In Formula 4-1 and Formula 4-2, $R_3$ may be a deuterium atom, a halogen atom, a cyano group, a trifluoromethyl group, a substituted or unsubstituted silyl group, a substituted or unsubstituted amino group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms.

In Formula 4-1 and Formula 4-2, $X_1$, $X_2$, $R_1$, $R_2$, $R_4$, a, b, and d may be the same as defined in Formula 1.

In an embodiment, the fused polycyclic compound represented by Formula 1 may be represented by Formula 5-1 or Formula 5-2.

[Formula 5-1]

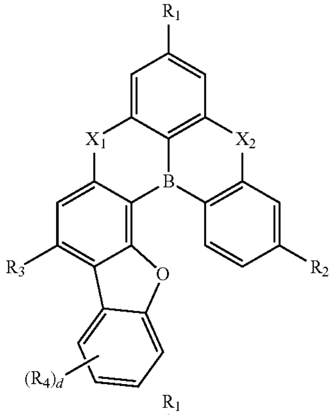

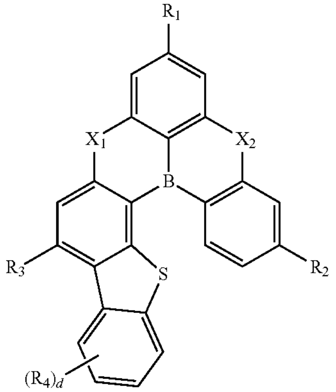

In Formula 5-1 and Formula 5-2, $R_1$ to $R_3$ may each independently be a deuterium atom, a halogen atom, a cyano group, a trifluoromethyl group, a substituted or unsubstituted silyl group, a substituted or unsubstituted amino group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms.

In Formula 5-1 and Formula 5-2, $X_1$, $X_2$, $R_4$, and d may be the same as defined in Formula 1.

In the fused polycyclic compound of an embodiment, $R_4$ may be a hydrogen atom.

In an embodiment, the fused polycyclic compound represented by Formula 5-1 may be represented by Formula 6-1.

[Formula 6-1]

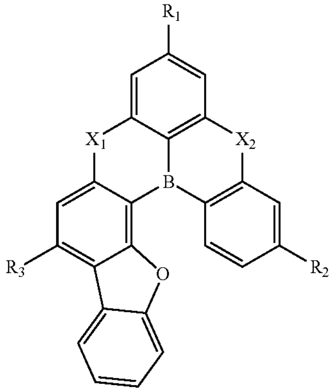

In Formula 6-1, $X_1$, $X_2$ and $R_1$ to $R_3$ may be the same as defined in Formula 5-1.

In an embodiment, the fused polycyclic compound represented by Formula 5-2 may be represented by Formula 6-2.

[Formula 6-2]

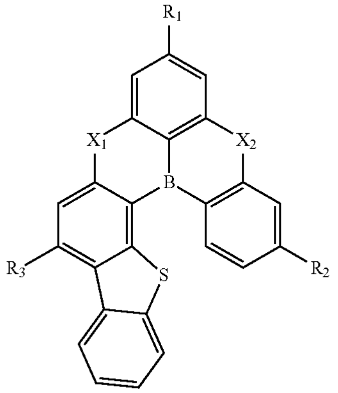

In Formula 6-2, $X_1$, $X_2$ and $R_1$ to $R_3$ may be the same as defined in Formula 5-2.

In any of the fused polycyclic compounds represented by Formula 2-1 to Formula 6-2, in an embodiment, at least one of $R_1$ to $R_3$ may be an arylamine group or a substituted or unsubstituted carbazole group.

In any of the fused polycyclic compounds represented by Formula 2-1 to Formula 6-2, in an embodiment, $R_2$ and $R_3$ may be the same.

The fused polycyclic compound of an embodiment may be any one selected from Compound Group 1. An organic electroluminescence device ED of an embodiment may include at least one fused polycyclic compound selected from Compound Group 1 in an emission layer EML.

[Compound Group 1]

1

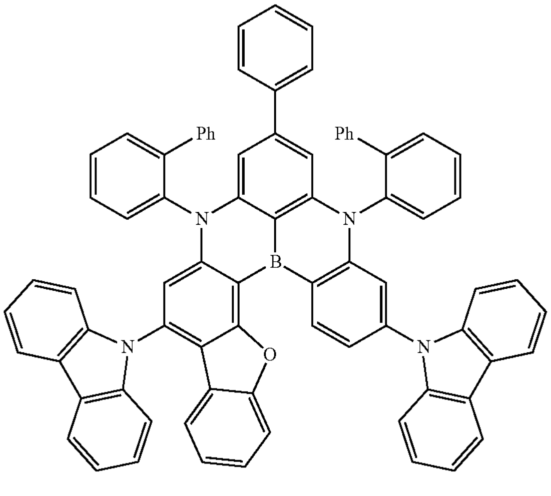

-continued

2

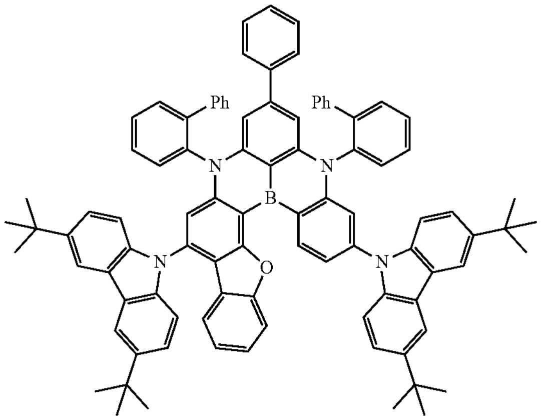

3

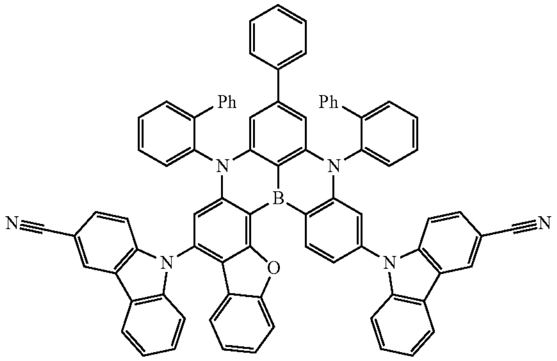

4

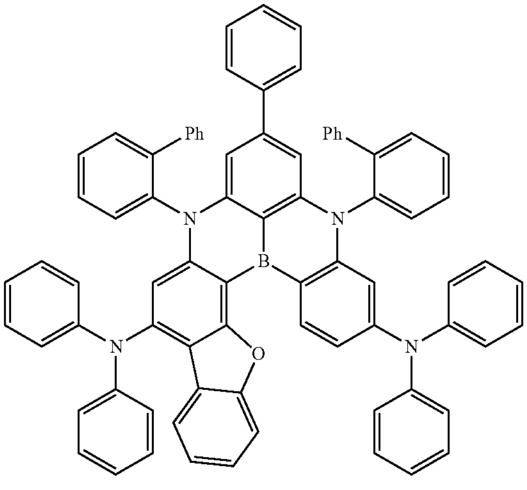

5
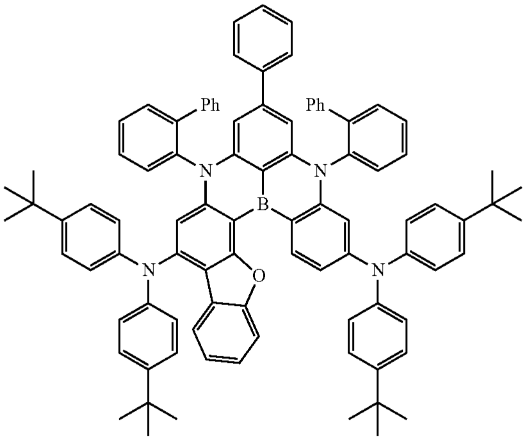
6
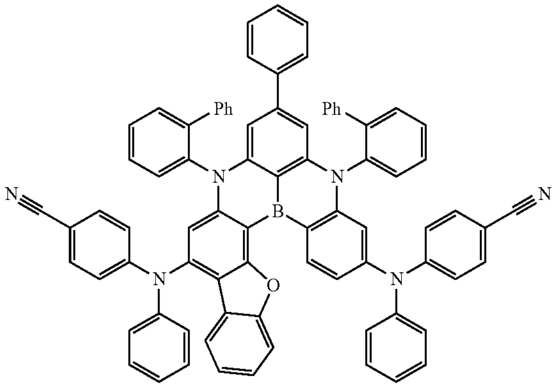
7
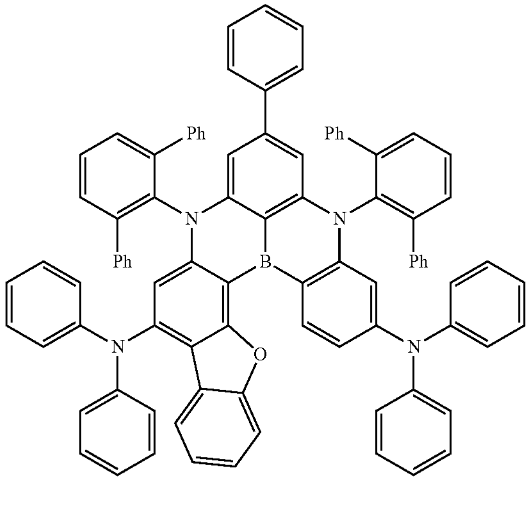
8
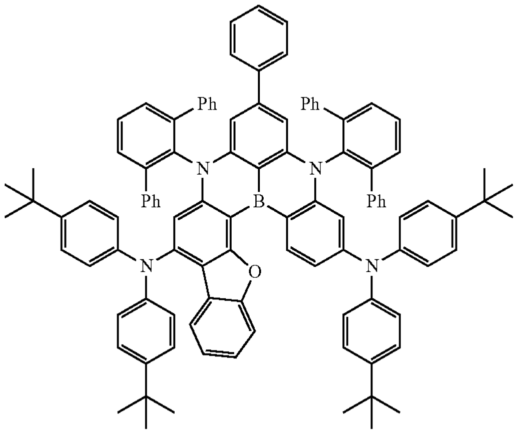
9
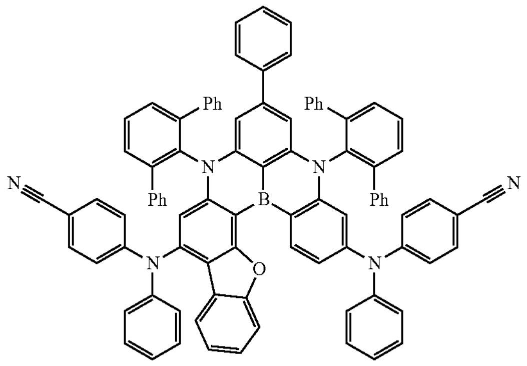
10
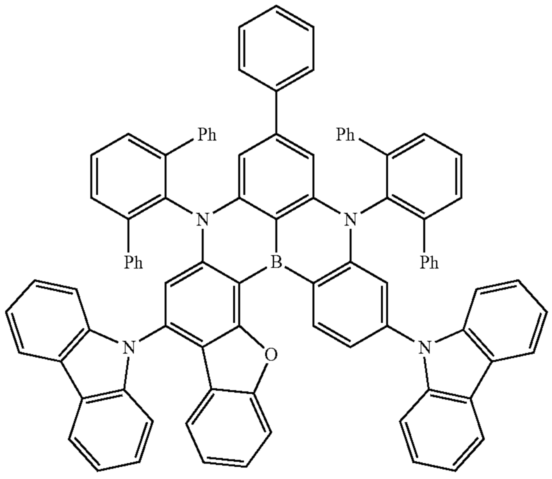

-continued
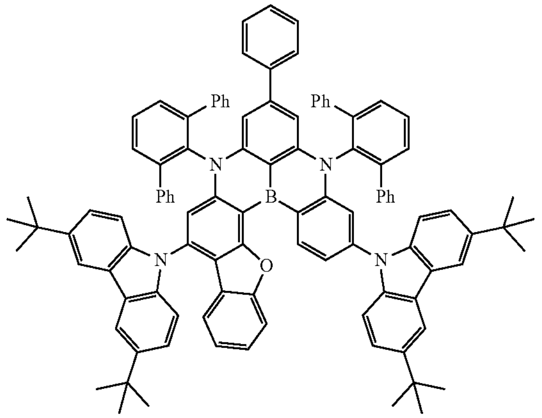
11
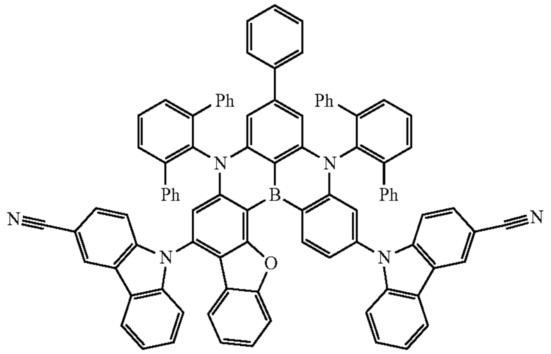
12
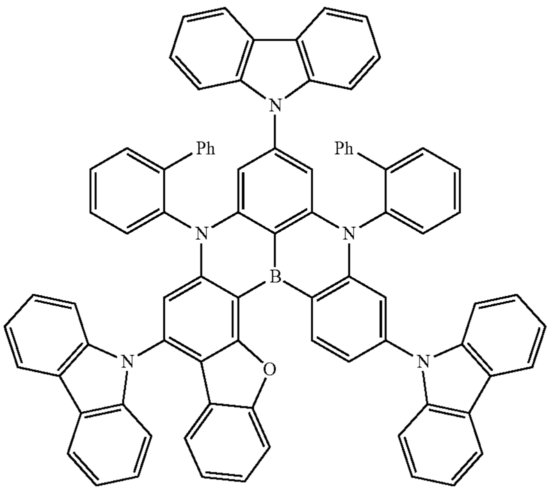
13
-continued
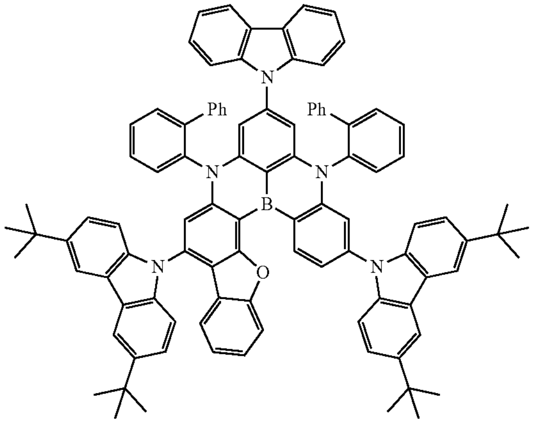
14
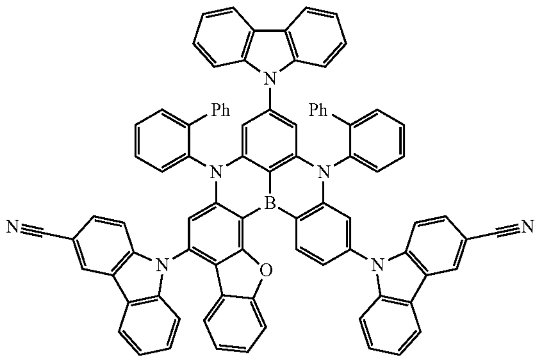
15
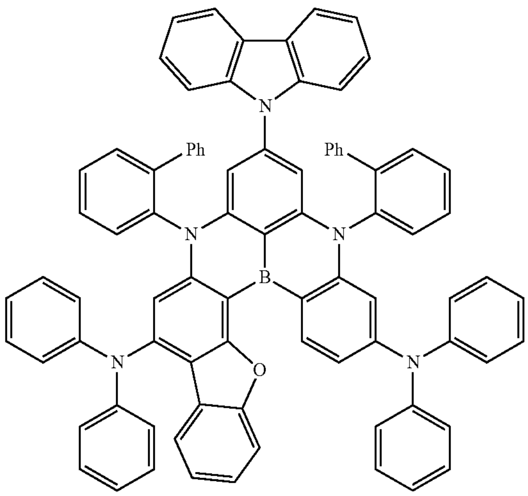
16

-continued
17
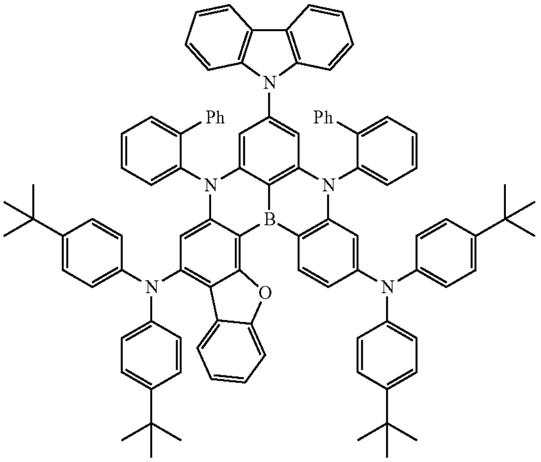
18
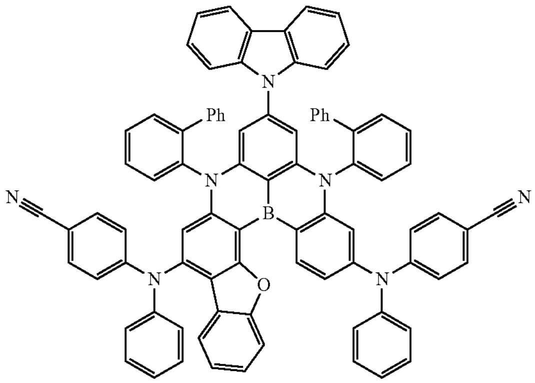
19
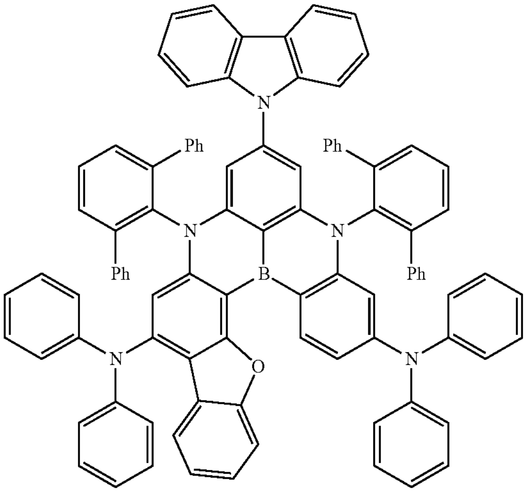
-continued
20
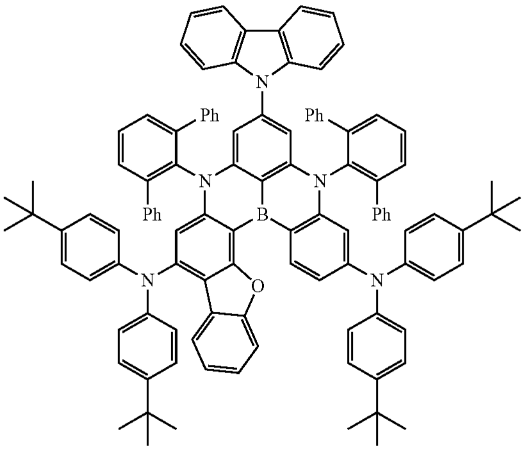
21
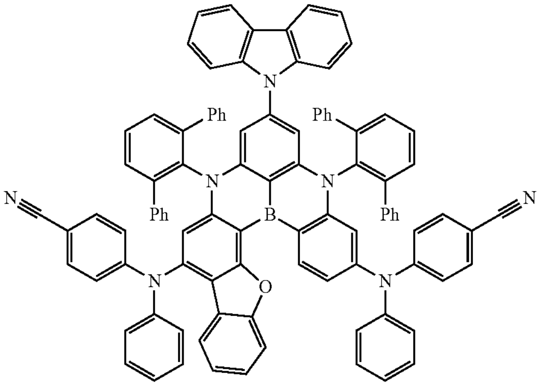
22
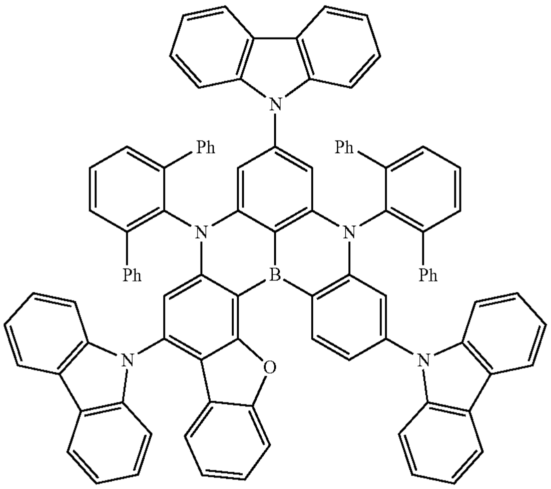

-continued
23
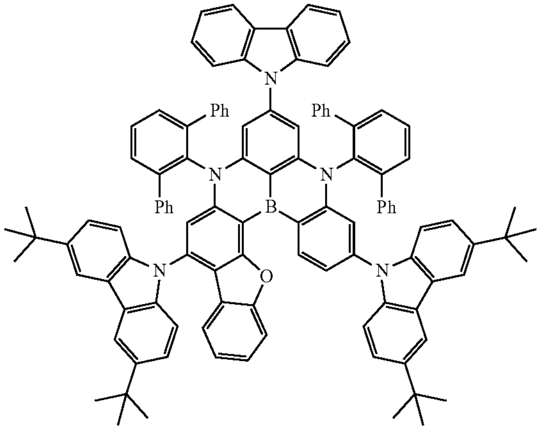
24
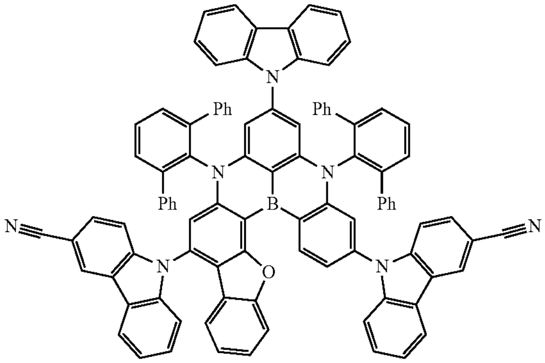
25
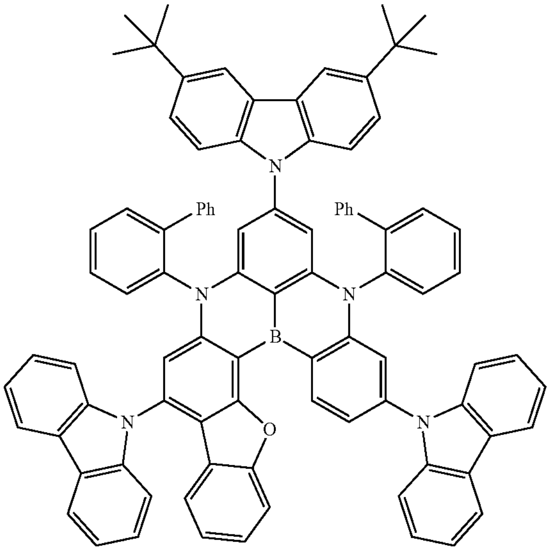
-continued
26
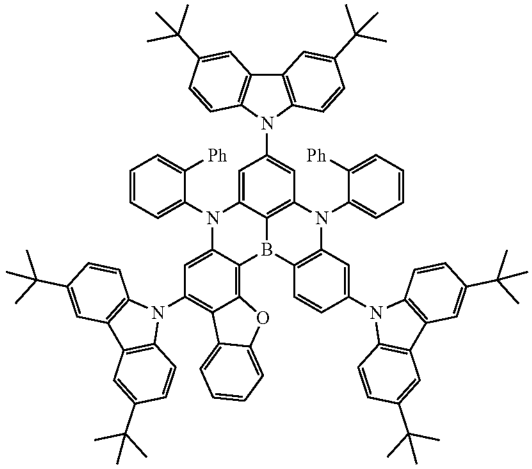
27
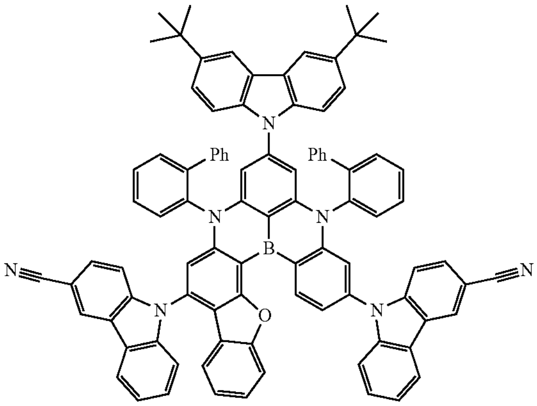
28
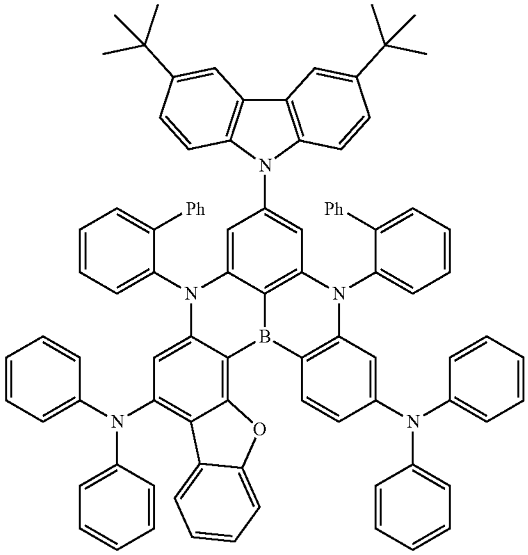

-continued
29
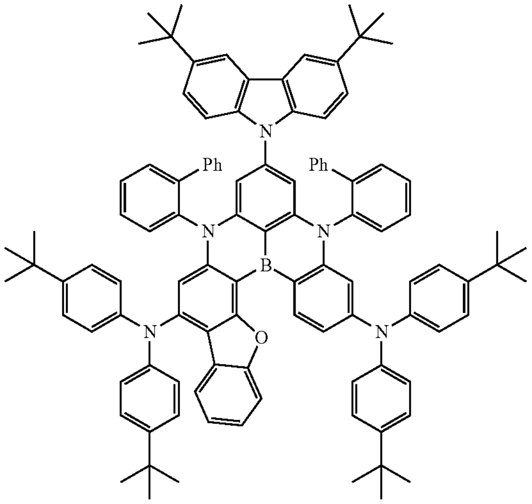
30
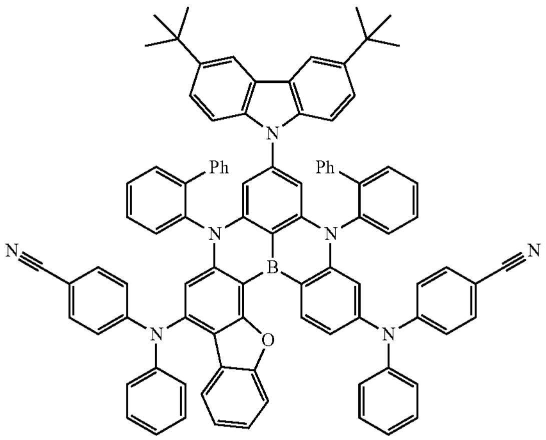
31
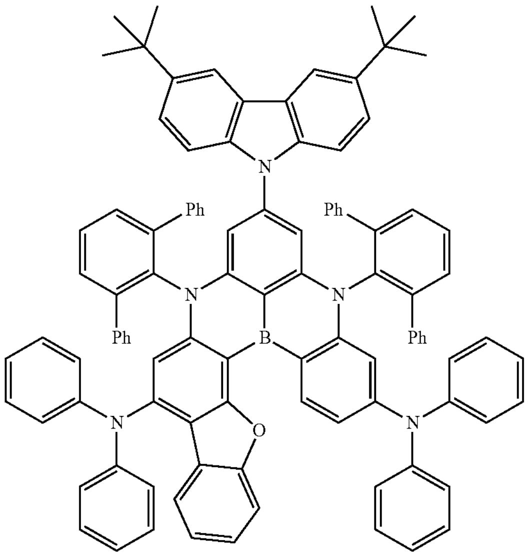
-continued
32
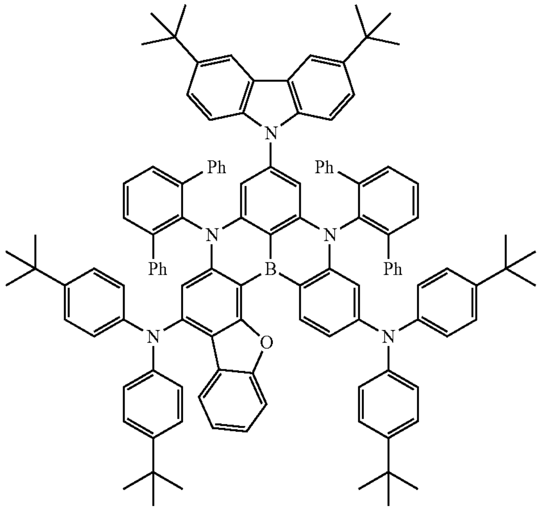
33
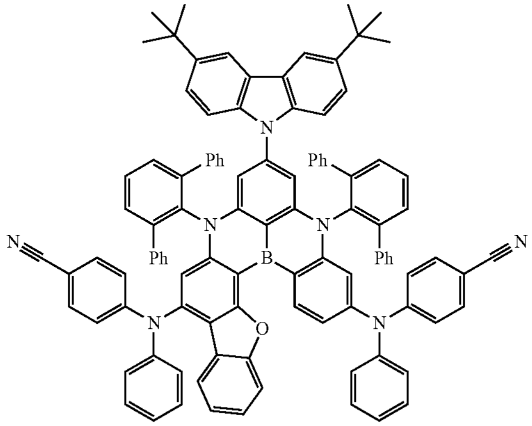
34
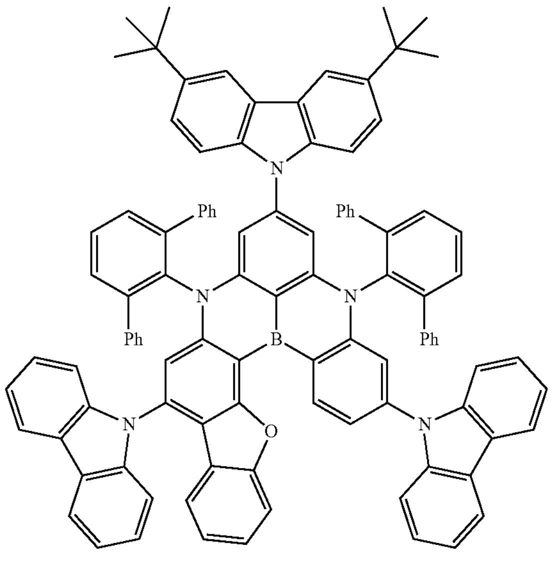

-continued
35
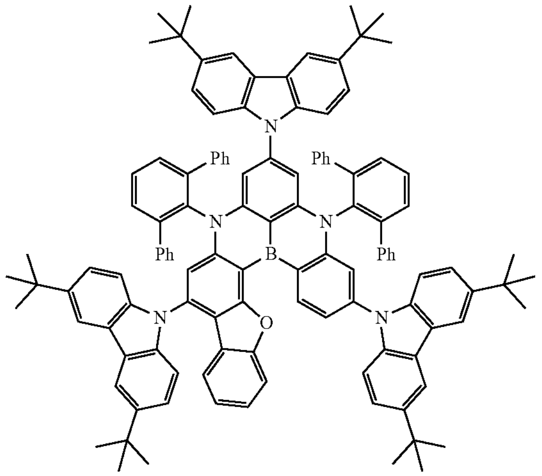
36
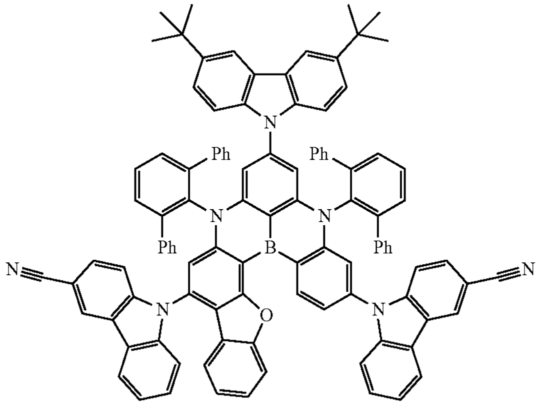
37
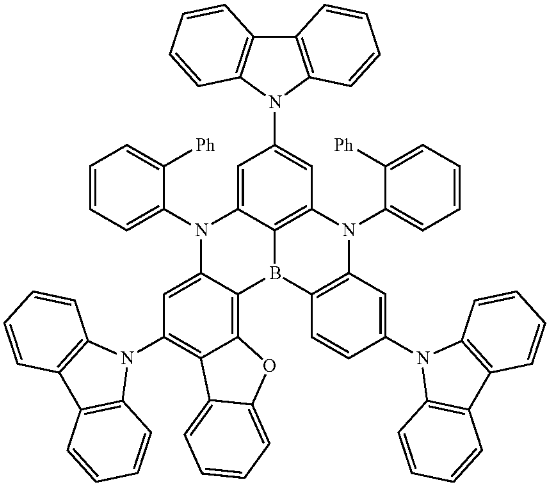
-continued
38
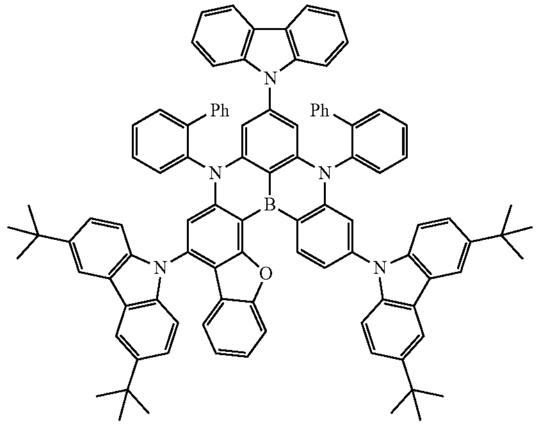
39
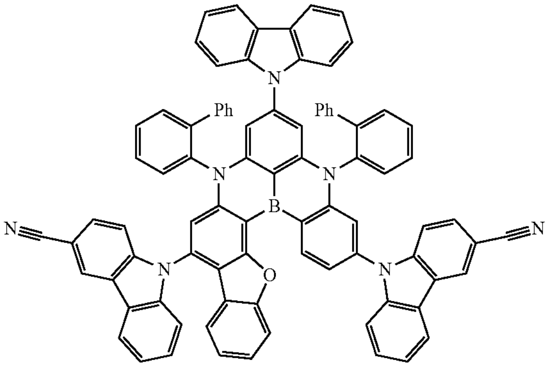
40
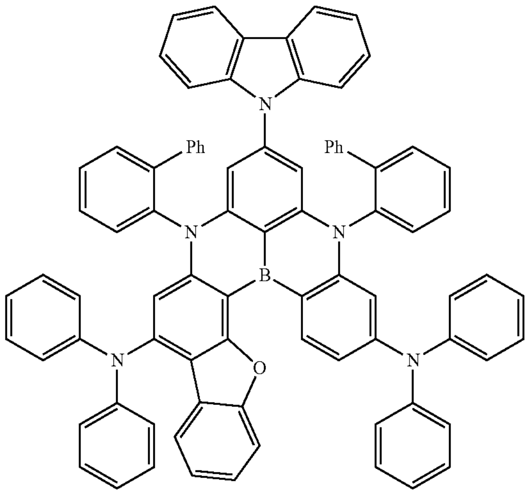

-continued
41
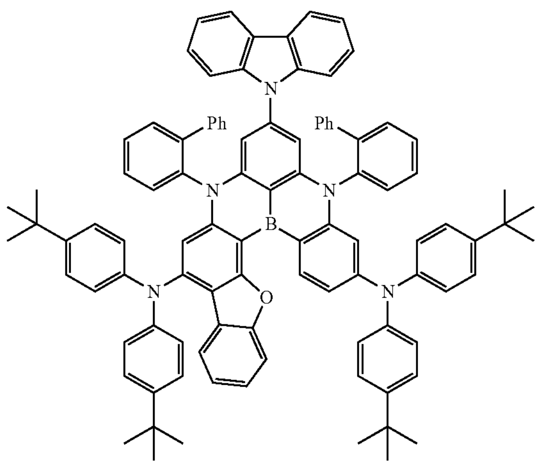
42
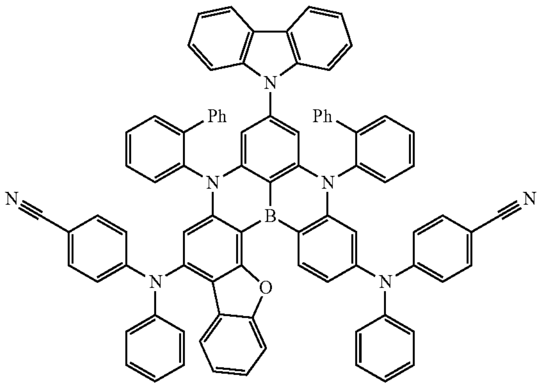
43
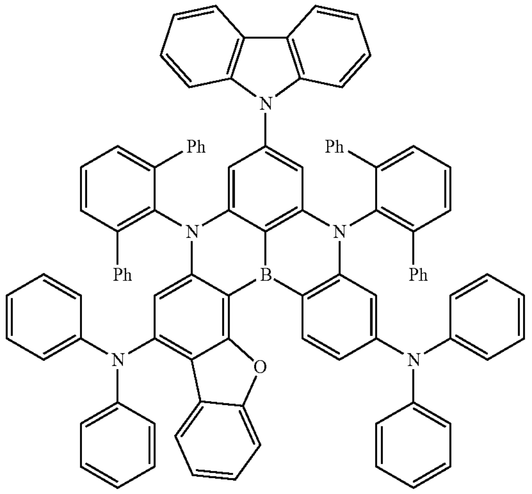
-continued
44
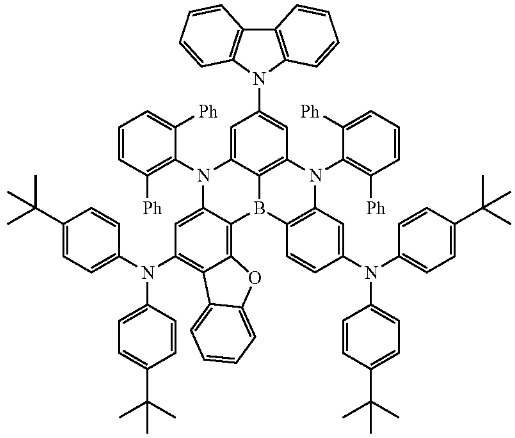
45
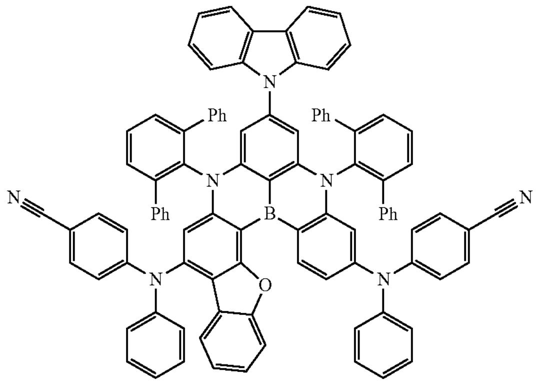
46
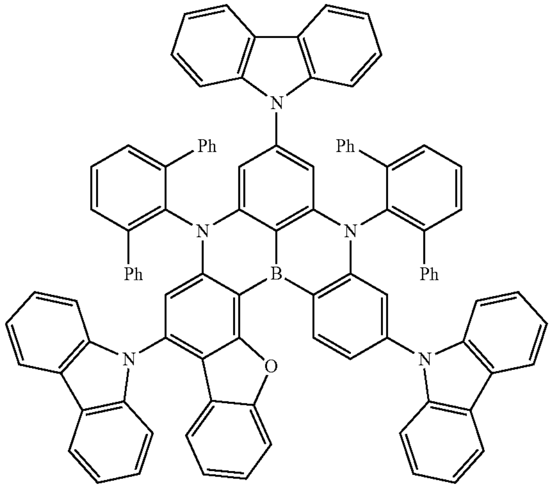

-continued
47
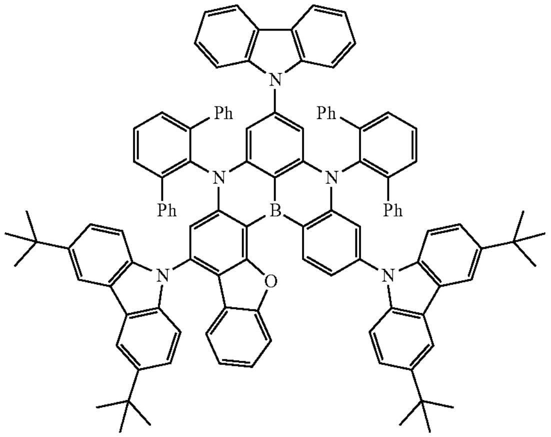
48
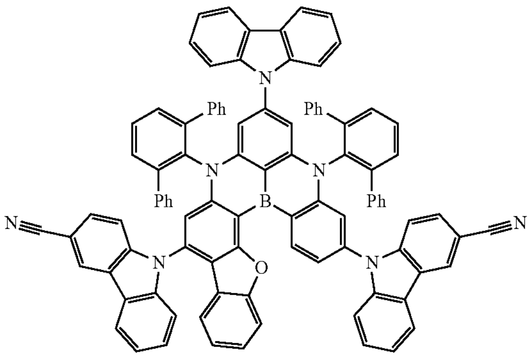
49
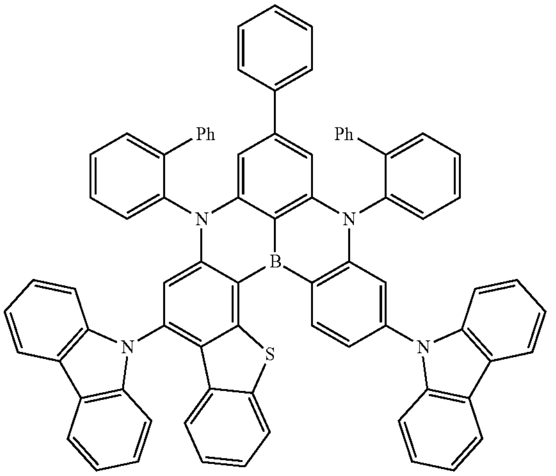
-continued
50
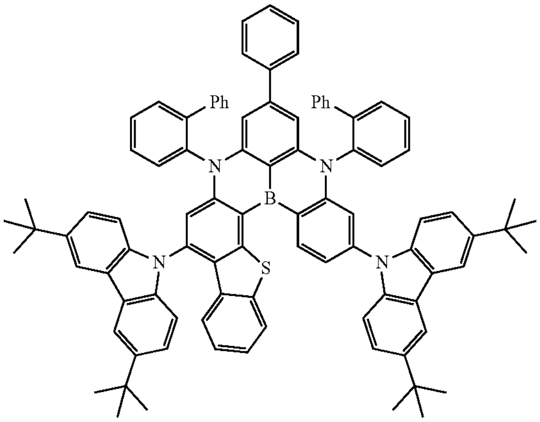
51
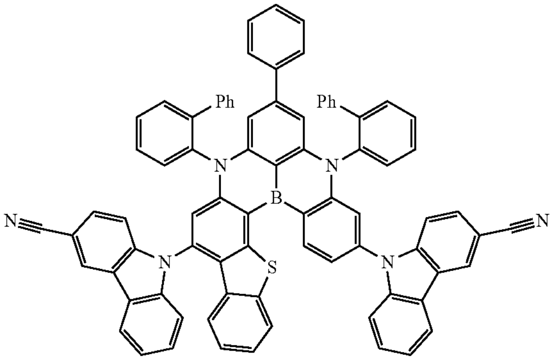
52
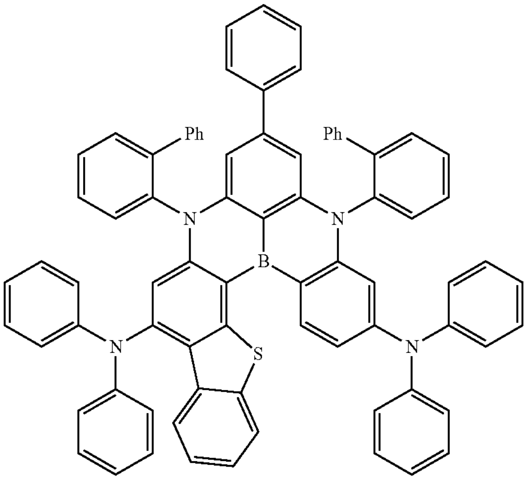

-continued
53
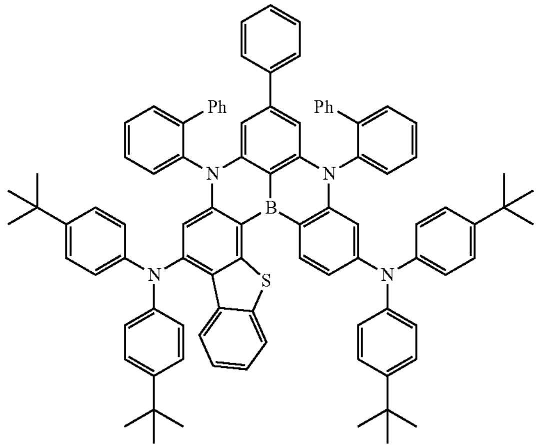
54
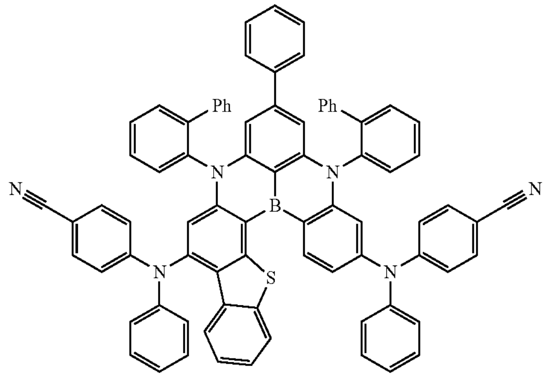
55
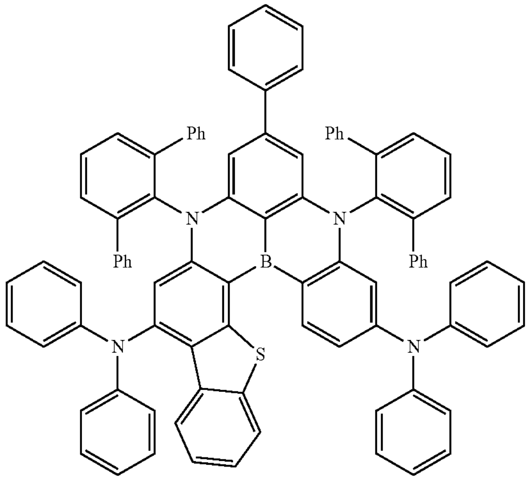
-continued
56
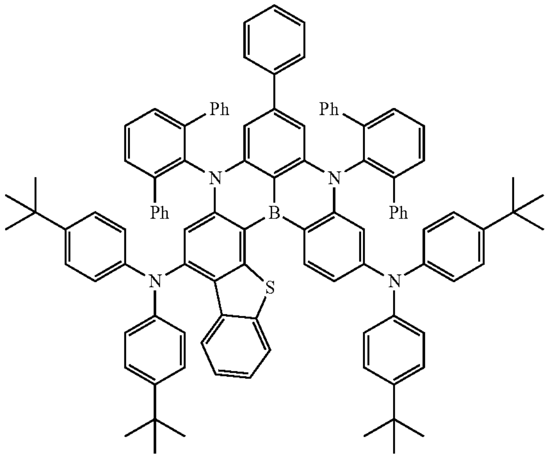
57
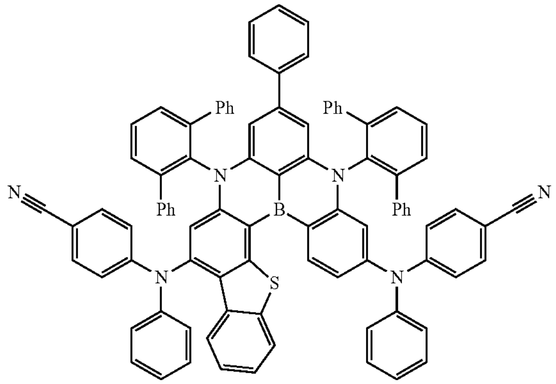
58
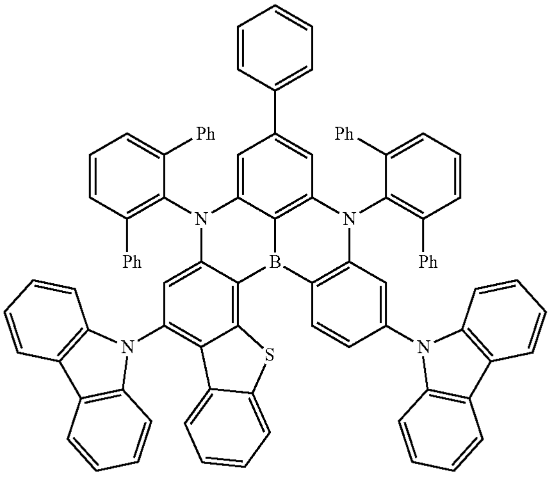

59
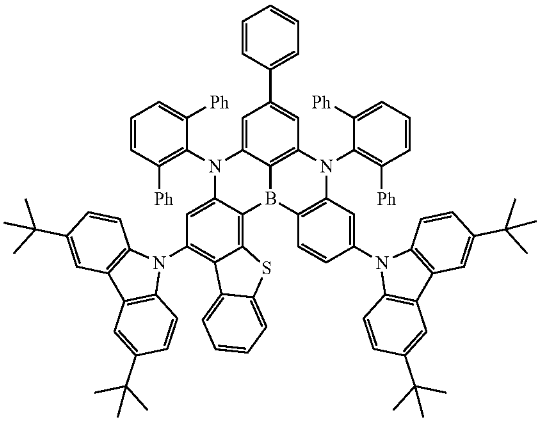
60
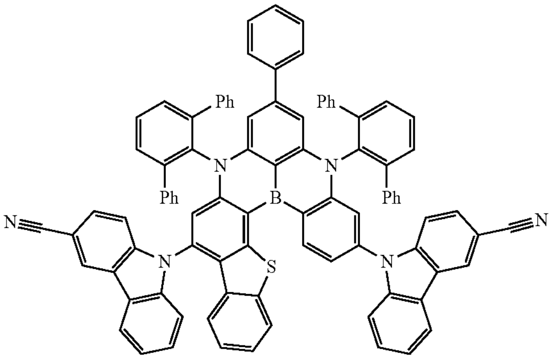
61
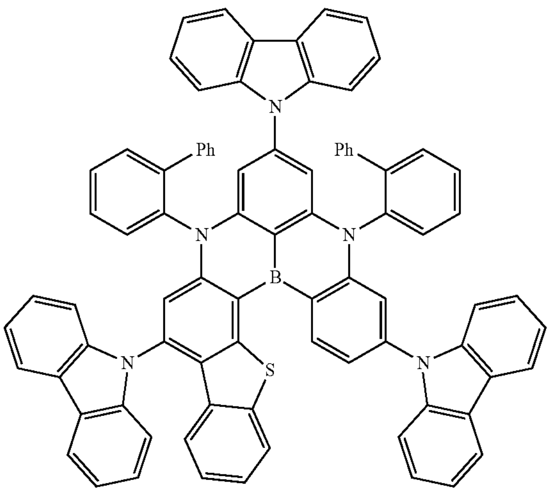
62
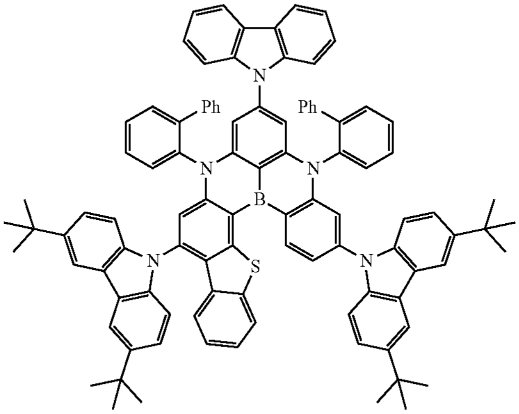
63
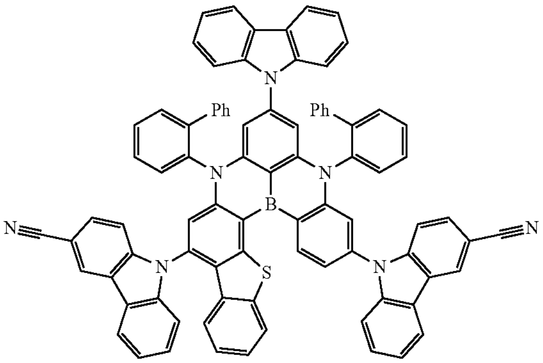
64
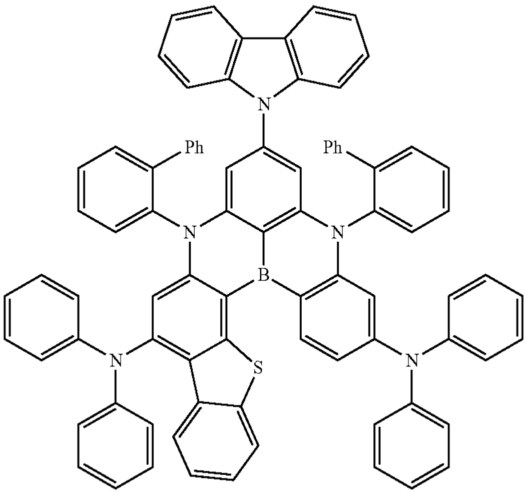

-continued
65
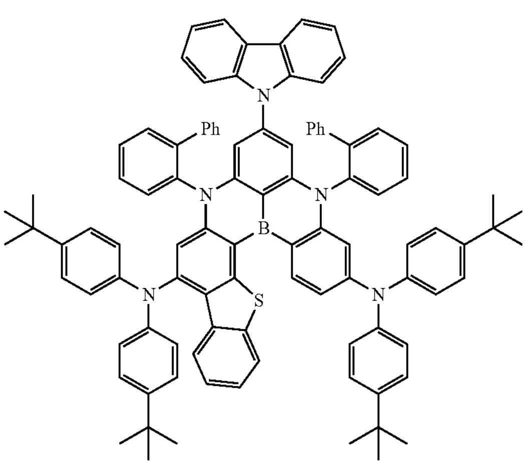
66
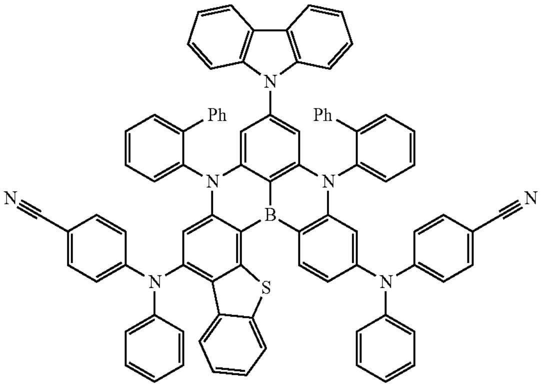
67
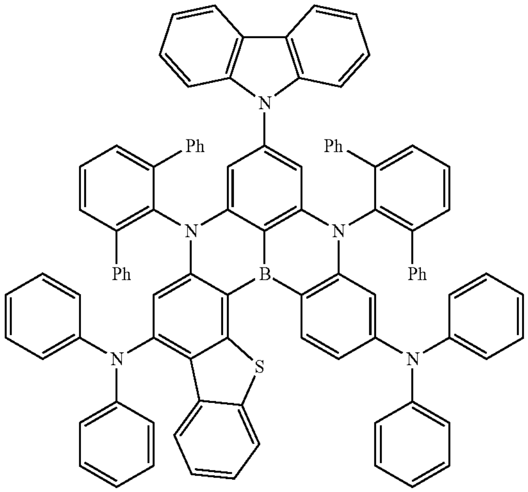
-continued
68
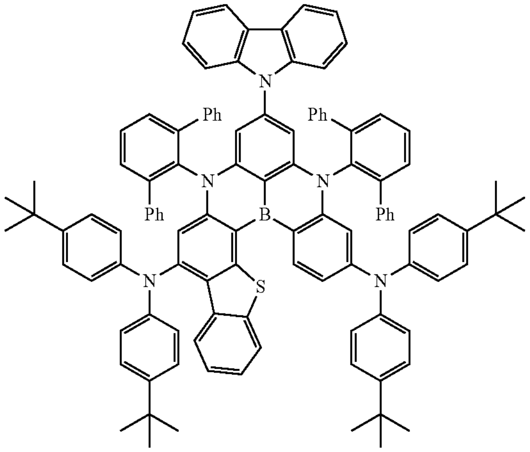
69
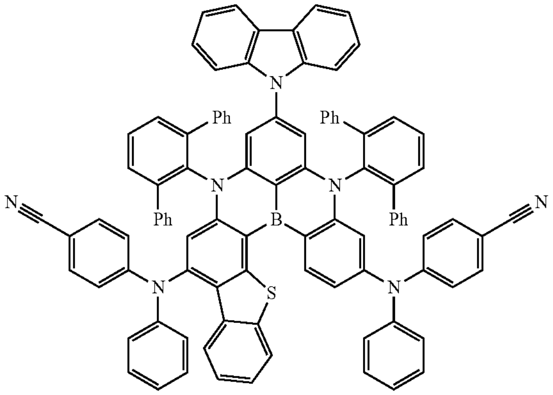
70
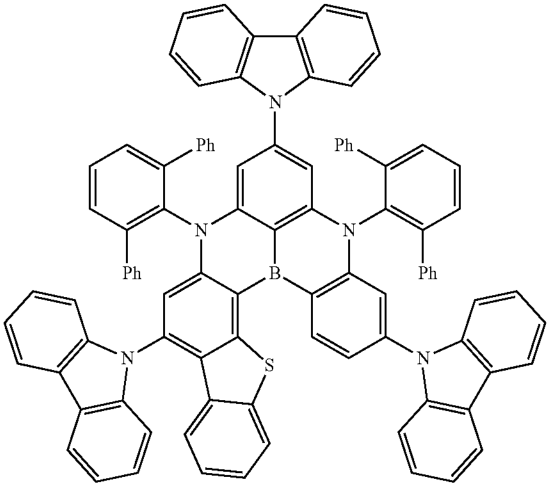

-continued
71
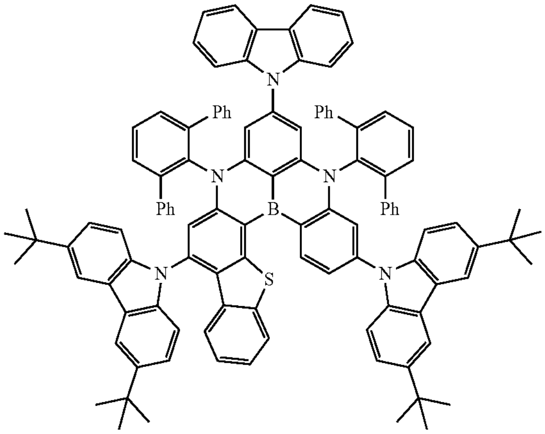
72
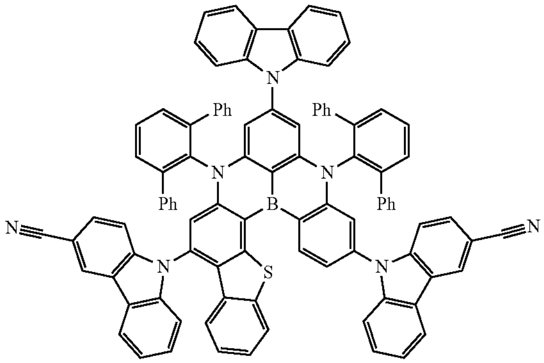
73
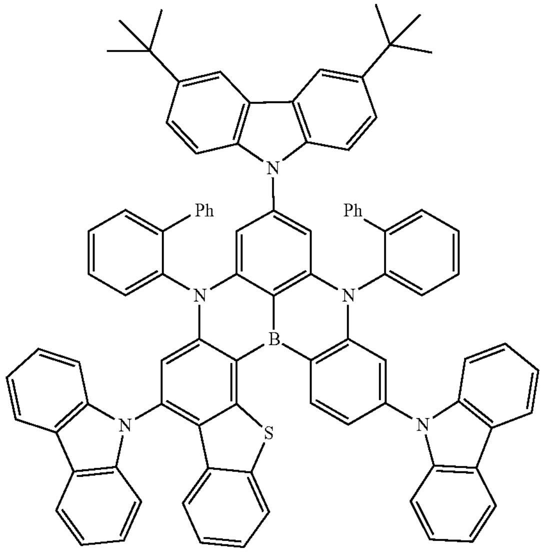
-continued
74
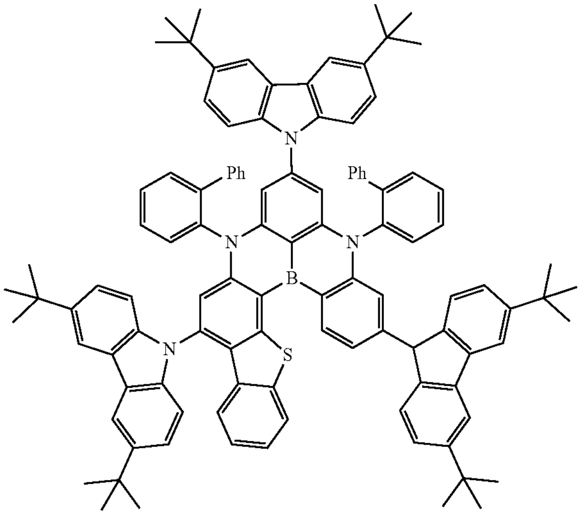
75
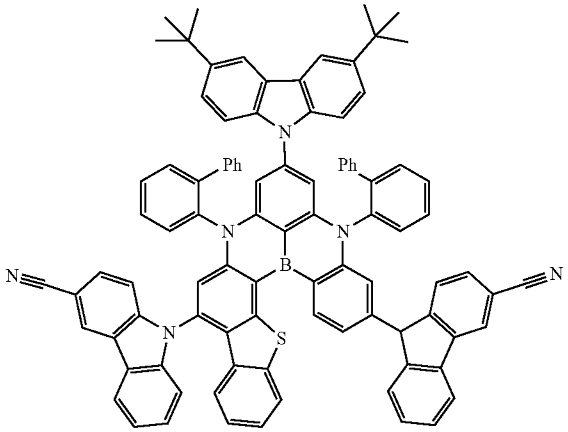
76
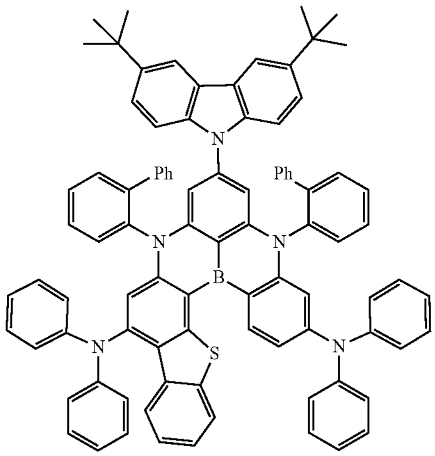

-continued
77
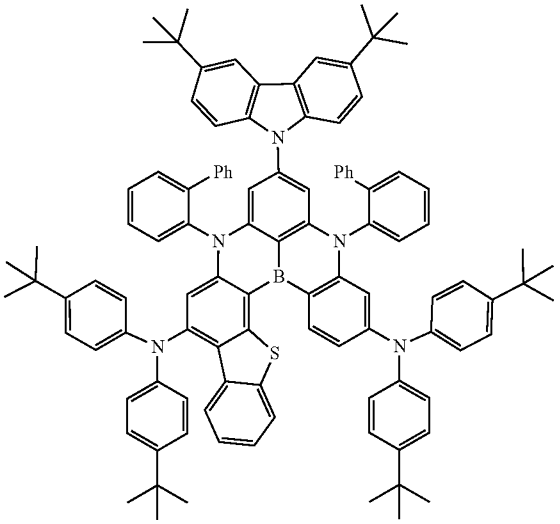
78
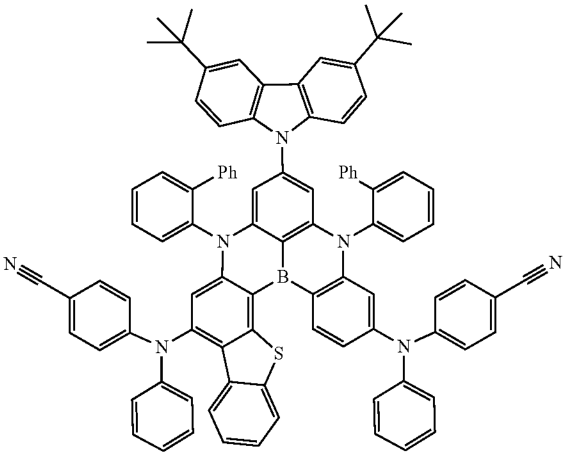
79
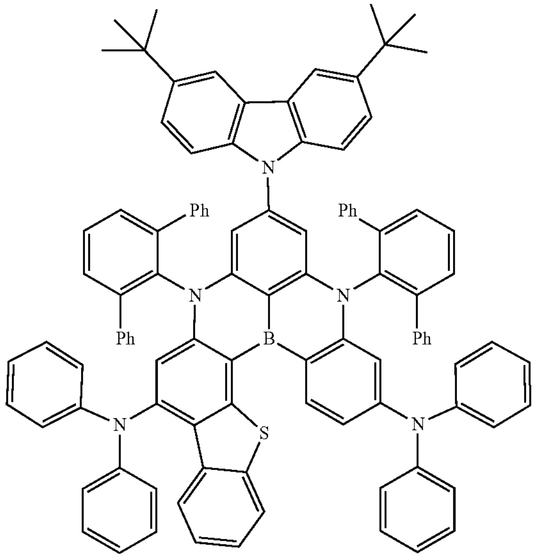
-continued
80
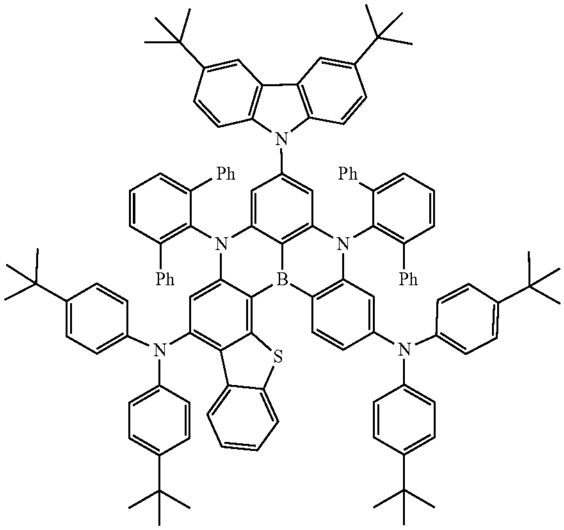
81
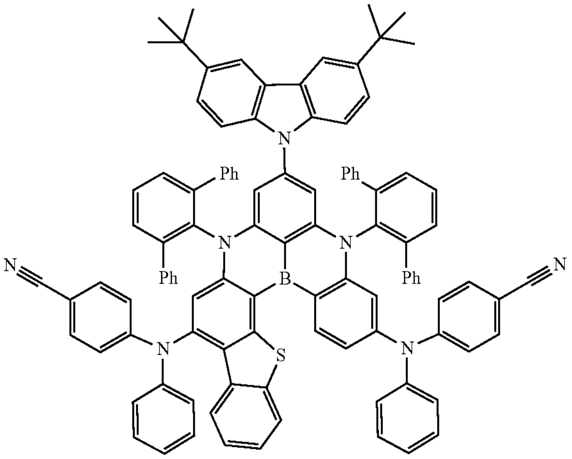
82
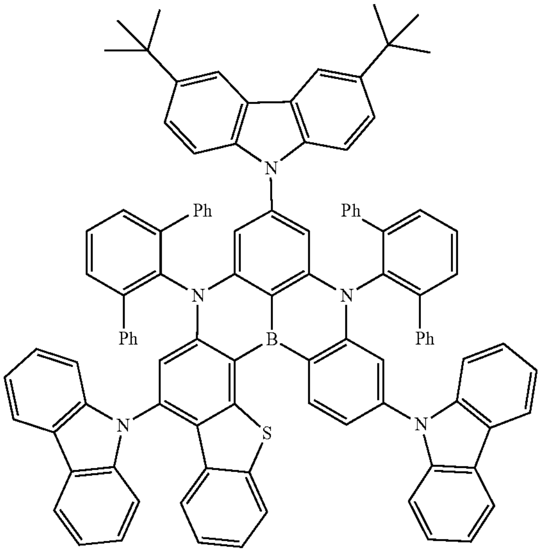

-continued
83
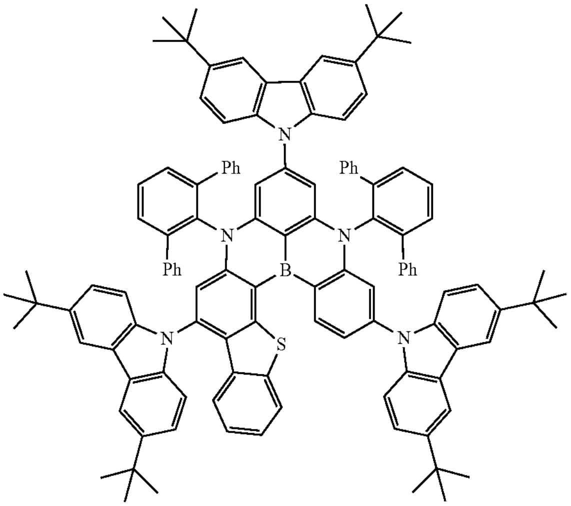
84
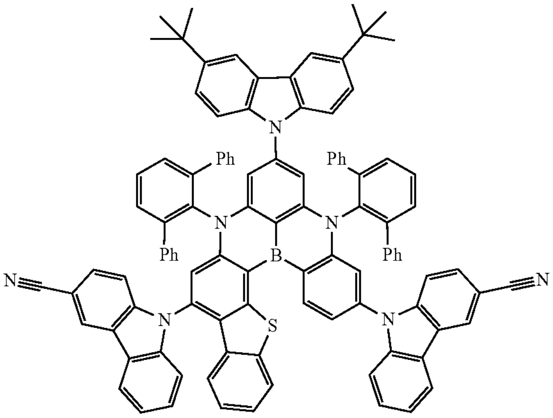
85
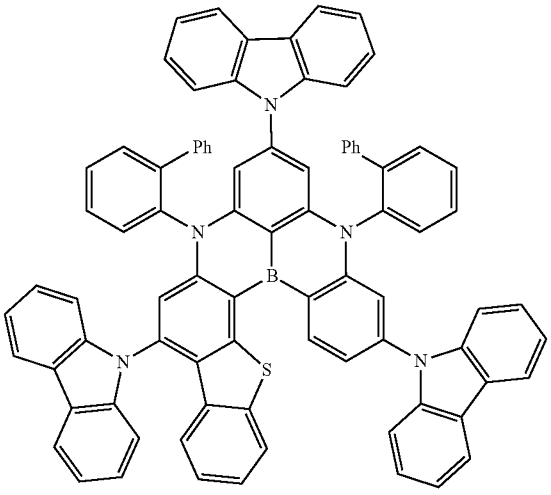
-continued
86
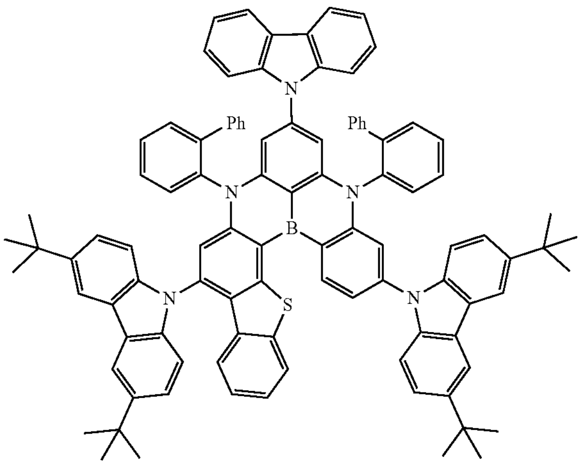
87
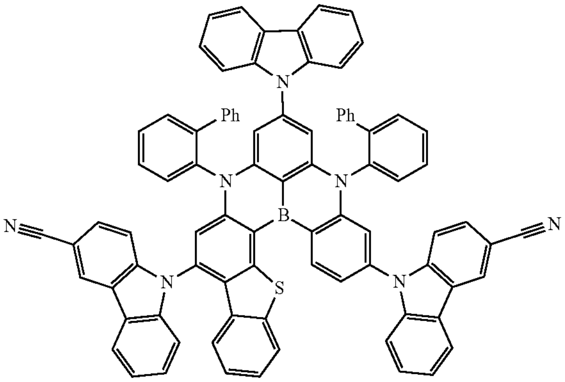
88
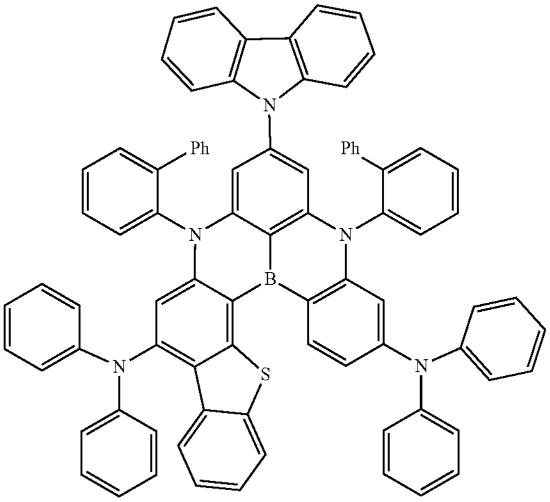

-continued
89
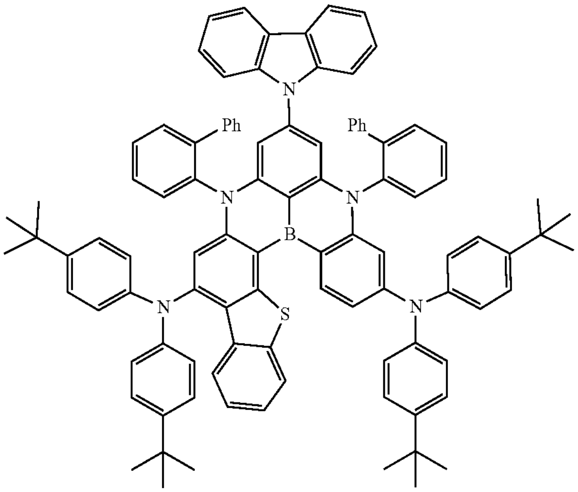
90
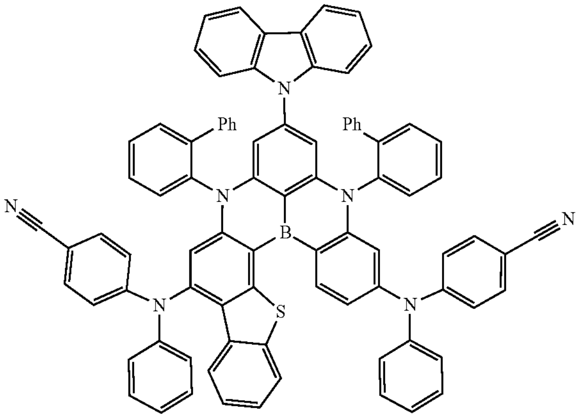
91
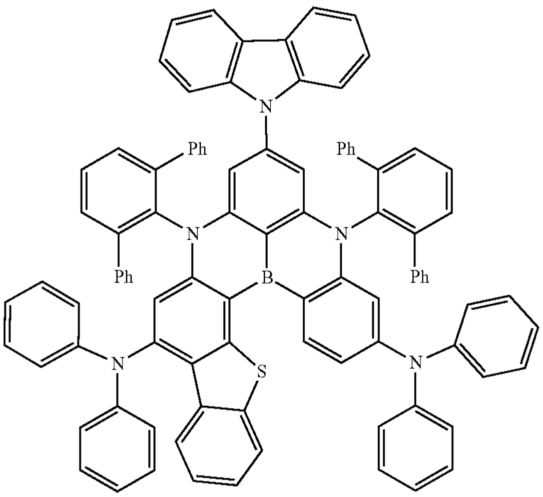
-continued
92
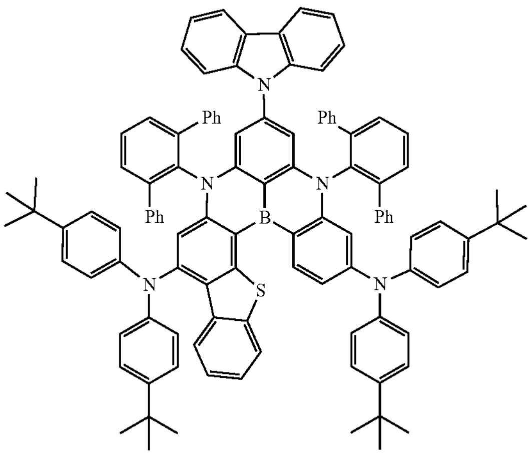
93
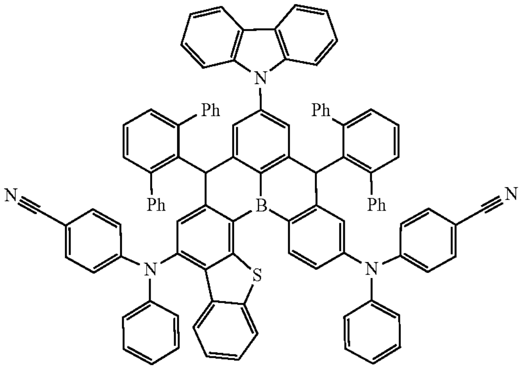
94
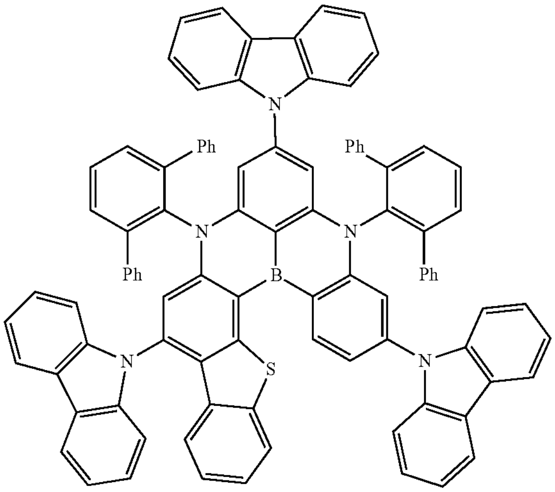

-continued
95
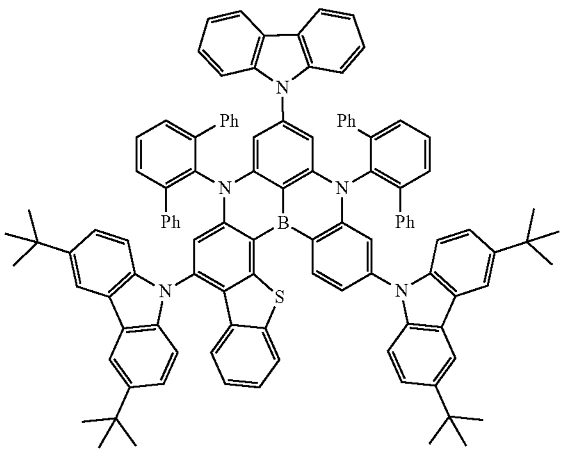
96
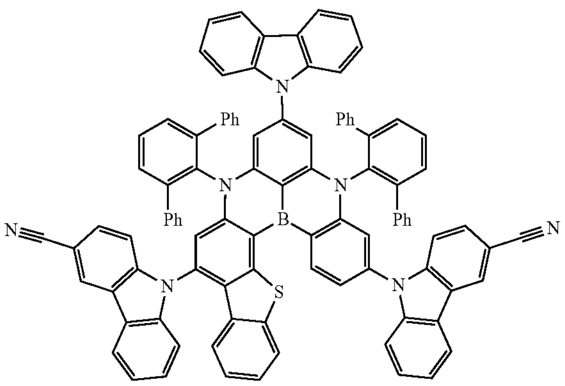
97
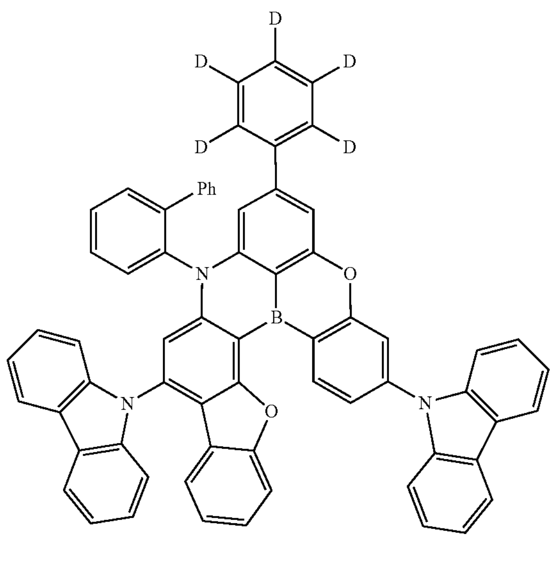
-continued
98
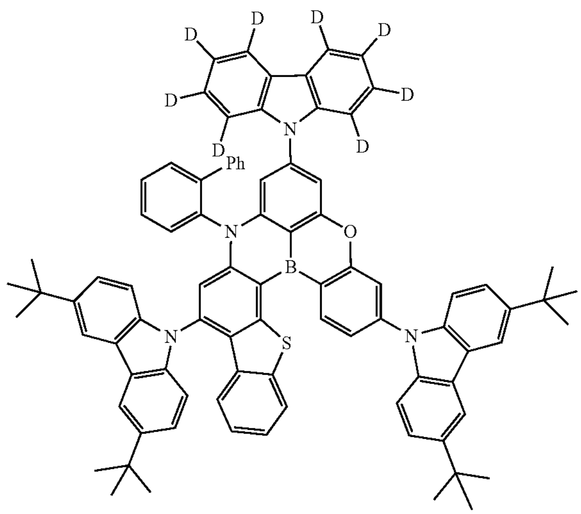
99
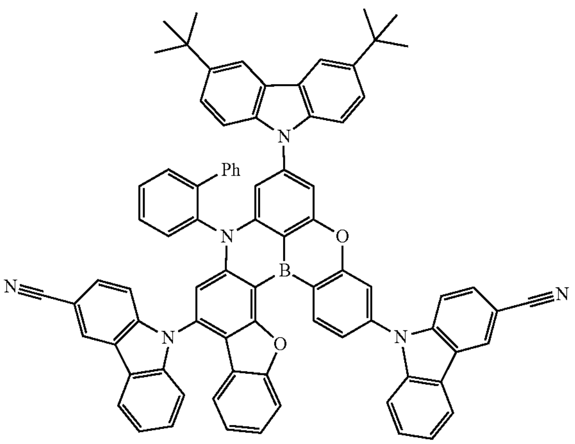
100
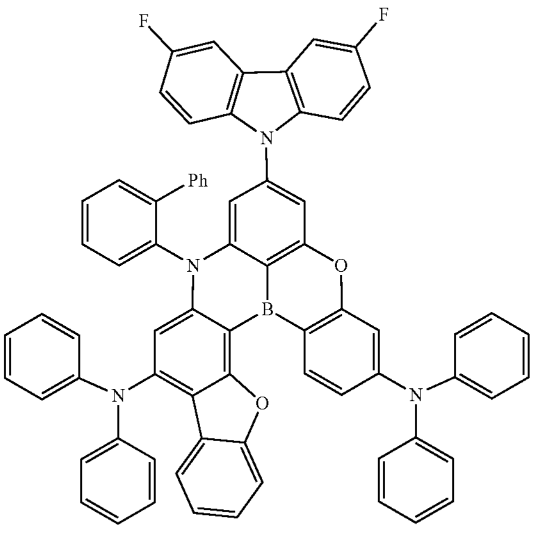

-continued
101
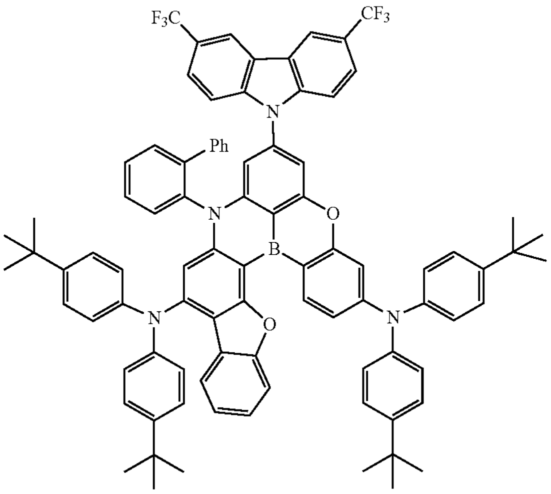
102
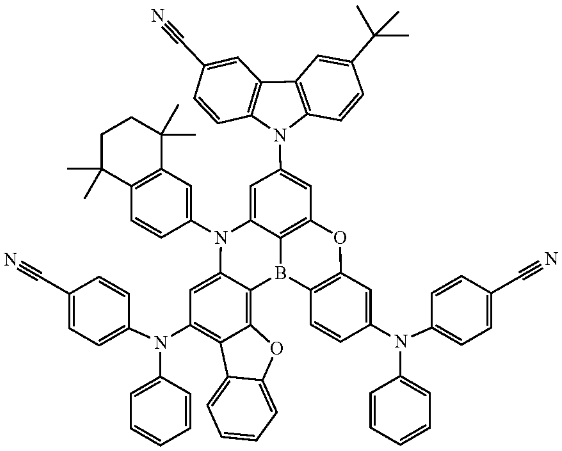
103
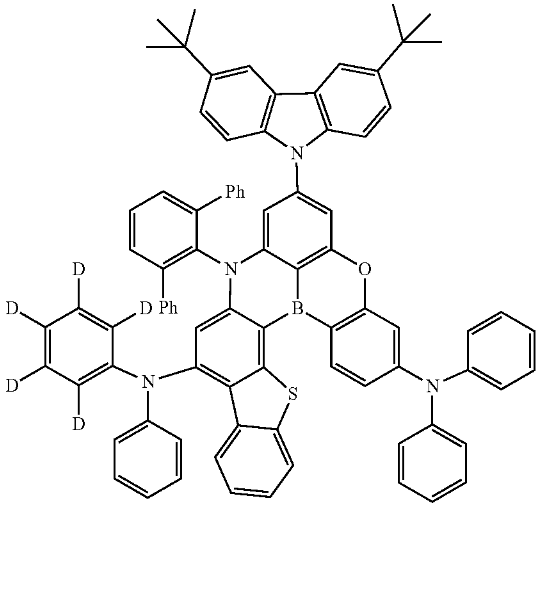
-continued
104
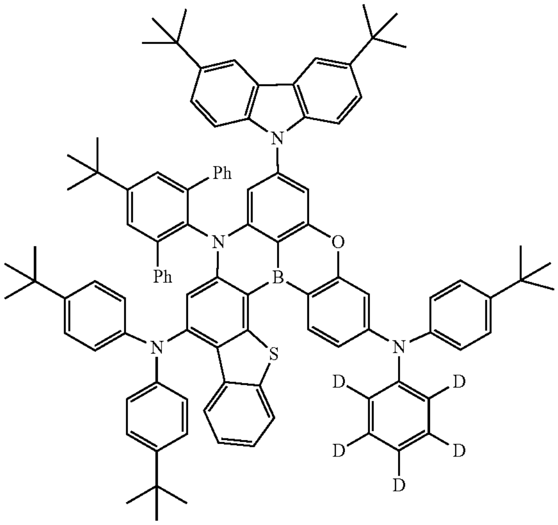
105
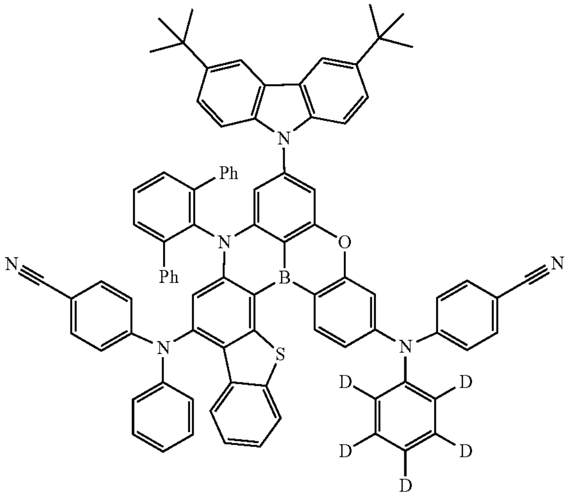
106
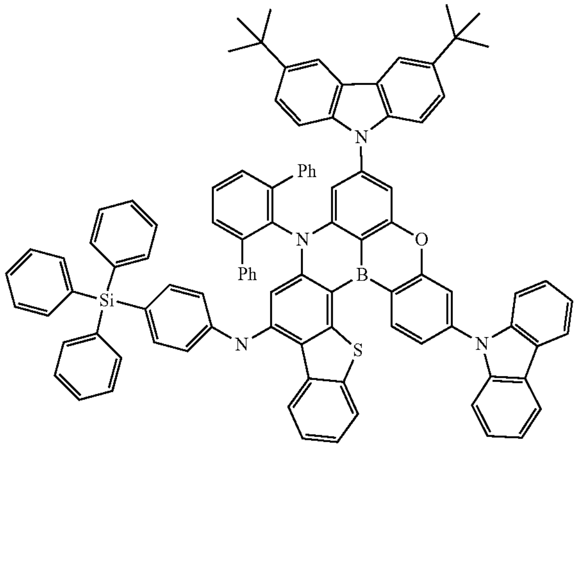

-continued
107
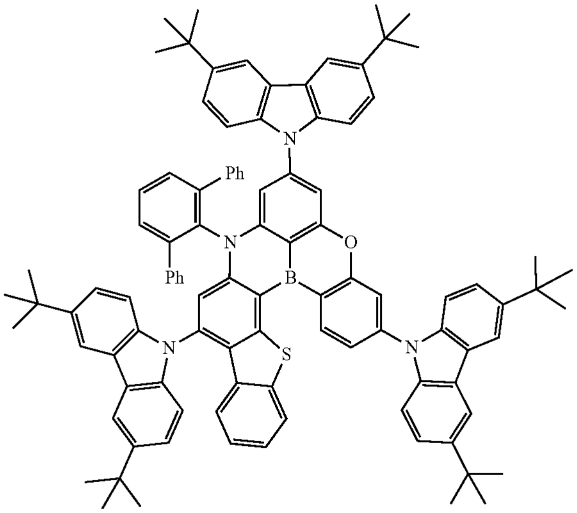
108
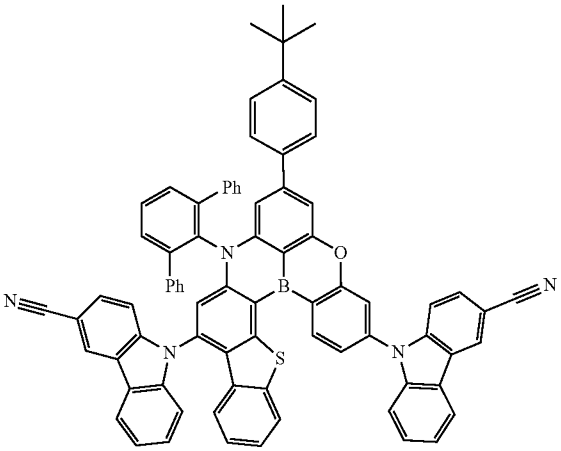
109
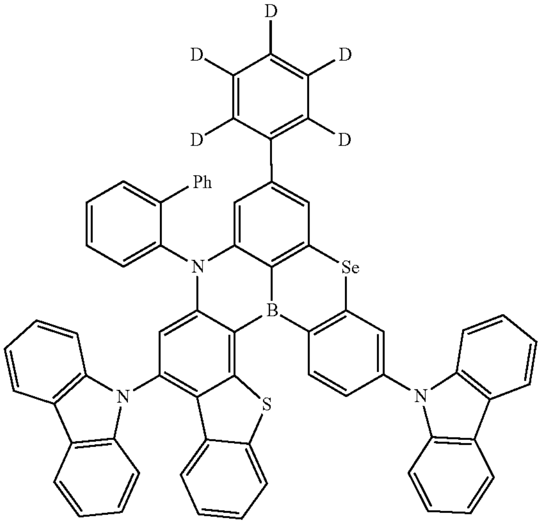
-continued
110
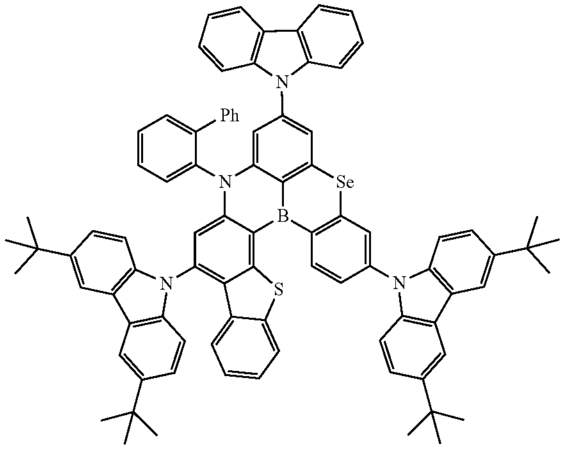
111
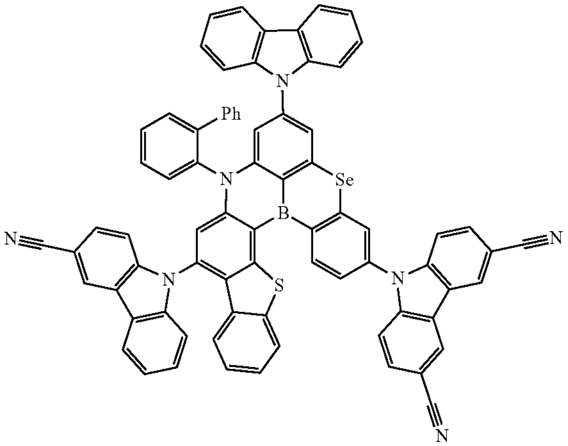
112
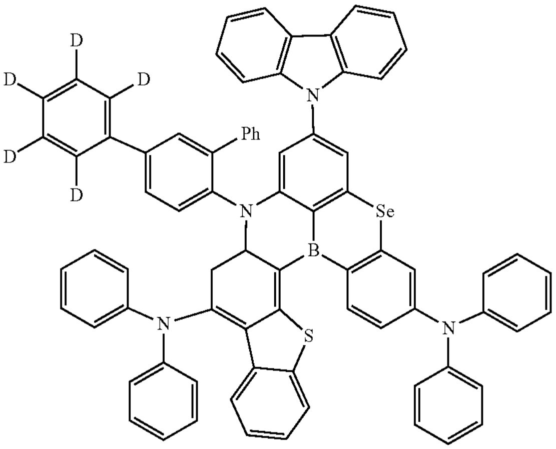

-continued
113
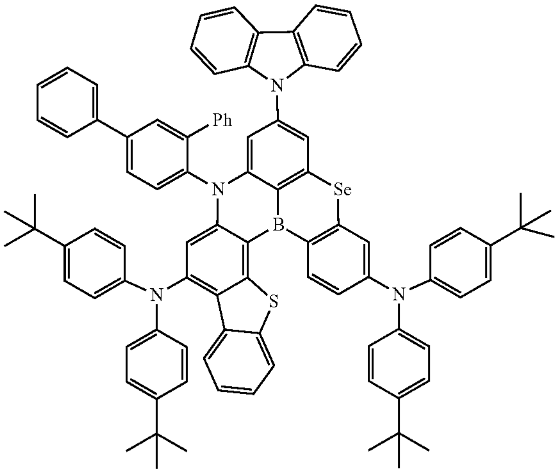
114
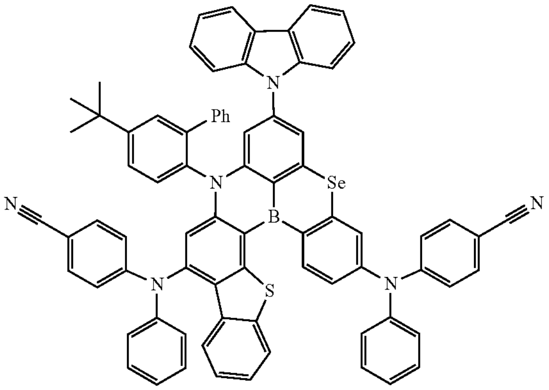
115
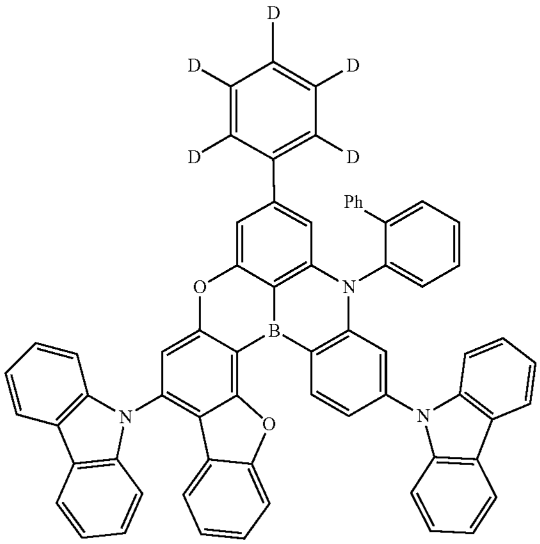
-continued
116
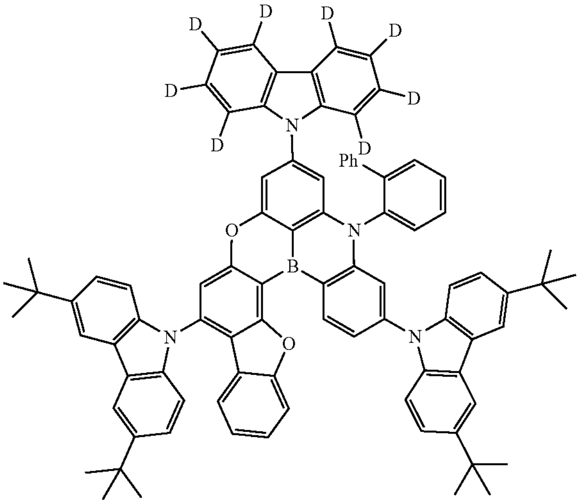
117
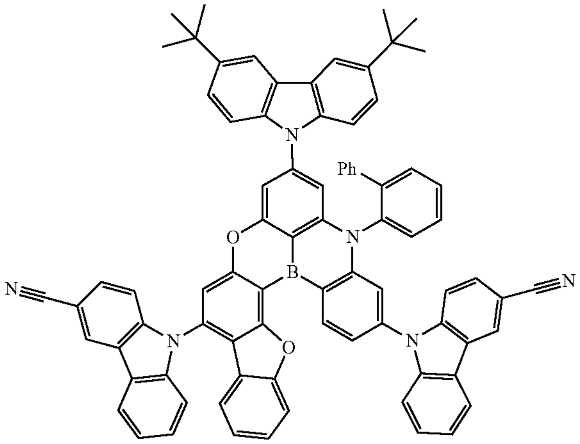
118
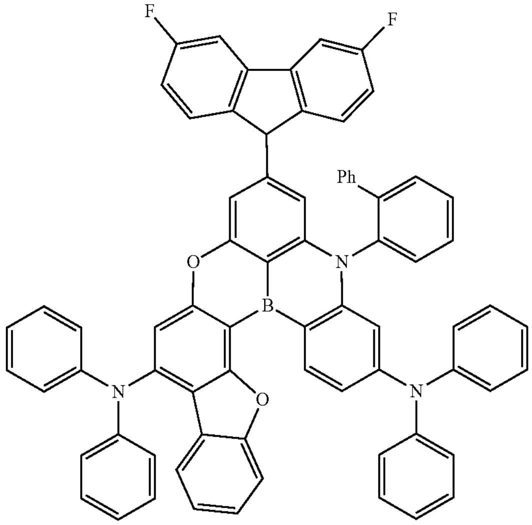

-continued
119
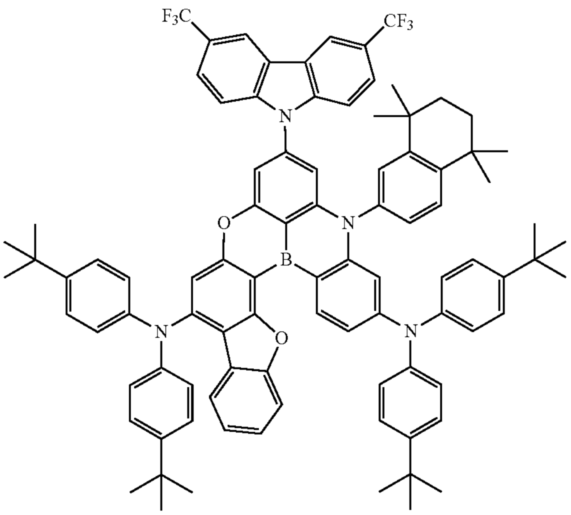
120
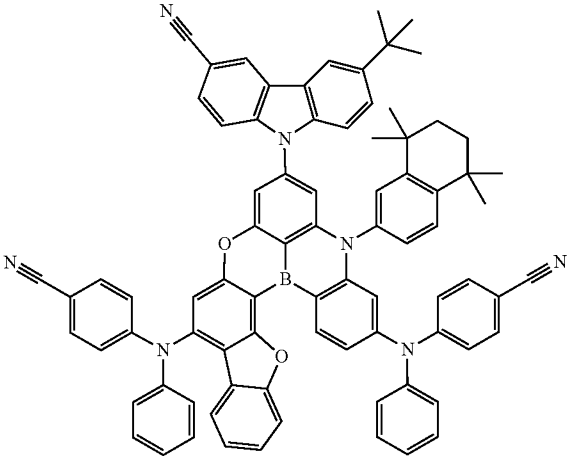
121
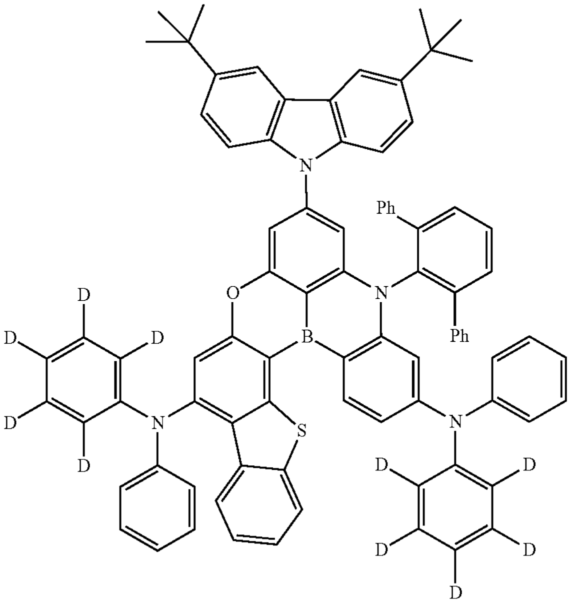
-continued
122
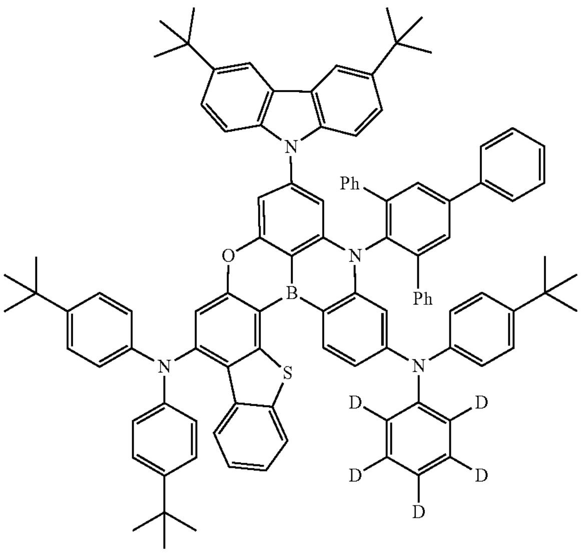
123
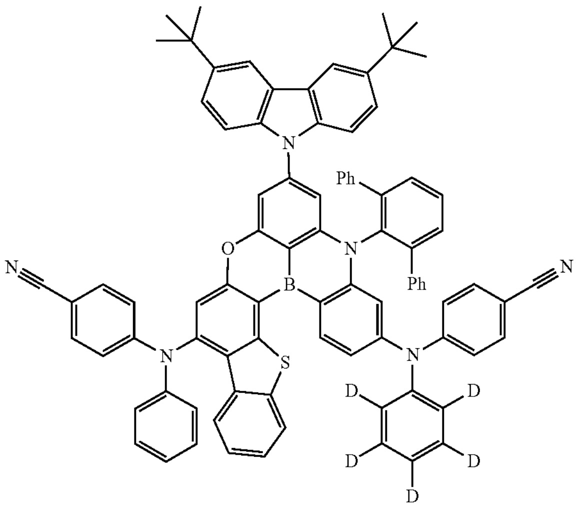

-continued
124
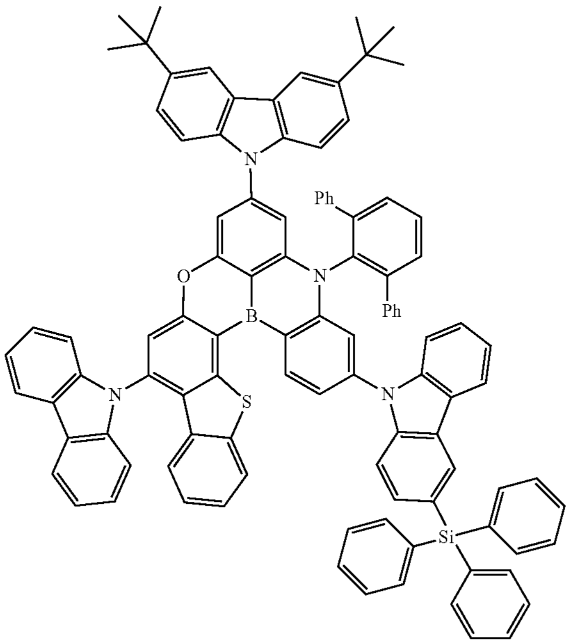
125
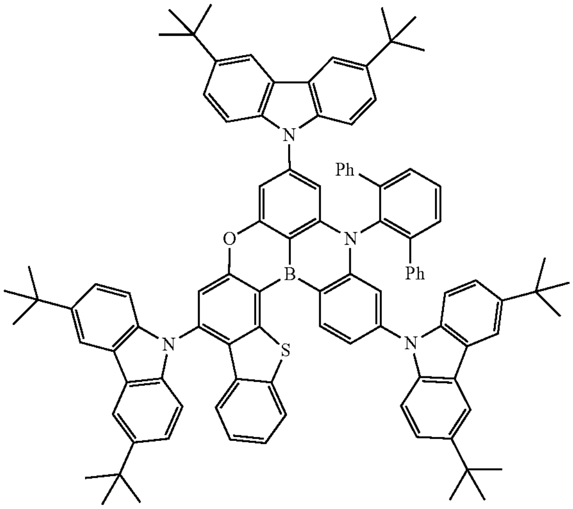
126
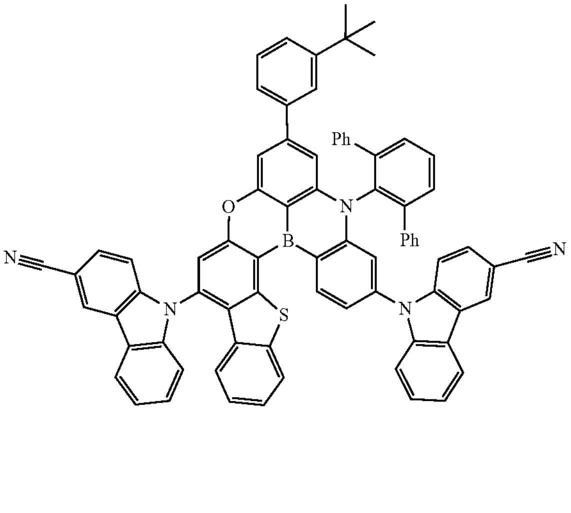
127
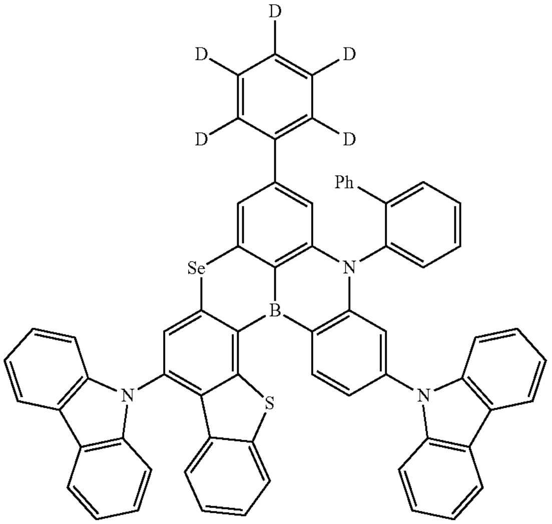
128
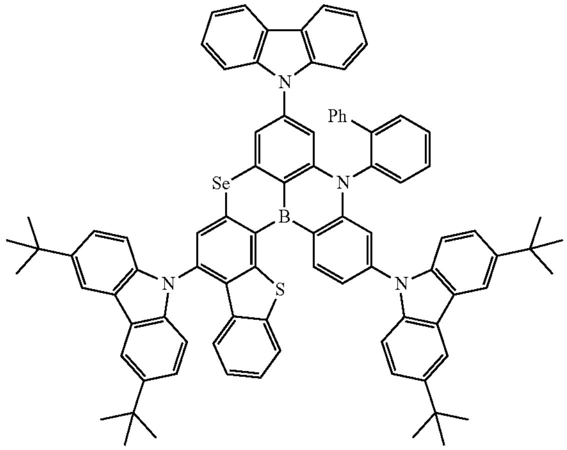
129
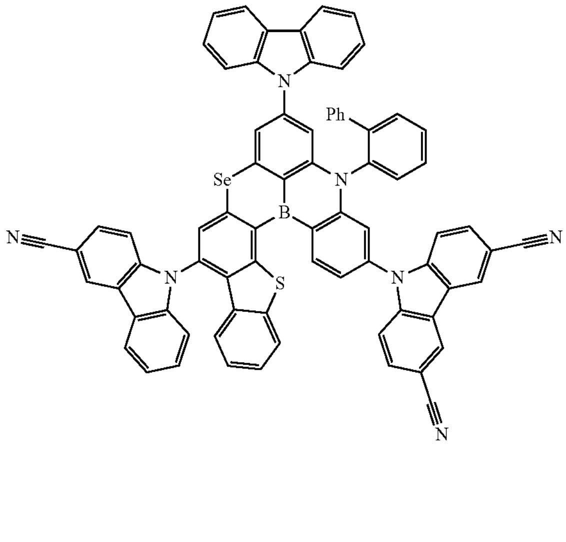

-continued
130
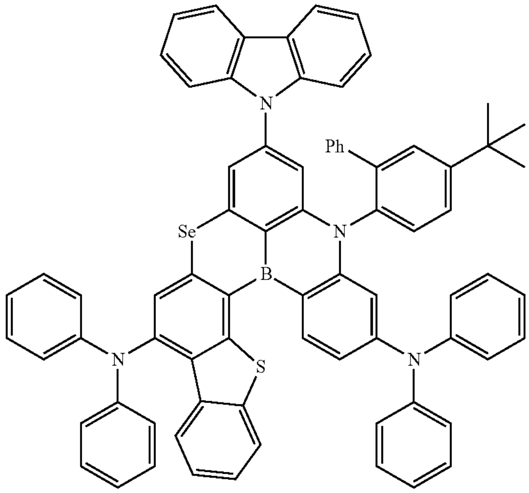
131
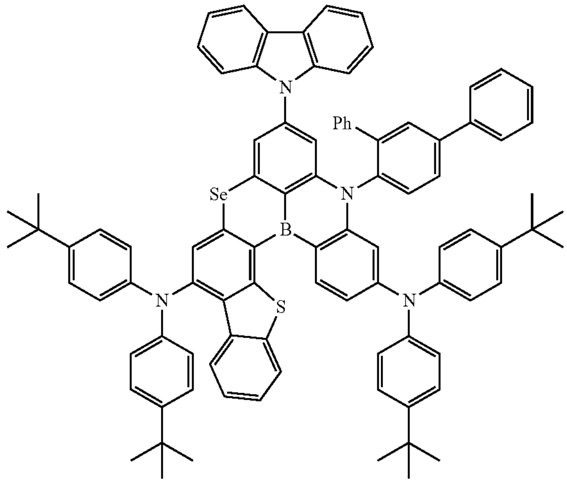
132
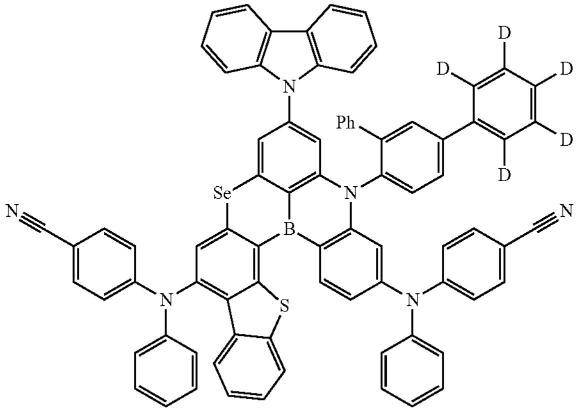
-continued
133
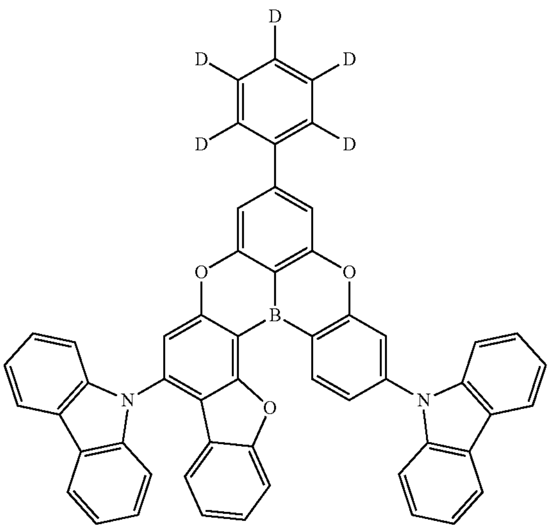
134
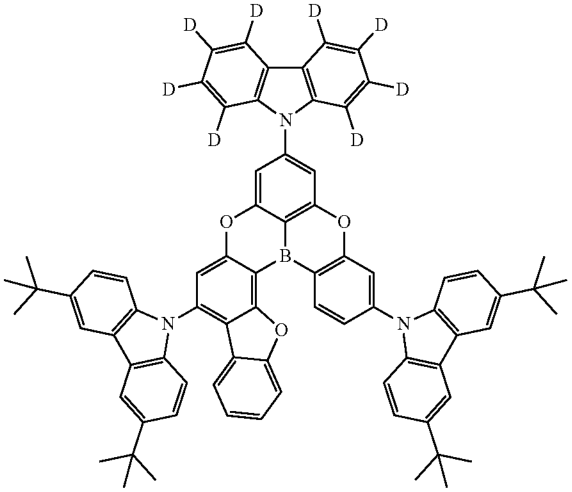
135
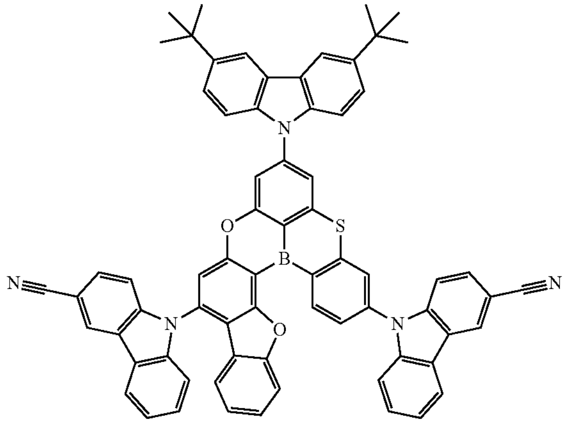

-continued
136
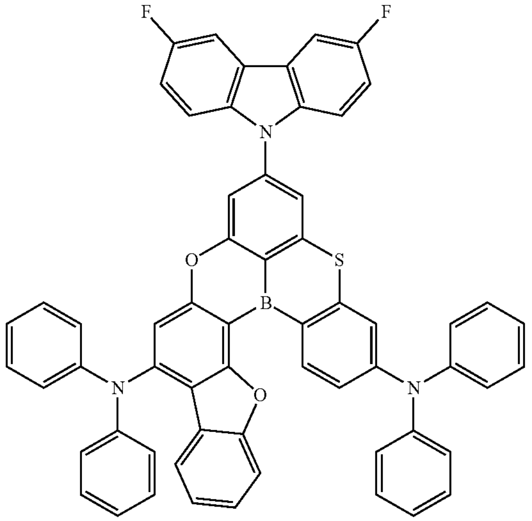
137
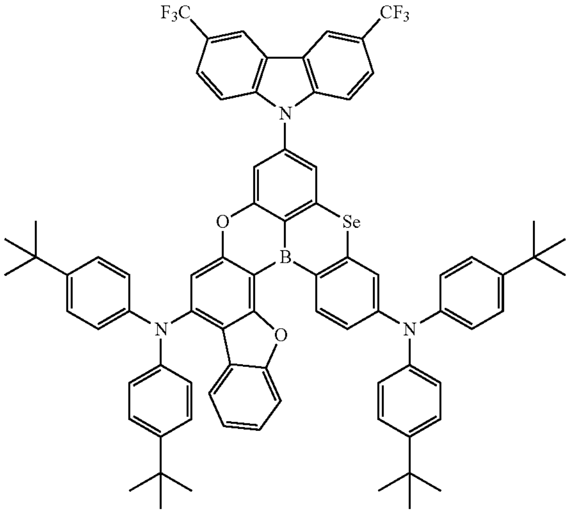
138
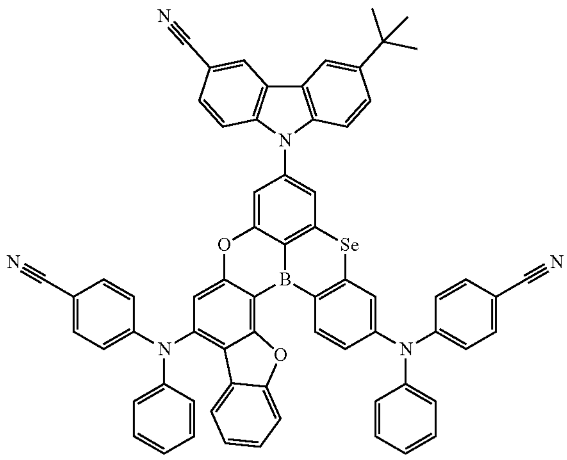
-continued
139
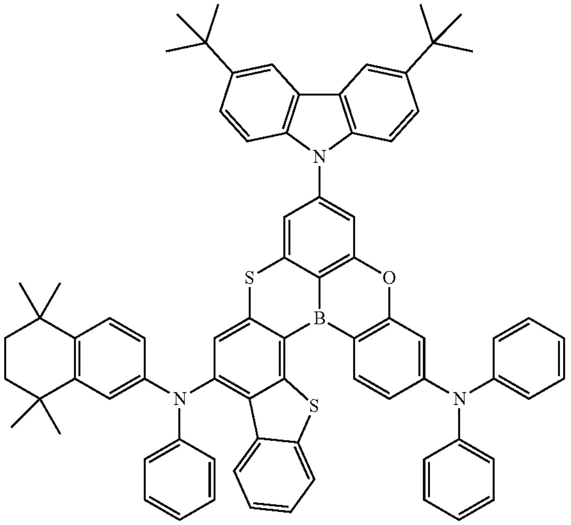
140
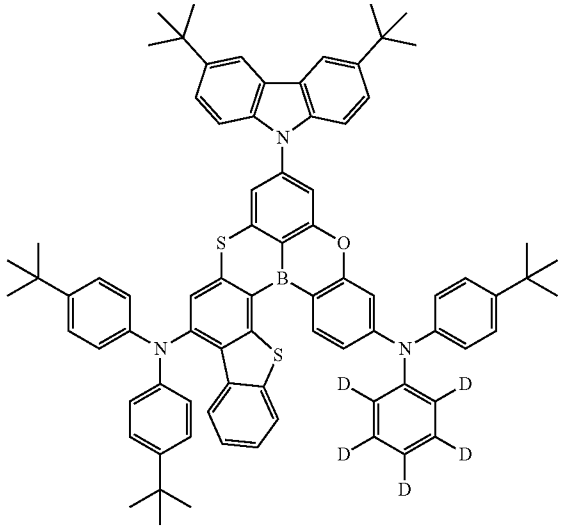
141
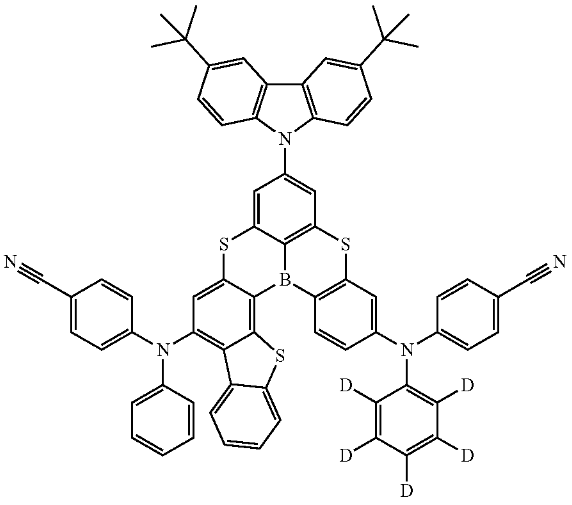

-continued
142
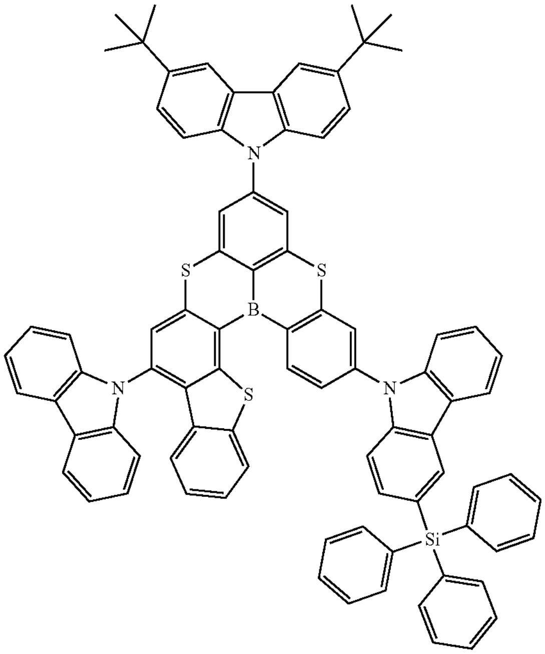
143
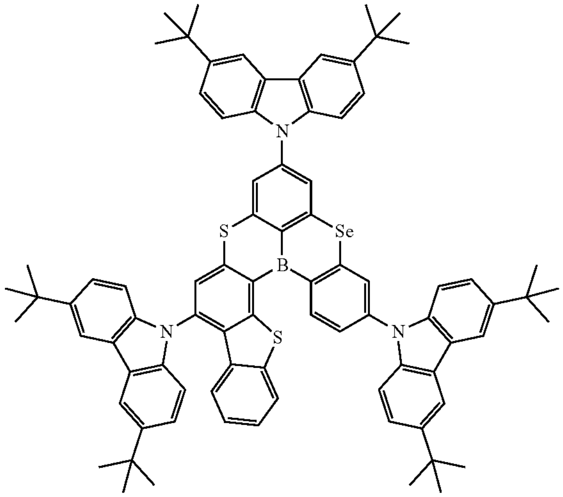
144
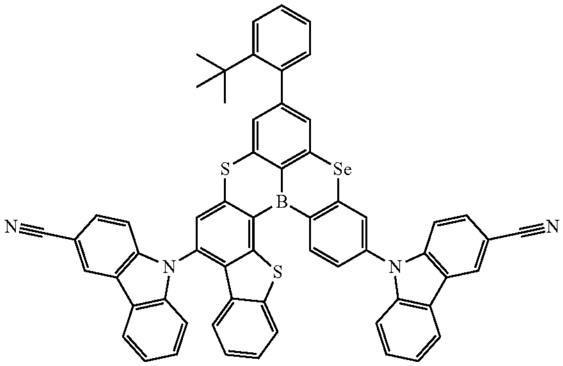
-continued
145
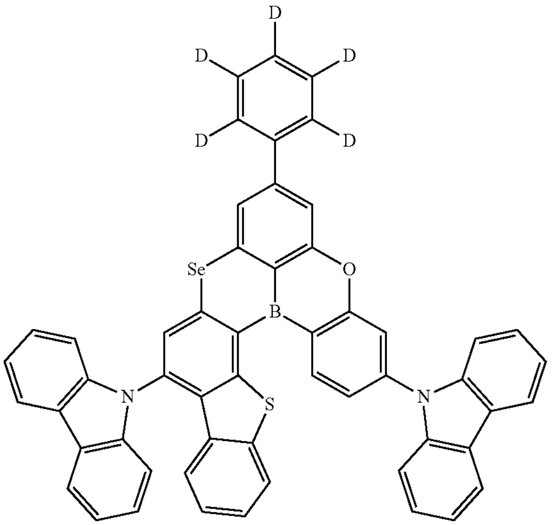
146
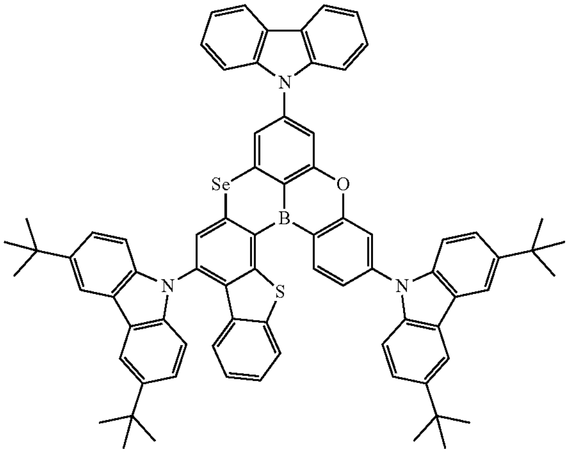
147
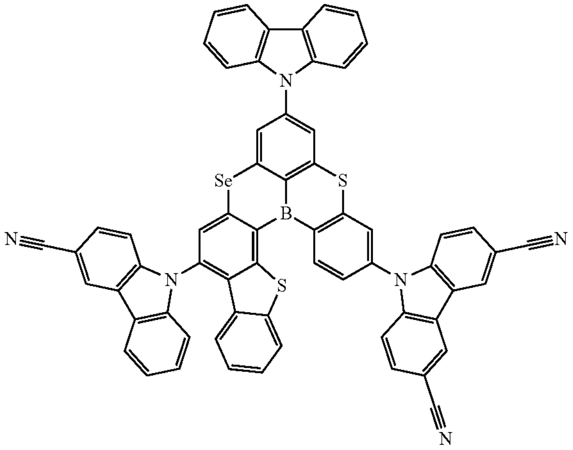

-continued
148
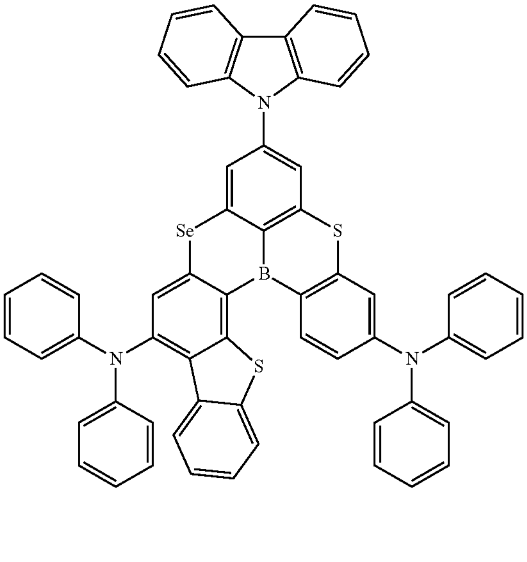
149
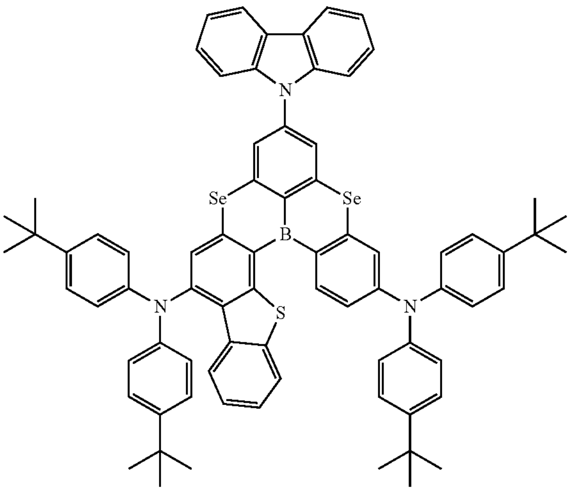
150
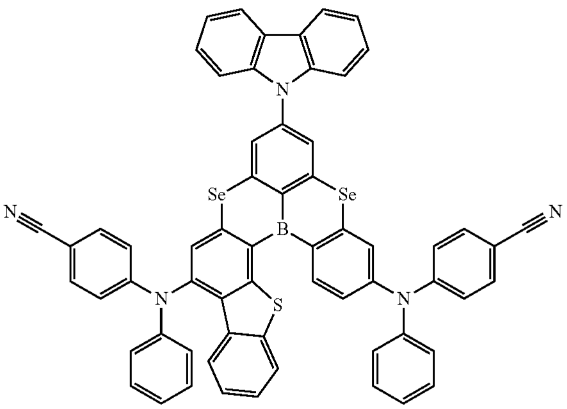
-continued
151
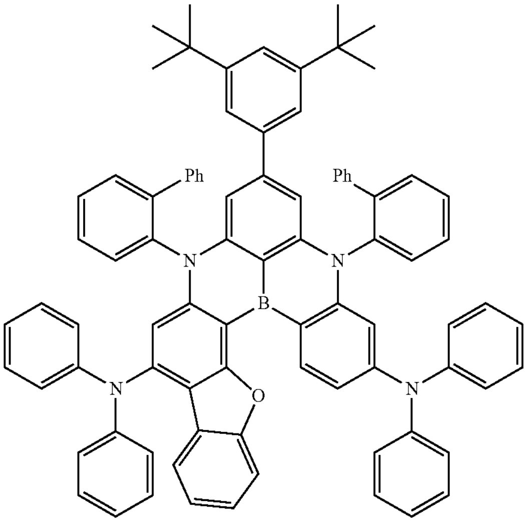
152
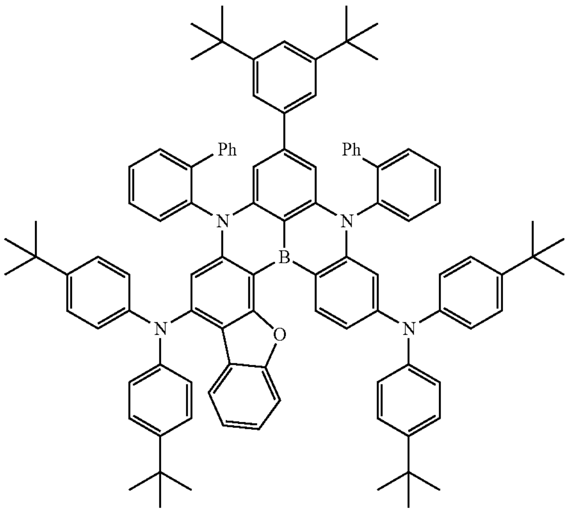
153
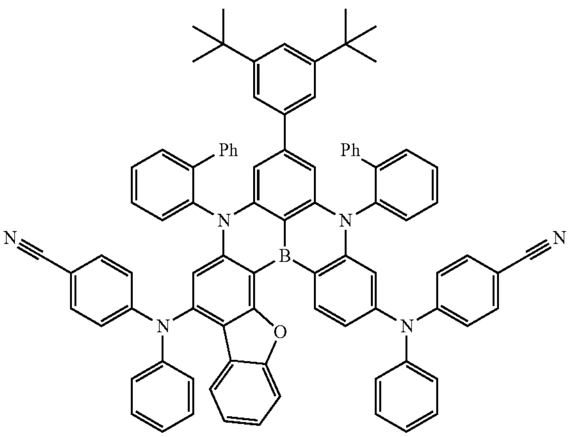

-continued
154
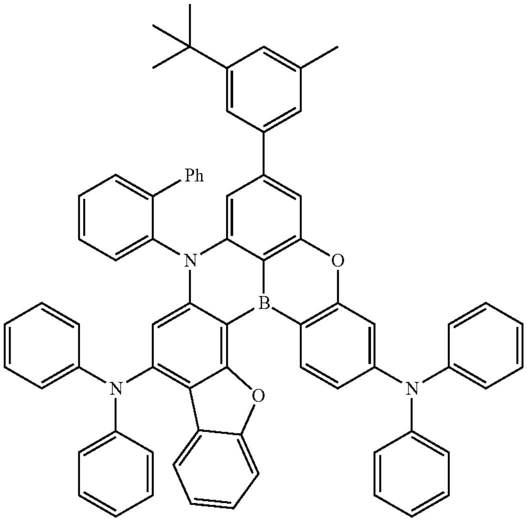
155
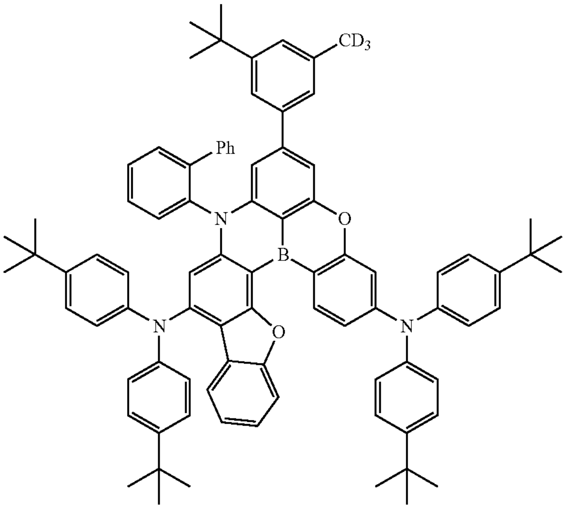
156
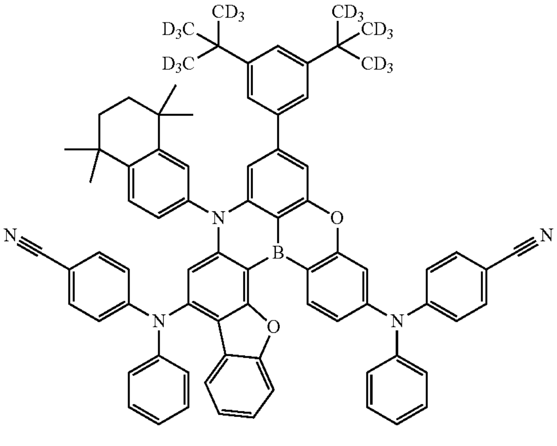
-continued
157
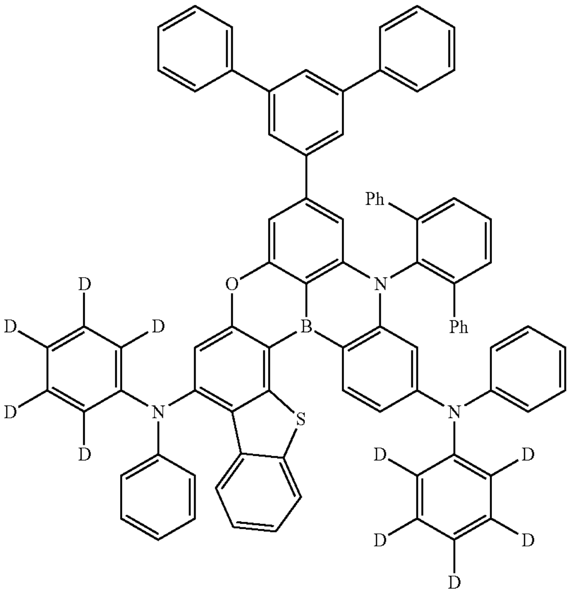
158
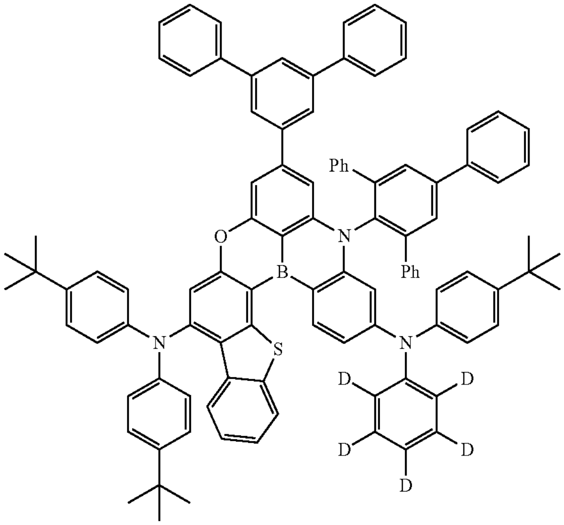
159
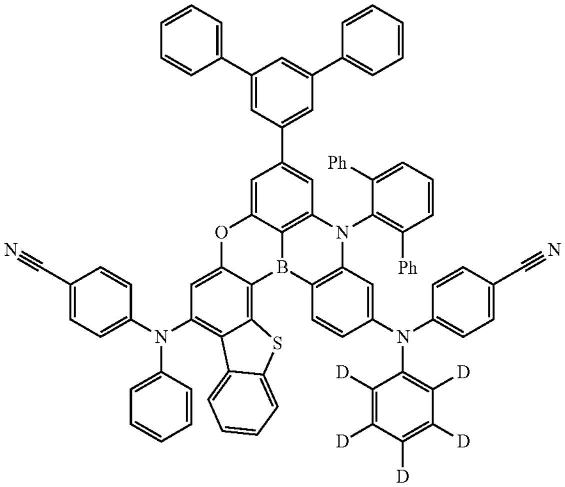

-continued

160

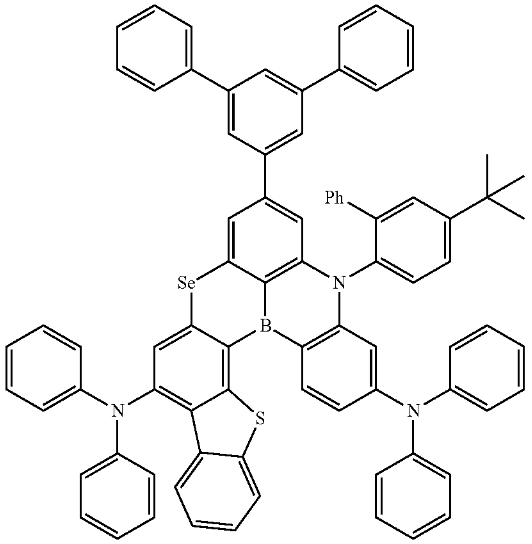

161

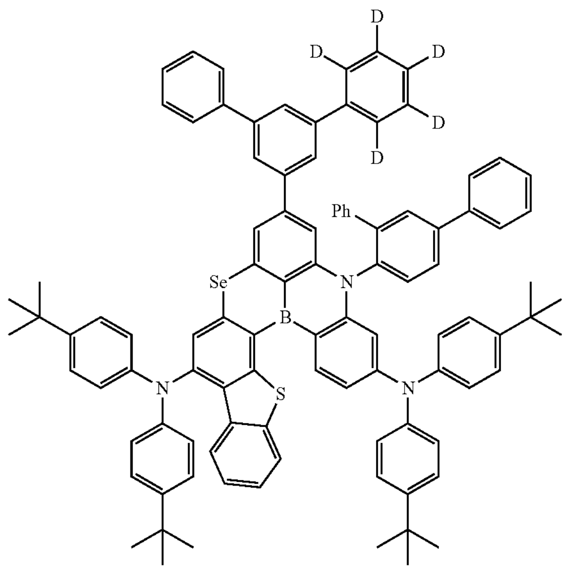

162

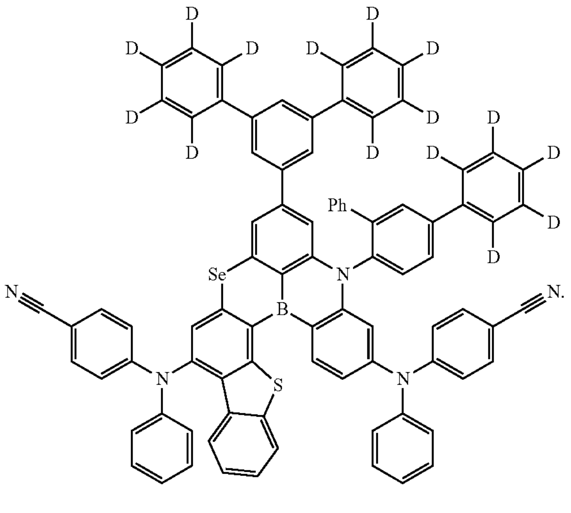

The fused polycyclic compound of an embodiment, represented by Formula 1, may be a material for emitting thermally activated delayed fluorescence (TADF). The fused polycyclic compound of an embodiment represented by Formula 1 may be a thermally activated delayed fluorescence dopant having a difference (ΔEST) between a lowest triplet excitation energy level (T1 level) and a lowest singlet excitation energy level ($S_1$ level) equal to or less than about 0.2 eV.

The fused polycyclic compound of an embodiment represented by Formula 1 may be a material for emitting light in a blue region. The light in a blue region may mean light of a wavelength region, for example, in a range of about 430 nm to about 490 nm. However, embodiments are not limited thereto, and the fused polycyclic compound may be used as a material for emitting light in various wavelength regions, such as red light or green light.

The fused polycyclic compound according to embodiments may be used in the organic electroluminescence device ED of an embodiment to improve the efficiency and life of the organic electroluminescence device. For example, the fused polycyclic compound according to embodiments may be used in an emission layer EML of the organic electroluminescence device ED of an embodiment to improve the emission efficiency and life of the organic electroluminescence device. In an embodiment, a maximum external quantum efficiency of the organic electroluminescence device ED may be equal to or greater than about 20%.

In an embodiment, the emission layer EML may be a delayed fluorescence emission layer including a first compound and a second compound, and the first compound of the emission layer EML may include the fused polycyclic compound of an embodiment represented by Formula 1. In an embodiment, the first compound may be a dopant, and the second compound may be a host. For example, the first compound may be a dopant for emitting delayed fluorescence, and the second compound may be a host for emitting delayed fluorescence.

Although not shown in the drawings, in an embodiment, the organic electroluminescence device ED may include multiple emission layers. The emission layers may be provided in a stack so that the organic electroluminescence device ED including the multiple emission layers may emit white light. The organic electroluminescence device including the multiple emission layers may be an organic electroluminescence device with a tandem structure. If the organic electroluminescence device ED includes multiple emission layers, at least one emission layer EML may include the fused polycyclic compound according to embodiments as described above.

In the organic electroluminescence device ED of an embodiment, the emission layer EML may include anthracene derivatives, pyrene derivatives, fluoranthene derivatives, chrysene derivatives, dihydrobenzanthracene derivatives, or triphenylene derivatives. For example, the emission layer EML may include anthracene derivatives or pyrene derivatives.

In an embodiment, the emission layer EML may further include a compound represented by Formula E-1. For example, the compound represented by Formula E-1 may be used as the second compound.

[Formula E-1]

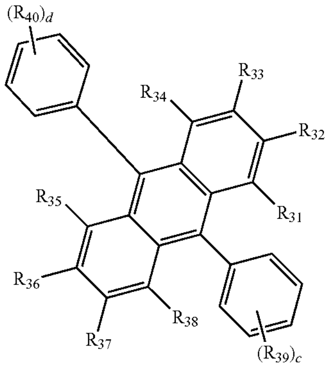

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group of 1 to 10 carbon atoms, a substituted or unsubstituted alkenyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula E-1, $R_{31}$ to $R_{40}$ may be combined with an adjacent group to form a saturated hydrocarbon ring, an unsaturated hydrocarbon ring, a saturated heterocycle, or an unsaturated heterocycle.

In Formula E-1, c and d may each independently be an integer from 0 to 5.

The compound represented by Formula E-1 may be any one selected from Compound E1 to Compound E19.

E1

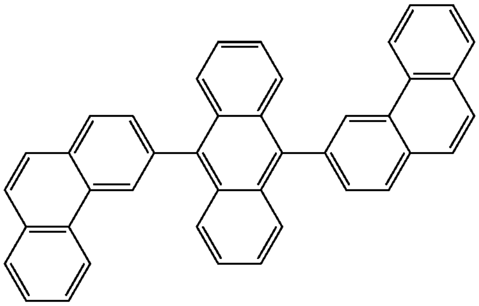

E2

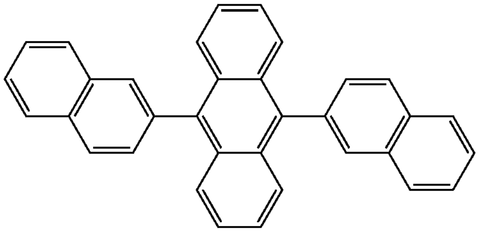

-continued

E3

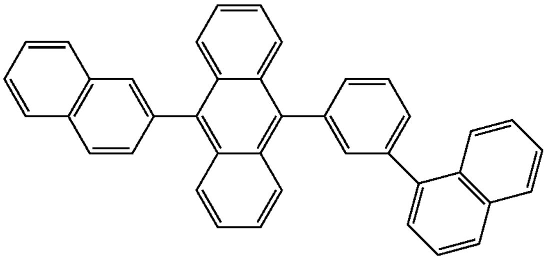

E4

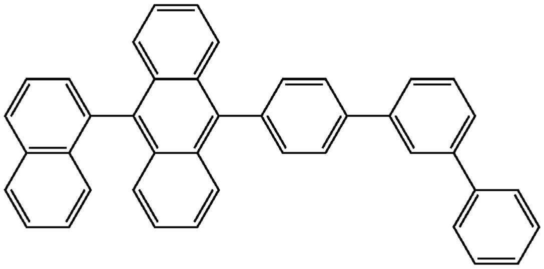

E5

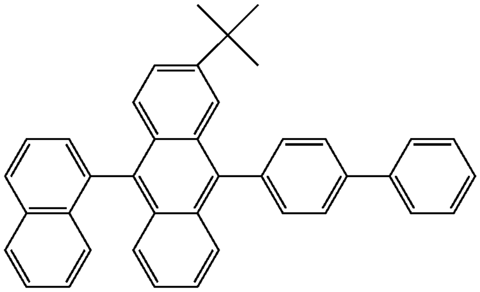

E6

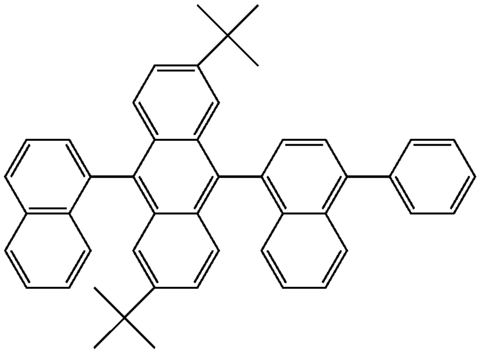

E7

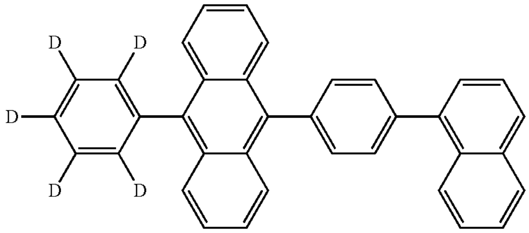

-continued
E8
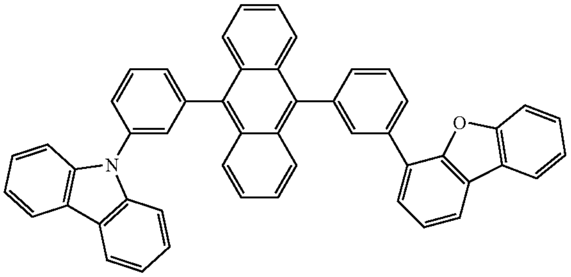
E9
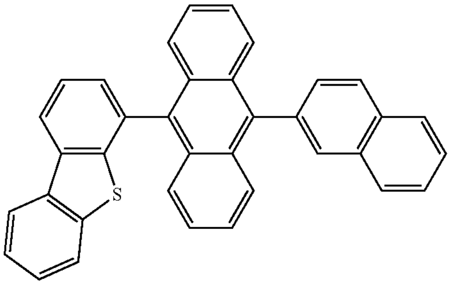
E10
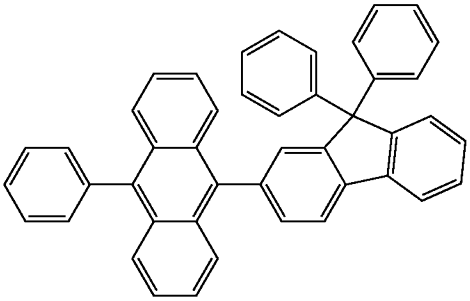
E11
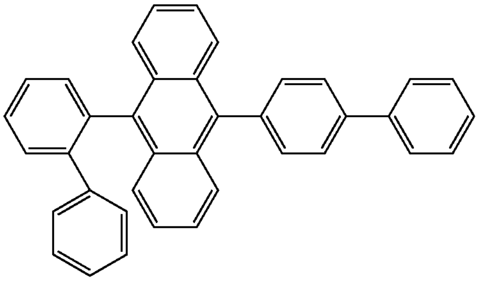
E12
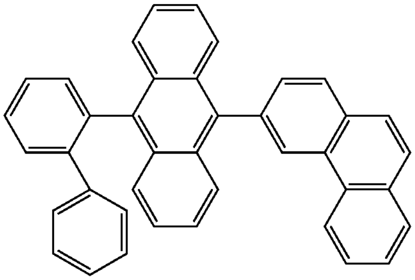
-continued
E13
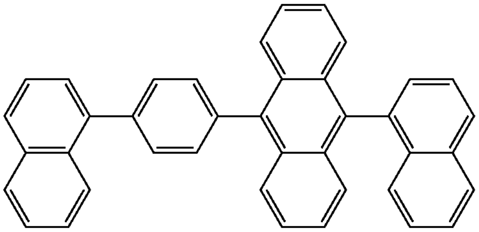
E14
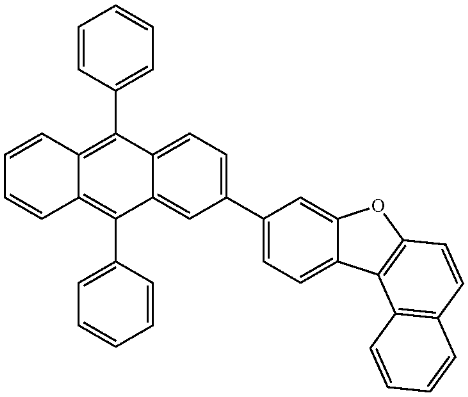
E15
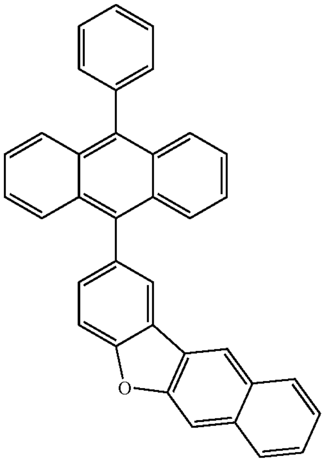
E16
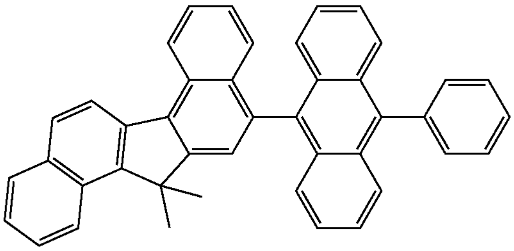

-continued

E17

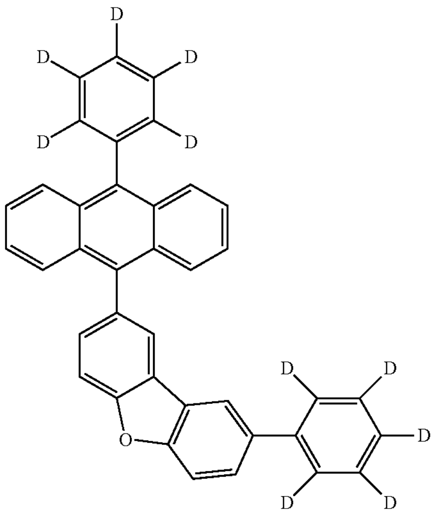

E18

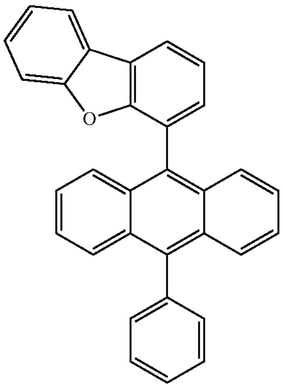

E19

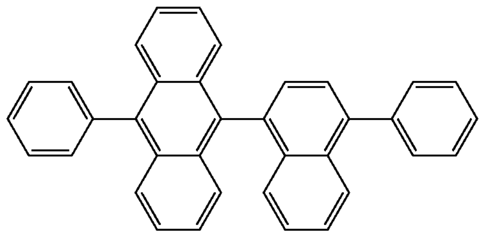

In an embodiment, the emission layer EML may include a compound represented by Formula E-2a or Formula E-2b. The compound represented by Formula E-2a or Formula E-2b may be used as a phosphorescence host material.

[Formula E-2a]

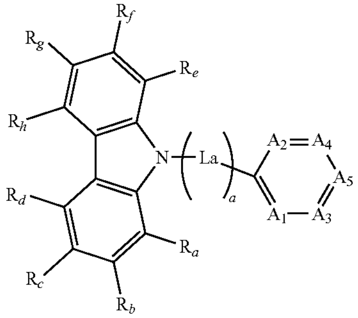

In Formula E-2b, a may be an integer from 0 to 10, and La may be a direct linkage, a substituted or unsubstituted arylene group of 6 to 30 ring-forming carbon atoms, or a substituted or unsubstituted heteroarylene group of 2 to 30 ring-forming carbon atoms. If a is 2 or more, multiple La groups may each independently be a substituted or unsubstituted arylene group of 6 to 30 ring-forming carbon atoms, or a substituted or unsubstituted heteroarylene group of 2 to 30 ring-forming carbon atoms.

In Formula E-2a, $A_1$ to $A_5$ may each independently be N or $C(R_i)$. $R_a$ to $R_1$ may be each independently a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. $R_a$ to $R_i$ may be combined with an adjacent group to form a hydrocarbon ring or a heterocycle including N, O, S, etc. as a ring-forming atom.

In Formula E-2a, two or three of $A_1$ to $A_5$ may be N, and the remainder of $A_1$ to $A_5$ may be $C(R_i)$.

[Formula E-2b]

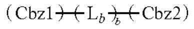

In Formula E-2b, Cbz1 and Cbz2 may each independently be an unsubstituted carbazole group, or a carbazole group substituted with an aryl group of 6 to 30 ring-forming carbon atoms. L; may be a direct linkage, a substituted or unsubstituted arylene group of 6 to 30 ring-forming carbon atoms, or a substituted or unsubstituted heteroarylene group of 2 to 30 ring-forming carbon atoms. In Formula E-2b, b may be an integer from 0 to 10, and if b is 2 or more, multiple $L_b$ groups may each independently be a substituted or unsubstituted arylene group of 6 to 30 ring-forming carbon atoms, or a substituted or unsubstituted heteroarylene group of 2 to 30 ring-forming carbon atoms.

The compound represented by Formula E-2a or Formula E-2b may be any one selected from Compound Group E-2. However, the compounds listed in Compound Group E-2 are only examples, and the compound represented by Formula E-2a or Formula E-2b is not limited to the compounds listed in Compound Group E-2.

[Compound Group E-2]
E-2-1
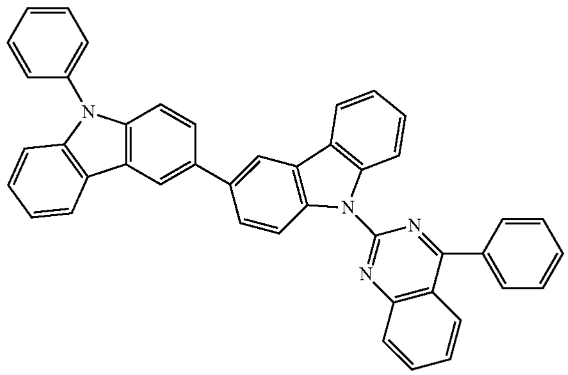
E-2-2
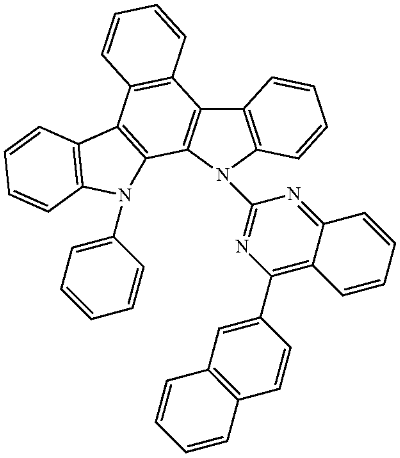
E-2-3
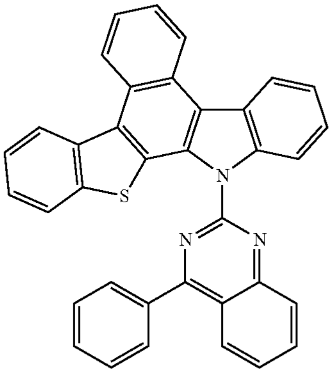
-continued
E-2-4
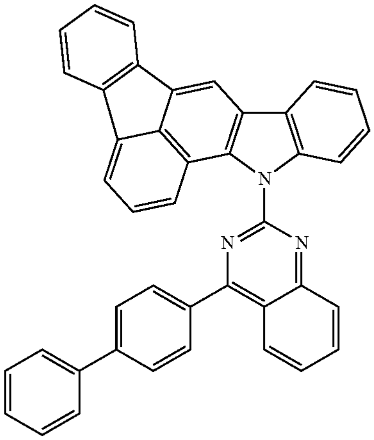
E-2-5
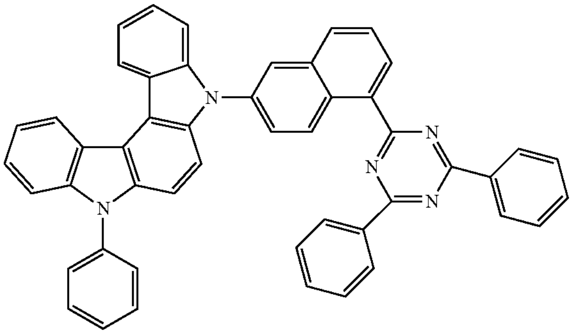
E-2-6
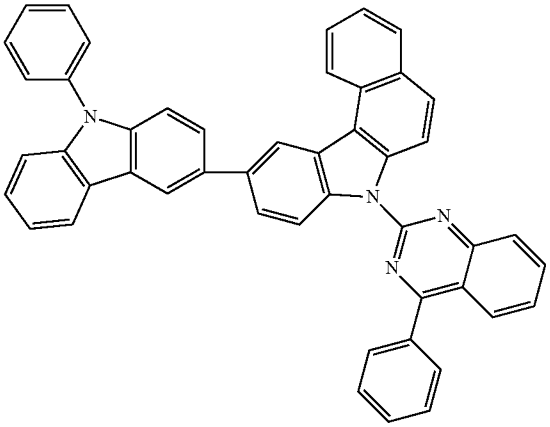

-continued
E-2-7
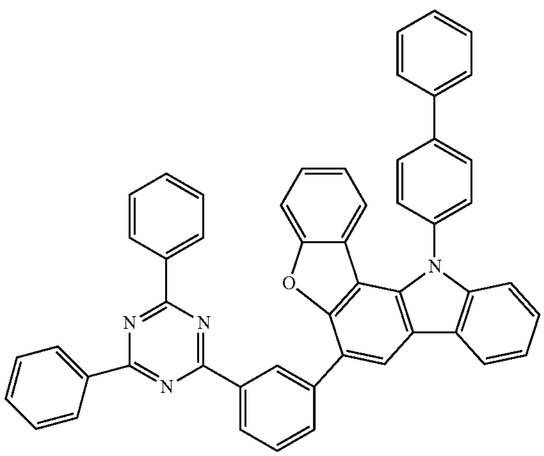
E-2-8
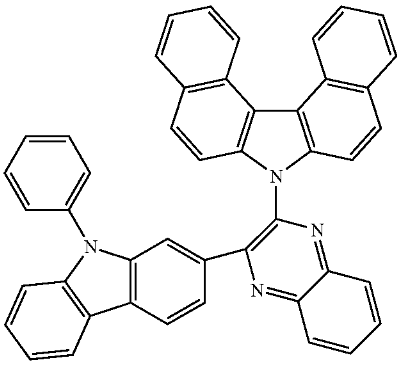
E-2-9
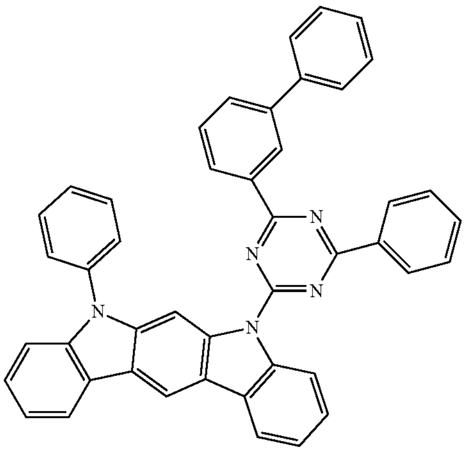
-continued
E-2-10
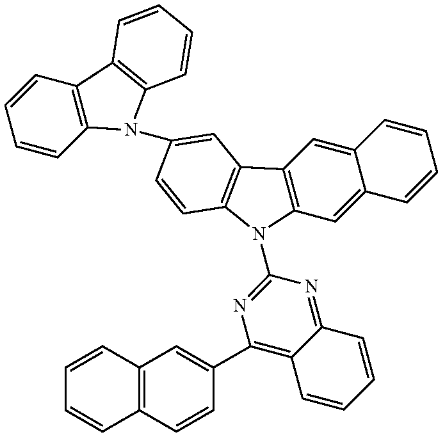
E-2-11
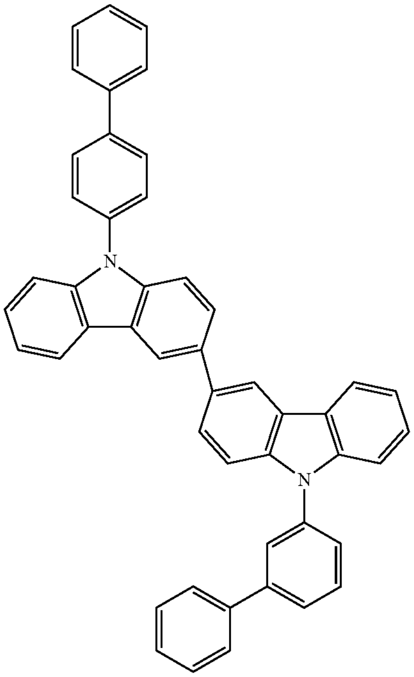
E-2-12
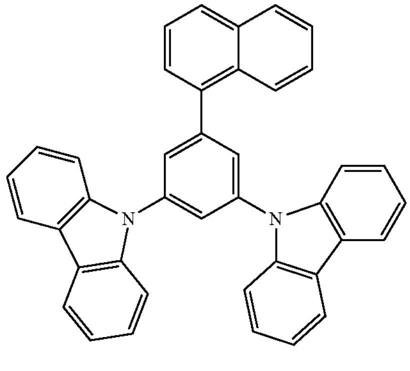

-continued
E-2-13
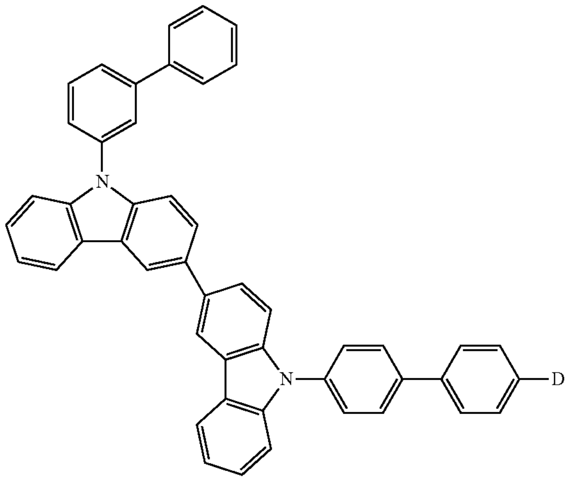
E-2-14
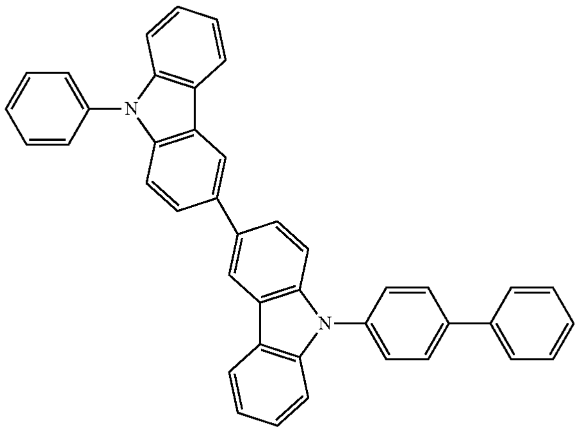
E-2-15
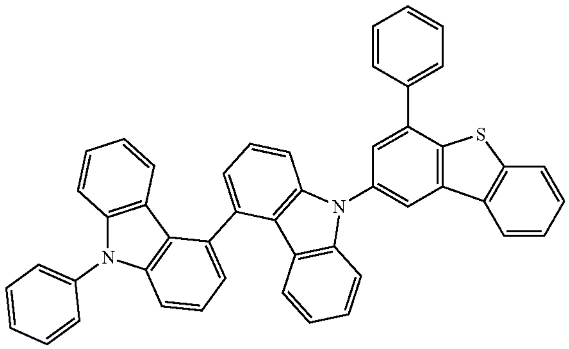
-continued
E-2-16
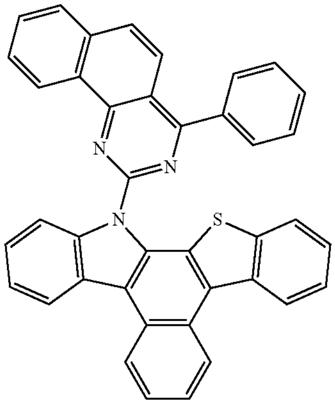
E-2-17
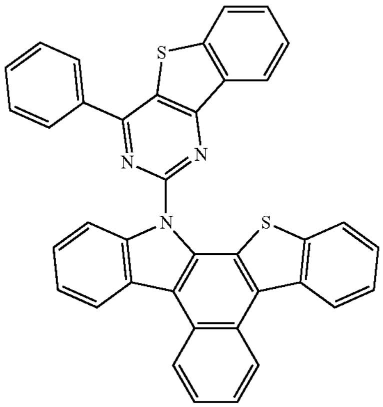
E-2-18
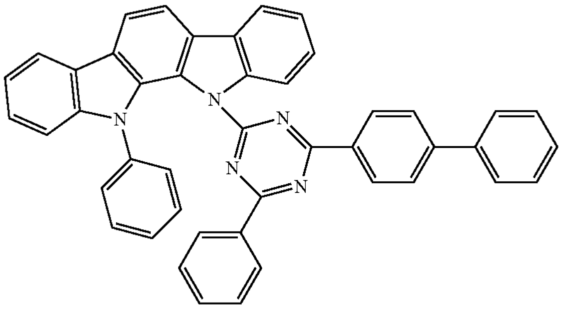
E-2-19
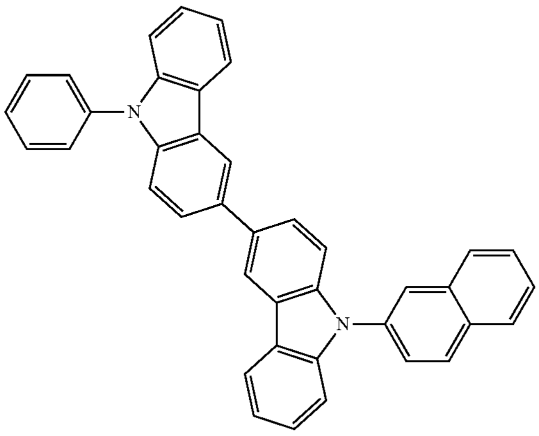

-continued

E-2-20

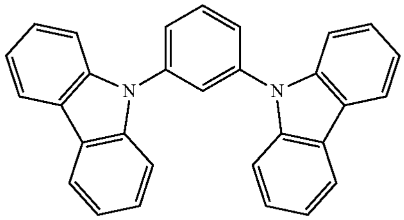

E-2-21

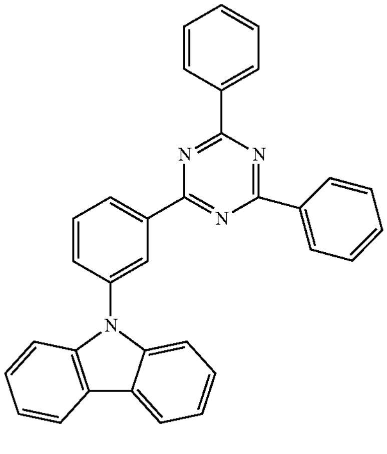

E-2-22

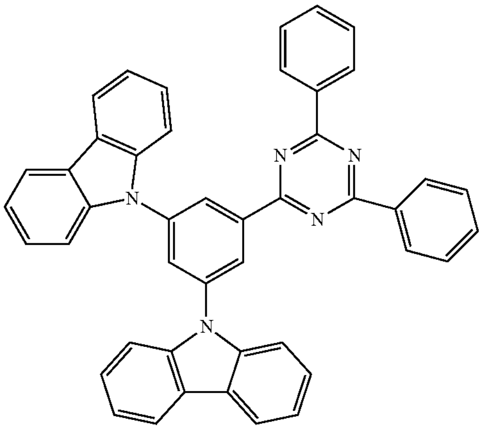

E-2-23

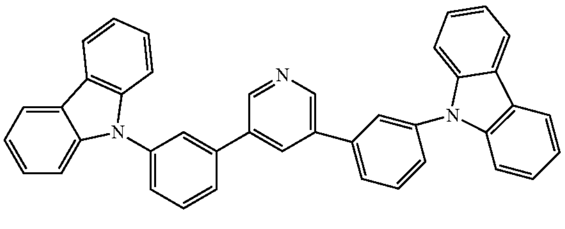

-continued

E-2-24

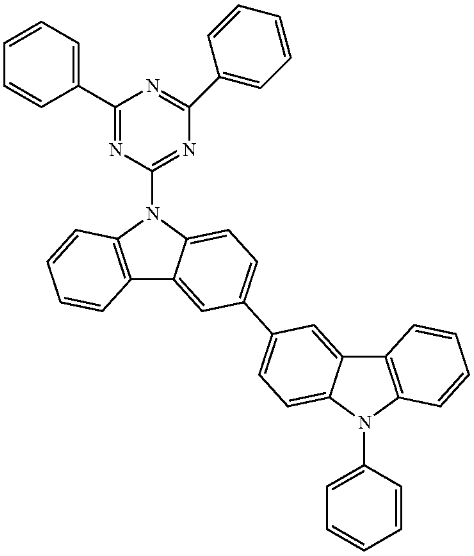

The emission layer EML may further include a common material of the art as a host material. For example, the emission layer EML may include as a host material, at least one of bis(4-(9H-carbazol-9-yl)phenyl)diphenylsilane (BCPDS), (4-(1-(4-(diphenylamino)phenyl)cyclohexyl)phenyl)diphenyl-phosphine oxide (POPCPA), bis[2-(diphenylphosphino)phenyl]ether oxide (DPEPO), 4,4'-bis(carbazolyl)-1,1'-biphenyl (CBP), 1,3-bis(carbazol-9-yl)benzene (mCP), 2,8-bis(diphenylphosphoryl)dibenzo[b,d]furan (PPF), 4,4',4''-tris(carbazol-9-yl)-triphenylamine (TCTA), or 1,3,5-tris(1-phenyl-1H-benzo[d]imidazole-2-yl)benzene (TPBi). However, embodiments are not limited thereto. For example, tris(8-hydroxyquinolino)aluminum ($Alq_3$), 9,10-di (naphthalene-2-yl)anthracene (ADN), 2-tert-butyl-9,10-di (naphth-2-yl)anthracene (TBADN), distyrylarylene (D'SA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be used as the host material.

The emission layer EML may include a compound represented by Formula M-a or Formula M-b. The compound represented by Formula M-a or Formula M-b may be used as a phosphorescence dopant material.

[Formula M-a]

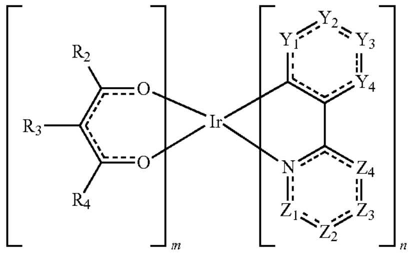

In Formula M-a, $Y_1$ to $Y_4$ and $Z_1$ to $Z_4$ may each independently be $C(R_1)$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula M-a, m may be 0 or 1, and n may be 2 or 3. In Formula M-a, if m is 0, n may be 3, and if m is 1, n may be 2.

The compound represented by Formula M-a may be used as a phosphorescence dopant.

The compound represented by Formula M-a may be any one selected from Compounds M-a1 to M-a25. However, Compounds M-a1 to M-a25 are only examples, and the compound represented by Formula M-a is not limited to Compounds M-a1 to M-a25.

M-a1

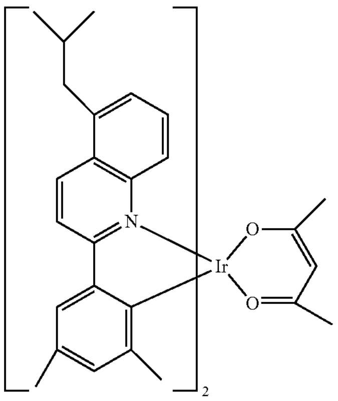

M-a2

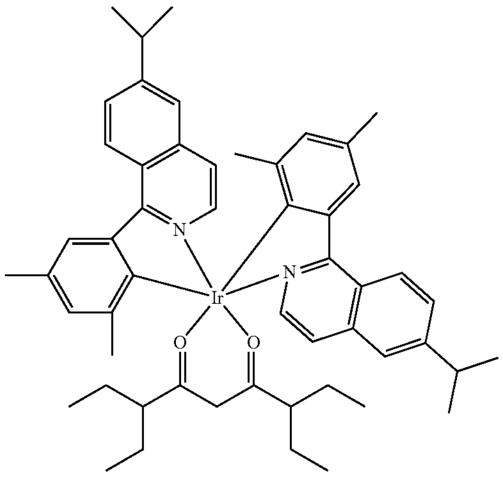

M-a3

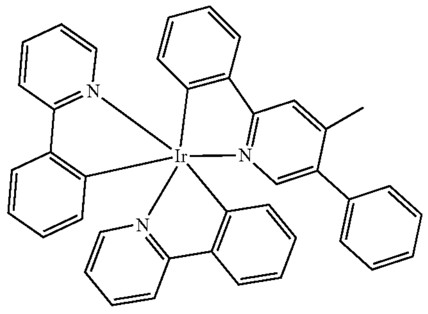

-continued

M-a4

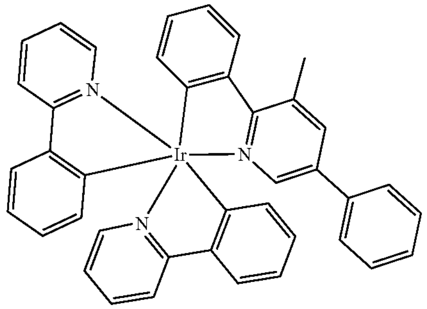

M-a5

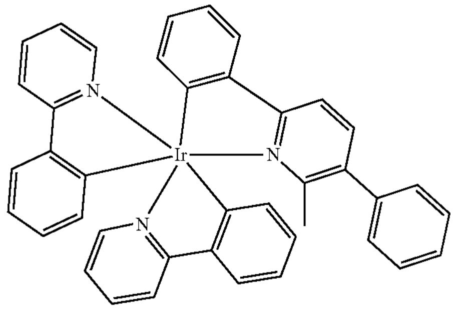

M-a6

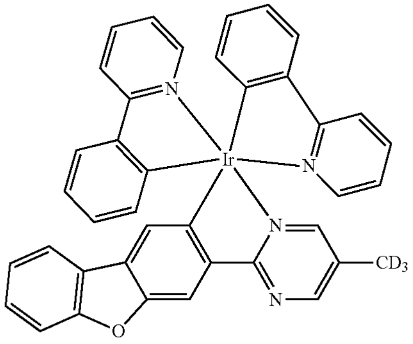

M-a7

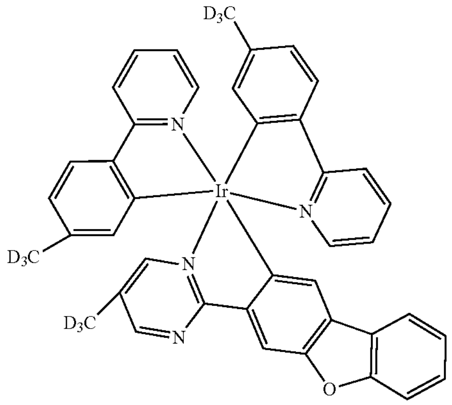

M-a8

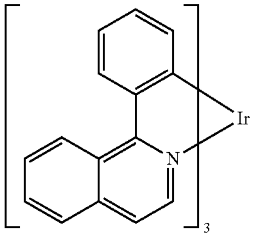

-continued
M-a9
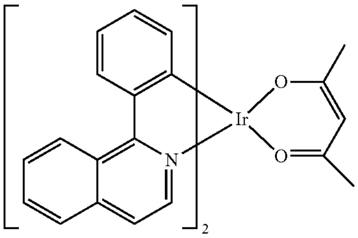
M-a10
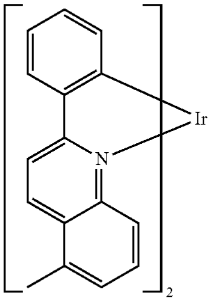
M-a11
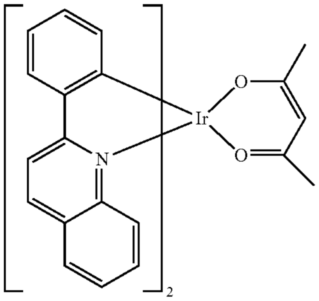
M-a12
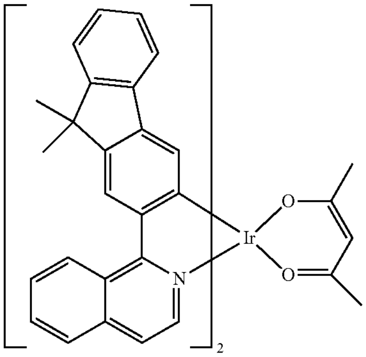
M-a13
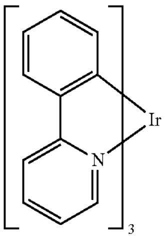
-continued
M-a14
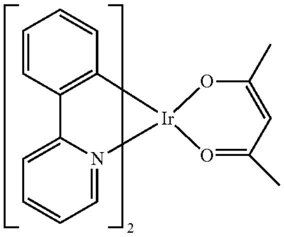
M-a15
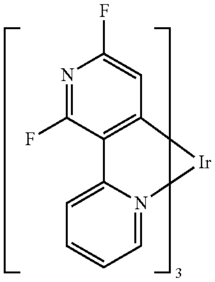
M-a16
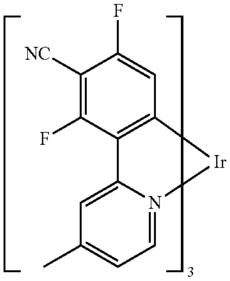
M-a17
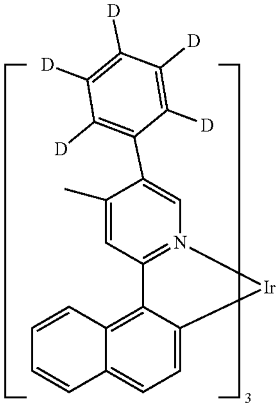
M-a20
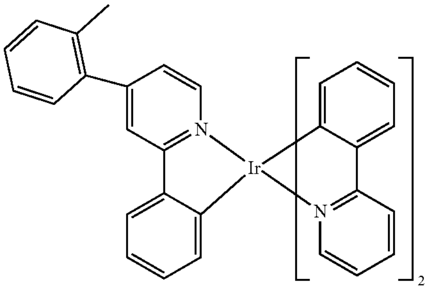

-continued

M-a21

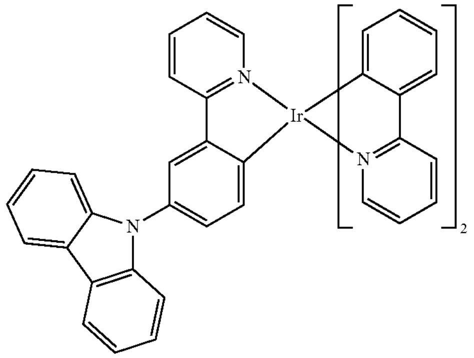

M-a22

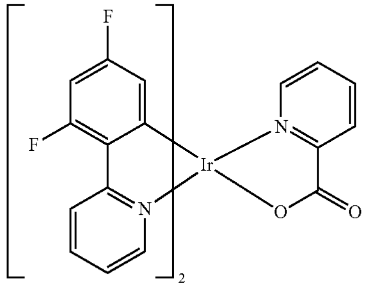

M-a23

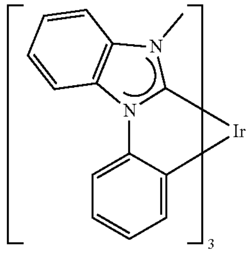

M-a24

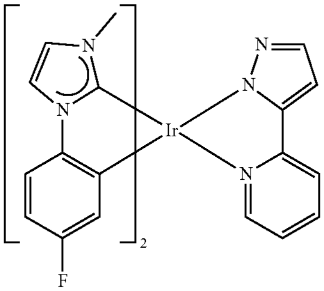

M-a25

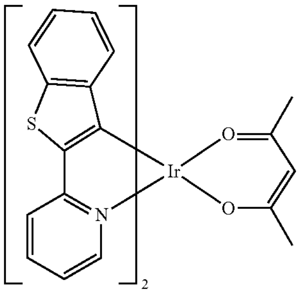

Compound M-a1 and Compound M-a2 may be used as red dopant materials, and Compound M-a3 and Compound M-a4 may be used as green dopant materials.

[Formula M-b]

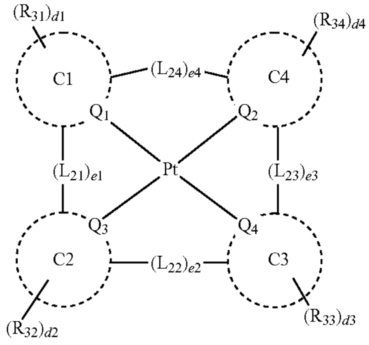

In Formula M-b, $Q_1$ to $Q_4$ may each independently be C or N, $C_1$ to $C_4$ may each independently be a substituted or unsubstituted hydrocarbon ring of 5 to 30 ring-forming carbon atoms, or a substituted or unsubstituted heterocycle of 2 to 30 ring-forming carbon atoms. In Formula M-b, $L_{21}$ to $L_{24}$ may each independently be a direct linkage,

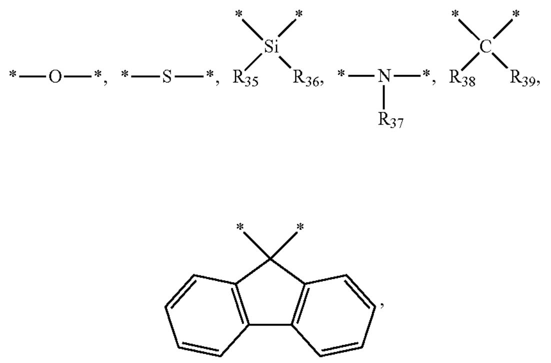

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, and e1 to e4 may each independently be 0 or 1. In Formula M-b, $R_{31}$ to $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, and d1 to d4 may each independently be an integer from 0 to 4.

The compound represented by Formula M-b may be used as a blue phosphorescence dopant or as a green phosphorescence dopant.

The compound represented by Formula M-b may be any one selected from Compound M-b-1 to Compound M-b-12. However, Compounds M-b-1 to M-b-12 are only examples, and the compound represented by Formula M-b is not limited to Compounds M-b-1 to M-b-12.

-continued
M-b-1
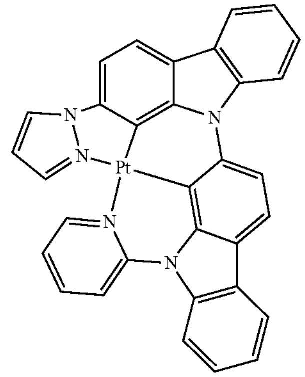
M-b-2
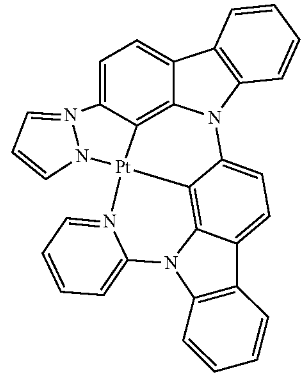
M-b-3
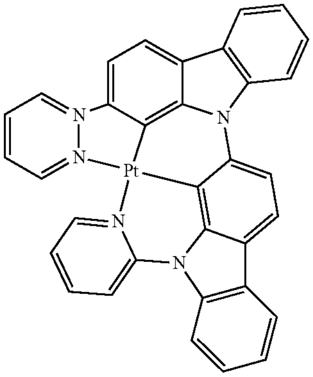
M-b-4
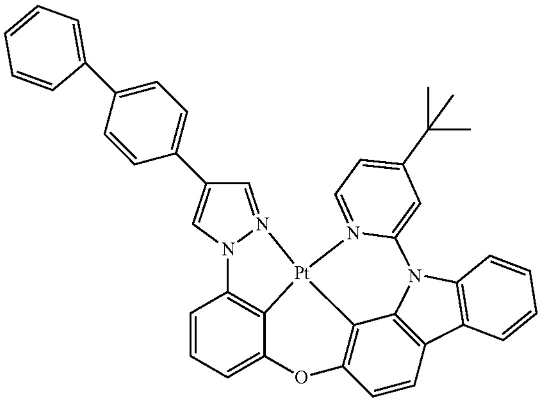
M-b-5
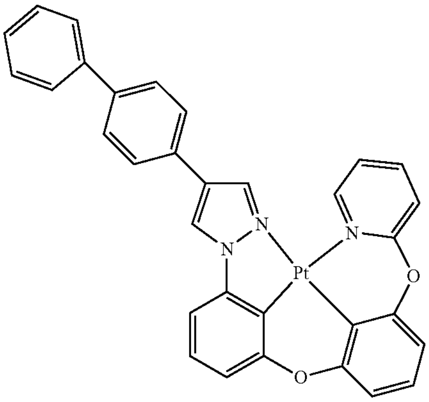
M-b-6
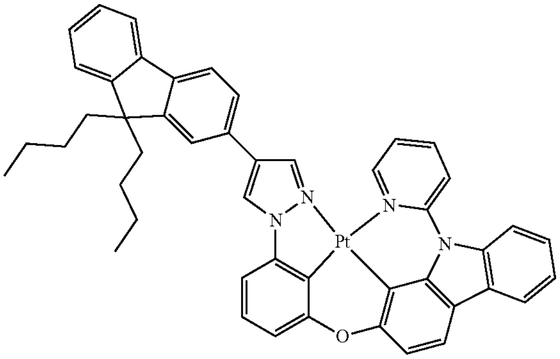
M-b-7
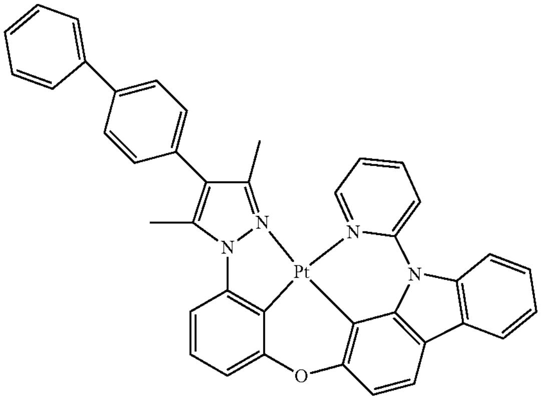
M-b-8
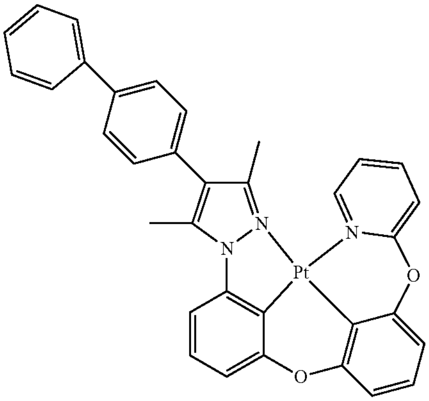

-continued

M-b-9

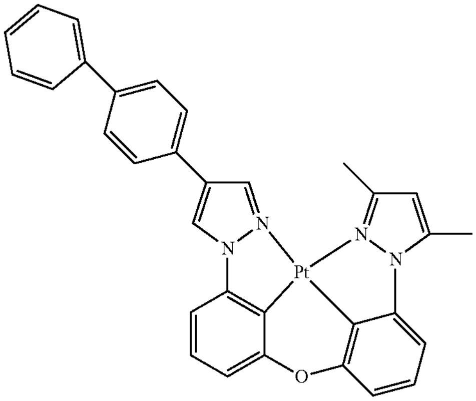

M-b-10

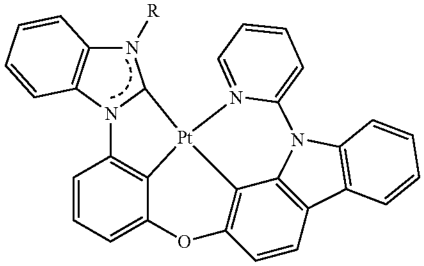

M-b-11

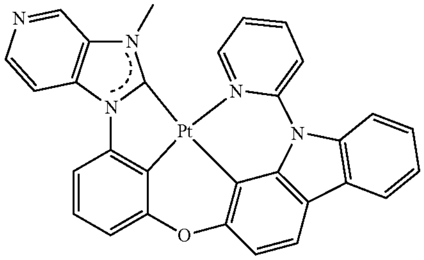

M-b-12

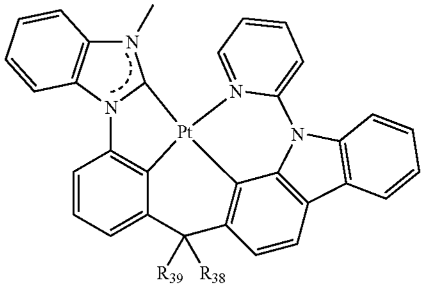

In Compound M-b-1 to Compound M-b-12, R, $R_{38}$, and $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

The emission layer EML may include a compound represented by any one of Formula F-a to Formula F-c. The compounds represented by Formula F-a to Formula F-c may be used as fluorescence dopant materials.

[Formula F-a]

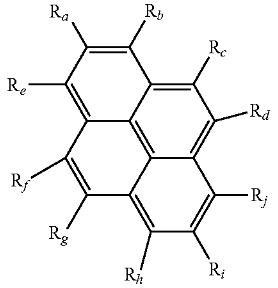

In Formula F-a, two selected from $R_a$ to $R_j$ may be each independently substituted with a group represented by $$*\text{—}NAr_1Ar_2.$$

The remainder of $R_a$ to $R_j$ not substituted with the group represented by $$*\text{—}NAr_1Ar_2$$

may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In the group represented by $$*\text{—}NAr_1Ar_2,$$

$Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. For example, at least one of $Ar_1$ or $Ar_2$ may be a heteroaryl group including O or S as a ring-forming atom.

[Formula F-b]

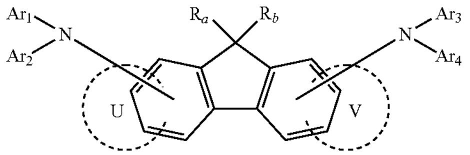

In Formula F-b, $R_a$ and Rb may each independently be a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula F-b, $Ar_1$ to $Ar_4$ may each independently be a substituted or unsubstituted aryl group having 6 to 30 ring-forming carbon atoms, or a substituted or unsubstituted heteroaryl group having 2 to 30 ring-forming carbon atoms.

In Formula F-b, U and V may each independently be a substituted or unsubstituted hydrocarbon ring of 5 to 30 ring-forming carbon atoms, or a substituted or unsubstituted heterocycle of 2 to 30 ring-forming carbon atoms.

In Formula F-b, the number of rings represented by U and V may each independently be 0 or 1. For example, in Formula F-b, if the number of U or V is 1, a fused ring may be present at the part designated by U or V, and if the number of U or V is 0, a ring may not be present at the part designated by U or V. If the number of U is 0 and the number of V is 1, or if the number of U is 1 and the number of V is 0, a fused ring having the fluorene core of Formula F-b may be a ring compound with four rings. If the number of both U and V is 0, a fused ring having the fluorene core of Formula F-b may be a ring compound with three rings. If the number of U and V is each 1, a fused ring having the fluorene core of Formula F-b may be a ring compound with five rings.

[Formula F-c]

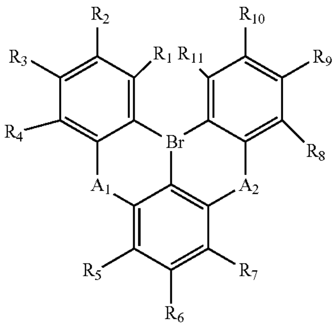

In Formula F-c, $A_1$ and $A_2$ may each independently be O, S, Se, or $N(R_m)$, and $R_m$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In Formula F-c, $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula F-c, $A_1$ and $A_2$ may each independently be combined with the substituents of an adjacent ring to form a fused ring. For example, if $A_1$ and $A_2$ are each independently $N(R_m)$, $A_1$ may be combined with $R_4$ or $R_5$ to form a ring. For example, $A_2$ may be combined with $R_7$ or $R_8$ to form a ring.

In an embodiment, the emission layer EML may include as a dopant material, styryl derivatives (for example, 1,4-bis[2-(3-N-ethylcarbazoryl) vinyl]benzene (BCzVB), 4-(di-p-tolylamino)-4'-[(di-p-tolylamino)styryl]stilbene (DPAVB), and N-(4-((E)-2-(6-((E)-4-(diphenylamino) styryl) naphthalen-2-yl) vinyl)phenyl)-N-phenylbenzenamine (N-BDAVBi)), perylene and derivatives thereof (for example, 2,5,8,11-tetra-t-butylperylene (TBP)), pyrene and derivatives thereof (for example, 1,1-dipyrene, 1,4-dipyrenylbenzene and 1,4-(bis(N,N-diphenylamino)pyrene), etc.

The emission layer EML may include a phosphorescence dopant material. For example, the phosphorescence dopant may include a metal complex including iridium (Ir), platinum (Pt), osmium (Os), gold (Au), titanium (Ti), zirconium (Zr), hafnium (Hf), europium (Eu), terbium (Tb) or thulium (Tm). For example, iridium (III) bis(4,6-difluorophenylpyridinato-N,C2') picolinate (FIrpic), bis(2,4-difluorophenylpyridinato)-tetrakis(1-pyrazolyl) borate iridium (III) (Fir6), or platinum octaethyl porphyrin (PtOEP) may be used as the phosphorescence dopant. However, embodiments are not limited thereto.

In the organic electroluminescence devices ED of embodiments as shown in FIG. 3 to FIG. 6, an electron transport region ETR is provided on an emission layer EML. The electron transport region ETR may include at least one of a hole blocking layer HBL, an electron transport layer ETL, or an electron injection layer EIL. However, embodiments are not limited thereto.

The electron transport region ETR may be a layer of a single material, a layer formed of different materials, or a multilayer structure having layers formed of different materials.

For example, the electron transport region ETR may have a single layer structure of an electron injection layer EIL or an electron transport layer ETL, or a single layer structure formed of an electron injection material and an electron transport material. In other embodiments, the electron transport region ETR may have a single layer structure formed of different materials, or may have a structure in which an electron transport layer ETL/electron injection layer EIL, or a hole blocking layer HBL/electron transport layer ETL/electron injection layer EIL, are stacked in its respective stated order from the light emitting layer EML, but embodiments are not limited thereto. A thickness of the electron transport region ETR may be, for example, in a range of about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

The electron transport region ETR may include a compound represented by Formula ET-1.

[Formula ET-1]

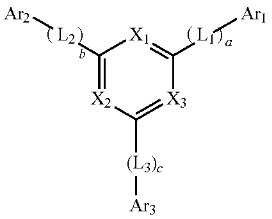

In Formula ET-1, at least one of $X_1$ to $X_3$ may be N, and the remainder of $X_1$ to $X_3$ may be $C(R_a)$. $R_a$ may be a hydrogen atom, a deuterium atom, a substituted or unsubstituted alkyl of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In Formula ET-1, $Ar_1$ to $Ar_3$ may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group of 6 to 30 ring-forming carbon atoms, or a substituted or unsubstituted heteroarylene group of 2 to 30 ring-forming carbon atoms. If a to c are each 2 or more, $L_1$ to $L_3$ may each independently be a substituted or unsubstituted arylene group of 6 to 30 ring-forming carbon atoms, or a substituted or unsubstituted heteroarylene group of 2 to 30 ring-forming carbon atoms.

The electron transport region ETR may include an anthracene-based compound. However, embodiments are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris (3'-(pyridin-3-yl) biphenyl-3-yl)-1,3,5-triazine, 2-(4-(N-phenylbenzoimidazolyl-1-ylphenyl)-9,10-dinaphthylanthracene, 1,3,5-tri (1-phenyl-1H-benzo[d]imidazol-2-yl) benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-$N^1$,$O_8$)-(1,1'-biphenyl-4-olato)aluminum (BA1q), berylliumbis(benzoquinolin-10-olate ($Bebq_2$), 9,10-di (naphthalene-2-yl)anthracene (ADN), 1,3-bis[3,5-di(pyridin-3-yl)phenyl]benzene (BmPyPhB), and mixtures thereof, without limitation.

The electron transport region ETR may include at least one compound selected from Compounds ET1 to ET36.

ET1

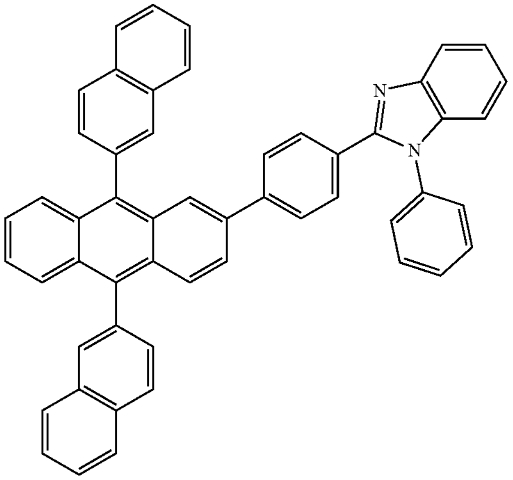

-continued

ET2

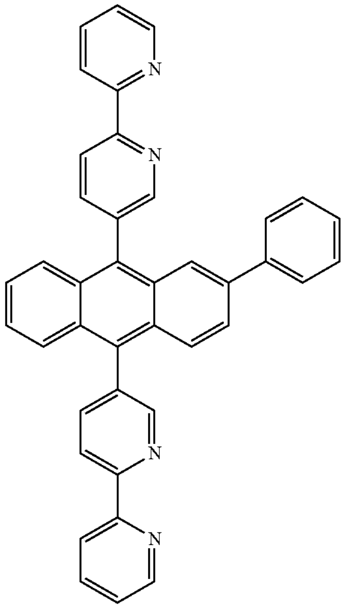

ET3

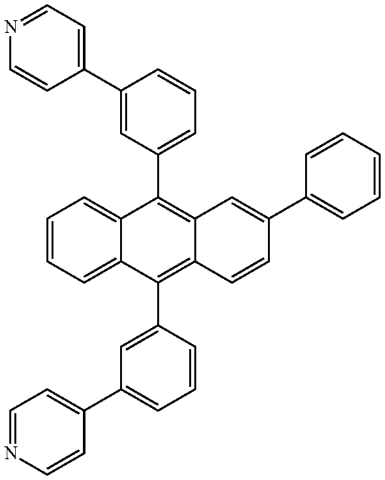

ET4

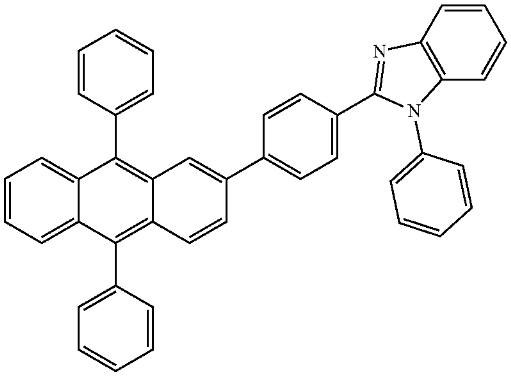

ET5
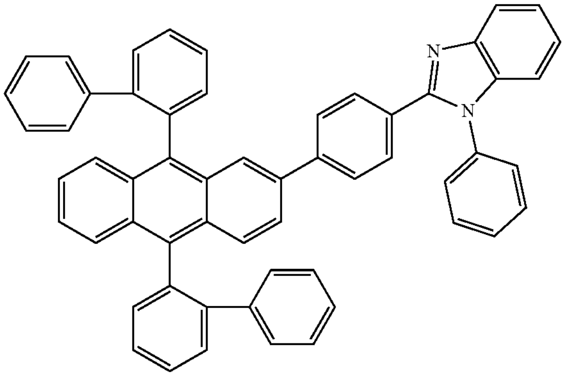
ET6
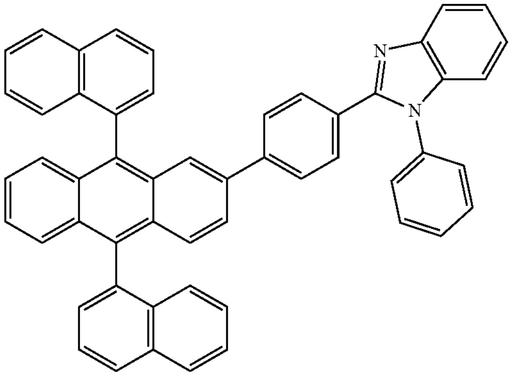
ET7
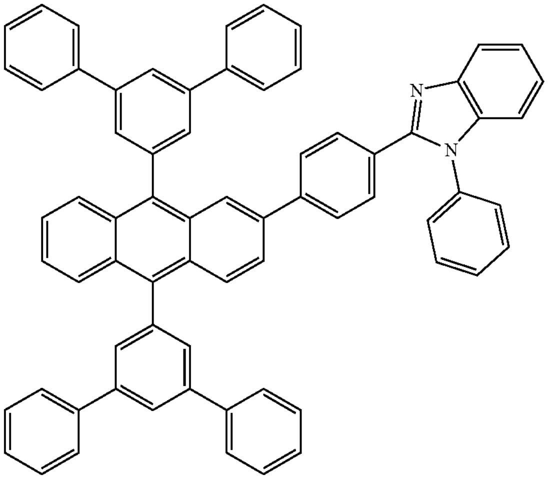
ET8
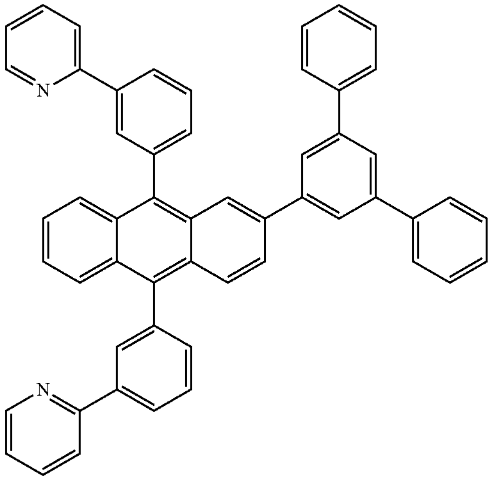
ET9
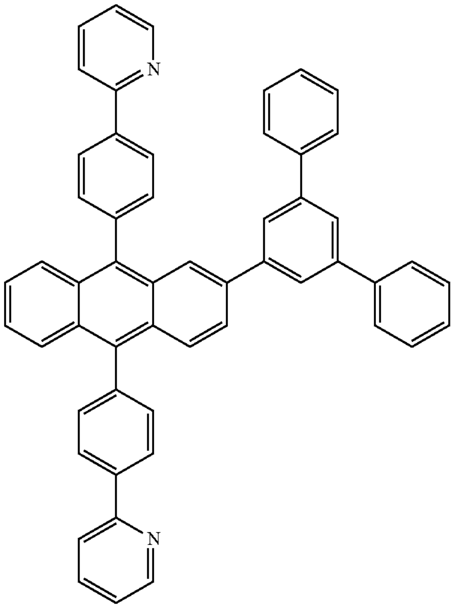

-continued
ET10
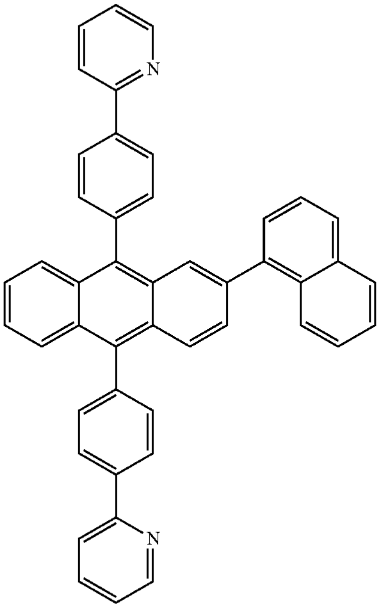
ET11
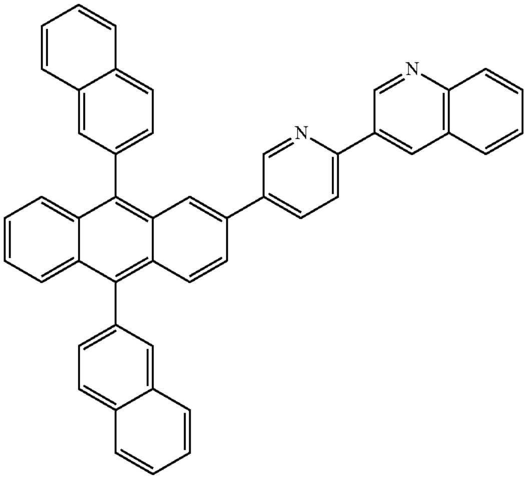
ET12
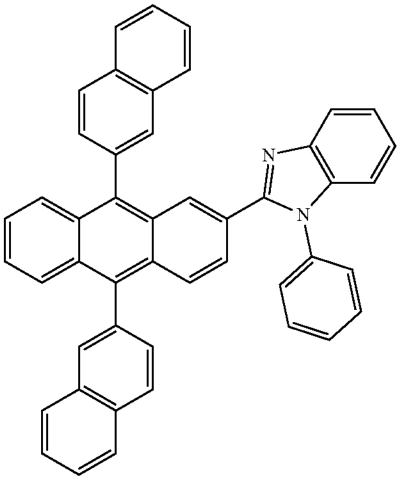
-continued
ET13
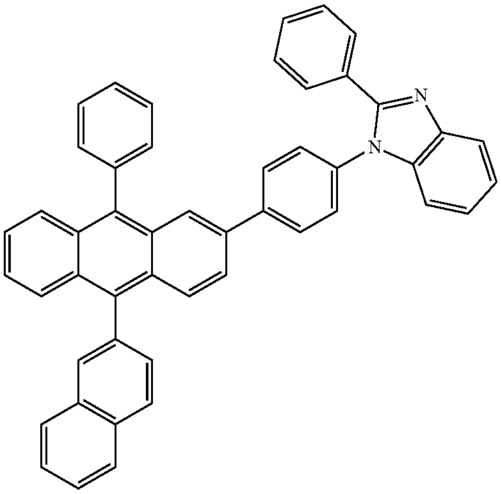
ET14
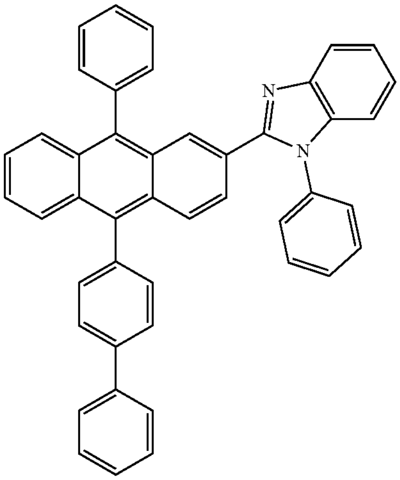
ET15
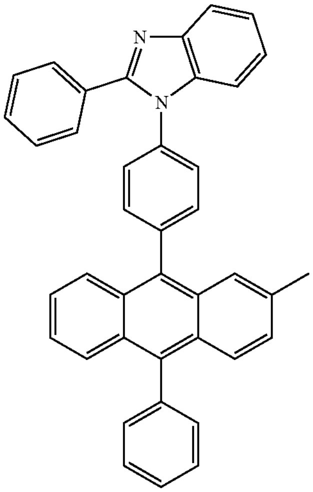

-continued
ET16
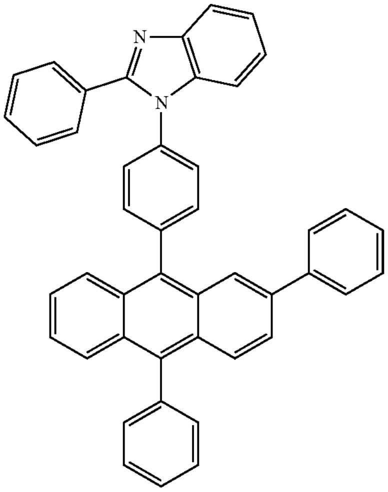
ET17
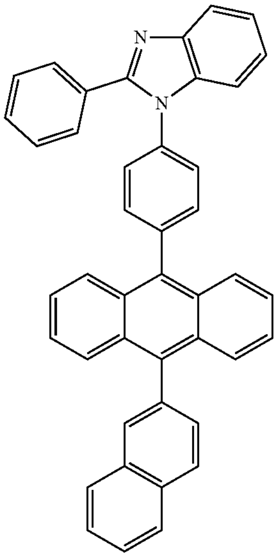
ET18
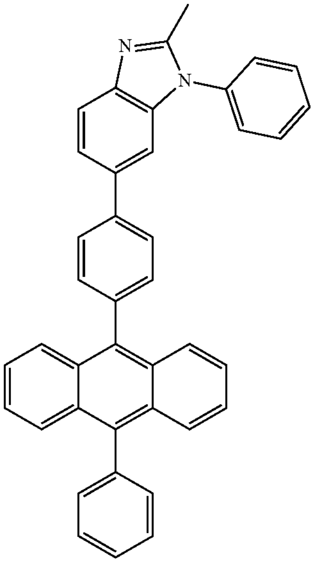
-continued
ET19
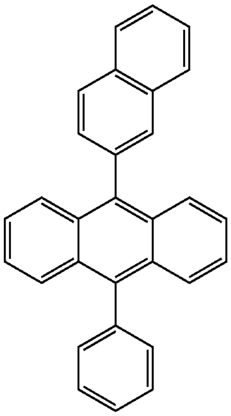
ET20
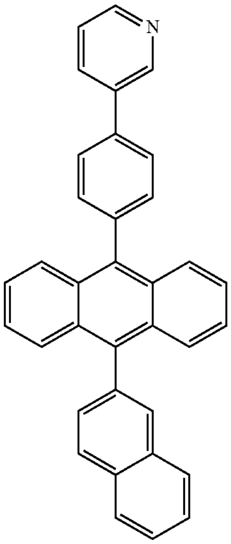
ET21
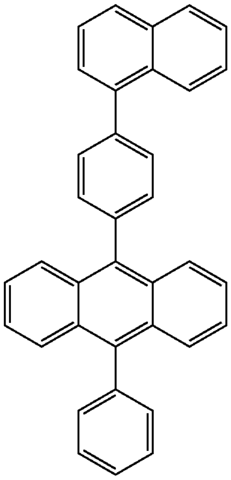

ET22
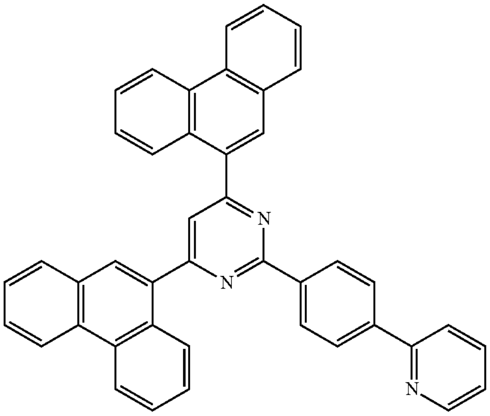
ET23
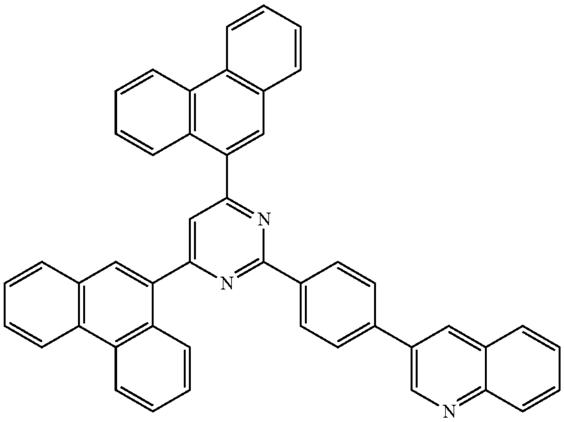
ET24
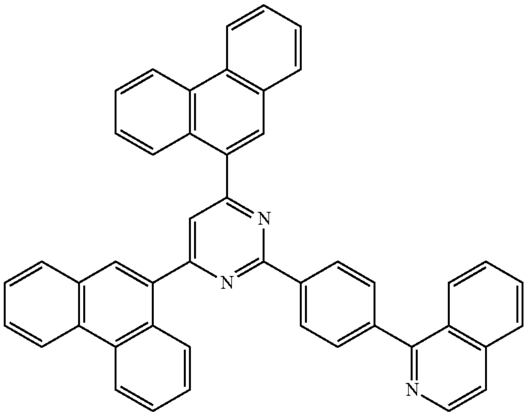
ET25
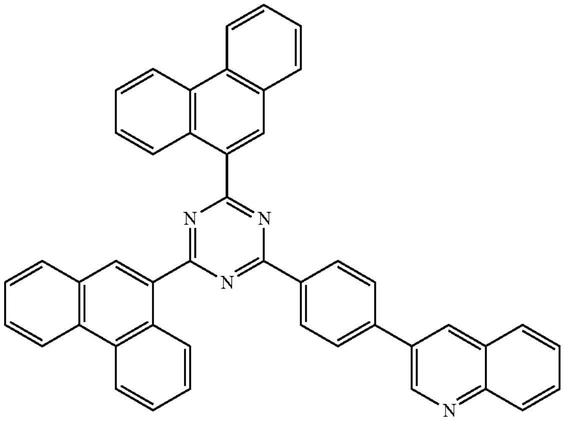
ET26
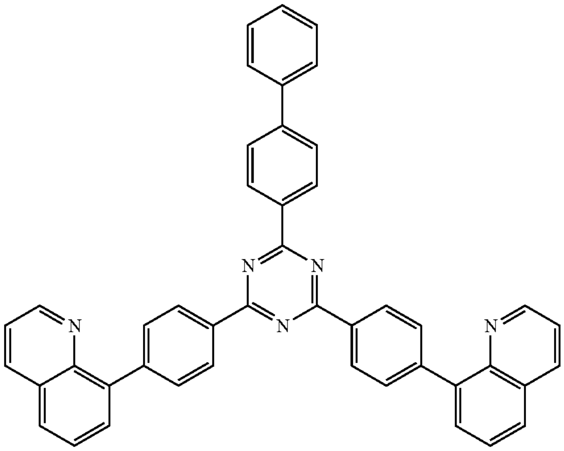
ET27
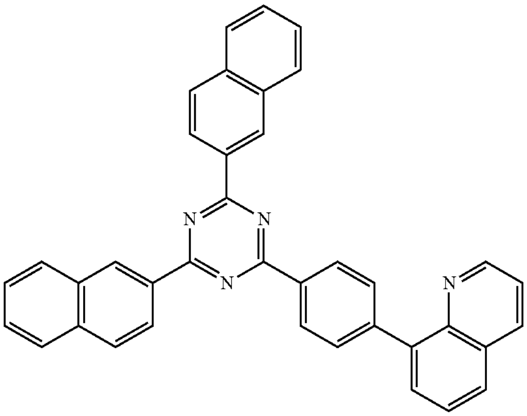

-continued
ET28
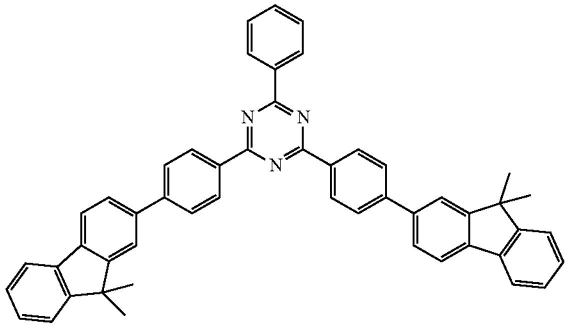
ET29
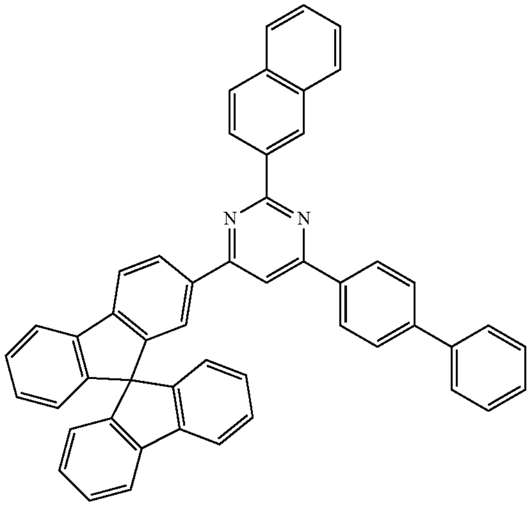
ET30
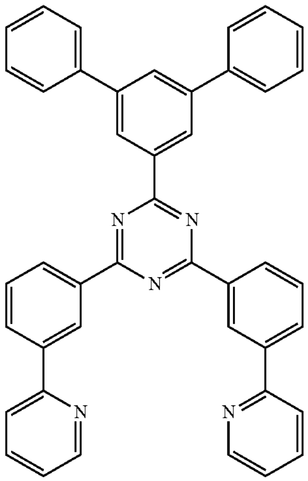
-continued
ET31
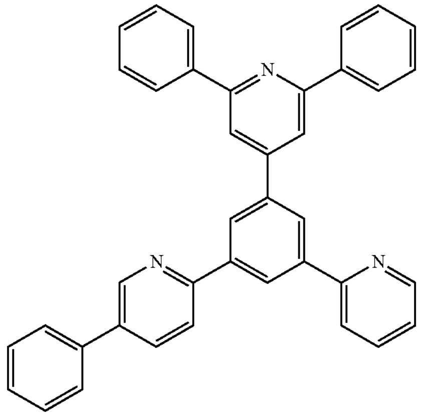
ET32
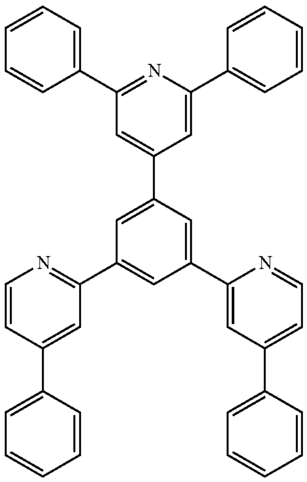
ET33
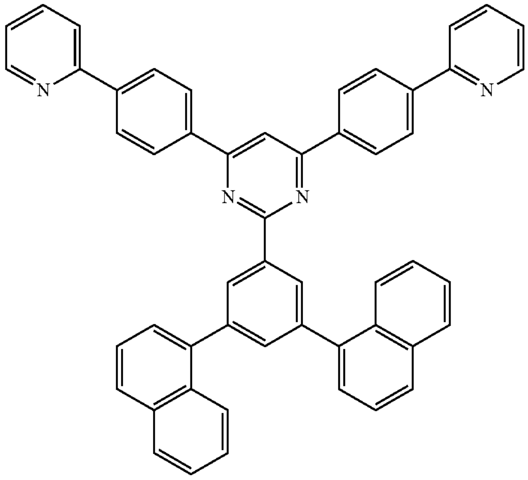

-continued

ET34

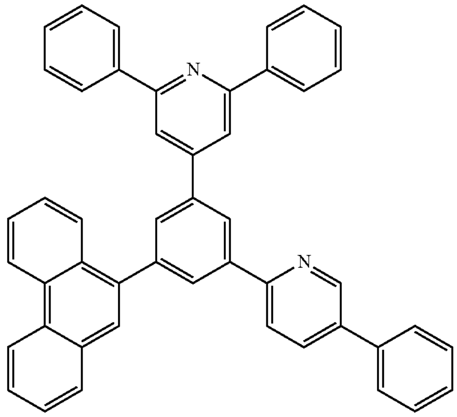

ET35

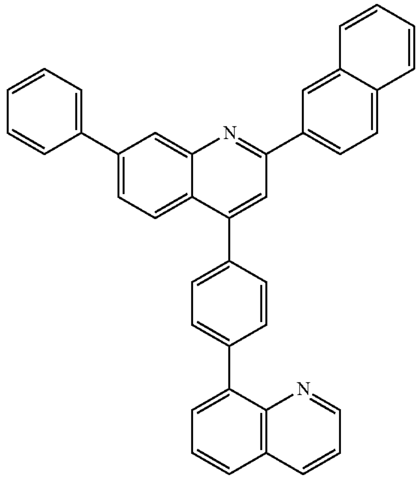

ET36

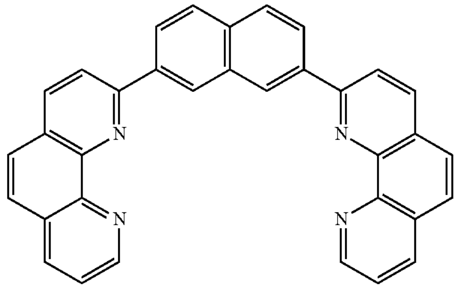

The electron transport region ETR may include a metal halide such as LiF, NaCl, CsF, RbCl, RbI, CuI and KI, a lanthanide such as Yb, or a co-depositing material of the metal halide and the lanthanide. For example, the electron transport region ETR may include KI:Yb, RbI:Yb, etc., as the co-depositing material. The electron transport region ETR may include a metal oxide such as $Li_2O$ and BaO, or 8-hydroxy-lithium quinolate (Liq). However, embodiments are not limited thereto. The electron transport region ETR also may be formed of a mixture material of an electron transport material and an insulating organo metal salt. The organo metal salt may be a material having an energy band gap equal to or greater than about 4 eV. For example, the organo metal salt may include metal acetates, metal benzoates, metal acetoacetates, metal acetylacetonates, or metal stearates.

The electron transport region ETR may include at least one of 2,9-dimethyl-4,7-diphenyl-1,10-phenanthroline (BCP), or 4,7-diphenyl-1,10-phenanthroline (Bphen) in addition to the aforementioned materials. However, embodiments are not limited thereto.

The electron transport region ETR may include the compounds of the electron transport region in at least one of an electron injection layer EIL, an electron transport layer ETL, or a hole blocking layer HBL.

If the electron transport region ETR includes an electron transport layer ETL, a thickness of the electron transport layer ETL may be in a range of about 100 Å to about 1,000 Å. For example, the thickness of the electron transport layer ETL may be in a range of about 150 Å to about 500 Å. If the thickness of the electron transport layer ETL satisfies the above-described range, satisfactory electron transport properties may be obtained without a substantial increase of driving voltage. If the electron transport region ETR includes an electron injection layer EIL, a thickness of the electron injection layer EIL may be in a range of about 1 Å to about 100 Å. For example, the thickness of the electron injection layer EIL may be in a range of about 3 Å to about 90 Å. If the thickness of the electron injection layer EIL satisfies the above described range, satisfactory electron injection properties may be obtained without a substantial increase of driving voltage.

A second electrode EL2 is provided on the electron transport region ETR. The second electrode EL2 may be a common electrode. The second electrode EL2 may be a cathode or an anode, but embodiments are not limited thereto. For example, if the first electrode EL1 is an anode, the second cathode EL2 may be a cathode, and if the first electrode EL1 is a cathode, the second electrode EL2 may be an anode.

The second electrode EL2 may be a transmissive electrode, a transflective electrode or a reflective electrode. If the second electrode EL2 is a transmissive electrode, the second electrode EL2 may include a transparent metal oxide, for example, ITO, IZO, ZnO, ITZO, etc.

If the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, compounds thereof, or mixtures thereof (for example, AgMg, or AgYb). In another embodiment, the second electrode EL2 may have a multilayered structure including a reflective layer or a transflective layer formed of the above-described materials and a transparent conductive layer formed of ITO, IZO, ZnO, ITZO, etc. For example, the second electrode EL2 may include the aforementioned metal materials, combinations of two or more metal materials selected from the aforementioned metal materials, or oxides of the aforementioned metal materials.

Although not shown in the drawings, the second electrode EL2 may be electrically connected to an auxiliary electrode. If the second electrode EL2 is electrically connected to the auxiliary electrode, the resistance of the second electrode EL2 may decrease.

In an embodiment, the organic electroluminescence device ED may further include a capping layer CPL disposed on the second electrode EL2. The capping layer CPL may be a multilayer or a single layer.

In an embodiment, the capping layer CPL may include an organic layer or an inorganic layer. For example, if the capping layer CPL includes an inorganic material, the inorganic material may include an alkali metal compound such as LiF, an alkaline earth metal compound such as $MgF_2$, SiON, SiNx, SiOy, etc.

For example, if the capping layer CPL includes an organic material, the organic material may include a-NPD, NPB, TPD, m-MTDATA, $Alq_3$, CuPc, $N^4,N^4,N^{4'},N^{4'}$-tetra(biphenyl-4-yl) biphenyl-4,4'-diamine (TPD15), 4,4',4"-tris(carbazol sol-9-yl)triphenylamine (TCTA), etc., or includes an epoxy resin, or acrylate such as methacrylate. The capping layer CPL may include at least one of Compounds P1 to P5, but embodiments are not limited thereto.

P1

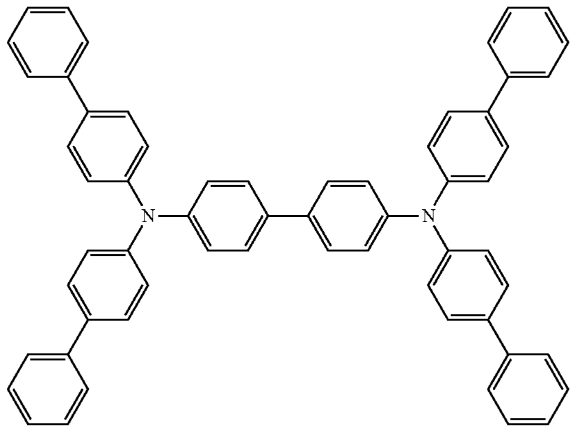

P2

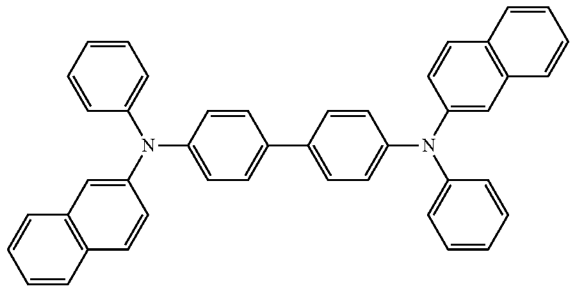

P3

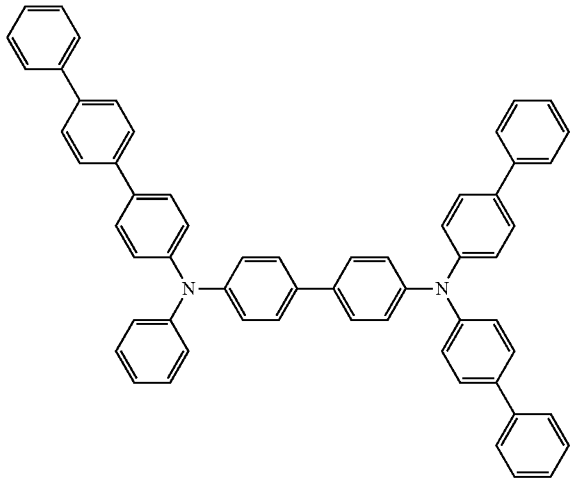

-continued

P4

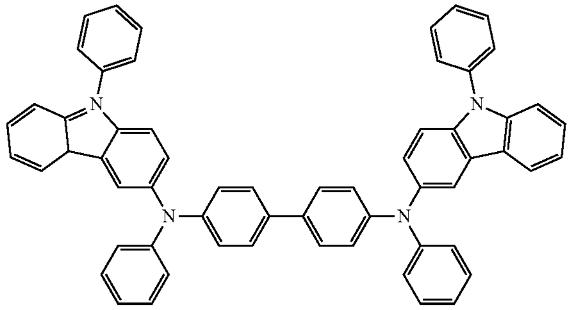

P5

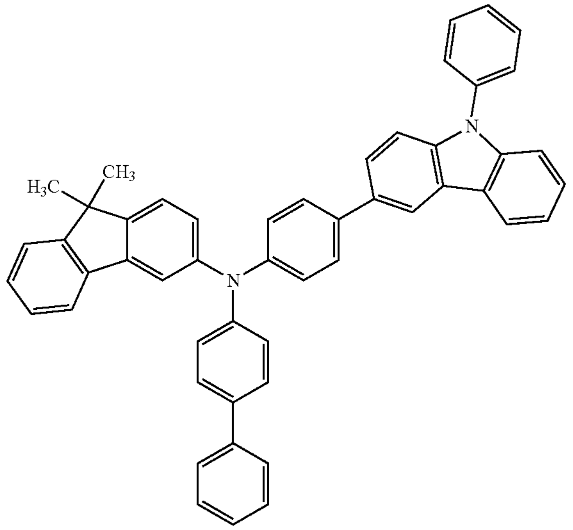

A refractive index of the capping layer CPL may be equal to or greater than about 1.6. For example, the refractive index of the capping layer CPL may be equal to or greater than about 1.6 with respect to light in a wavelength range of about 550 nm to about 660 nm.

Figure 7:
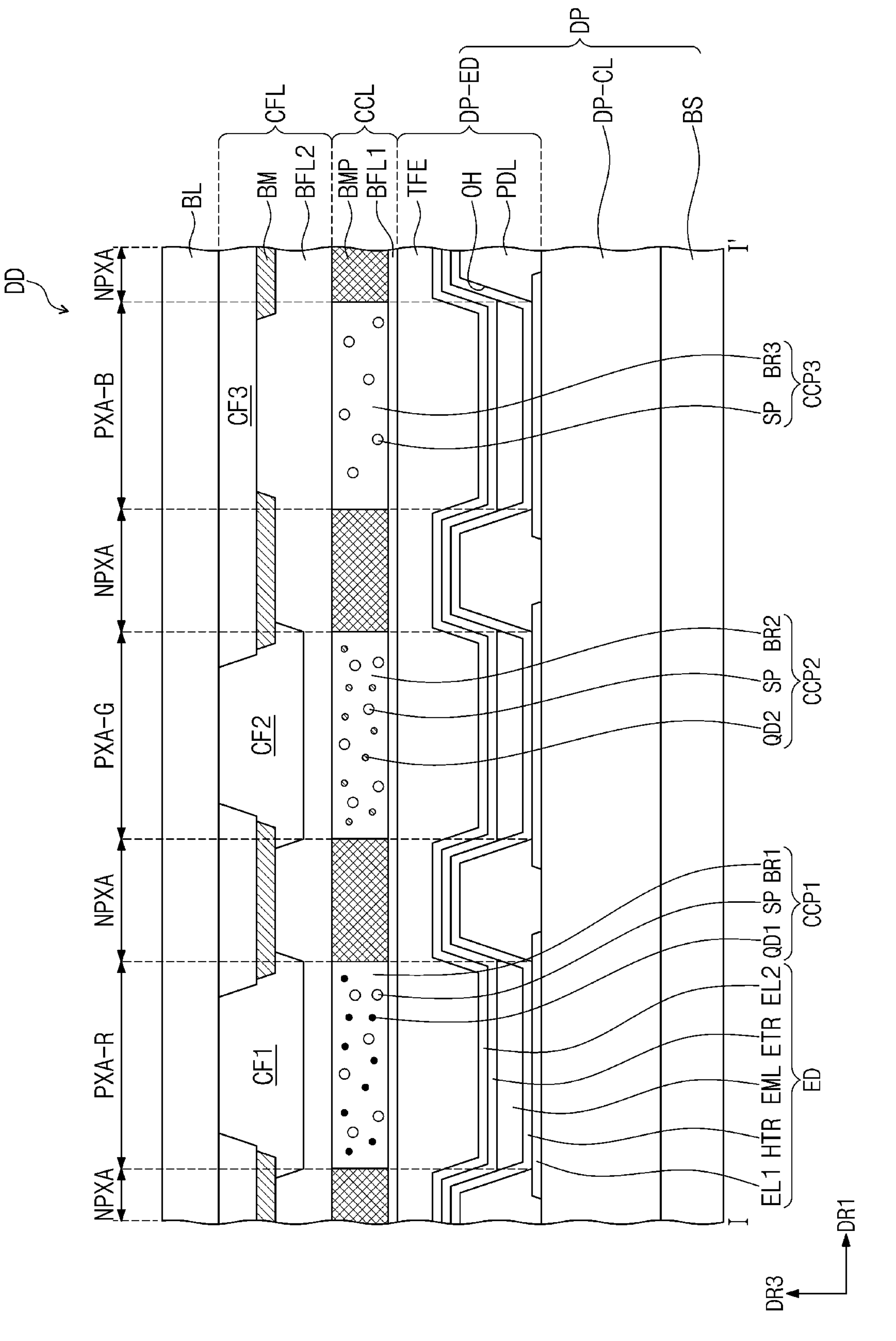
FIG. 7 is a schematic cross-sectional view showing a display apparatus according to an embodiment.
Figure 8:
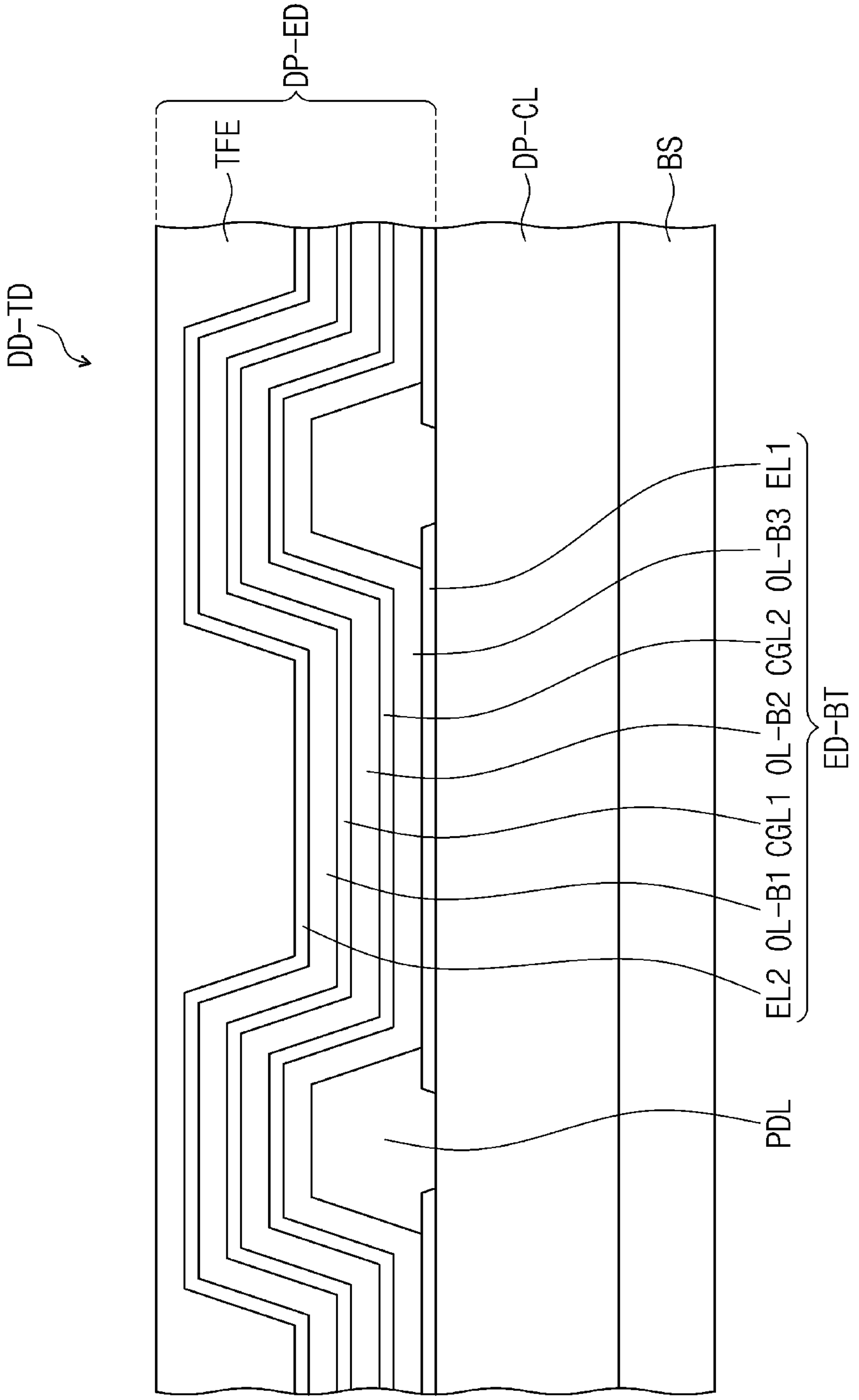
FIG. 8 is a schematic cross-sectional view showing a display apparatus according to an embodiment.

FIG. 7 and FIG. 8 are each a schematic cross-sectional view of a display apparatus according to embodiments, respectively. In the explanation on the display apparatuses of embodiments, referring to FIG. 7 and FIG. 8, the overlapping parts with the explanation on FIG. 1 to FIG. 6 will not be explained again, and the different features will be explained.

Referring to FIG. 7, the display apparatus DD according to an embodiment may include a display panel DP including a display device layer DP-ED, a light controlling layer CCL disposed on the display panel DP, and a color filter layer CFL.

In an embodiment shown in FIG. 7, the display panel DP includes a base layer BS, a circuit layer DP-CL provided on the base layer BS, and a display device layer DP-ED, and the display device layer DP-ED may include an organic electroluminescence device ED.

The organic electroluminescence device ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. A structure of the organic electroluminescence device according to FIG. 3 to FIG. 6 may be applied to the structure of the organic electroluminescence device ED shown in FIG. 7.

Referring to FIG. 7, the emission layer EML may be disposed in an opening OH defined in a pixel definition layer PDL. For example, the emission layer EML which is divided by the pixel definition layer PDL and correspondingly provided to each of the luminous areas PXA-R, PXA-G, and PXA-B may emit light in a same wavelength region. In the display apparatus DD of an embodiment, the emission layer EML may emit blue light. Although not shown in the drawings, in an embodiment, the emission layer EML may be provided as a common layer for all luminous areas PXA-R, PXA-G, and PXA-B.

The light controlling layer CCL may be disposed on the display panel DP. The light controlling layer CCL may include a light converter. The light converter may include a quantum dot or a phosphor. The light converter may transform the wavelength of a provided light and may emit the transformed light. For example, the light controlling layer CCL may be a layer including a quantum dot or a layer including a phosphor.

A quantum dot may be selected from a Group II-VI compound, a Group III-VI compound, a Group I—III-VI compound, a Group III-V compound, a Group III—II-V compound, a Group IV-VI compound, a Group IV element, a Group IV compound, or a combination thereof.

The Group II-VI compound may be selected from: a binary compound selected from the group consisting of CdSe, CdTe, CdS, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof; or any combination thereof.

The Group III-VI compound may be selected from: a binary compound such as $In_2S_3$, and $In_2Se_3$; a ternary compound such as $InGaS_3$, and $InGaSe_3$; or any combination thereof.

The Group I—III-VI compound may be selected from: a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof; a quaternary compound such as $AgInGaS_2$, and $CuInGaS_2$; or any combination thereof.

The Group III-V compound may be selected from: a binary compound selected from the group consisting of GaN, GaP, GaAs, GaSb, AlN, AlP, AlAs, AlSb, InN, InP, InAs, InSb, and mixtures thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof; a quaternary compound selected from the group consisting of GaAINP, GaAINAs, GaAINSb, GaAlPAs, GaAlPSb, GaInNP, GaInNAs, GaInNSb, GaInPAs, GaInPSb, InAINP, InAINAs, InAINSb, InAlPAs, InAlPSb, and mixtures thereof; or any combination thereof. The Group III-V compound may further include a Group II metal. For example, InZnP, etc. may be selected as a III—II—V group compound.

The Group IV-VI compound may be selected from: a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof, a quaternary compound selected from the group consisting of SnPbSSe, SnPbSeTe, SnPbSTe, and mixtures thereof; or any combination thereof. The Group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in a particle at a uniform concentration or may be present in a particle at a partially different concentration distribution state. In an embodiment, the quantum dot may have a core/shell structure in which a quantum dot surrounds another quantum dot. An interface between the core and the shell may have a concentration gradient in which the concentration of an element that is present in the shell decreases toward the center.

In embodiments, a quantum dot may have a core-shell structure including a core including a nanocrystal and a shell surrounding the core. The shell of the quantum dot may be a protection layer that prevents chemical deformation of the core to maintain semiconductor properties and/or may be a charging layer that imparts the quantum dot with electrophoretic properties. The shell may be a single layer or a multilayer. Examples of the shell of the quantum dot may include a metal oxide, a non-metal oxide, a semiconductor compound, or combinations thereof.

For example, the metal oxide or the non-metal oxide may include: a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and NiO; or a ternary compound such as $MgAl_2O_4$, $CoFe_2O_4$, $NiFe_2O_4$ and $CoMn_2O_4$, but embodiments are not limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

The quantum dot may have a full width of half maximum (FWHM) of an emission wavelength spectrum equal to or less than about 45 nm. For example, the quantum dot may have a FWHM of an emission wavelength spectrum equal to or less than about 40 nm. For example, the quantum dot may have a FWHM of an emission wavelength spectrum equal to or less than about 30 nm. Color purity or color reproducibility may be improved within these ranges. Light emitted through the quantum dot may be emitted in all directions, so that light viewing angle properties may be improved.

The form of the quantum dot may be shapes which are used in the art, without specific limitation. For example, a quantum dot may have a spherical shape, a pyramidal shape, a multi-arm shape, or a cubic shape, or the quantum dot may be in the form of a nanoparticle, a nanotube, a nanowire, a nanofiber, a nanoplate, etc.

The quantum dot may control the color of light emitted according to a particle size thereof, and accordingly, the quantum dot may have various emission colors such as blue, red, and green.

The light controlling layer CCL may include light controlling parts CCP1, CCP2, and CCP3. The light controlling parts CCP1, CCP2, and CCP3 may be separated from one another.

Referring to FIG. 7, a partition pattern BMP may be disposed between the separated light controlling parts CCP1, CCP2, and CCP3, but embodiments are not limited thereto. In FIG. 7, the partition pattern BMP is shown so that it does not overlap the light controlling parts CCP1, CCP2, and CCP3, but at least a portion of the edge of the light controlling parts CCP1, CCP2, and CCP3 may overlap the partition pattern BMP.

The light controlling layer CCL may include a first light controlling part CCP1 including a first quantum dot QD1 converting first color light provided from the organic electroluminescence device ED into second color light, a second light controlling part CCP2 including a second quantum dot QD2 converting first color light provided from the organic electroluminescence device ED into third color light, and a third light controlling part CCP3 transmitting first color light provided from the organic electroluminescence device ED.

In an embodiment, the first light controlling part CCP1 may provide red light which is the second color light, and the second light controlling part CCP2 may provide green light which is the third color light. The third color controlling part CCP3 may transmit and provide blue light which is the first color light provided from the organic electroluminescence device ED. For example, the first quantum dot QD1 may be a red quantum dot, and the second quantum dot QD2 may be a green quantum dot. The same description as provided above with respect to quantum dots may be applied to the quantum dots QD1 and QD2.

The light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but may include the scatterer SP.

The scatterer SP may be an inorganic particle. For example, the scatterer SP may include at least one of $TiO_2$, ZnO, $Al_2O_3$, $SiO_2$, or hollow silica. The scatterer SP may include at least one of $TiO_2$, ZnO, $Al_2O_3$, $SiO_2$, or hollow silica, or may be a mixture of two or more materials selected from $TiO_2$, ZnO, $Al_2O_3$, $SiO_2$, and hollow silica.

The light controlling layer CCL may include a barrier layer BFL1. The barrier layer BFL1 may block the penetration of moisture and/or oxygen (hereinafter, will be referred to as "humidity/oxygen"). The barrier layer BFL1 may be disposed on the light controlling parts CCP1, CCP2, and CCP3 to block the exposure of the light controlling parts CCP1, CCP2, and CCP3 to humidity/oxygen. The barrier layer BFL1 may cover the light controlling parts CCP1, CCP2, and CCP3. A barrier layer BFL2 may be provided between the light controlling parts CCP1, CCP2, and CCP3 and a color filter layer CFL.

The barrier layers BFL1 and BFL2 may each include at least one inorganic layer. For example, the barrier layers BFL1 and BFL2 may each be formed by including an inorganic material. For example, the barrier layers BFL1 and BFL2 may each be formed by including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or a metal thin film securing light transmittance. The barrier layers BFL1 and BFL2 may further include an organic layer. The barrier layers BFL1 and BFL2 may be composed of a single layer or of multiple layers.

In the display apparatus DD of an embodiment, the color filter layer CFL may be disposed on the light controlling layer CCL. In an embodiment, the color filter layer CFL may be disposed directly on the light controlling layer CCL. For example, the barrier layer BFL2 may be omitted.

The color filter layer CFL may include a light blocking part BM and filters $CF_1$, $CF_2$, and $CF_3$. The color filter layer CFL may include a first filter $CF_1$ that transmits second color light, a second filter $CF_2$ that transmits third color light, and a third filter $CF_3$ that transmits first color light. For example, the first filter $CF_1$ may be a red filter, the second filter $CF_2$ may be a green filter, and the third filter $CF_3$ may be a blue filter. Each of the filters CF1, CF2, and CF3 may include a polymer photosensitive resin and a pigment or dye. The first filter CF1 may include a red pigment or dye, the second filter CF2 may include a green pigment or dye, and the third filter CF3 may include a blue pigment or dye. However, embodiments are not limited thereto, and the third filter CF3 may not include a pigment or dye. The third filter CF3 may include a polymer photosensitive resin and may not include a pigment or dye. The third filter CF3 may be transparent. The third filter CF3 may be formed using a transparent photosensitive resin.

In an embodiment, the first filter CF1 and the second filter CF2 may each be yellow filters. The first filter CF1 and the second filter CF2 may be provided in one body without distinction.

The light blocking part BM may be a black matrix. The light blocking part BM may include an organic light blocking material or an inorganic light blocking material including a black pigment or black dye. The light blocking part BM may prevent light leakage and may distinguish the boundaries between adjacent filters CF1, CF2, and CF3. In an embodiment, the light blocking part BM may be formed as a blue filter.

The first to third filters CF1, CF2, and CF3 may be disposed corresponding to each of a red luminous area PXA-R, green luminous area PXA-G, and blue luminous area PXA-B, respectively.

A base substrate BL may be disposed on the color filter layer CFL. The base substrate BL may provide a base surface on which the color filter layer CFL, the light controlling layer CCL, etc. are disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

FIG. 8 is a schematic cross-sectional view showing a portion of the display apparatus according to an embodiment. In FIG. 8, the schematic cross-sectional view of a portion corresponding to the display panel DP in FIG. 7 is shown. In a display apparatus DD-TD of an embodiment, the organic electroluminescence device ED-BT may include light emitting structures OL-B1, OL-B2, and OL-B3. The organic electroluminescence device ED-BT may include oppositely disposed first electrode EL1 and second electrode EL2, and the light emitting structures OL-B1, OL-B2, and OL-B3 stacked in a thickness direction and provided between the first electrode EL1 and the second electrode EL2. Each of the light emitting structures OL-B1, OL-B2, and OL-B3 may include an emission layer EML (FIG. 7), and a hole transport region HTR and an electron transport region ETR disposed with the emission layer EML (FIG. 7) therebetween.

For example, the organic electroluminescence device ED-BT included in the display apparatus DD-TD of an embodiment may be an organic electroluminescence device having a tandem structure and including multiple emission layers.

In an embodiment shown in FIG. 8, light emitted from each of the light emitting structures OL-B1, OL-B2, and OL-B3 may be all blue light. However, embodiments are not limited thereto, and the wavelength regions of light emitted from the light emitting structures OL-B1, OL-B2, and OL-B3 may be different from each other. For example, the organic electroluminescence device ED-BT including the light emitting structures OL-B1, OL-B2, and OL-B3 emitting light in different wavelength regions may emit white light.

Charge generating layers CGL1 and CGL2 may be disposed between neighboring light emitting structures OL-B1, OL-B2, and OL-B3. The charge generating layers CGL1 and CGL2 may each independently include a p-type charge generating layer and/or an n-type charge generating layer.

Hereinafter, the compound according to an embodiment and the organic electroluminescence device of an embodiment will be explained referring to the Examples and the Comparative Examples. The Examples are only illustrations to assist in the understanding of the disclosure, and the scope of the disclosure is not limited thereto.

EXAMPLES

1. Synthesis of Fused Polycyclic Compound

A synthesis method of the fused polycyclic compound according to an embodiment will be explained with reference to the synthesis methods of Compounds 1, 37, 59, 99, 115, and 152. The synthesis methods of the fused polycyclic compounds explained below are only illustrations, and the synthesis method of the fused polycyclic compound according to embodiments are not limited to the Examples below.

(1) Synthesis of Compound 1

Compound 1 according to an embodiment may be synthesized by, for example, the reaction below.

[Reaction 1]

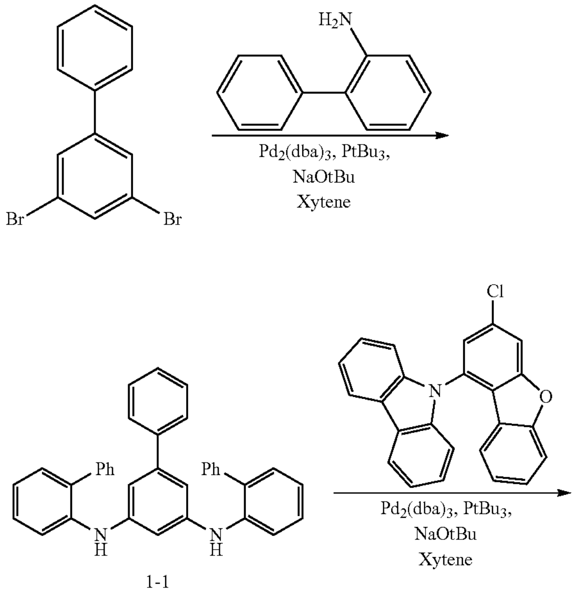

1-1

-continued

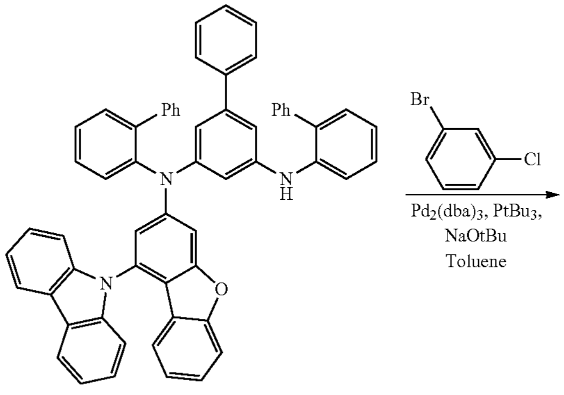

1-2

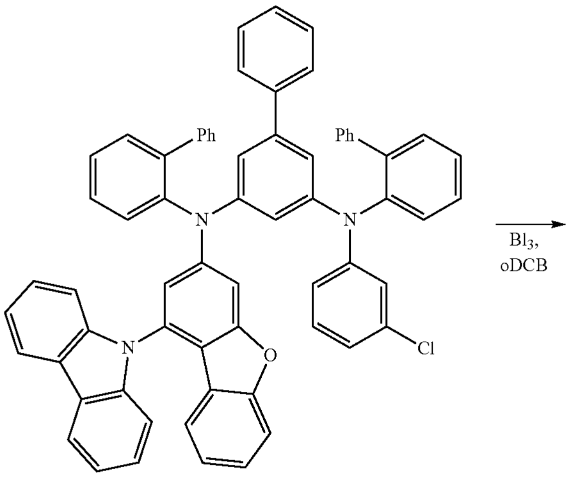

1-3

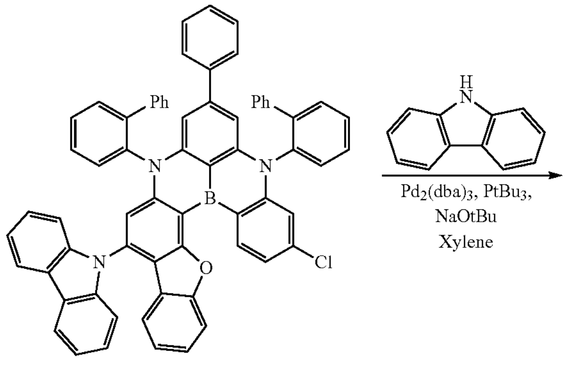

1-4

-continued

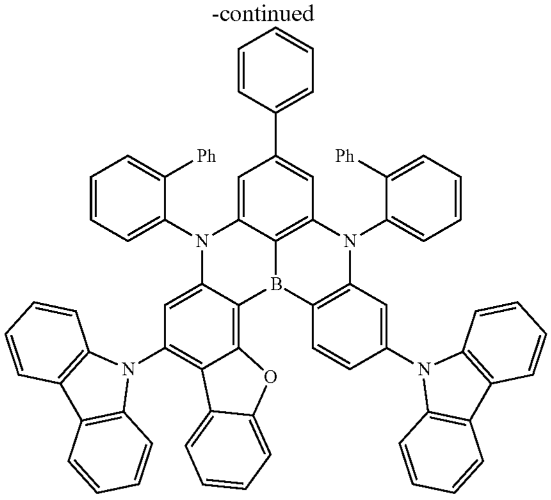

1

Synthesis of Intermediate 1-1

3,5-dibromo-1,1'-biphenyl (1 eq), [1,1'-biphenyl]-2-amine (1.1 eq), tris(dibenzylideneacetone)dipalladium(0) (0.1 eq), tri-tert-butylphosphine (0.2 eq), and sodium tert-butoxide (3 eq) were dissolved in toluene, followed by stirring under a nitrogen atmosphere at about 110 degrees centigrade for about 4 hours. After cooling, toluene was removed by drying under a reduced pressure. An organic layer obtained by washing with ethyl acetate and water three times each was dried with $MgSO_4$ and dried under a reduced pressure. Through separation by column chromatography and recrystallization (dichloromethane: n-hexane), Intermediate 1-1 was obtained (yield: 73%).

Synthesis of Intermediate 1-2

Intermediate 1-1 (1 eq), 9-(3-chlorodibenzo[b,d]furan-1-yl)-9H-carbazole (1 eq), tris(dibenzylideneacetone)dipalladium(0) (0.05 eq), tri-tert-butylphosphine (0.1 eq), and sodium tert-butoxide (2 eq) were dissolved in o-xylene, followed by stirring under a nitrogen atmosphere at about 140 degrees centigrade for about 10 hours. After cooling, o-xylene was removed by drying under a reduced pressure. An organic layer obtained by washing with ethyl acetate and water three times each was dried with $MgSO_4$ and dried under a reduced pressure. Through separation by column chromatography and recrystallization (dichloromethane: n-hexane), Intermediate 1-2 was obtained (yield: 64%).

Synthesis of Intermediate 1-3

Intermediate 1-2 (1 eq), 1-bromo-3-chlorobenzene 1 eq), tris(dibenzylideneacetone)dipalladium(0) (0.05 eq), tri-tert-butylphosphine (0.1 eq), and sodium tert-butoxide (2 eq) were dissolved in toluene, followed by stirring under a nitrogen atmosphere at about 140 degrees centigrade for about 10 hours. After cooling, toluene was removed by drying under a reduced pressure. An organic layer obtained by washing with ethyl acetate and water three times each was dried with $MgSO_4$ and dried under a reduced pressure. Through separation by column chromatography and recrystallization (dichloromethane: n-hexane), Intermediate 1-3 was obtained (yield: 67%).

Synthesis of Intermediate 1-4

Intermediate 1-3 (1 eq) was dissolved in ortho dichlorobenzene, a flask was cooled to about 0 degrees centigrade under a nitrogen atmosphere, and $BI_3$ (2.5 eq) dissolved in ortho dichlorobenzene was slowly injected thereto. After finishing the dropwise addition, the temperature was raised to about 140 degrees centigrade, and stirring was performed for about 4 hours. After cooling to about 0 degrees, triethylamine was slowly added dropwise to the flask until heating stopped to finish the reaction. Hexane was added for precipitation, and the solid content was filtered and obtained. The solid content thus obtained was separated by silica filtration, and purified again by recrystallization with MC/Hex to obtain Intermediate 1-4. Final separation was performed through column chromatography (dichloromethane: n-hexane) (yield: 41%).

Synthesis of Compound 1

Intermediate 1-4 (1 eq), 9H-carbazole (1.1 eq), tris(dibenzylideneacetone)dipalladium(0) (0.1 eq), tri-tert-butylphosphine (0.2 eq), and sodium tert-butoxide (2 eq) were dissolved in o-xylene, followed by stirring under a nitrogen atmosphere at about 140 degrees centigrade for about 20 hours. After cooling, o-xylene was removed by drying under a reduced pressure. An organic layer obtained by washing with ethyl acetate and water three times each was dried with $MgSO_4$ and dried under a reduced pressure. Through separation by column chromatography and recrystallization (dichloromethane: n-hexane), Compound 1 was obtained. Final purification was performed through sublimation purification (yield after sublimation: 6.7%).

(2) Synthesis of Compound 37

Compound 37 according to an embodiment may be synthesized by, for example, the reaction below.

[Reaction 2]

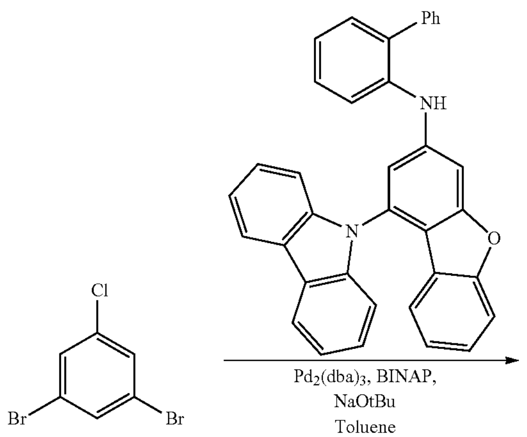

-continued

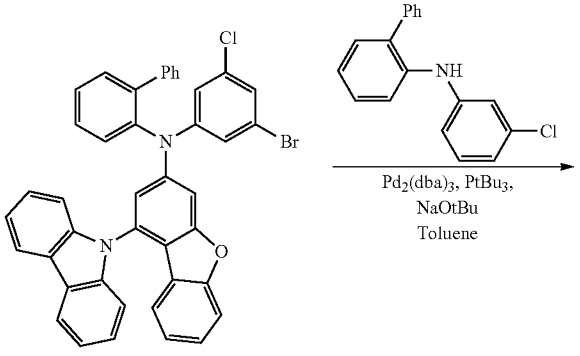

37-1

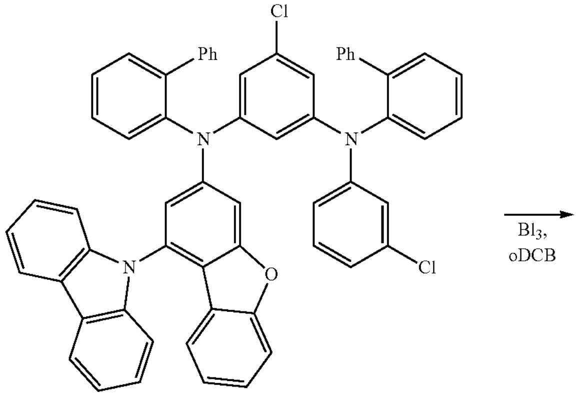

37-2

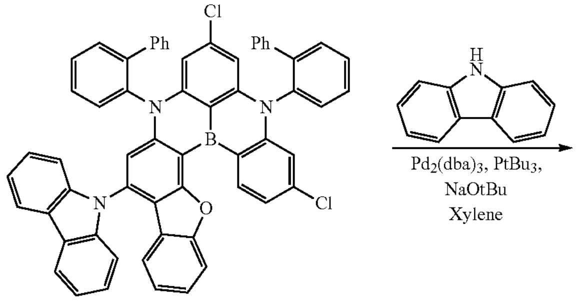

37-3

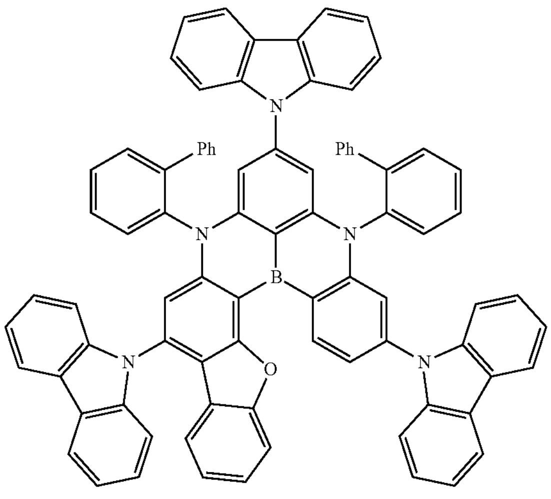

37

Synthesis of Intermediate 37-1

1,3-dibromo-5-chlorobenzene (1 eq), N-([1,1'-biphenyl]-2-yl)-1-(9H-carbazol-9-yl)dibenzo[b,d]furan-3-amine (1 eq), tris(dibenzylideneacetone)dipalladium(0) (0.05 eq), BINAP (0.1 eq), and sodium tert-butoxide (1.2 eq) were dissolved in toluene, followed by stirring under a nitrogen atmosphere at about 100 degrees centigrade for about 10 hours. After cooling, toluene was removed by drying under a reduced pressure. An organic layer obtained by washing with ethyl acetate and water three times each was dried with $MgSO_4$ and dried under a reduced pressure. Through separation by column chromatography and recrystallization (dichloromethane: n-hexane), Intermediate 37-1 was obtained (yield: 74%).

Synthesis of Intermediate 37-2

Intermediate 37-1 (1 eq), N-(3-chlorophenyl)-[1,1'-biphenyl]-2-amine (1 eq), tris(dibenzylideneacetone)dipalladium (0) (0.05 eq), tri-tert-butylphosphine (0.1 eq), and sodium tert-butoxide (1.2 eq) were dissolved in toluene, followed by stirring under a nitrogen atmosphere at about 100 degrees centigrade for about 10 hours. After cooling, toluene was removed by drying under a reduced pressure. An organic layer obtained by washing with ethyl acetate and water three times each was dried with $MgSO_4$ and dried under a reduced pressure. Through separation by column chromatography and recrystallization (dichloromethane: n-hexane), Intermediate 37-2 was obtained (yield: 62%).

Synthesis of Intermediate 37-3

Intermediate 37-2 (1 eq) was dissolved in ortho dichlorobenzene, a flask was cooled to about 0 degrees centigrade under a nitrogen atmosphere, and $BI_3$ (1.5 eq) dissolved in ortho dichlorobenzene was slowly injected thereto. After finishing the dropwise addition, the temperature was raised to about 140 degrees centigrade, and stirring was performed for about 10 hours. After cooling to about 0 degrees, triethylamine was slowly added dropwise to the flask until heating stopped to finish the reaction. Hexane was added for precipitation, and the solid content was filtered and obtained. The solid content thus obtained was separated by silica filtration, and purified again by recrystallization with MC/Hex to obtain Intermediate 37-3. Final separation was performed through column chromatography (dichloromethane: n-hexane) (yield: 46%).

Synthesis of Compound 37

Intermediate 37-3 (1 eq), 9H-carbazole (1.1· eq), tris (dibenzylideneacetone)dipalladium(0) (0.1 eq), tri-tert-butylphosphine (0.2 eq), and sodium tert-butoxide (2 eq) were dissolved in o-xylene, followed by stirring under a nitrogen atmosphere at about 140 degrees centigrade for about 20 hours. After cooling, o-xylene was removed by drying under a reduced pressure. An organic layer obtained by washing with ethyl acetate and water three times each was dried with $MgSO_4$ and dried under a reduced pressure. Through separation by column chromatography and recrystallization (dichloromethane: n-hexane), Compound 37 was obtained. Final purification was performed through sublimation purification (yield after sublimation: 26.7%).

(3) Synthesis of Compound 59
Compound 59 according to an embodiment may be synthesized by, for example, the reaction below.
[Reaction 3]
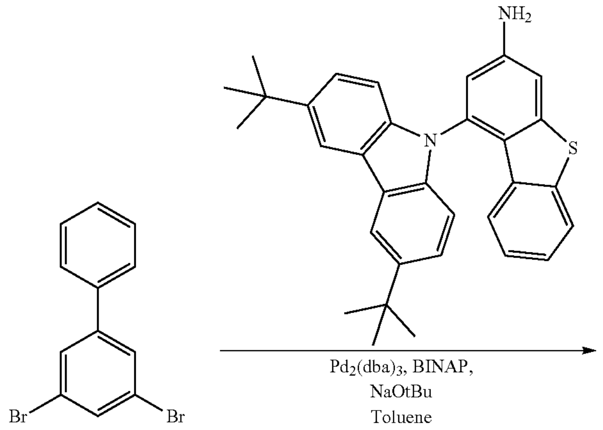
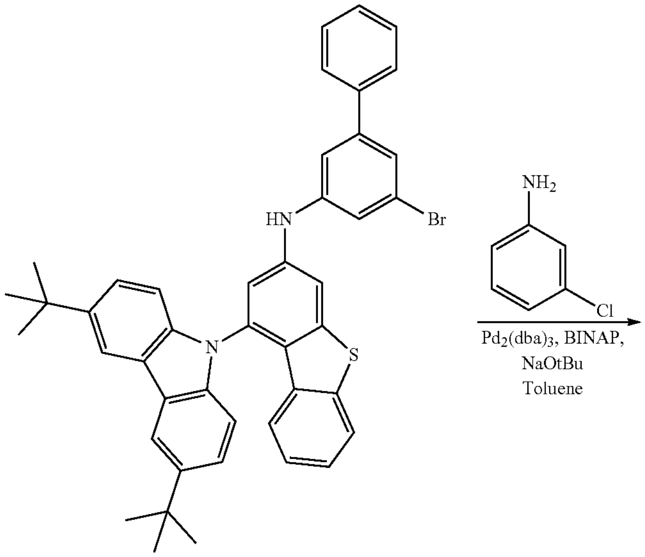
59-1

-continued
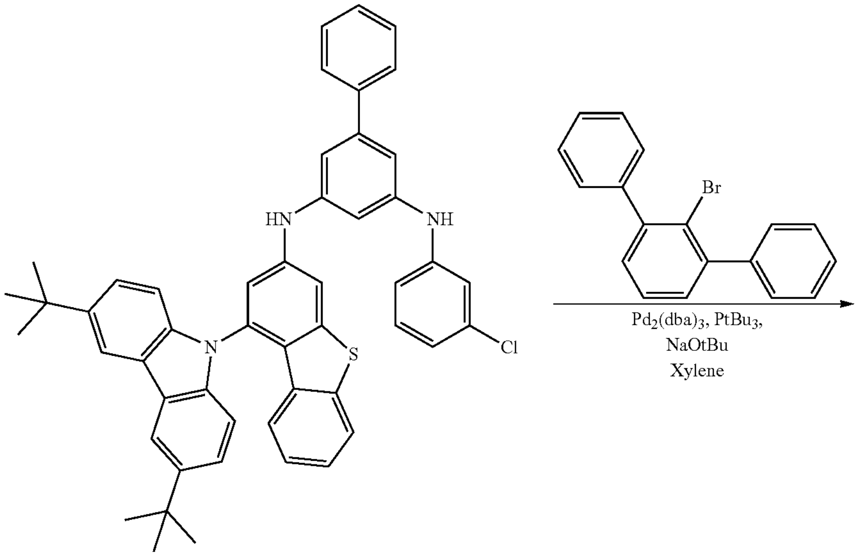
59-2
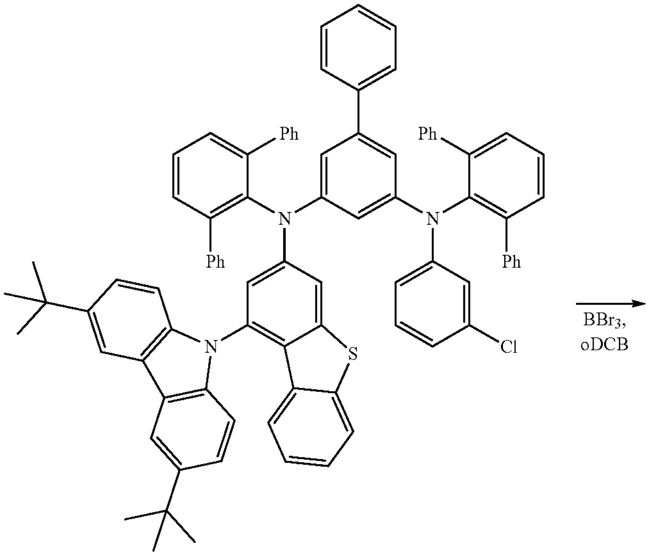
59-3

-continued

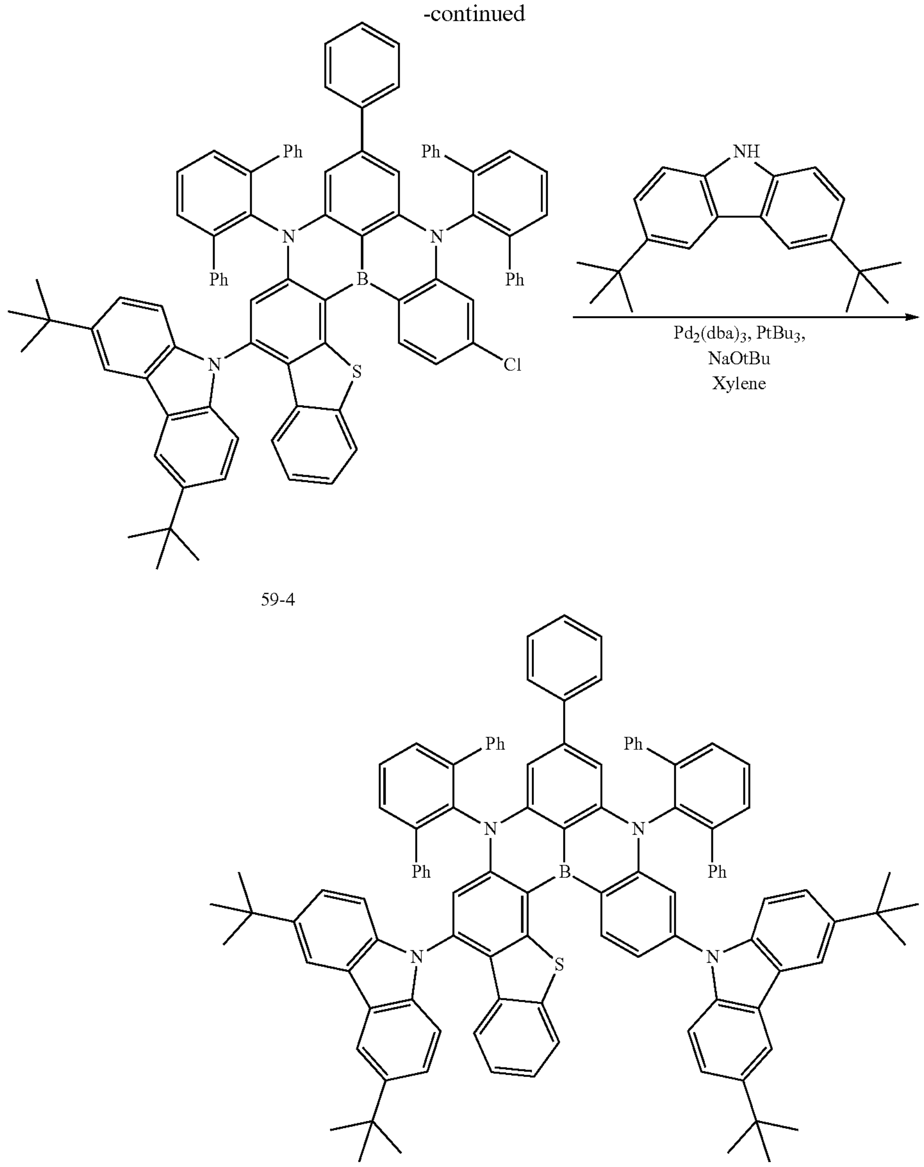

59-4

59

Synthesis of Intermediate 59-1

3,5-dibromo-1,1'-biphenyl (1 eq), 1-(3,6-di-tert-butyl-9H-carbazol-9-yl)dibenzo[b,d]thiophen-3-amine (0.8 eq), tris (dibenzylideneacetone)dipalladium(0) (0.05 eq), BINAP (0.1 eq), and sodium tert-butoxide (1.2 eq) were dissolved in toluene, followed by stirring under a nitrogen atmosphere at about 100 degrees centigrade for about 10 hours. After cooling, toluene was removed by drying under a reduced pressure. An organic layer obtained by washing with ethyl acetate and water three times each was dried with $MgSO_4$ and dried under a reduced pressure. Through separation by column chromatography and recrystallization (dichloromethane: n-hexane), Intermediate 59-1 was obtained (yield: 54%).

Synthesis of Intermediate 59-2

Intermediate 59-1 (1 eq), 3-chloroaniline (0.8 eq), tris (dibenzylideneacetone)dipalladium(0) (0.05 eq), BINAP (0.1 eq), and sodium tert-butoxide (1.0 eq) were dissolved in toluene, followed by stirring under a nitrogen atmosphere at about 100 degrees centigrade for about 10 hours. After cooling, toluene was removed by drying under a reduced pressure. An organic layer obtained by washing with ethyl acetate and water three times each was dried with $MgSO_4$ and dried under a reduced pressure. Through separation by column chromatography and recrystallization (dichloromethane: n-hexane), Intermediate 59-2 was obtained (yield: 64%).

Synthesis of Intermediate 59-3

Intermediate 59-2 (1 eq), 2'-bromo-1,1': 3',1"-terphenyl (8 eq), tri-tert-butylphosphine (0.2 eq), and sodium tert-butoxide (3 eq) were dissolved in o-xylene, followed by stirring under a nitrogen atmosphere at about 160 degrees centigrade for about 24 hours. After cooling, o-xylene was removed by drying under a reduced pressure. An organic layer obtained by washing with ethyl acetate and water three times each was dried with $MgSO_4$ and dried under a reduced pressure. Through separation by column chromatography and recrystallization (dichloromethane: n-hexane), Intermediate 59-3 was obtained (yield: 64%).

Synthesis of Intermediate 59-4

Intermediate 59-3 (1 eq) was dissolved in ortho dichlorobenzene, a flask was cooled to about 0 degrees centigrade under a nitrogen atmosphere, and $BI_3$ (1.5 eq) dissolved in ortho dichlorobenzene was slowly injected thereto. After finishing the dropwise addition, the temperature was raised to about 140 degrees centigrade, and stirring was performed for about 10 hours. After cooling to about 0 degrees, triethylamine was slowly added dropwise to the flask until heating stopped to finish the reaction. Hexane was added for precipitation, and the solid content was filtered and obtained. The solid content thus obtained was separated by silica filtration, and purified again by recrystallization with MC/Hex to obtain Intermediate 59-4. Final separation was performed through column chromatography (dichloromethane: n-hexane) (yield: 34%).

Synthesis of Compound 59

Intermediate 59-4 (1 eq), 9H-carbazole (2.2 eq), tris (dibenzylideneacetone)dipalladium(0) (0.1 eq), tri-tert-butylphosphine (0.2 eq), and sodium tert-butoxide (3 eq) were dissolved in o-xylene, followed by stirring under a nitrogen atmosphere at about 150 degrees centigrade for about 24 hours. After cooling, o-xylene was removed by drying under a reduced pressure. An organic layer obtained by washing with ethyl acetate and water three times each was dried with $MgSO_4$ and dried under a reduced pressure. Through separation by column chromatography and recrystallization (dichloromethane: n-hexane), Compound 59 was obtained. Final purification was performed through sublimation purification (yield after sublimation: 24%).

(4) Synthesis of Compound 99

Compound 99 according to an embodiment may be synthesized by, for example, the reaction below.

[Reaction 4]

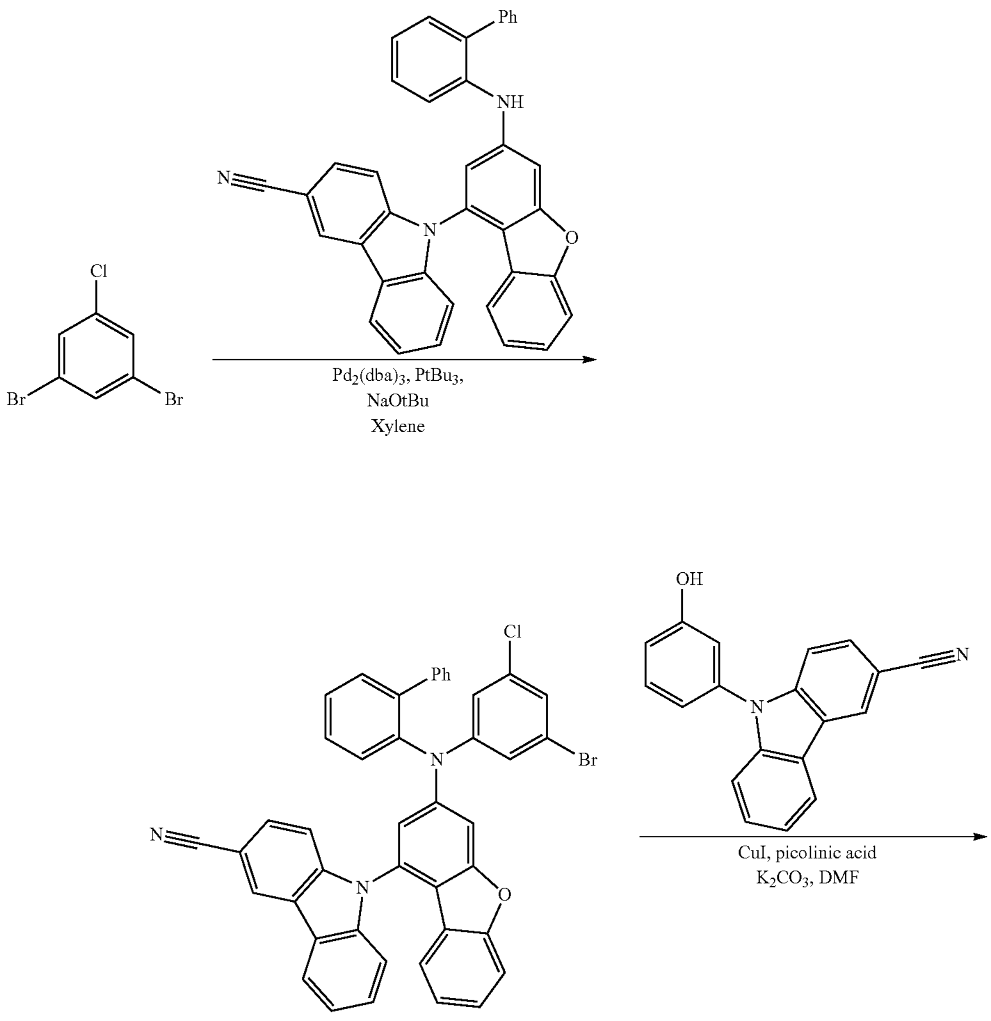

99-1

-continued

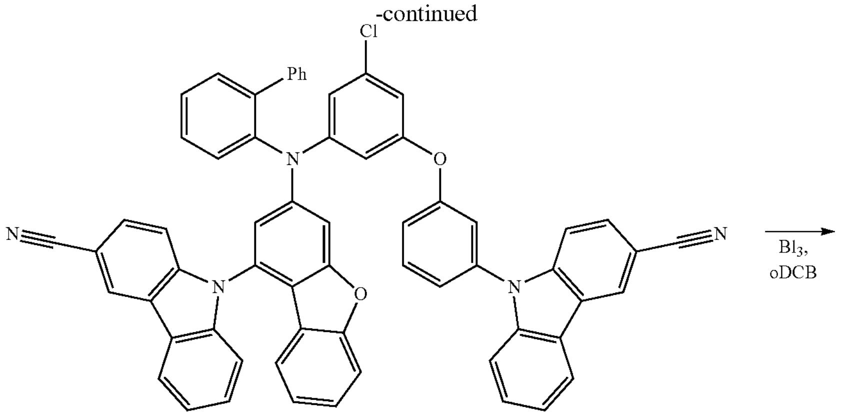

99-2

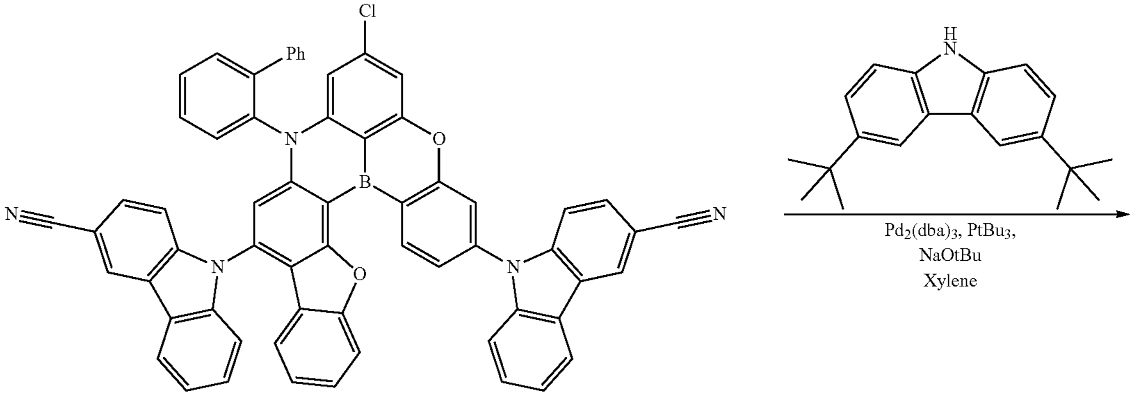

99-3

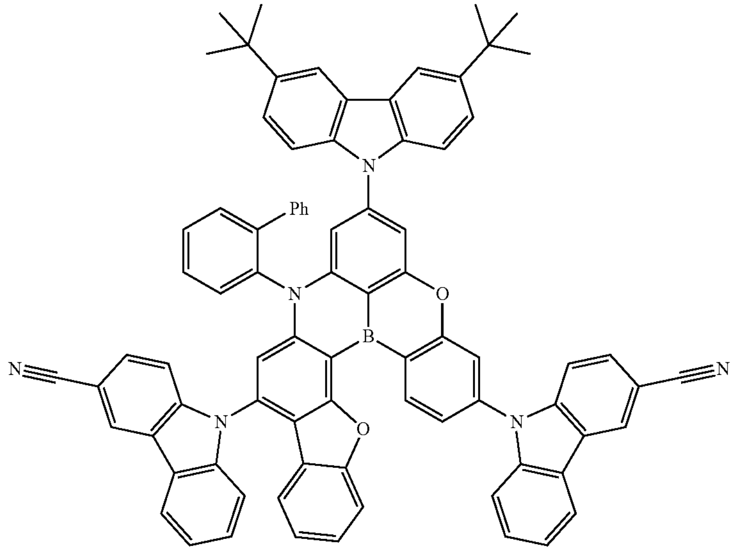

99

Synthesis of Intermediate 99-1

1,3-dibromo-5-chlorobenzene (1 eq), 9-(3-([1,1'-biphenyl]-2-(0.8 ylamino)dibenzo[b,d]furan-1-yl)-9H-carbazole-3-carbonitrile eq), tris(dibenzylideneacetone)dipalladium(0) (0.05 eq), BINAP (0.1 eq), and sodium tert-butoxide (1.2 eq) were dissolved in o-xylene, followed by stirring under a nitrogen atmosphere at about 100 degrees centigrade for about 10 hours. After cooling, o-xylene was removed by drying under a reduced pressure. An organic layer obtained by washing with ethyl acetate and water three times each was dried with $MgSO_4$ and dried under a reduced pressure. Through separation by column chromatography and recrystallization (dichloromethane: n-hexane), Intermediate 99-1 was obtained (yield: 63%).

Synthesis of Intermediate 99-2

Intermediate 99-1 (1 eq), 9-(3-hydroxyphenyl)-9H-carbazole-3-carbonitrile (1.5 eq), CuI (1 eq), picolinic acid (1 eq), and $K_2CO_3$ (2 eq) were dissolved in DMF, followed by stirring under a nitrogen atmosphere at about 160 degrees centigrade for about 20 hours. After cooling, DMF was removed by drying under a reduced pressure. An organic layer obtained by washing with ethyl acetate and water three times each was dried with $MgSO_4$ and dried under a reduced pressure. Through separation by column chromatography and recrystallization (dichloromethane: n-hexane), Intermediate 99-2 was obtained (yield: 57%).

Synthesis of Intermediate 99-3

Intermediate 99-2 (1 eq) was dissolved in ortho dichlorobenzene, a flask was cooled to about 0 degrees centigrade under a nitrogen atmosphere, and $BI_3$ (1.5 eq) dissolved in ortho dichlorobenzene was slowly injected thereto. After finishing the dropwise addition, the temperature was raised to about 140 degrees centigrade, and stirring was performed for about 10 hours. After cooling to about 0 degrees, triethylamine was slowly added dropwise to the flask until heating stopped to finish the reaction. Hexane was added for precipitation, and the solid content was filtered and obtained. The solid content thus obtained was separated by silica filtration, and purified again by recrystallization with MC/Hex to obtain Intermediate 99-3. Final separation was performed through column chromatography (dichloromethane: n-hexane) (yield: 41%).

Synthesis of Compound 99

Intermediate 99-3 (1 eq), 3,6-di-tert-butyl-9H-carbazole (1.2 eq), tris(dibenzylideneacetone)dipalladium(0) (0.05 eq), tri-tert-butylphosphine (0.1 eq), and sodium tert-butoxide (2 eq) were dissolved in o-xylene, followed by stirring under a nitrogen atmosphere at about 150 degrees centigrade for about 24 hours. After cooling, o-xylene was removed by drying under a reduced pressure. An organic layer obtained by washing with ethyl acetate and water three times each was dried with $MgSO_4$ and dried under a reduced pressure. Through separation by column chromatography and recrystallization (dichloromethane: n-hexane), Compound 99 was obtained. Final purification was performed through sublimation purification (yield after sublimation: 18%).

(5) Synthesis of Compound 115

Compound 115 according to an embodiment may be synthesized by, for example, the reaction below.

[Reaction 5]

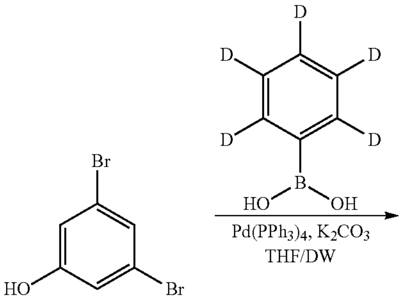

-continued

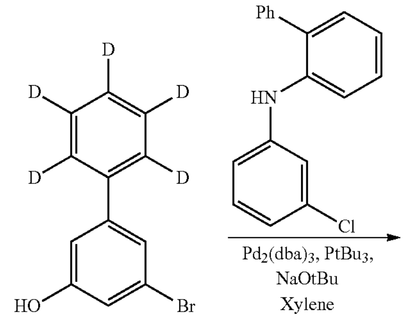

115-1

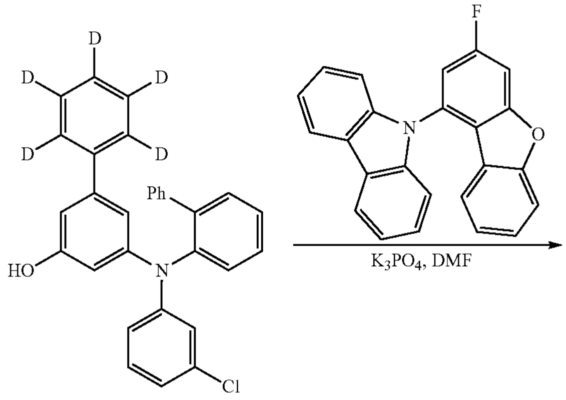

115-2

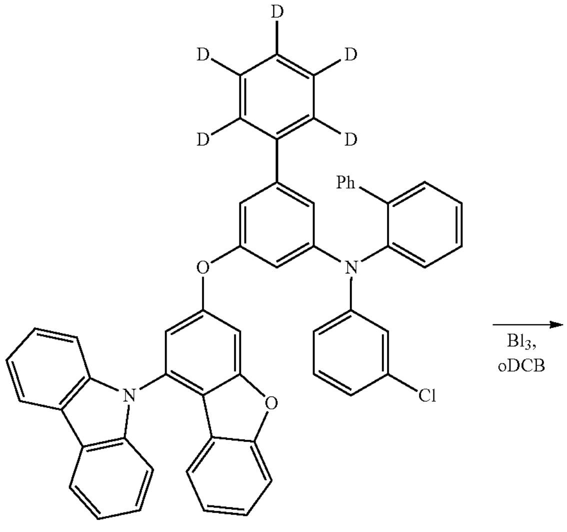

115-3

-continued

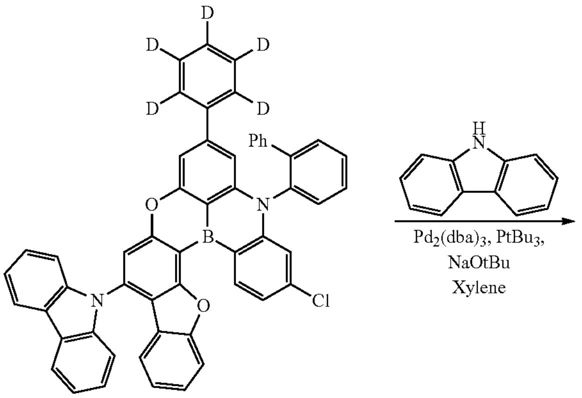

115-4

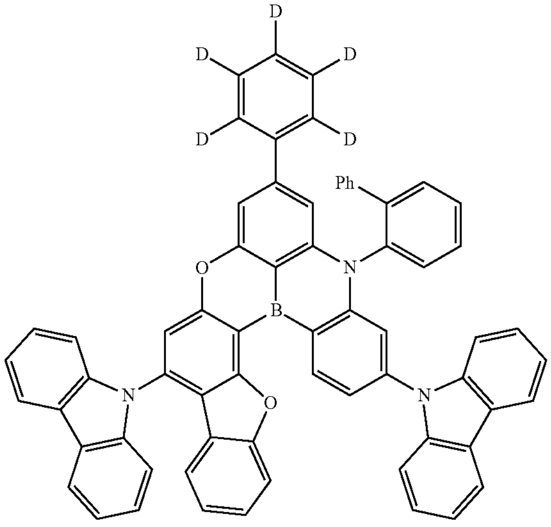

115

Synthesis of Intermediate 115-1

3,5-dibromophenol (1 eq), (phenyl-d5) boronic acid (1 eq), $Pd(PPh_3)_4$ (0.05 eq), and $K_2CO_3$ (2 eq) were dissolved in THF/DW, followed by stirring at about 80 degrees centigrade for about 20 hours. After cooling, an organic layer obtained by washing with ethyl acetate and water three times each was dried with $MgSO_4$ and dried under a reduced pressure. Through separation by column chromatography and recrystallization (dichloromethane: n-hexane), Intermediate 115-1 was obtained (yield: 57%).

<Synthesis of Intermediate 115-2>!

Intermediate 115-1 (1 eq), N-(3-chlorophenyl)-[1,1'-biphenyl]-2-amine (1 eq), tris(dibenzylideneacetone)dipalladium(0) (0.05 eq), tri-tert-butylphosphine (0.1 eq), and sodium tert-butoxide (2 eq) were dissolved in o-xylene, followed by stirring under a nitrogen atmosphere at about 110 degrees centigrade for about 24 hours. After cooling, o-xylene was removed by drying under a reduced pressure. An organic layer obtained by washing with ethyl acetate and water three times each was dried with $MgSO_4$ and dried under a reduced pressure. Through separation by column chromatography and recrystallization (dichloromethane: n-hexane), Intermediate 115-2 was obtained (yield: 72%).

Synthesis of Intermediate 115-3

Intermediate 115-2 (1 eq), 9-(3-fluorodibenzo[b,d]furan-1-yl)-9H-carbazole (1 eq), and $K_3PO_4$ (3 eq) were dissolved in DMF, followed by stirring under a nitrogen atmosphere at about 180 degrees centigrade for about 20 hours. After cooling, DMF was removed by drying under a reduced pressure. An organic layer obtained by washing with ethyl acetate and water three times each was dried with $MgSO_4$ and dried under a reduced pressure. Through separation by column chromatography and recrystallization (dichloromethane: n-hexane), Intermediate 115-3 was obtained (yield: 61%).

Synthesis of Intermediate 115-4

Intermediate 115-3 (1 eq) was dissolved in ortho dichlorobenzene, a flask was cooled to about 0 degrees centigrade under a nitrogen atmosphere, and $BI_3$ (1.5 eq) dissolved in ortho dichlorobenzene was slowly injected thereto. After finishing the dropwise addition, the temperature was raised to about 140 degrees centigrade, and stirring was performed for about 10 hours. After cooling to about 0 degrees, triethylamine was slowly added dropwise to the flask until heating stopped to finish the reaction. Hexane was added for precipitation, and the solid content was filtered and obtained. The solid content thus obtained was separated by silica filtration, and purified again by recrystallization with MC/Hex to obtain Intermediate 115-4. Final separation was performed through column chromatography (dichloromethane: n-hexane) (yield: 38%).

Synthesis of Compound 115

Intermediate 115-4 (1 eq), 9H-carbazole (1.2 tris(dibenzylideneacetone)dipalladium(0) (0.05 eq), tri-tert-butylphosphine (0.1 eq), and sodium tert-butoxide (2 eq) were dissolved in o-xylene, followed by stirring under a nitrogen atmosphere at about 150 degrees centigrade for about 24 hours. After cooling, o-xylene was removed by drying under a reduced pressure. An organic layer obtained by washing with ethyl acetate and water three times each was dried with $MgSO_4$ and dried under a reduced pressure. Through separation by column chromatography and recrystallization (dichloromethane: n-hexane), Compound 115 was obtained. Final purification was performed through sublimation purification (yield after sublimation: 43%).

(6) Synthesis of Compound 152
Compound 152 according to an embodiment may be synthesized by, for example, the reaction below.
[Reaction 6]
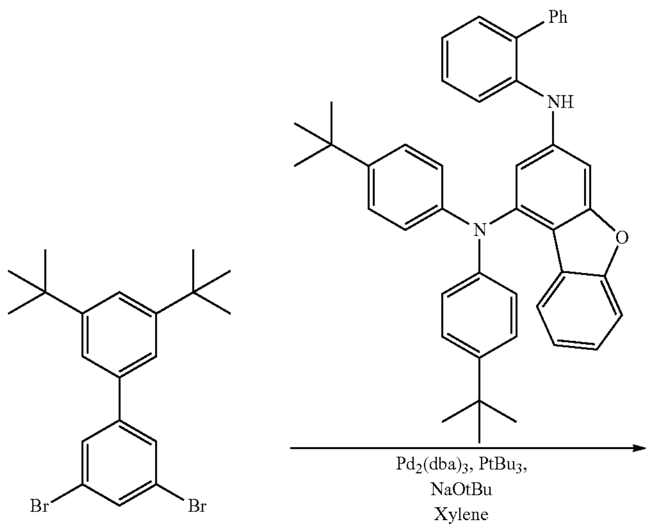
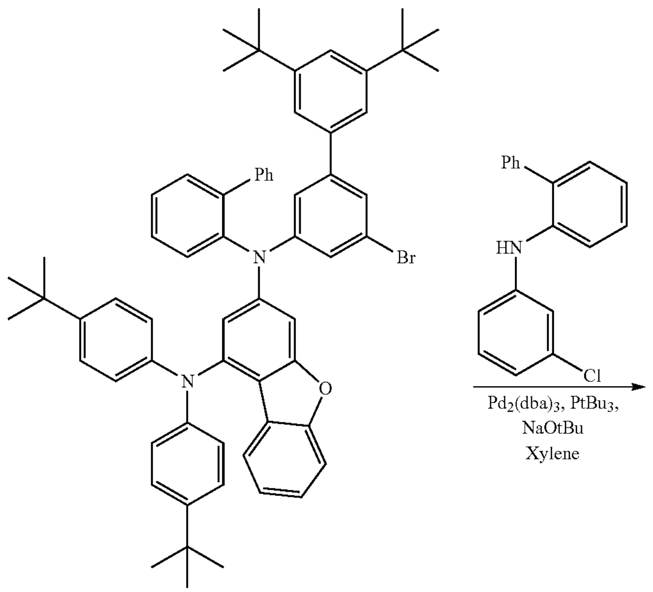
152-1

-continued
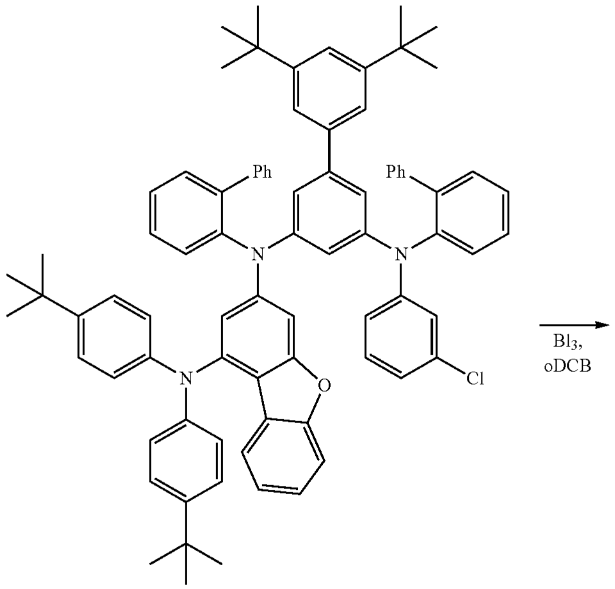
152-2
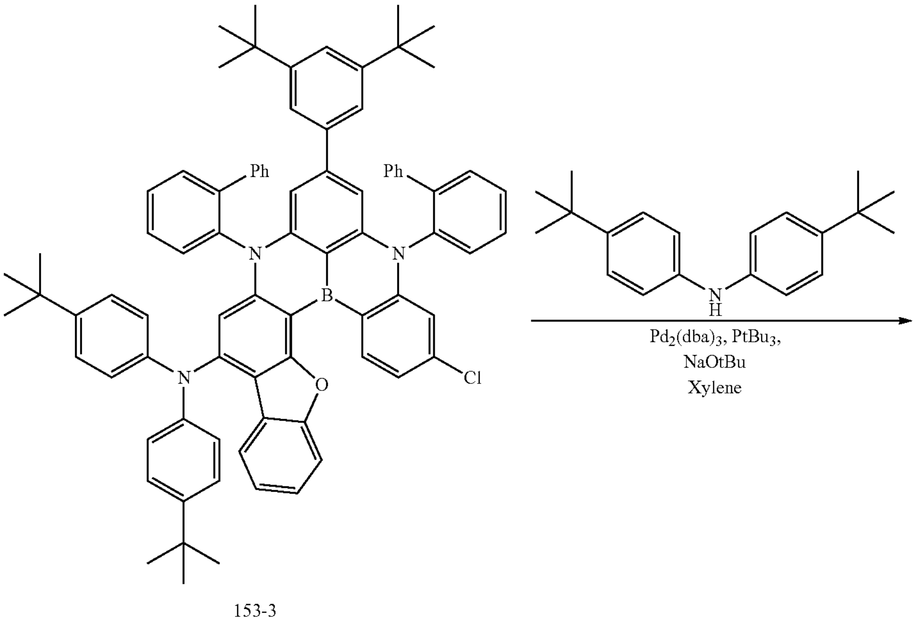
153-3

-continued

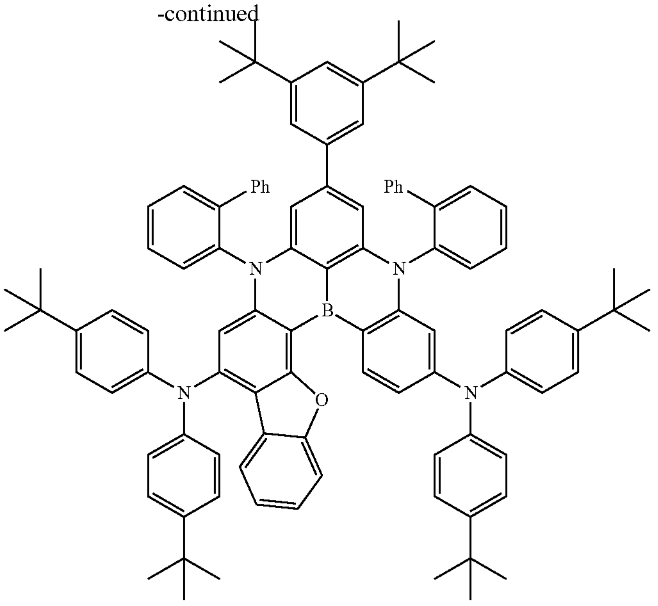

152

Synthesis of Intermediate 152-1

3,5-dibromo-3',5'-di-tert-butyl-1,1'-biphenyl (1 eq), $N^3$—([1,1'-biphenyl]-2-yl)-$N^1$,$N^1$-bis(4-(tert-butyl)phenyl) dibenzo[b,d]furan-1,3-diamine (1 eq), tris(dibenzylideneacetone)dipalladium(0) (0.05 eq), BINAP (0.05 eq), and sodium tert-butoxide (1.2 eq) were dissolved in o-xylene, followed by stirring at about 100 degrees centigrade for about 24 hours. After cooling, o-xylene was removed by drying under a reduced pressure. An organic layer obtained by washing with ethyl acetate and water three times each was dried with $MgSO_4$ and dried under a reduced pressure. Through separation by column chromatography and recrystallization (dichloromethane: n-hexane), Intermediate 152-1 was obtained (yield: 67%).

Synthesis of Intermediate 152-2

Intermediate 152-1 (1 eq), N-(3-chlorophenyl)-[1,1'-biphenyl]-2-amine (1 eq), tris(dibenzylideneacetone)dipalladium(0) (0.05 eq), tri-tert-butylphosphine (0.1 eq), and sodium tert-butoxide (1.2 eq) were dissolved in o-xylene, followed by stirring under a nitrogen atmosphere at about 110 degrees centigrade for about 20 hours. After cooling, o-xylene was removed by drying under a reduced pressure. An organic layer obtained by washing with ethyl acetate and water three times each was dried with $MgSO_4$ and dried under a reduced pressure. Through separation by column chromatography and recrystallization (dichloromethane: n-hexane), Intermediate 152-2 was obtained (yield: 63%).

Synthesis of Intermediate 152-3

Intermediate 152-2 (1 eq) was dissolved in ortho dichlorobenzene, a flask was cooled to about 0 degrees centigrade under a nitrogen atmosphere, and $BI_3$ (1.5 eq) dissolved in ortho dichlorobenzene was slowly injected thereto. After finishing the dropwise addition, the temperature was raised to about 140 degrees centigrade, and stirring was performed for about 10 hours. After cooling to about 0 degrees, triethylamine was slowly added dropwise to the flask until heating stopped to finish the reaction. Hexane was added for precipitation, and the solid content was filtered and obtained. The solid content thus obtained was separated by silica filtration, and purified again by recrystallization with MC/Hex to obtain Intermediate 152-3. Final separation was performed through column chromatography (dichloromethane: n-hexane) (yield: 57%).

Synthesis of Compound 152

Intermediate 152-3 (1 eq), bis(4-(tert-butyl)phenyl)amine (1.2 eq), tris(dibenzylideneacetone)dipalladium(0) (0.05 eq), tri-tert-butylphosphine (0.1 eq), and sodium tert-butoxide (1.5 eq) were dissolved in o-xylene, followed by stirring under a nitrogen atmosphere at about 150 degrees centigrade for about 24 hours. After cooling, o-xylene was removed by drying under a reduced pressure. An organic layer obtained by washing with ethyl acetate and water three times each was dried with $MgSO_4$ and dried under a reduced pressure. Through separation by column chromatography and recrystallization (dichloromethane: n-hexane), Compound 152 was obtained. Final purification was performed through sublimation purification (yield after sublimation: 34%).

2. Confirmation of Fused Polycyclic Compound

The molecular weights and NMR analysis results of the synthesized fused polycyclic compounds are shown in Table 1.

TABLE 1

| Compound | H NMR (δ) | Calc. | Found |
|---|---|---|---|
| 1 | 9.12 (1H, d), 8.19 (1H, d), 7.82 (2H, d), 7.75 (2H, d), 7.62-7.43 (12H, m), 7.38-7.12 (16H, m), 6.81-6.63 (13H, m), 6.54, (2H, d) | 1068.40 | 1069.20 |
| 37 | 9.23 (1H, d), 8.09 (1H, d), 7.93 (2H, d), 7.85 (2H, d), 7.71 (2H, d), 7.63-7.52 (13H, m), 7.48-7.28 (14H, m), 7.08-6.71 (15H, m), 6.44, (2H, d) | 1157.43 | 1158.36 |
| 59 | 9.09 (1H, d), 8.21 (1H, d), 7.72 (2H, s), 7.65 (2H, s), 7.52-7.37 (14H, m), 7.28-7.02 (18H, m), 6.91-6.63 (13H, m), 6.62, (2H, d), 1.43 (18H, s), 1.35 (18H, s) | 1460.69 | 1461.71 |
| 99 | 9.05 (1H, d), 8.21 (1H, d), 8.10 (2H, s), 7.85 (2H, d), 7.79 (2H, s), 7.67-7.51 (9H, m), 7.42-7.22 (10H, m), 6.91-6.73 (10H, m), 6.47 (1H, d), 6.34 (1H, s), 1.37 (18H, s) | 1168.46 | 1169.38 |
| 115 | 9.17 (1H, d), 8.11 (1H, d), 7.92 (2H, d), 7.78 (2H, d), 7.63-7.44 (8H, m), 7.39-7.11 (9H, m), 6.84-6.63 (10H, m), 6.65 (1H, d), 6.51 (1H, d) | 922.35 | 923.22 |
| 152 | 9.26 (1H, d), 8.09 (1H, d), 7.82-7.64 (13H, m), 7.48-7.23 (16H, m), 6.99-6.73 (14H, m), 6.61 (1H, d), 6.45 (1H, d), 1.45 (18H, s), 1.42 (18H, s), 1.37 (18H, s) | 1408.81 | 1409.57 |

3. Manufacture and Evaluation of Organic Electroluminescence Device Including Fused Polycyclic Compound Organic electroluminescence devices of embodiments including Example Compounds and Comparative Compounds below in an emission layer were manufactured by a method below.

(Example Compound)

1

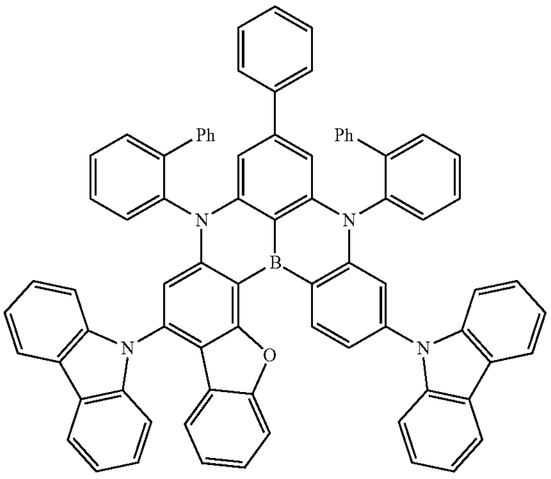

-continued

37

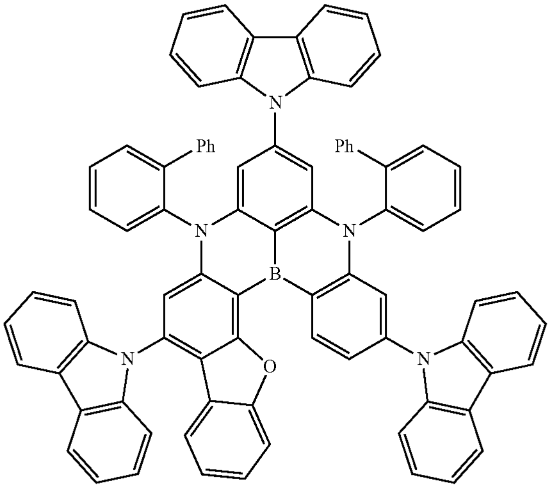

59

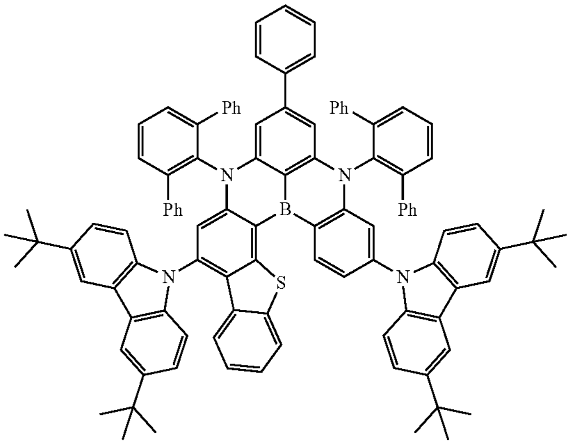

-continued

99

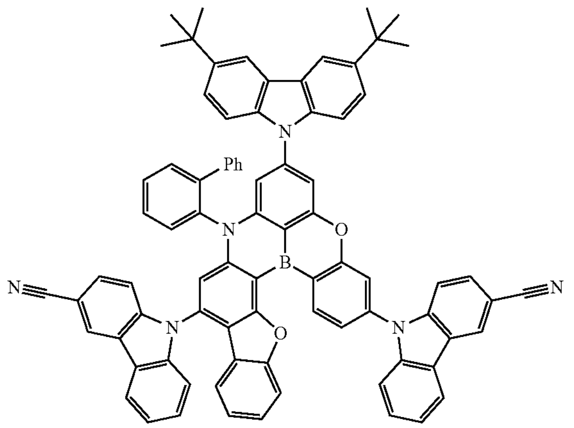

115

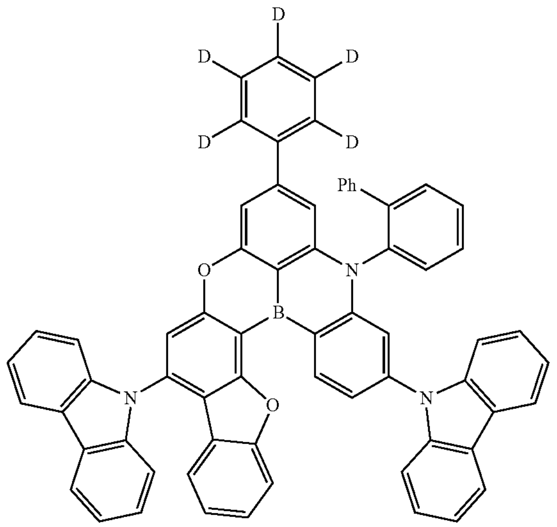

152

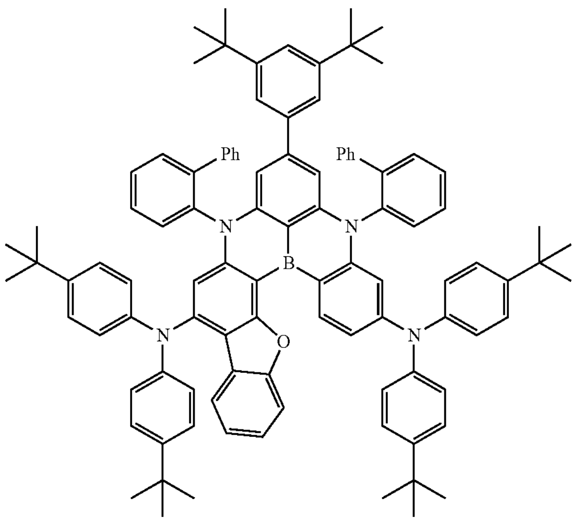

-continued (Comparative Compound)

C-1

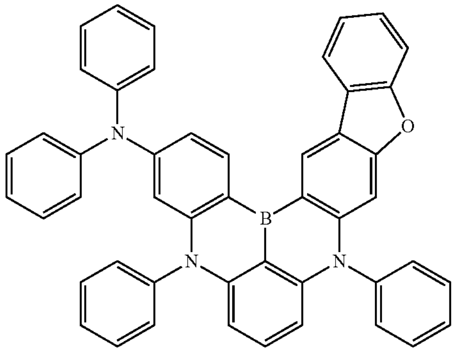

C-2

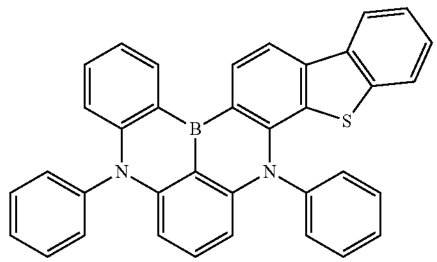

C-3

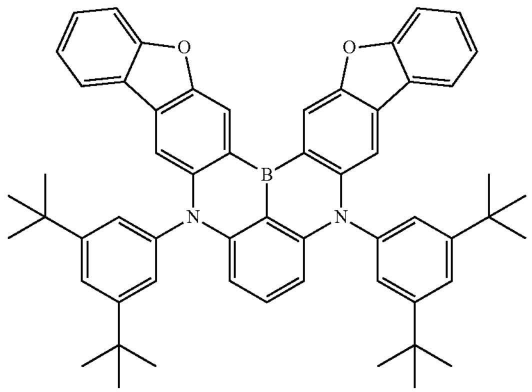

Manufacture of Organic Electroluminescence Device

In order to form a first electrode, an ITO glass substrate with about 15 (2/cm$^2$ (1200 Å) of Corning Co. was cut into a size of 50 mm×50 mm×0.7 mm, washed with ultrasonic waves using isopropyl alcohol and pure water for about five minutes for each, exposed to ultraviolet rays for about 30 minutes, and cleansed by exposing to ozone. The glass substrate was installed on a vacuum deposition apparatus.

On the glass substrate, NPD was vacuum deposited to a thickness of about 300 Å to form a hole injection layer, and the compound according to Table 1 was vacuum deposited on the hole injection layer to a thickness of about 200 Å to form a hole transport layer. On the hole transport layer, CzSi was vacuum deposited to a thickness of about 100 Å.

On the layer, mCP and an Example Compound according to Table 1 or a Comparative Compound were deposited simultaneously in a weight ratio of 99:1 to form an emission layer having a thickness of about 200 Å.

TSPO1 was vacuum deposited to a thickness of about 200 Å to form an electron transport layer, and TPBi was vacuum deposited to a thickness of about 300 Å to form an electron injection layer.

On the electron transport layer, an alkali metal halide of LiF was deposited to a thickness of about 10 Å, and Al was vacuum deposited to a thickness of about 3,000 Å to form a LiF/Al second electrode to manufacture an organic electroluminescence device.

The compounds used for the manufacture of the organic electroluminescence device are shown below.

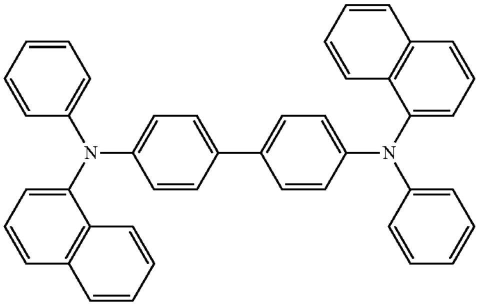

NPD

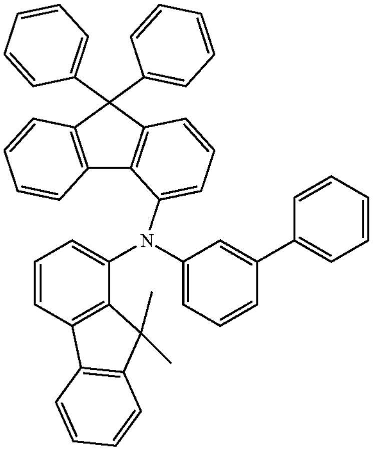

H-1-3

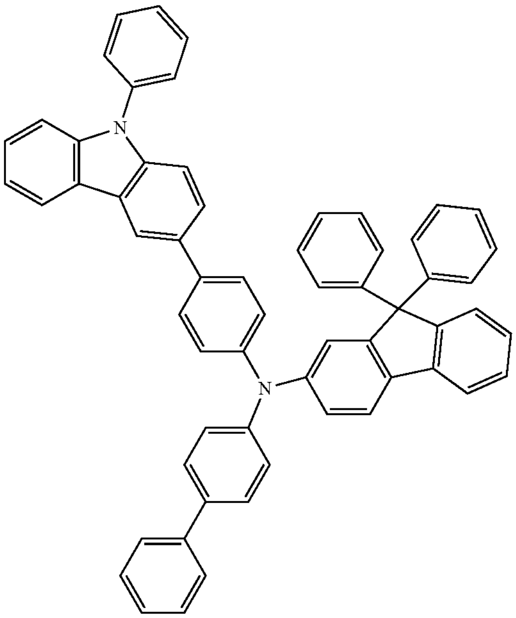

H-1-19

-continued

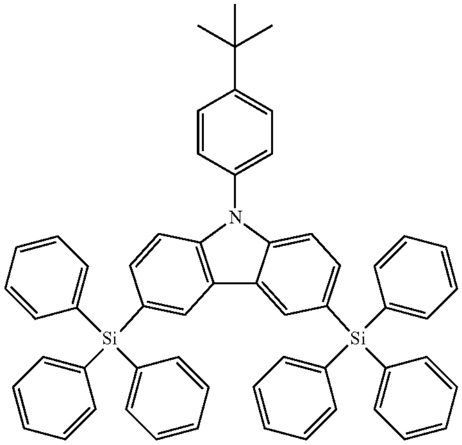

CzSi

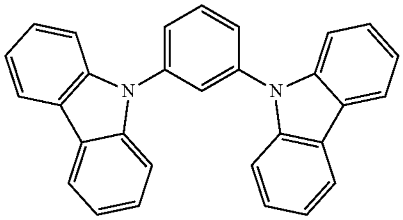

mCP

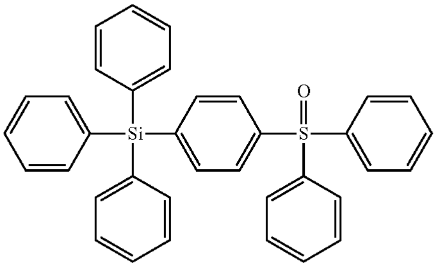

TSPO1

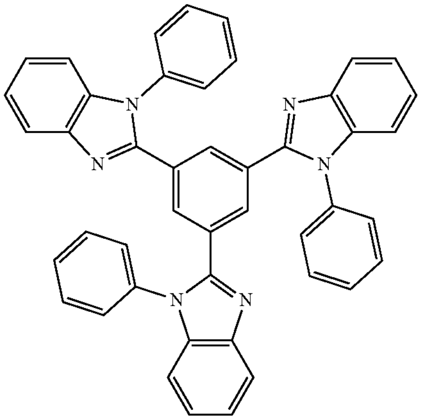

TPBI

Evaluation of Properties of Organic Electroluminescence Device

In Table 2, simulation results on the Example Compounds are shown. The simulation was performed by setting an mCP compound as a matrix, and each of the Example Compounds and Comparative Compounds was compared.

In Table 3, the evaluation results on the organic electroluminescence devices of Example 1 to Example 6, and Comparative Example 1 to Comparative Example 3 are shown.

In the evaluation results on the properties of the Examples and Comparative Examples, shown in Table 3, a driving voltage at a current density of about 10 mA/$cm^2$ and emission efficiency were measured. The maximum external quantum efficiency (EQE) was calculated by a method of internal quantum efficiency x charge balance x out-coupling efficiency. The charge balance is a value according to the electron hole injection properties of an organic electroluminescence device, and 1 is the maximum. The out-coupling efficiency means a refractive index and involves the degree of orientation. Accordingly, the EQE shows the maximum of about 25% by a method of measuring the maximum percent of light emitted by flowing a current, and sometimes, shows up to about 30% due to the effects like the out-coupling efficiency in literatures.

TABLE 2

| | OSC (f) | IQE (%) |
|---|---|---|
| Example 1 | 0.3463 | 91.26 |
| Example 2 | 0.3619 | 94.38 |
| Example 3 | 0.3755 | 97.11 |
| Example 4 | 0.3599 | 93.99 |
| Example 5 | 0.3444 | 90.87 |
| Example 6 | 0.3658 | 95.16 |
| Comparative Example 1 | 0.2449 | 70.98 |
| Comparative Example 2 | 0.2079 | 63.57 |
| Comparative Example 3 | 0.2313 | 68.25 |

TABLE 3

| | Hole transport layer material | Dopant in emission layer | Driving voltage (V) | Emission efficiency (cd/A) | EQE (%) | Emission color |
|---|---|---|---|---|---|---|
| Example 1 | H-1-19 | Compound 1 | 4.7 | 24.8 | 23.4 | Blue |
| Example 2 | H-1-3 | Compound 37 | 4.6 | 26.3 | 24.2 | Blue |
| Example 3 | H-1-3 | Compound 59 | 4.5 | 26.9 | 24.9 | Blue |
| Example 4 | H-1-3 | Compound 99 | 4.7 | 25.2 | 24.1 | Blue |
| Example 5 | H-1-19 | Compound 115 | 4.8 | 24.5 | 23.3 | Blue |
| Example 6 | H-1-3 | Compound 152 | 4.6 | 25.6 | 24.4 | Blue |
| Comparative Example 1 | H-1-3 | C-1 | 5.4 | 19.8 | 18.2 | Blue |
| Comparative Example 2 | H-1-3 | C-2 | 5.6 | 17.6 | 16.3 | Blue |
| Comparative Example 3 | H-1-19 | C-3 | 5.5 | 18.7 | 17.5 | Blue |

Referring to the results of Table 2, it could be confirmed that Examples 1 to 6 showed higher oscillator strength constants (OSC, f) when compared to Comparative Examples 1 to 3. All of Examples 1 to 6 showed internal quantum efficiency (IQE, %) of about 90% or more, which was higher than that of Comparative Examples 1 to 6.

Referring to the results of Table 3, in the case of the Examples of the organic electroluminescence devices using the fused polycyclic compounds according to embodiments as light-emitting materials, it could be found that a lower driving voltage value, a relatively lower driving voltage and higher emission efficiency were shown when compared to the Comparative Examples.

The fused polycyclic compound according to an embodiment includes a heterocyclic compound fused at a specific position with respect to boron and may provide light absorbance and reinforce multiple resonance effects. Accordingly, a difference (AEST) between the lowest triplet excitation energy level (T1 level) and the lowest singlet excitation energy level (S1 level) is relatively reduced, the reversed intersystem crossing from the lowest triplet excitation energy level to the lowest singlet excitation energy level occurs more readily, and the efficiency of the organic electroluminescence devices of the Examples may increase. The fused polycyclic compound according to an embodiment additionally includes a functional group at a para position to boron, and a HOMO orbital and a LUMO orbital may be distributed in order, "short range CT" phenomenon by which the overlap between the HOMO orbital and the LUMO orbital increases may be further reinforced, and a high oscillator strength constant (f) value may be achieved. The oscillator strength of the fused polycyclic compound according to an embodiment may be reduced due to the additional fusion, and a high oscillator strength constant (f) value may be achieved.

Since the fused polycyclic compound becomes bulky, the twist of a whole molecule may be further reinforced. Accordingly, the organic electroluminescence devices of embodiments may show excellent light-emitting properties.

When compared to the fused polycyclic compound of an embodiment, Comparative Compound C-1 and Comparative Compound C-2 have different fused positions of fused heterocyclic compounds. When compared to the fused polycyclic compound of an embodiment, Comparative Compound C-3 has different fused positions of fused heterocyclic compounds, and the heterocyclic compounds are symmetrically fused. The Comparative Compounds include a fused compound at the para position to boron, and the additional introduction of a donor functional group to the para position to boron is impossible, a LUMO orbital becomes distributed, a HOMO orbital and a LUMO orbital are not distributed in order, and the short range DT properties are deteriorated. Accordingly, it could be confirmed that the Comparative Examples may show a high voltage and low efficiency when compared to the Examples.

The organic electroluminescence device of an embodiment includes the fused polycyclic compound of an embodiment and may show an improved driving voltage and emission efficiency. The organic electroluminescence device of an embodiment includes the fused polycyclic compound of an embodiment as a light-emitting material, and may accomplish a low driving voltage and high emission efficiency in a blue light wavelength region.

The organic electroluminescence device of an embodiment may show improved device characteristics of a low driving voltage and high efficiency.

The fused polycyclic compound of an embodiment may be used as a material of an emission layer of an organic electroluminescence device and by using the same, the efficiency of the organic electroluminescence device may be improved.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

The invention claimed is:

1. An organic electroluminescence device, comprising:

a first electrode;

a second electrode facing the first electrode; and a plurality of organic layers disposed between the first electrode and the second electrode, wherein the plurality of organic layers comprise:

at least one organic layer comprising a fused polycyclic compound represented by Formula 1, and at least one organic layer comprising an amine compound represented by Formula H-1:

[Formula 1]

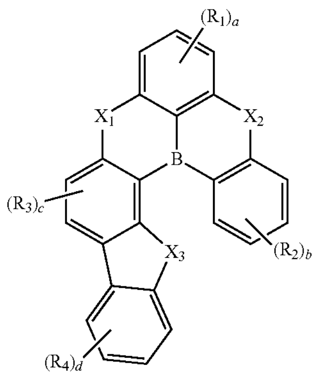

wherein in Formula 1, $X_1$ and $X_2$ are each independently $N(R_5)$, O, S, or Se, $X_3$ is O or S, $R_1$, $R_2$ and $R_4$ are each independently a hydrogen atom, a deuterium atom, a halogen atom, a cyano group, a trifluoromethyl group, a substituted or unsubstituted silyl group, a substituted or unsubstituted amino group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, $R_3$ is a substituted amino group or a substituted or unsubstituted heteroaryl group of 2 to 60 ring-forming carbon atoms, $R_5$ is a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, a is an integer from 0 to 3, b and d are each independently an integer from 0 to 4, and c is an integer from 1 to 2,

[Formula H-1]

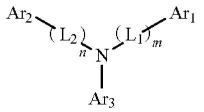

wherein in Formula H-1, $L_1$ and $L_2$ are each independently a direct linkage, a substituted or unsubstituted arylene group of 6 to 30 ring-forming carbon atoms, or a substituted or unsubstituted heteroarylene group of 2 to 30 ring-forming carbon atoms, m and n are each independently an integer from 0 to 10, $Ar_1$ and $Ar_2$ are each independently a substituted or unsubstituted aryl group of 6 to 30 ring-forming carbon atoms, or a substituted or unsubstituted heteroaryl group of 2 to 30 ring-forming carbon atoms, and $Ar_3$ is a substituted or unsubstituted aryl group of 6 to 30 ring-forming carbon atoms, and wherein a maximum external quantum efficiency is equal to or greater than about 20%.

2. The organic electroluminescence device of claim 1, wherein the plurality of organic layers comprises:

a hole transport region disposed on the first electrode;

an emission layer disposed on the hole transport region; and an electron transport region disposed on the emission layer, and the emission layer comprises the fused polycyclic compound represented by Formula 1.

3. The organic electroluminescence device of claim 2, wherein the emission layer emits delayed fluorescence.

4. The organic electroluminescence device of claim 2, wherein the emission layer is a delayed fluorescence emission layer comprising a first compound and a second compound, and the first compound comprises the fused polycyclic compound represented by Formula 1.

5. The organic electroluminescence device of claim 2, wherein the hole transport region comprises:

a hole injection layer disposed on the first electrode;

a hole transport layer disposed on the hole injection layer; and an electron blocking layer disposed on the hole transport layer, and at least one of the hole injection layer, the hole transport layer, and the electron blocking layer comprises the amine compound represented by Formula H-1.

6. The organic electroluminescence device of claim 1, further comprising a capping layer disposed on the second electrode, wherein the capping layer has a refractive index equal to or greater than about 1.6.

7. The organic electroluminescence device of claim 1, wherein the fused polycyclic compound represented by Formula 1 is represented by Formula 2-1 or Formula 2-2:

[Formula 2-1]

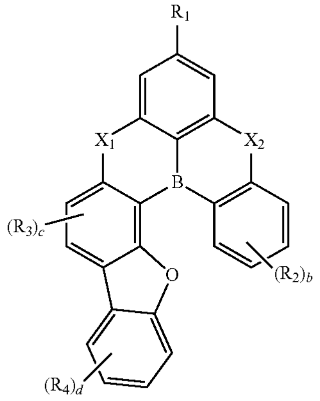

[Formula 2-2]

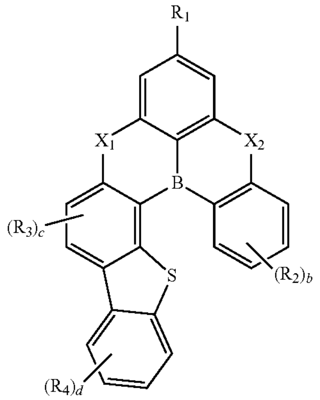

wherein in Formula 2-1 and Formula 2-2, $R_1$ is a deuterium atom, a halogen atom, a cyano group, a trifluoromethyl group, a substituted or unsubstituted silyl group, a substituted or unsubstituted amino group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, and $X_1$, $X_2$, $R_2$ to $R_4$, and b to d are the same as defined in Formula 1.

8. The organic electroluminescence device of claim 1, wherein the fused polycyclic compound represented by Formula 1 is represented by Formula 3-1 or Formula 3-2:

[Formula 3-1]

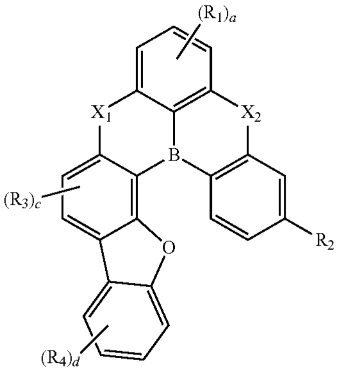

-continued

[Formula 3-2]

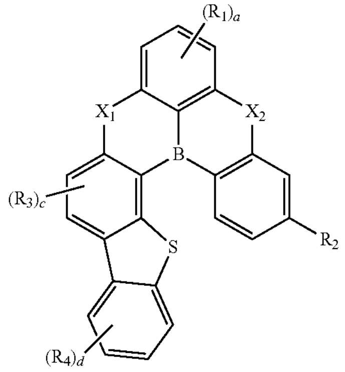

wherein in Formula 3-1 and Formula 3-2, $R_2$ is a deuterium atom, a halogen atom, a cyano group, a trifluoromethyl group, a substituted or unsubstituted silyl group, a substituted or unsubstituted amino group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, and $X_1$, $X_2$, $R_1$, $R_3$, $R_4$, a, c, and d are the same as defined in Formula 1.

9. The organic electroluminescence device of claim 1, wherein the fused polycyclic compound represented by Formula 1 is represented by Formula 4-1 or Formula 4-2:

[Formula 4-1]

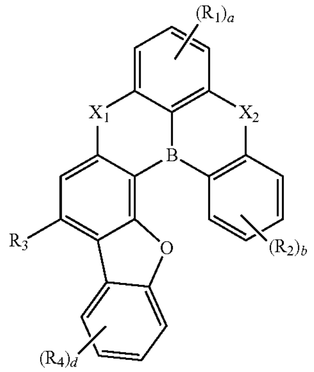

[Formula 4-2]

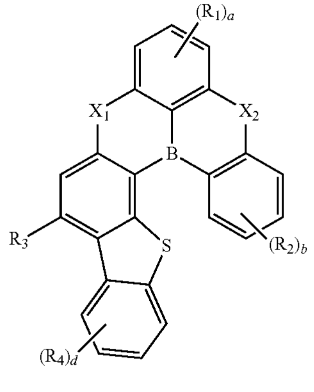

wherein in Formula 4-1 and Formula 4-2, $R_3$ is a substituted amino group or a substituted or unsubstituted heteroaryl group of 2 to 60 ring-forming carbon atoms, and $X_1$, $X_2$, $R_1$, $R_2$, $R_4$, a, b, and d are as defined in Formula 1.

10. The organic electroluminescence device of claim 1, wherein the fused polycyclic compound represented by Formula 1 is represented by Formula 5-1 or Formula 5-2:

[Formula 5-1]

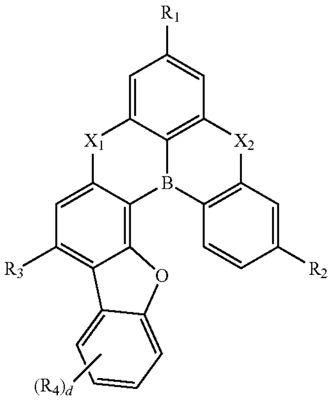

[Formula 5-2]

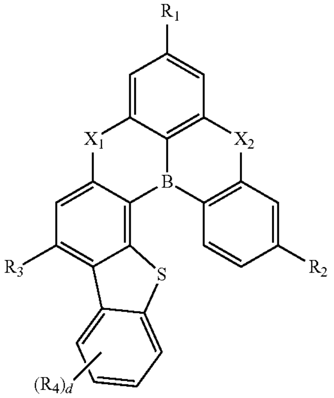

wherein in Formula 5-1 and Formula 5-2, $R_1$ and $R_2$ are each independently a deuterium atom, a halogen atom, a cyano group, a trifluoromethyl group, a substituted or unsubstituted silyl group, a substituted or unsubstituted amino group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, $R_3$ is a substituted amino group or a substituted or unsubstituted heteroaryl group of 2 to 60 ring-forming carbon atoms, and $X_1$, $X_2$, $R_4$, and d are as defined in Formula 1.

11. The organic electroluminescence device of claim 1, wherein $R_4$ is a hydrogen atom, and at least one of $R_1$ to $R_3$ is an arylamine group or a substituted or unsubstituted carbazole group.

12. The organic electroluminescence device of claim 1, wherein b and c are each 1, and $R_2$ and $R_3$ are the same.

13. The organic electroluminescence device of claim 1, wherein the fused polycyclic compound represented by Formula 1 is at least one selected from Compound Group 1:

[Compound Group 1]

1

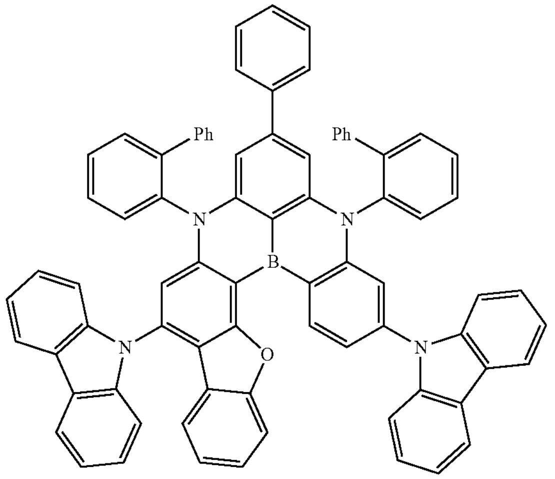

2

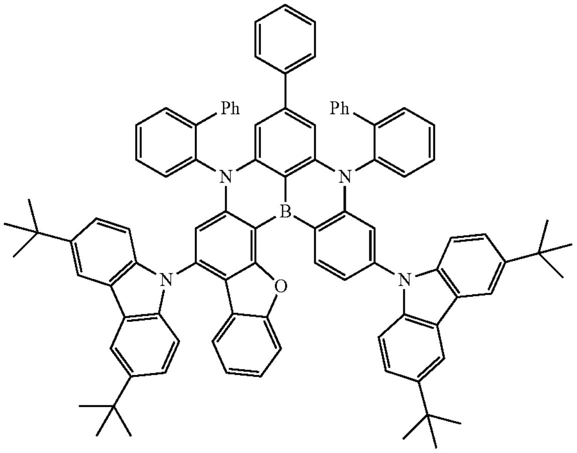

3

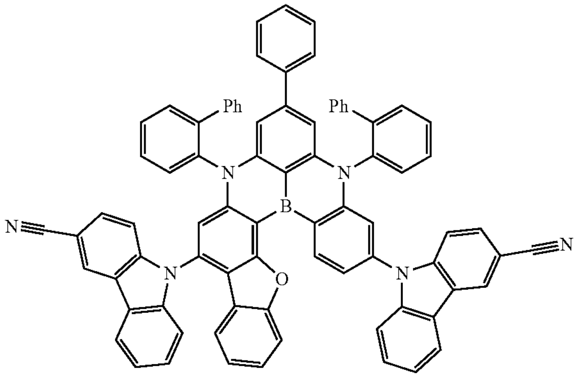

-continued
4
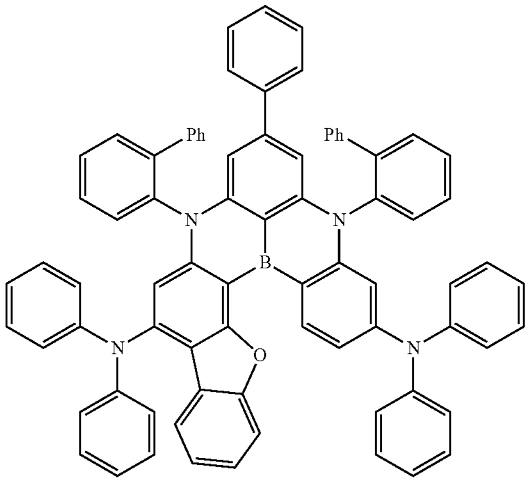
5
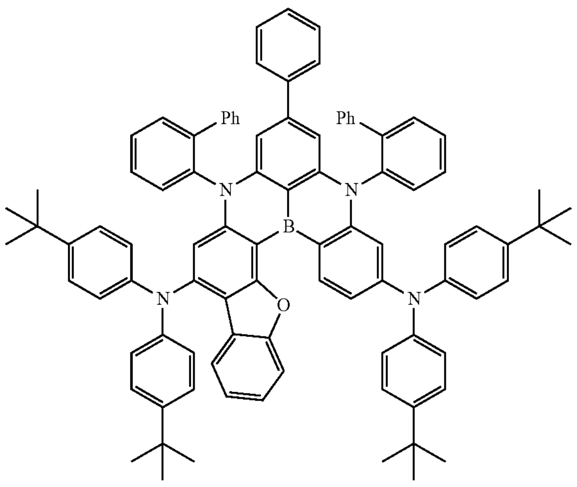
6
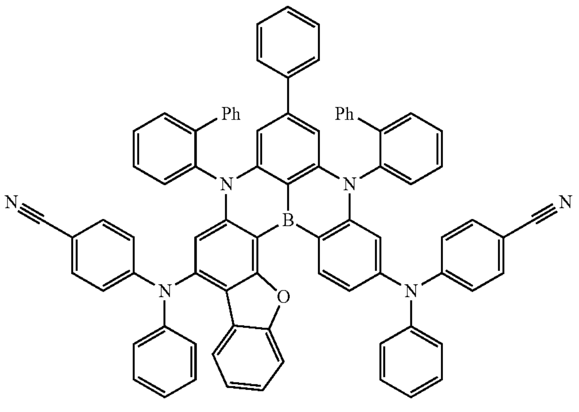
-continued
7
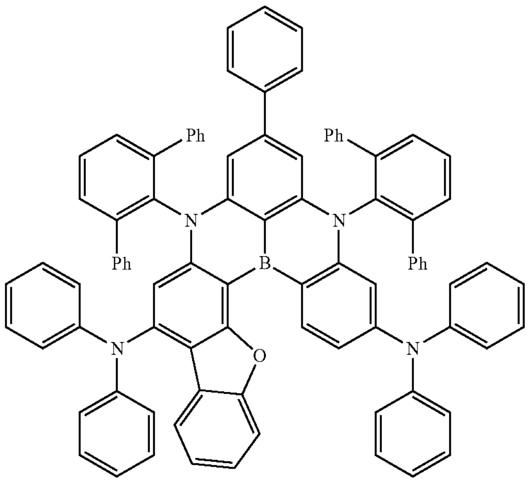
8
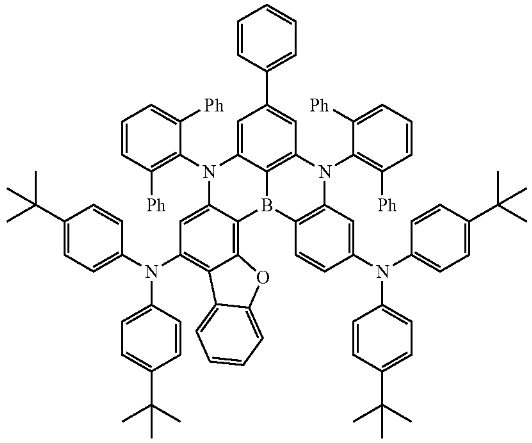
9
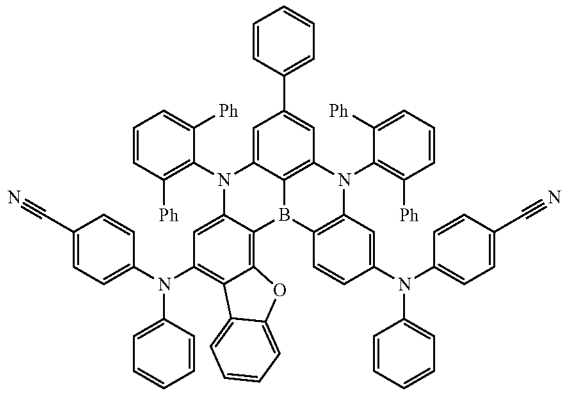

-continued
10
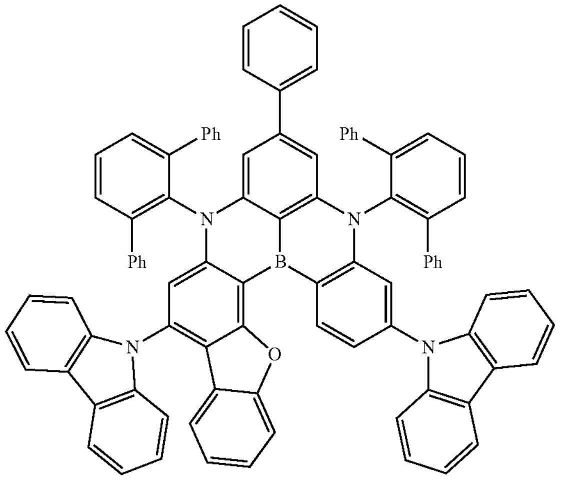
11
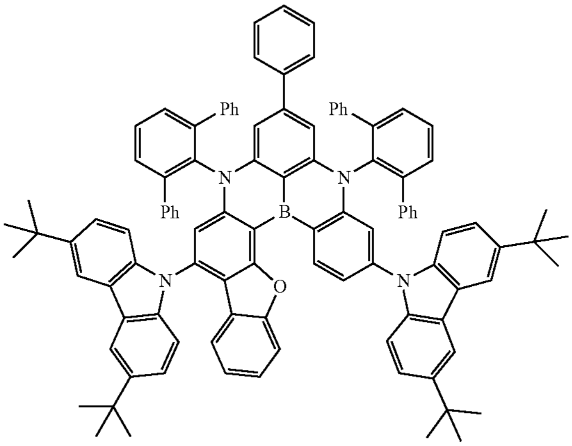
12
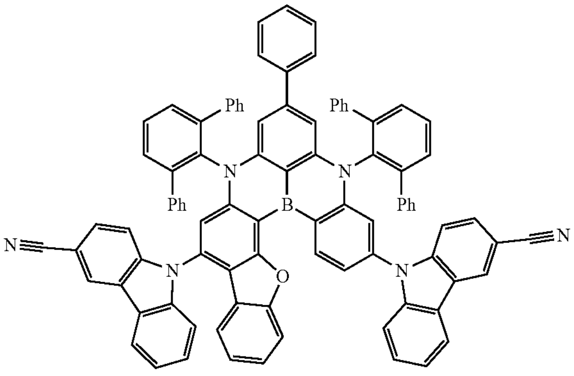
-continued
13
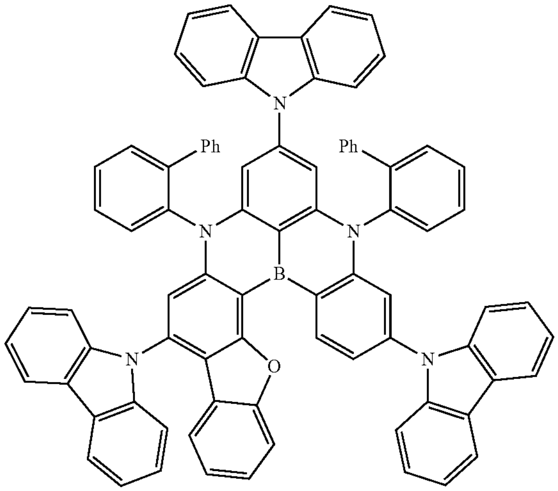
14
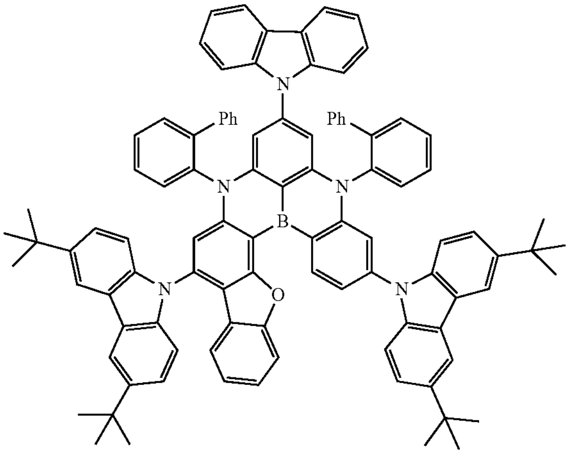
15
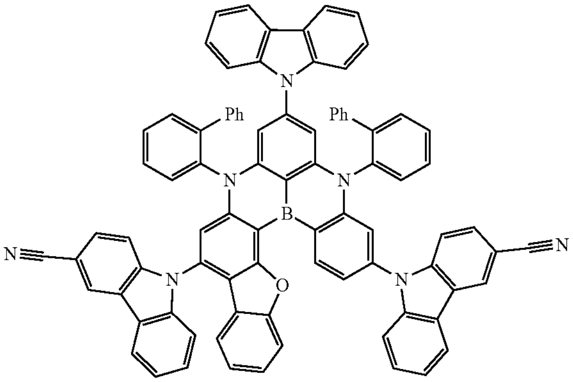

-continued
16
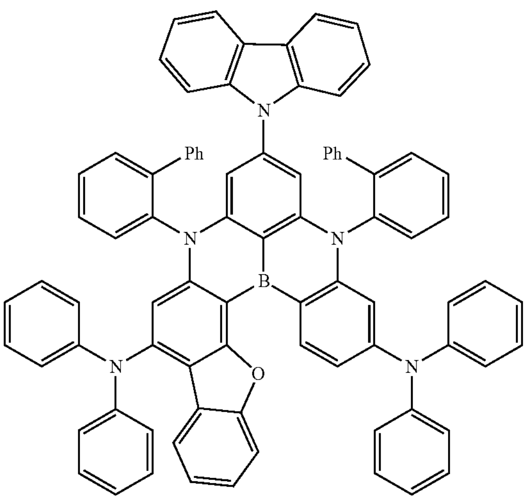
17
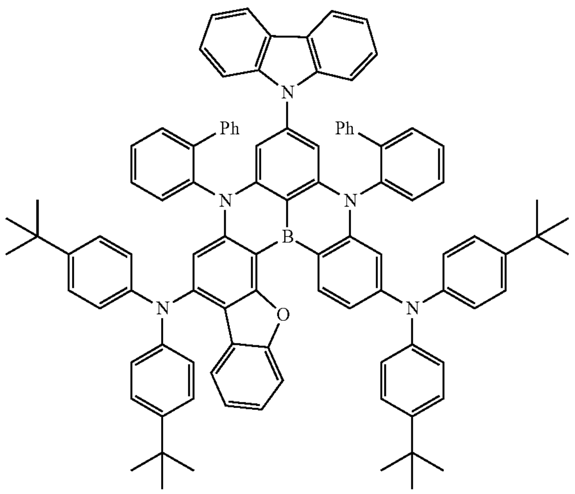
18
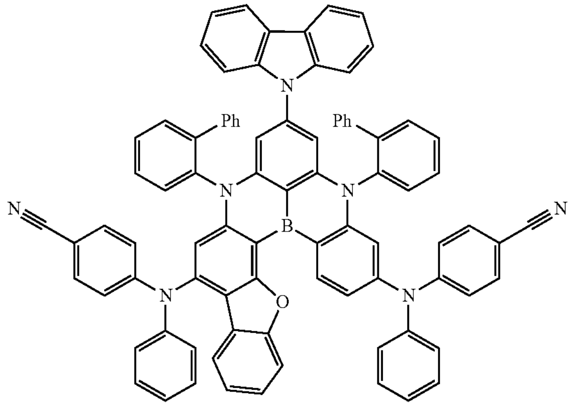
-continued
19
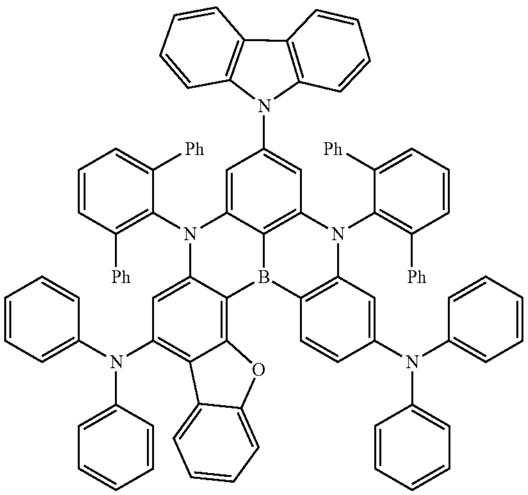
20
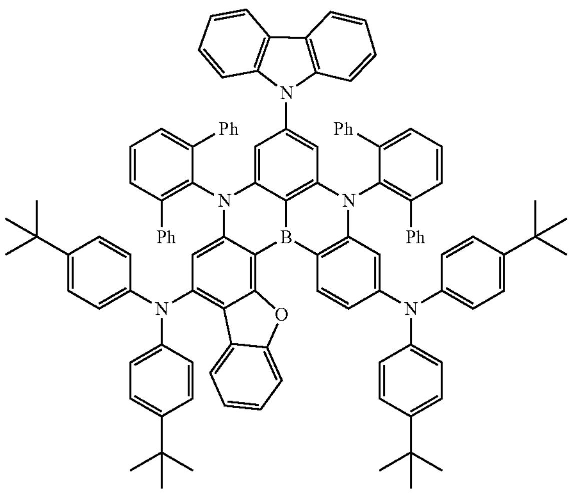
21
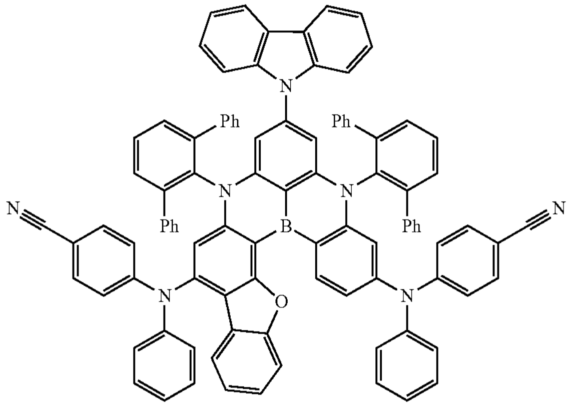

-continued
22
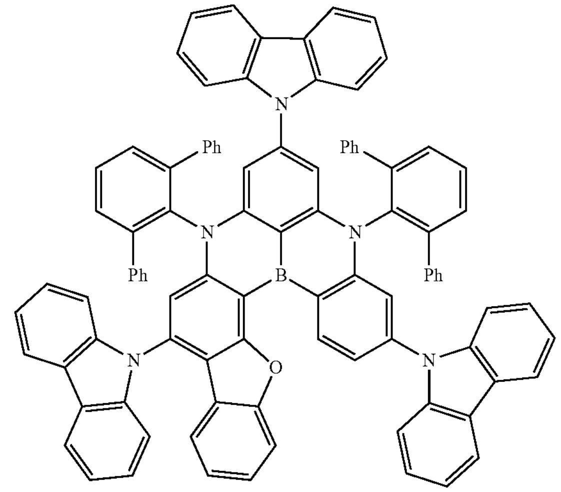
23
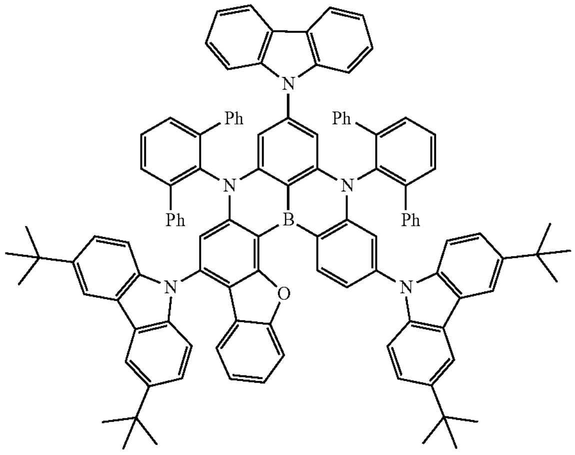
24
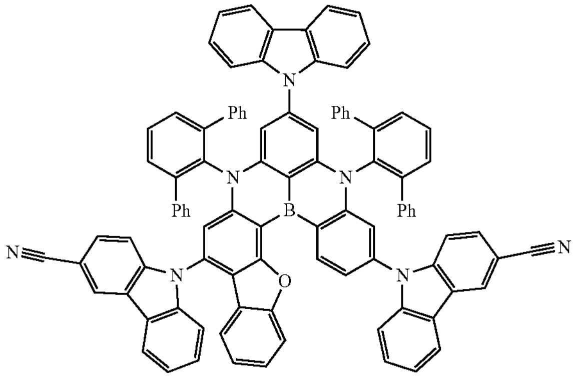
-continued
25
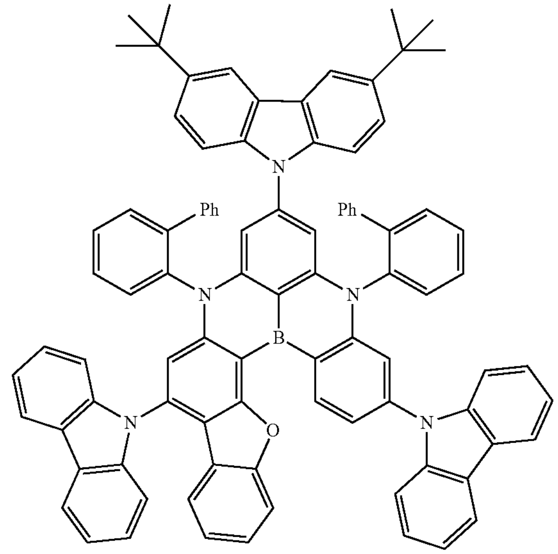
26
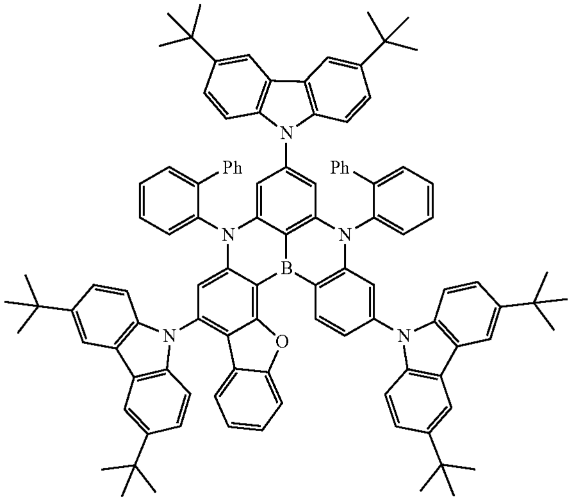
27
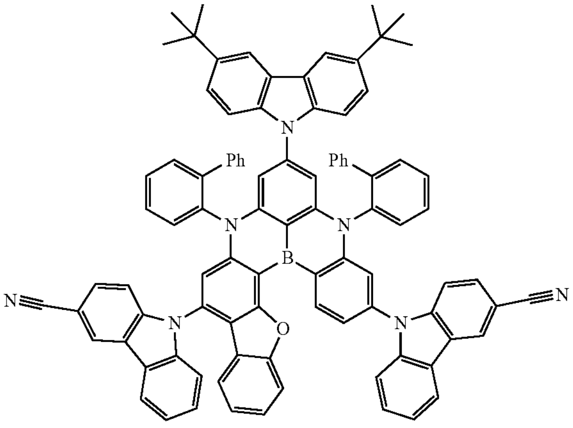

-continued
28
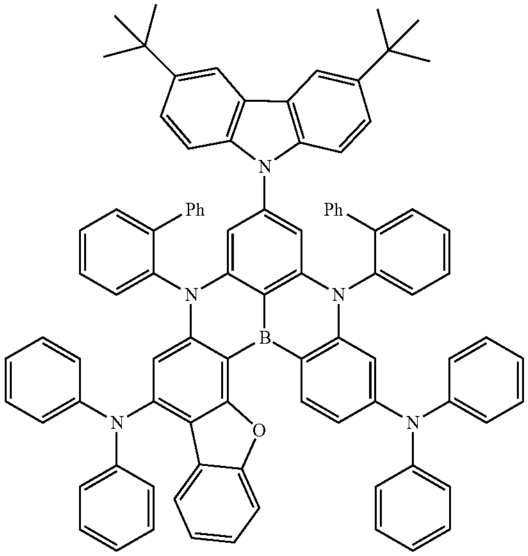
29
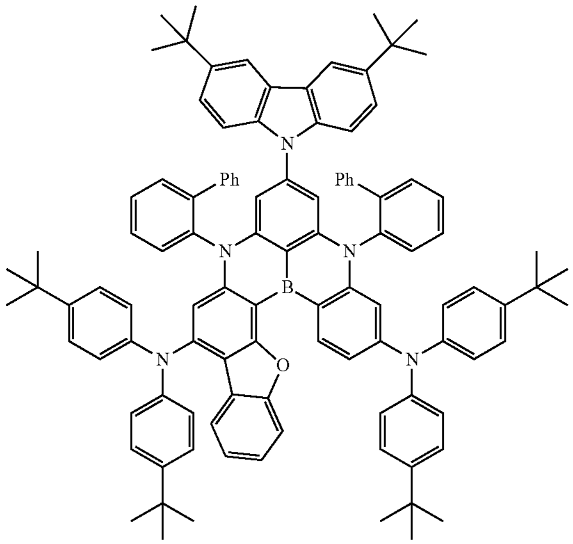
30
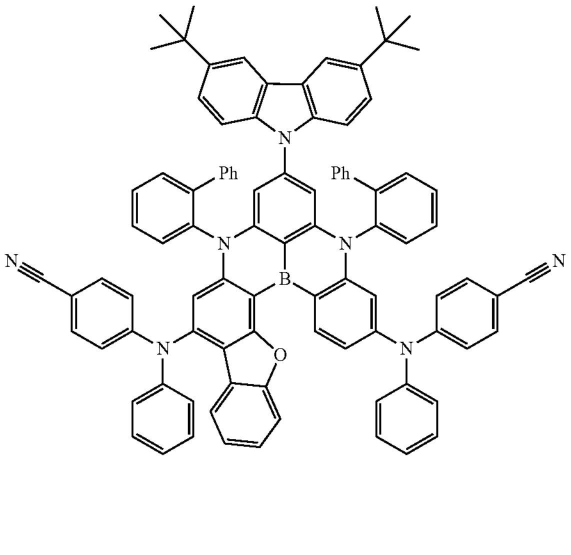
-continued
31
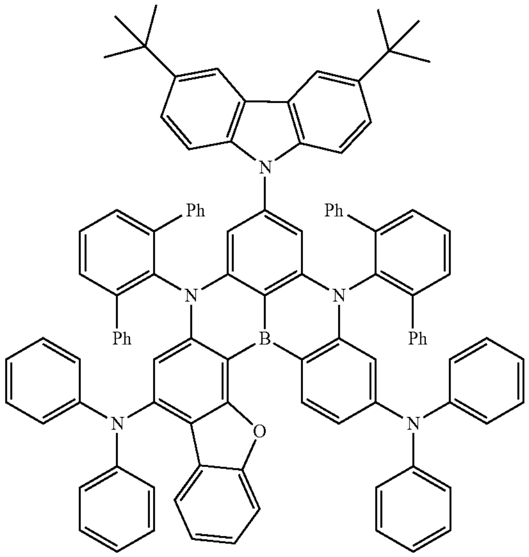
32
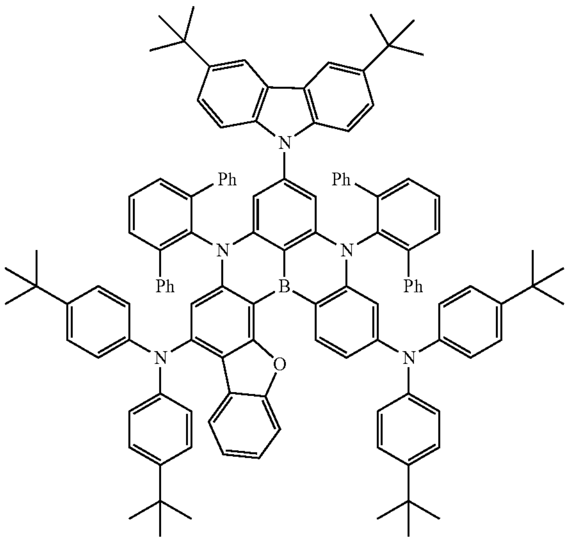
33
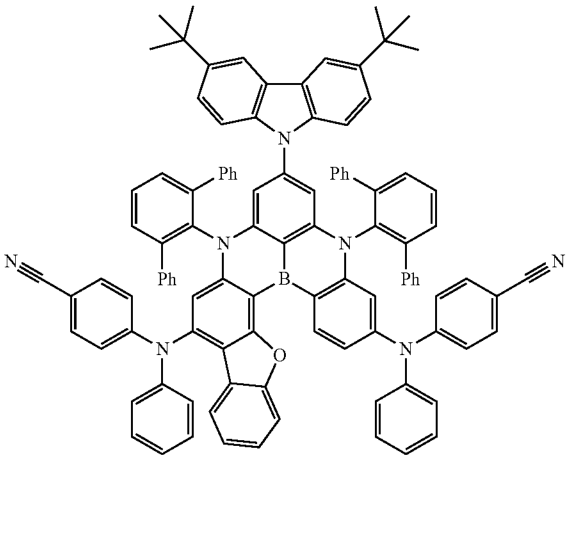

-continued
34
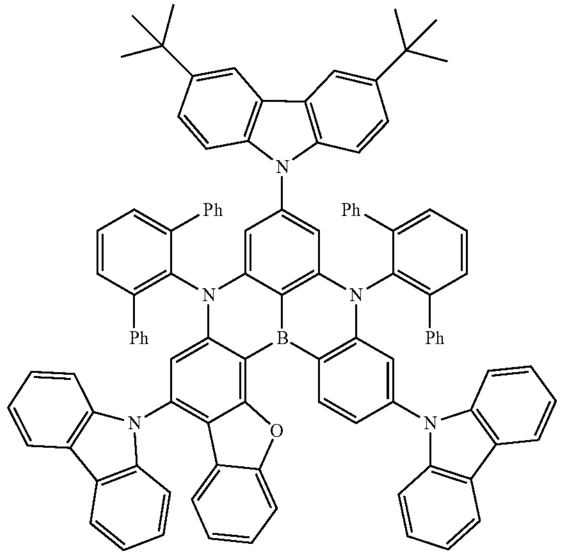
35
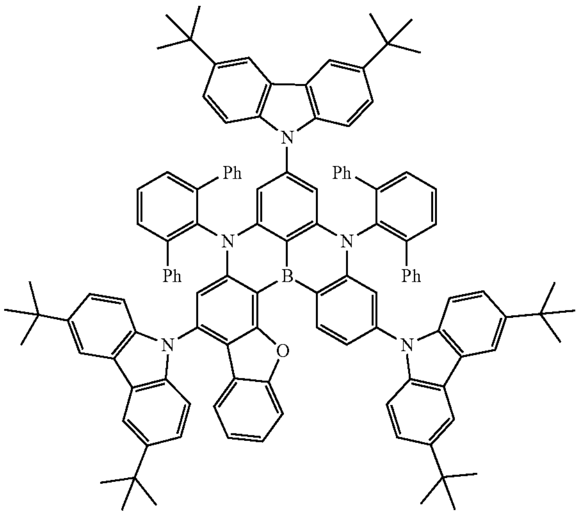
36
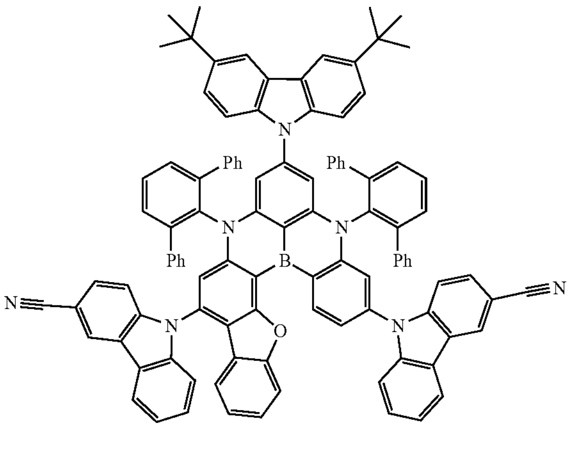
-continued
37
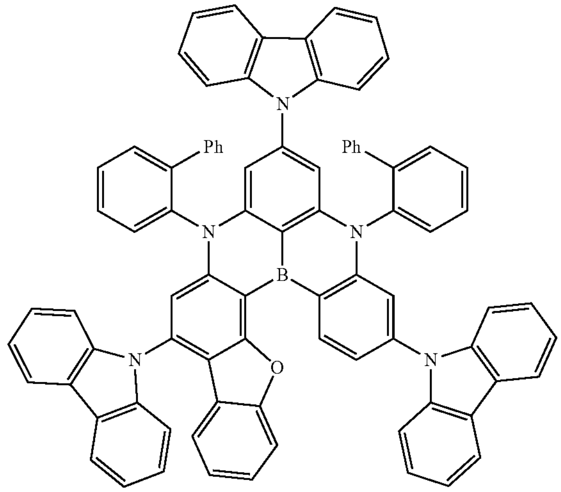
38
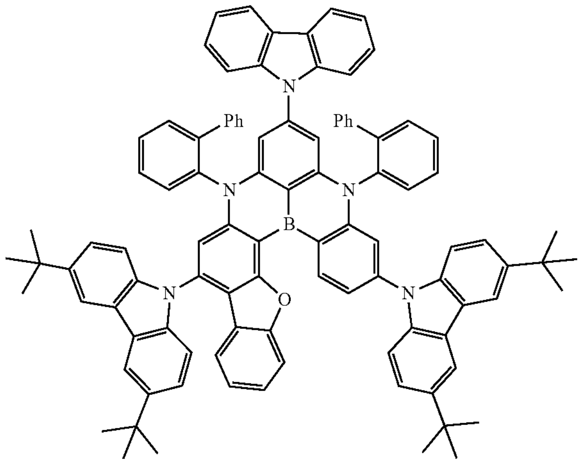
39
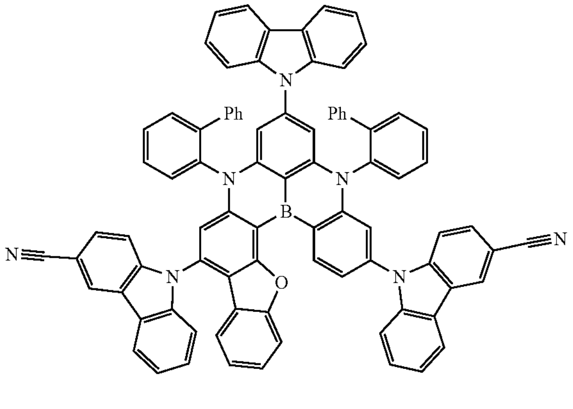

-continued
40
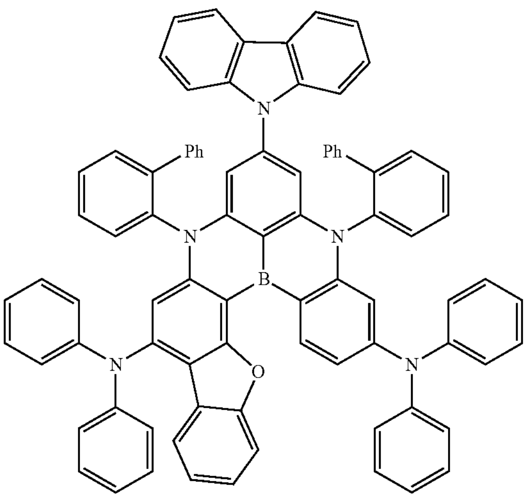
41
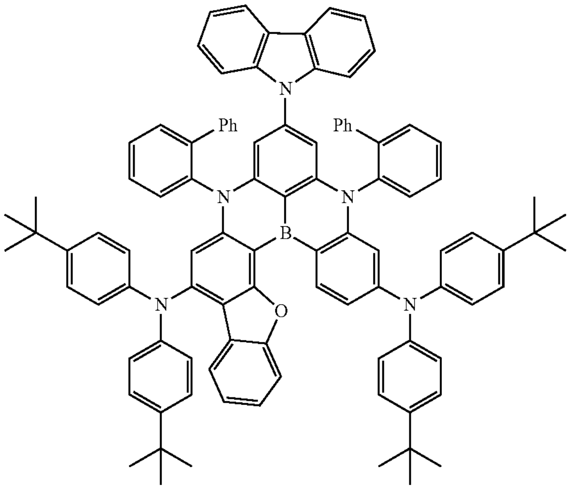
42
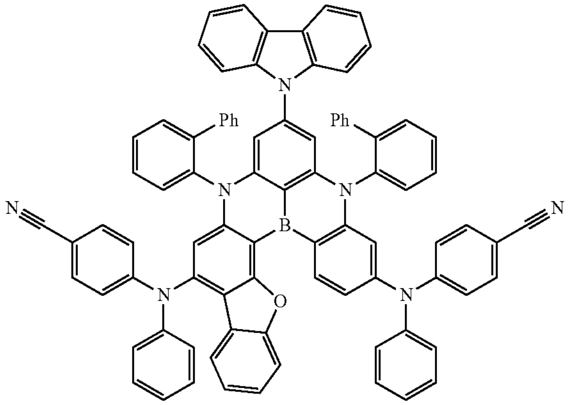
-continued
43
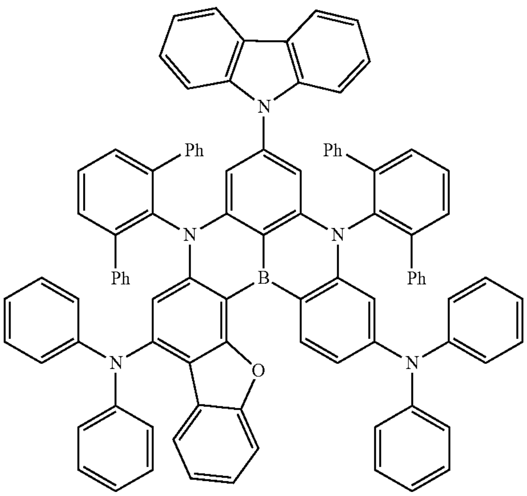
44
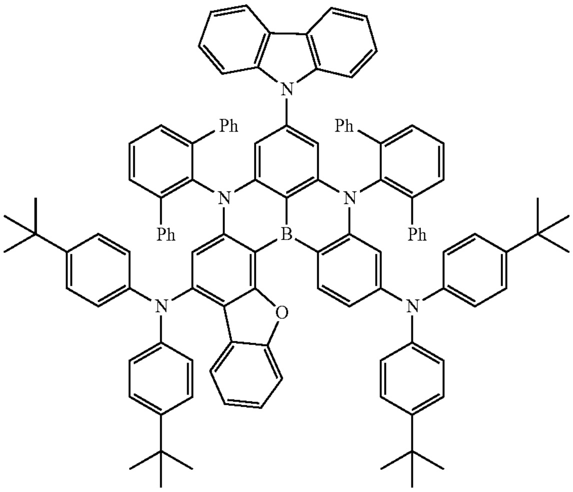
45
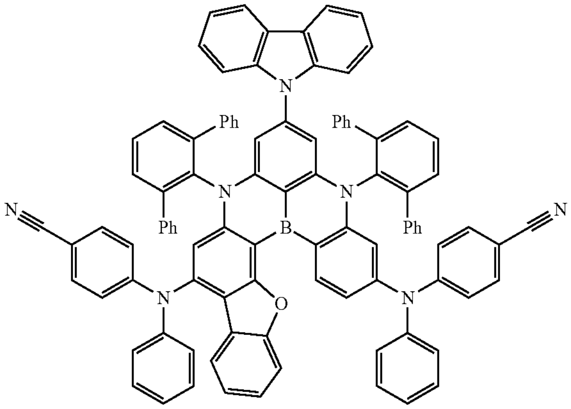

-continued
46
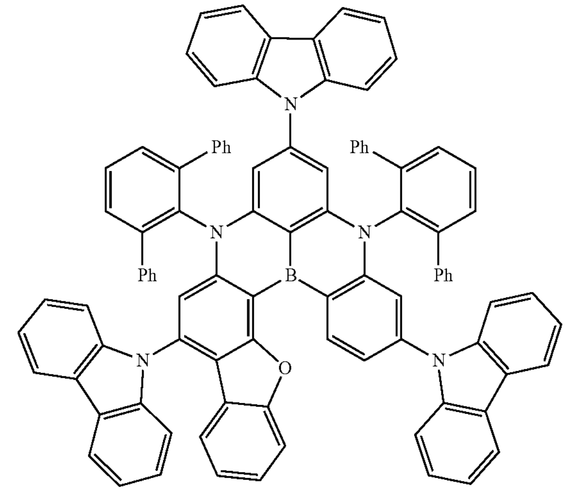
47
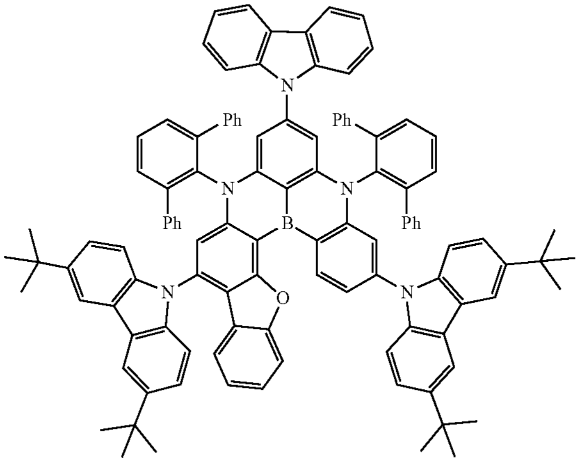
48
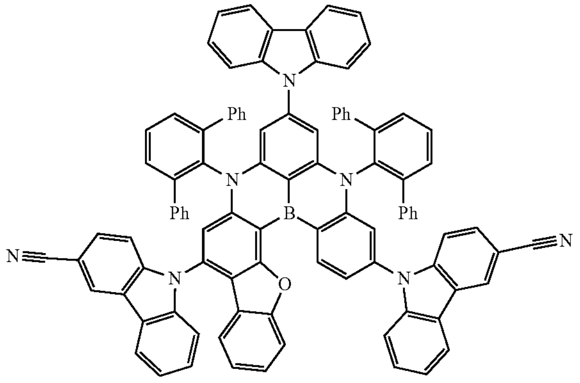
-continued
49
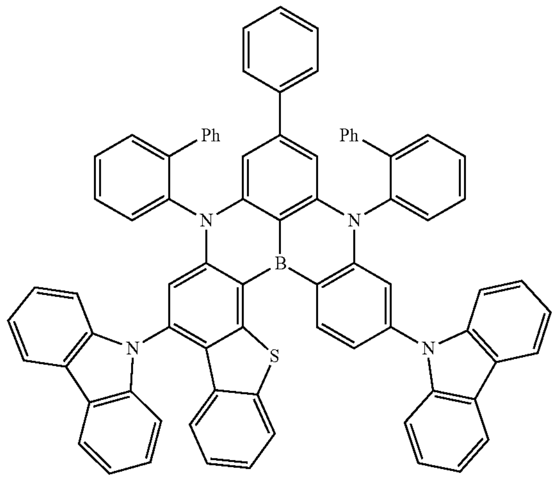
50
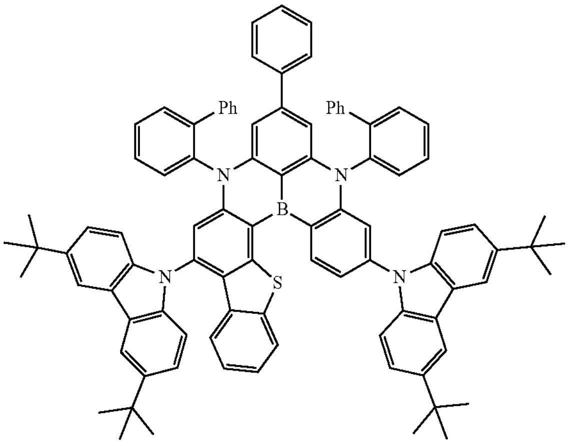
51
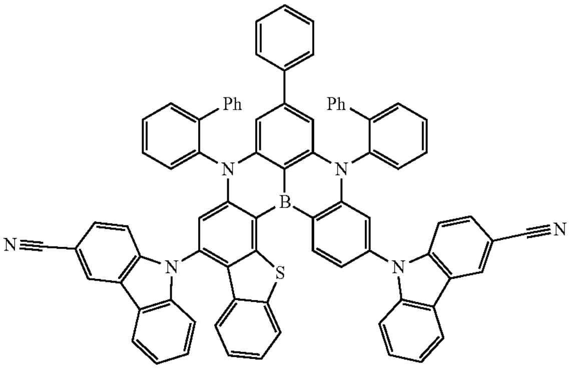

-continued
52
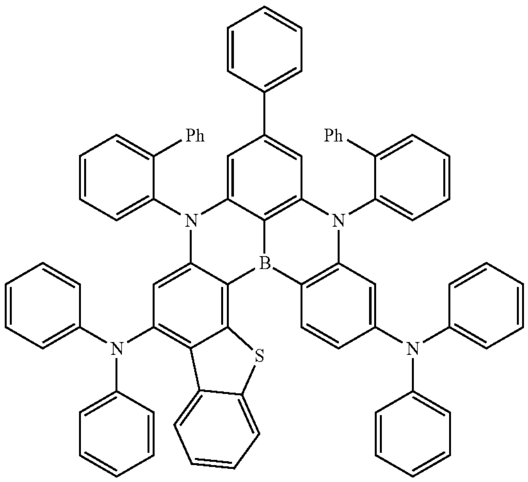
53
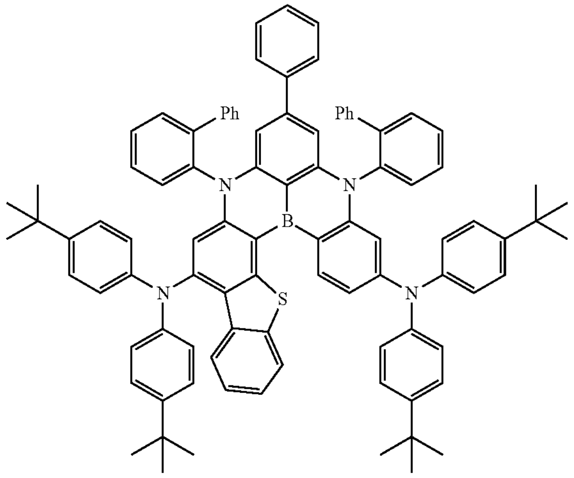
54
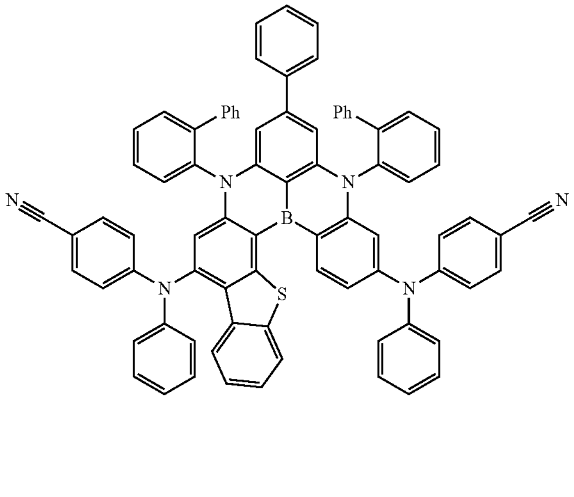
55
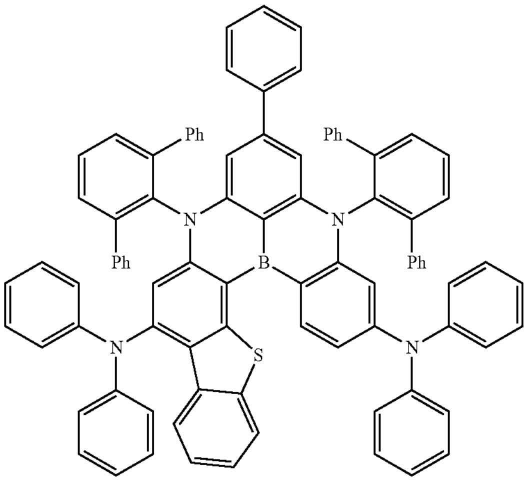
56
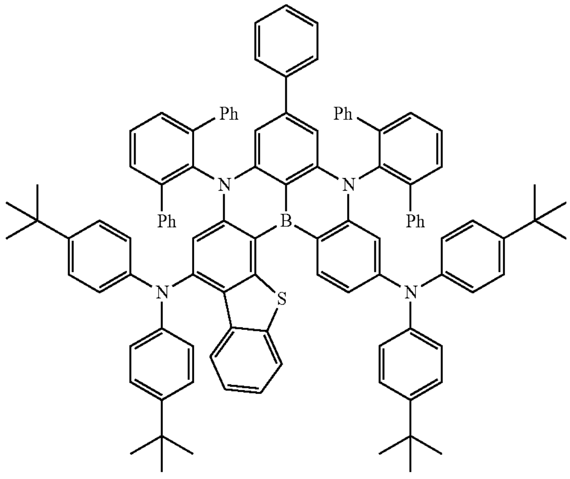
57
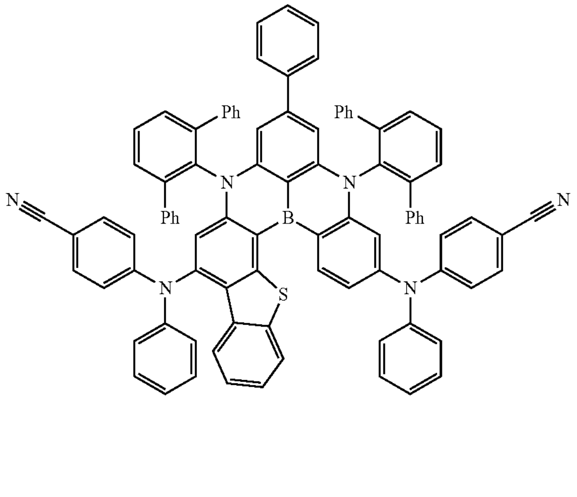

-continued
58
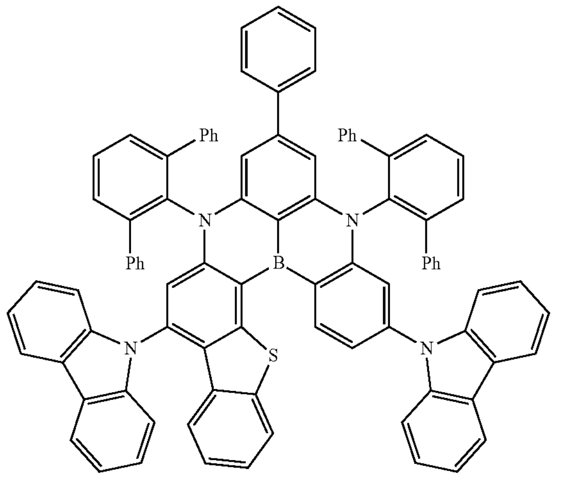
59
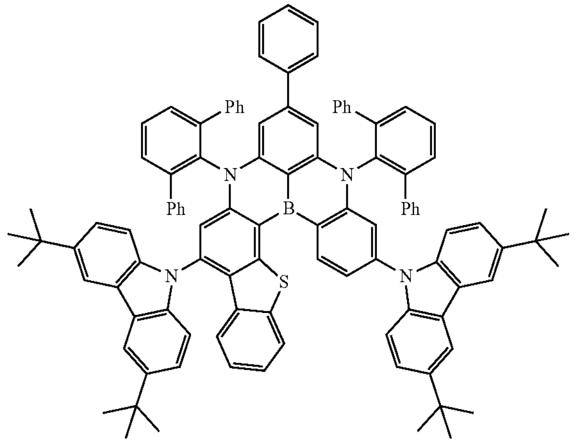
60
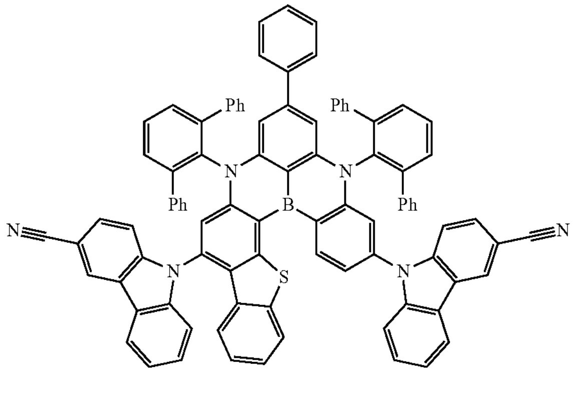
-continued
61
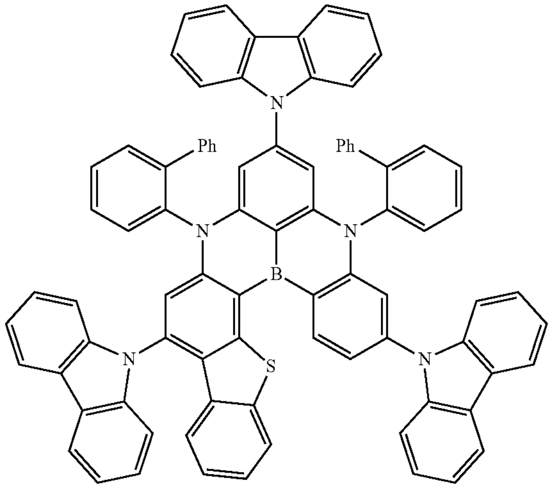
62
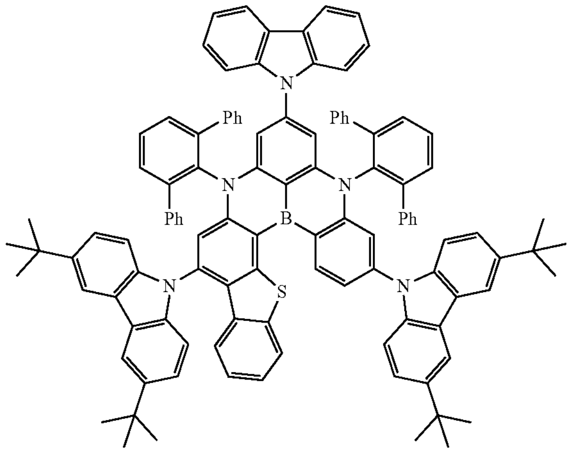
63
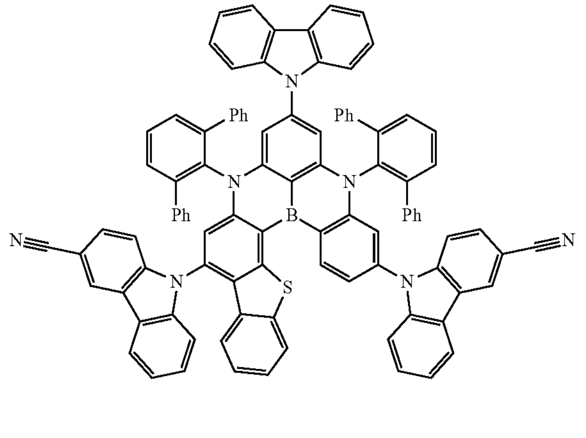

64
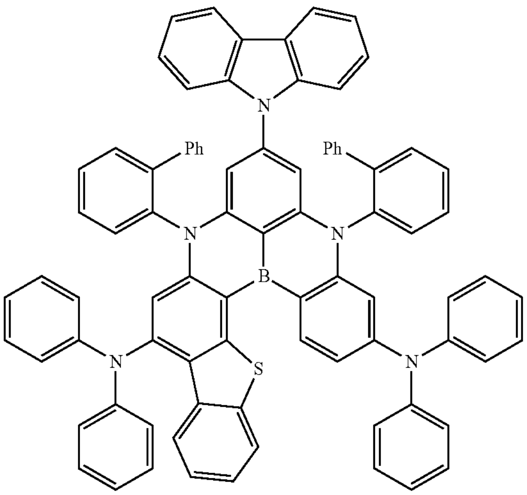
65
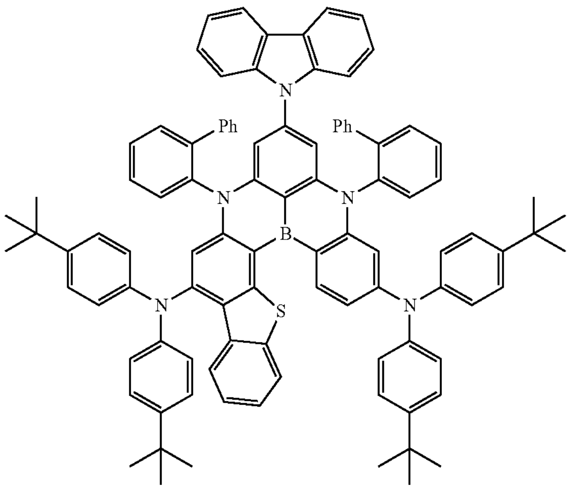
66
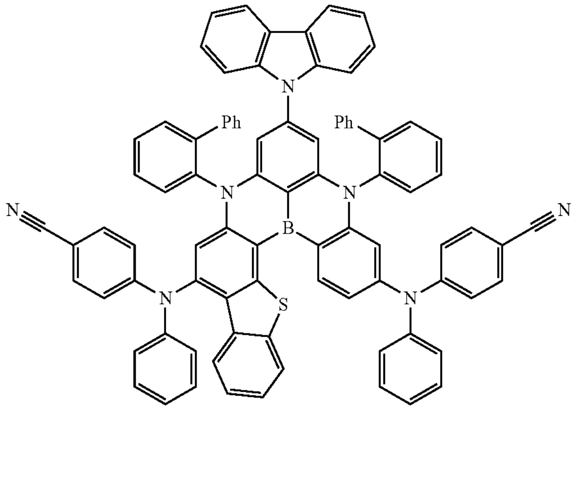
67
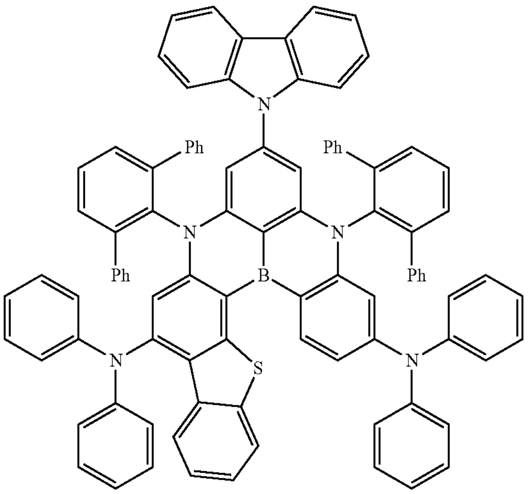
68
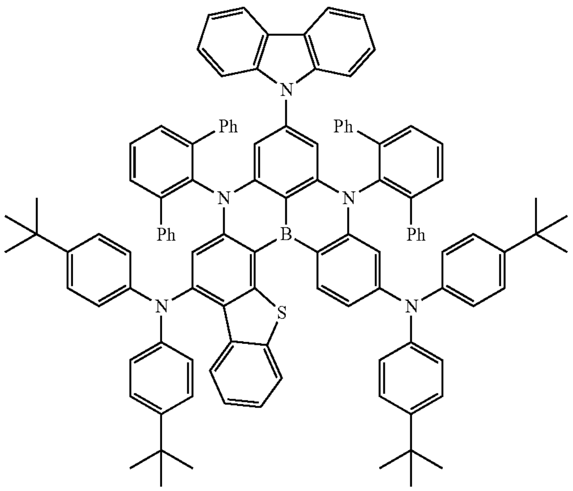
69
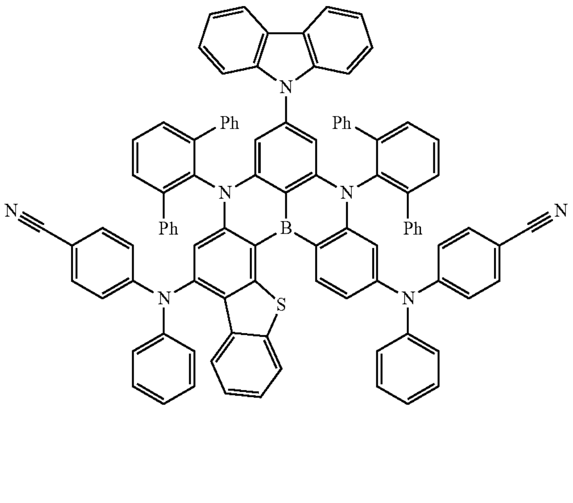

-continued
70
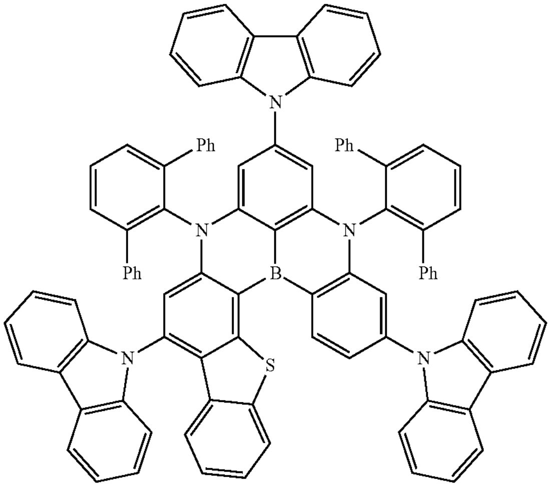
71
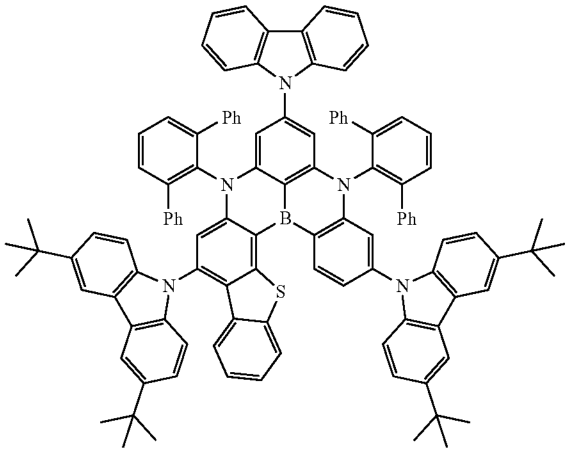
72
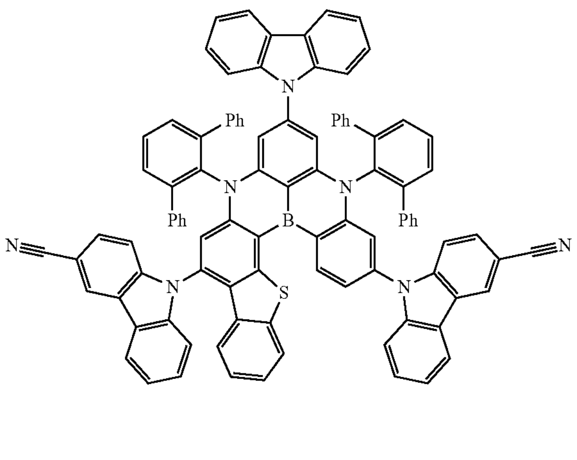
-continued
73
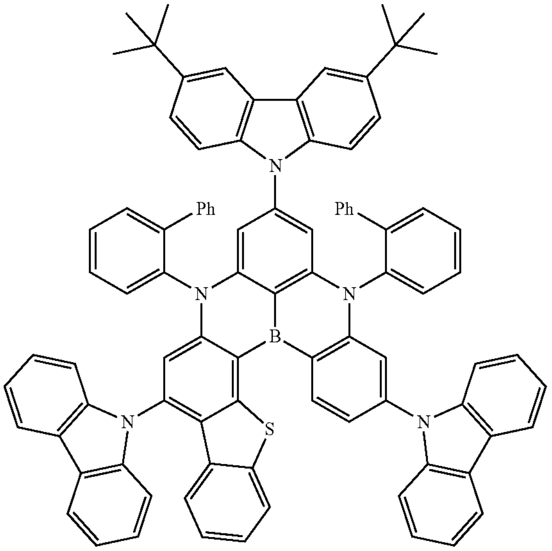
74
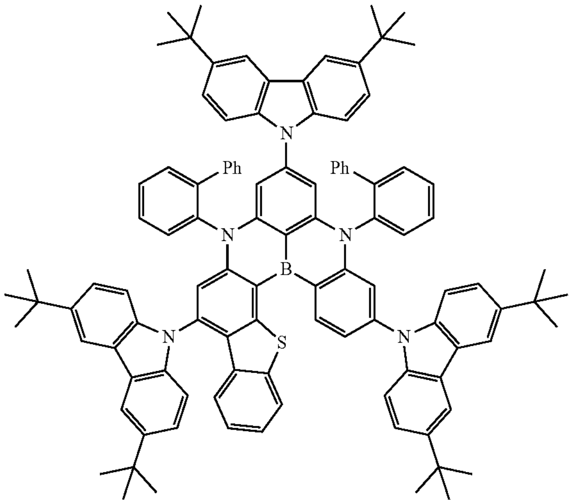
75
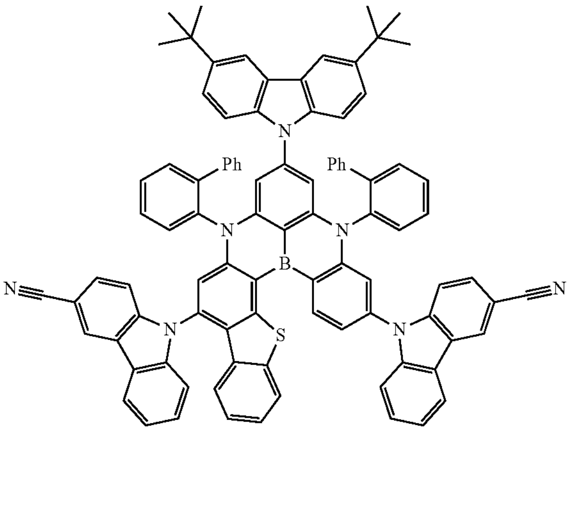

-continued
76
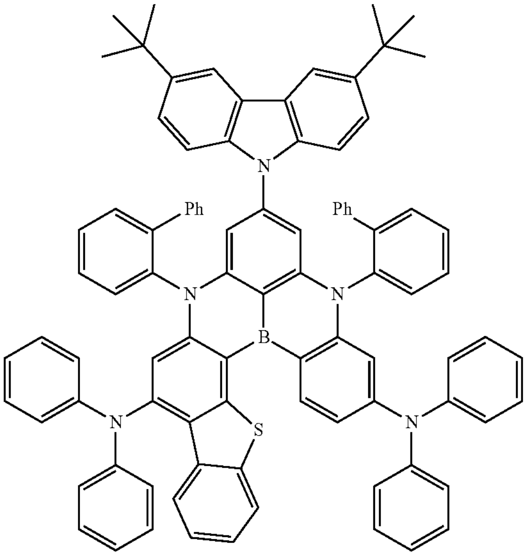
77
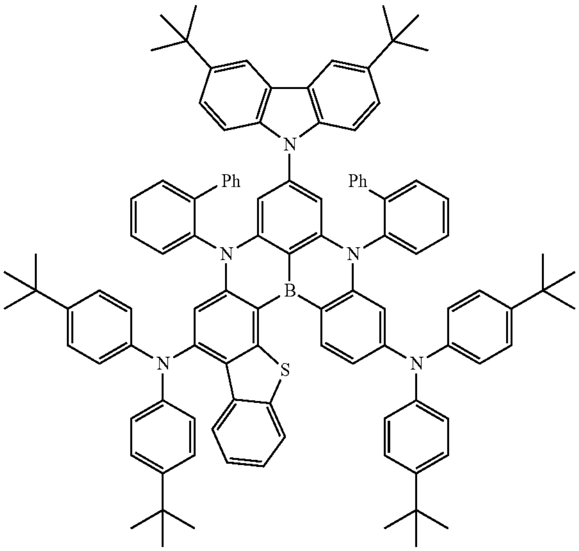
78
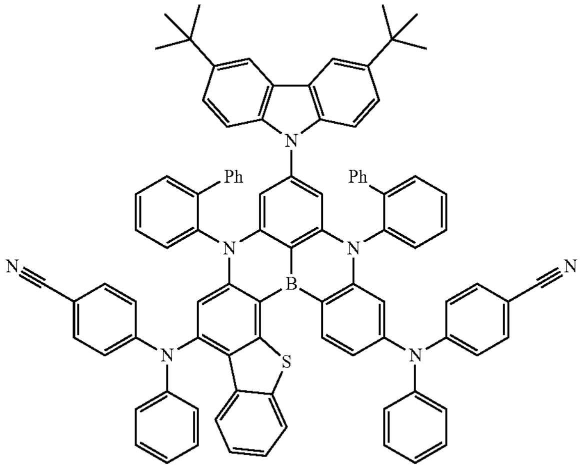
79
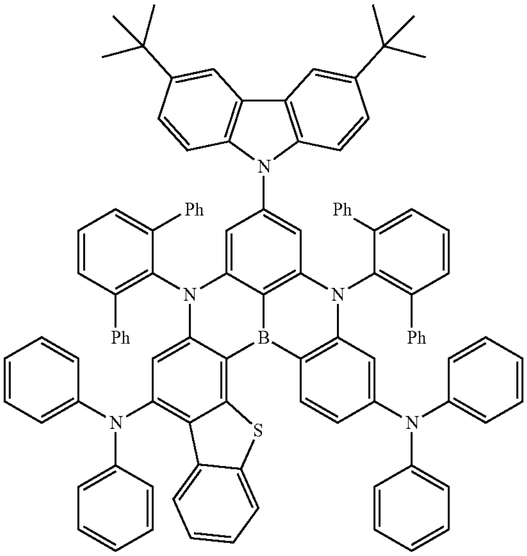
80
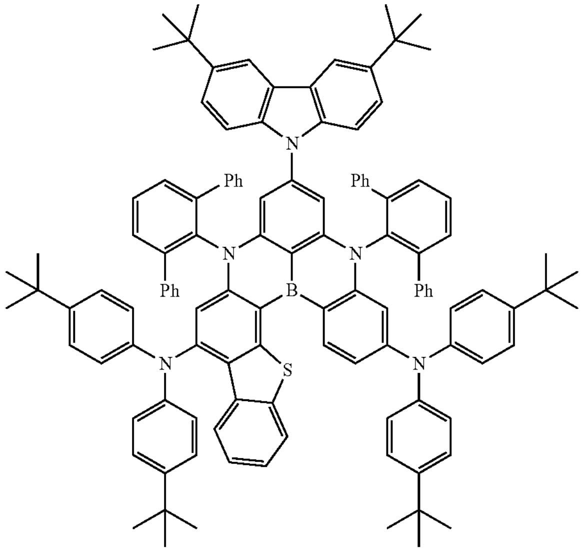
81
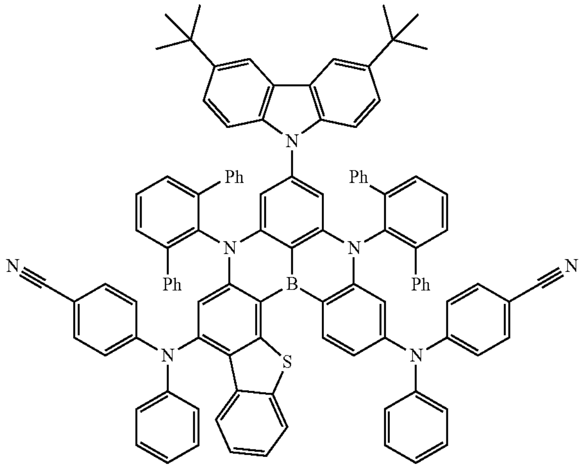

-continued
82
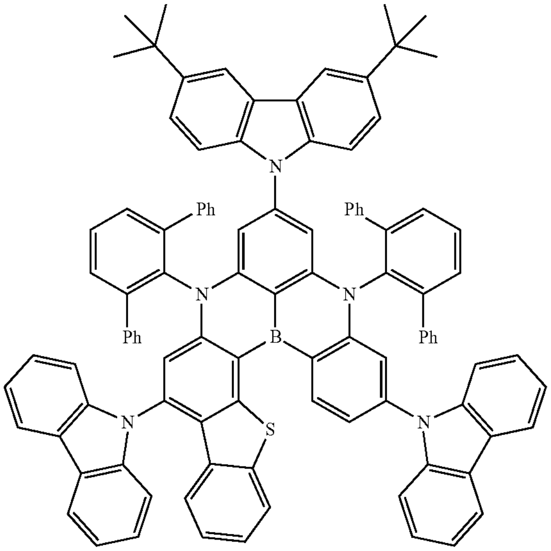
83
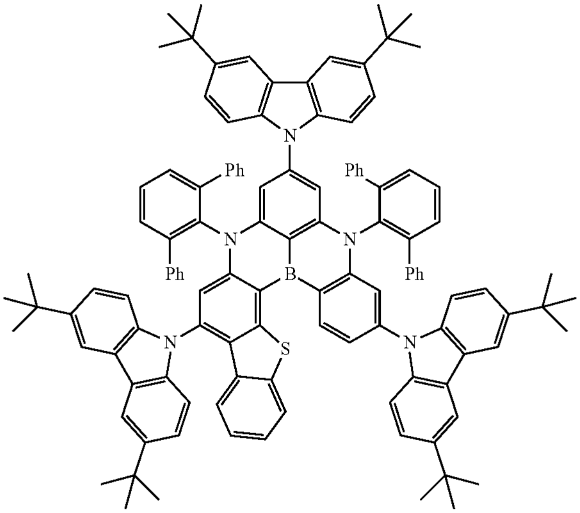
84
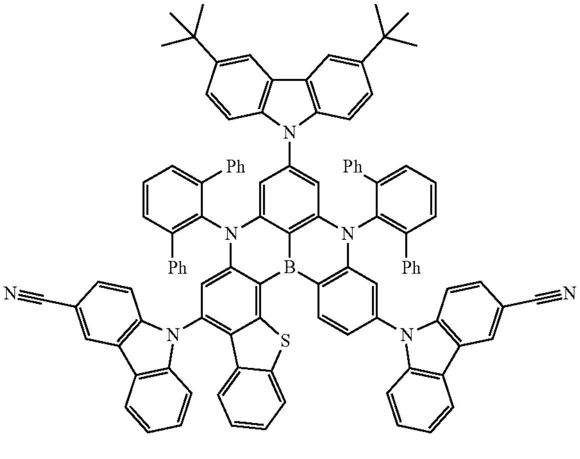
-continued
85
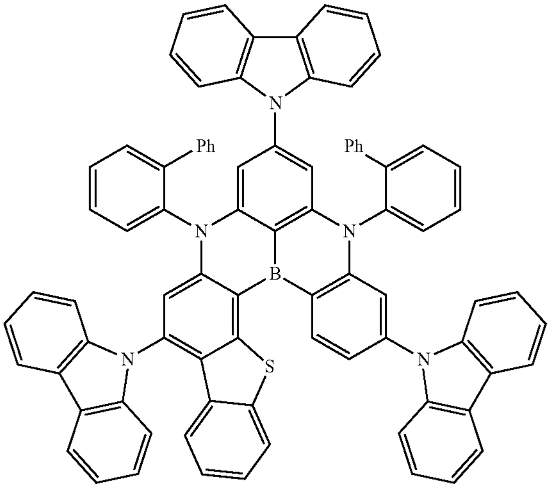
86
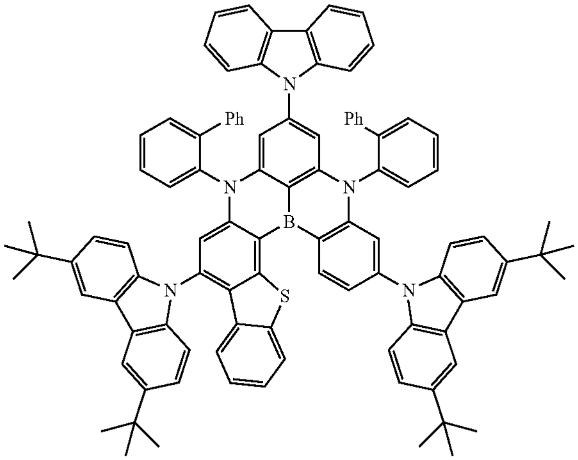
87
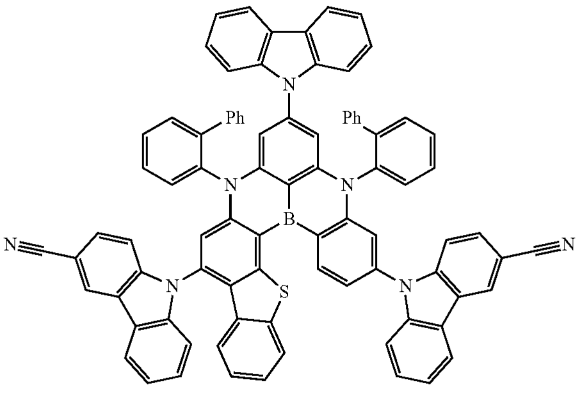

-continued
88
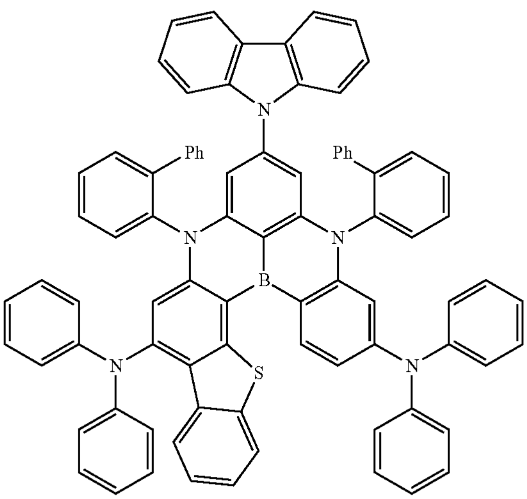
89
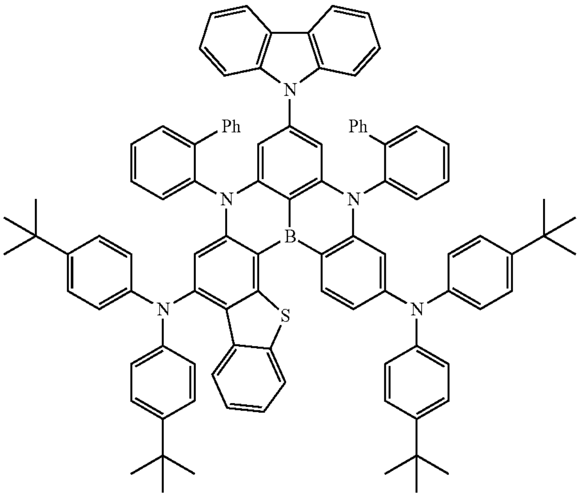
90
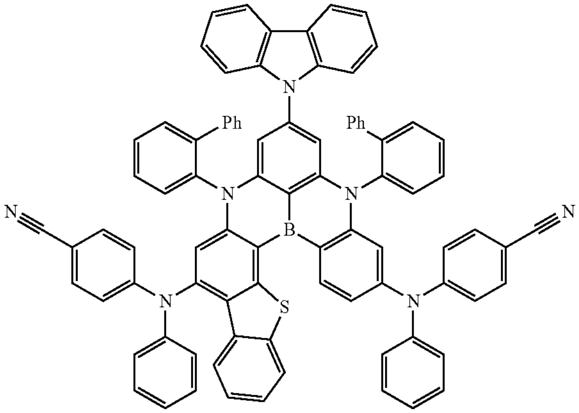
-continued
91
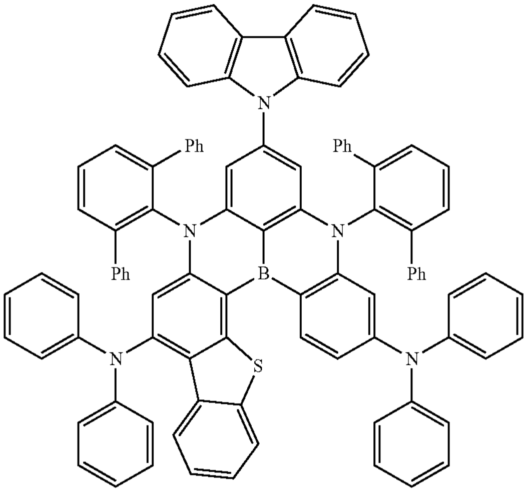
92
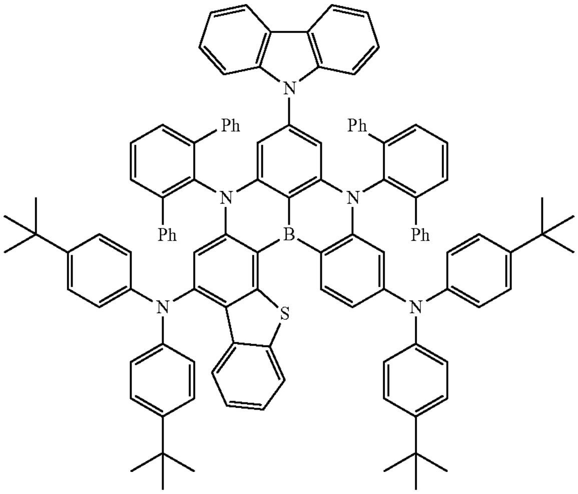
93
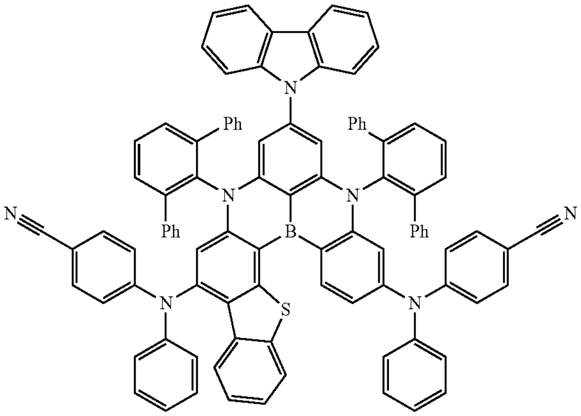

94
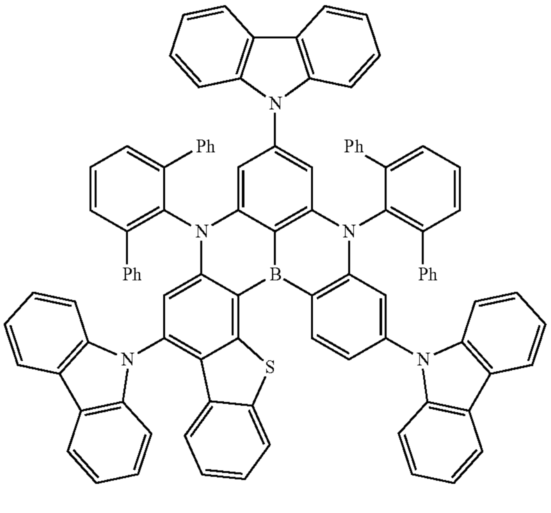
95
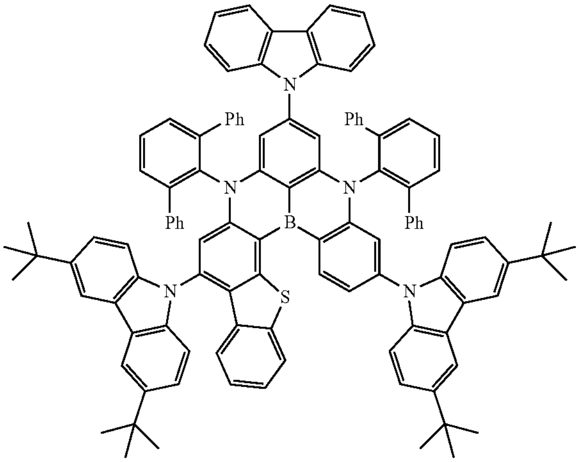
96
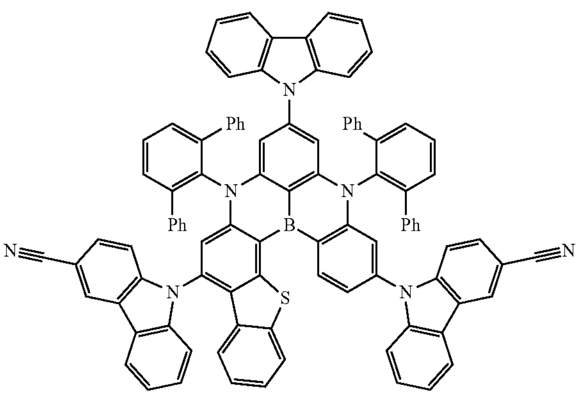
97
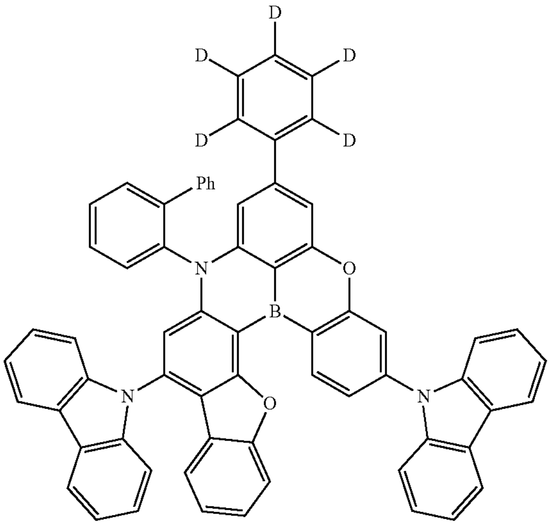
98
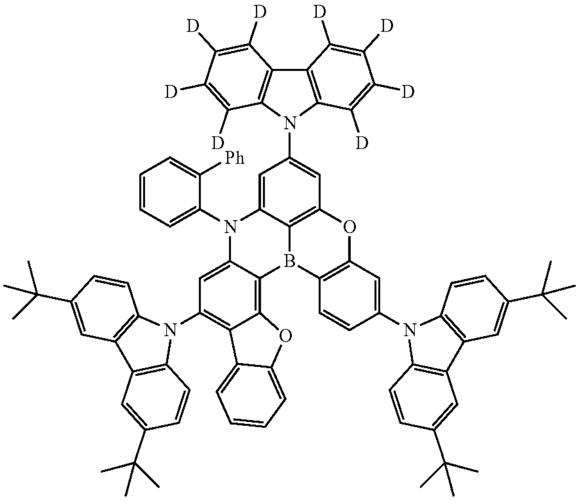
99
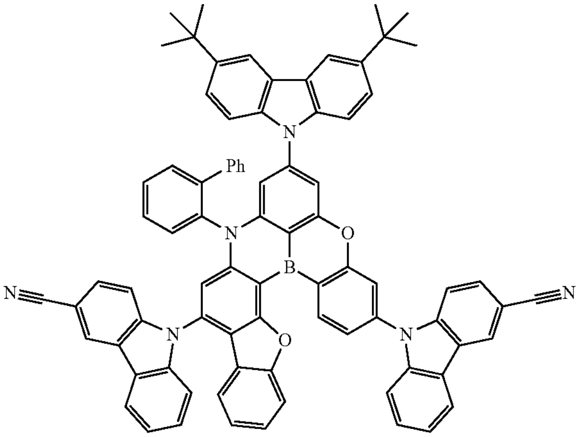

100
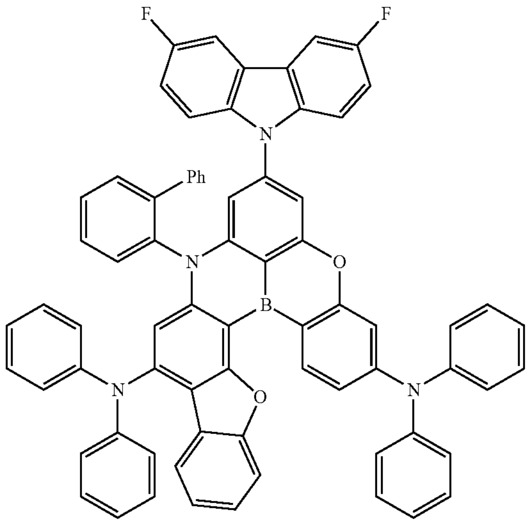
101
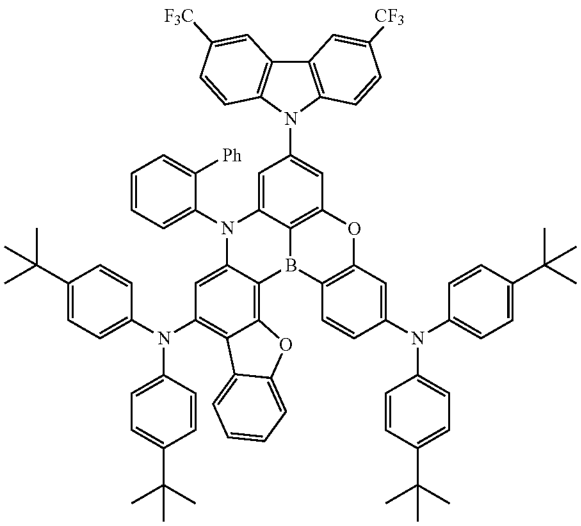
102
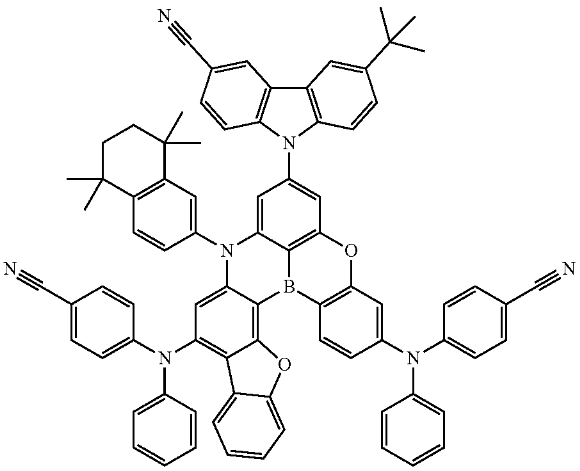
103
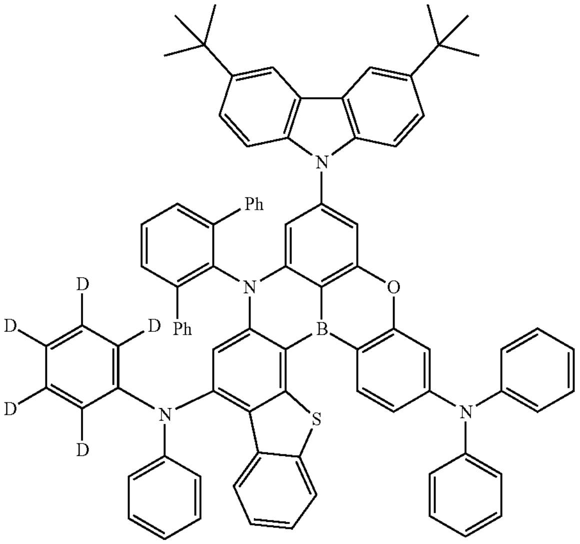
104
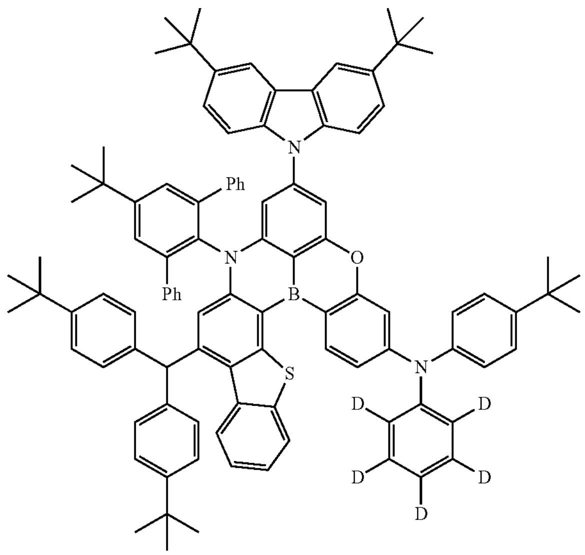
105
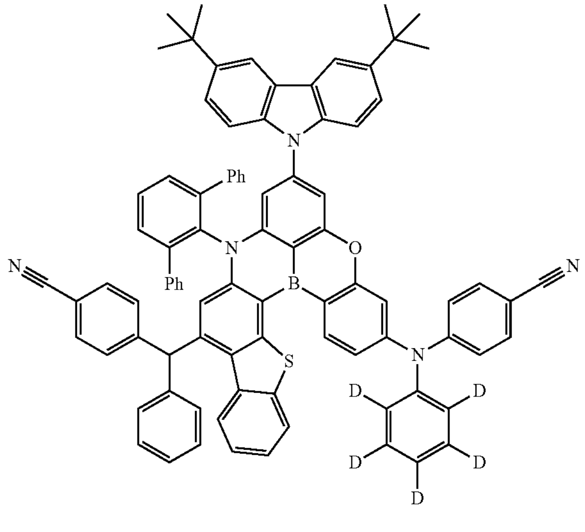

-continued
106
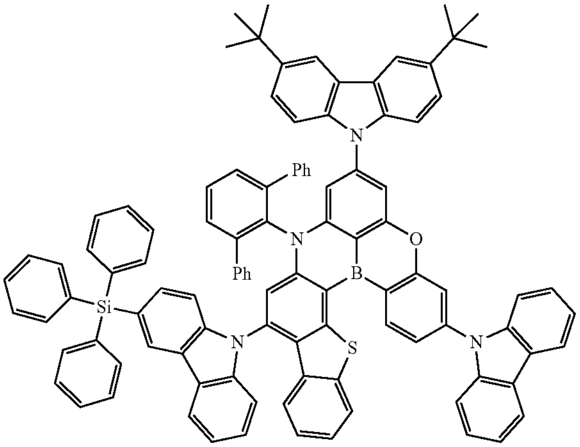
107
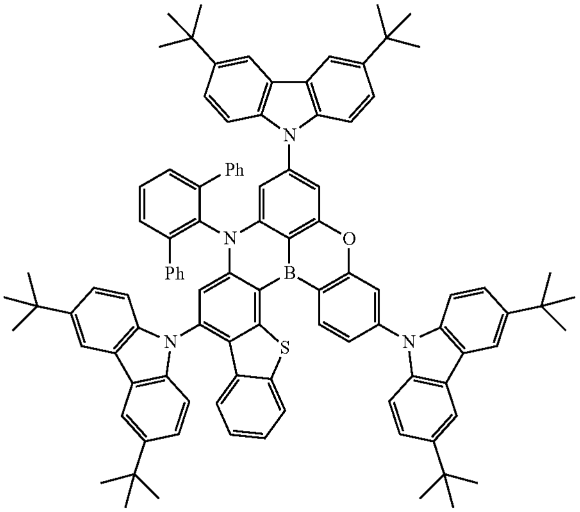
108
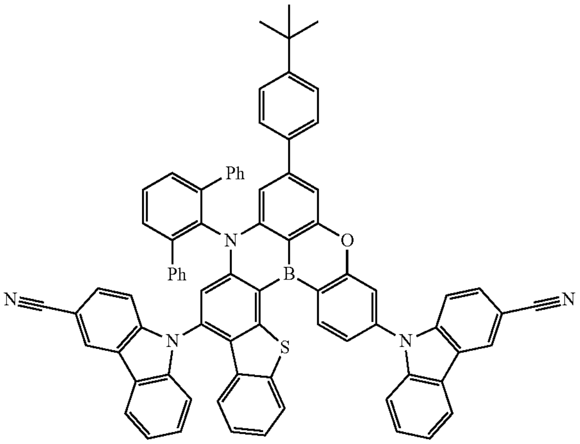
-continued
109
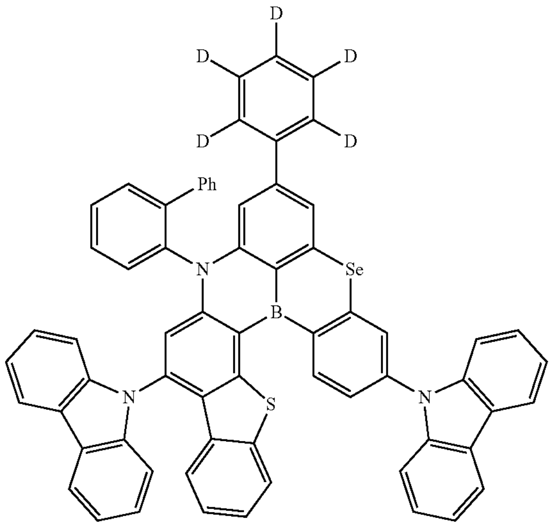
110
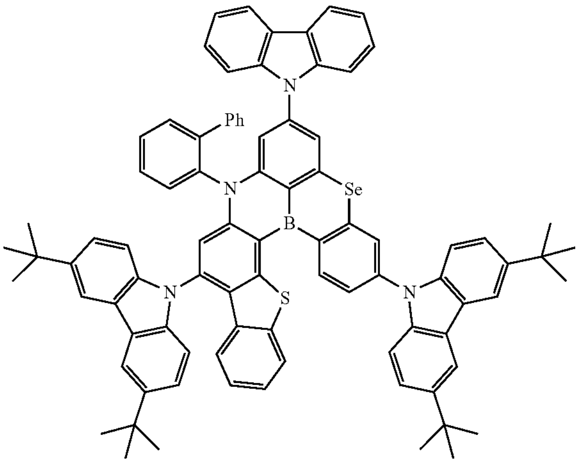
111
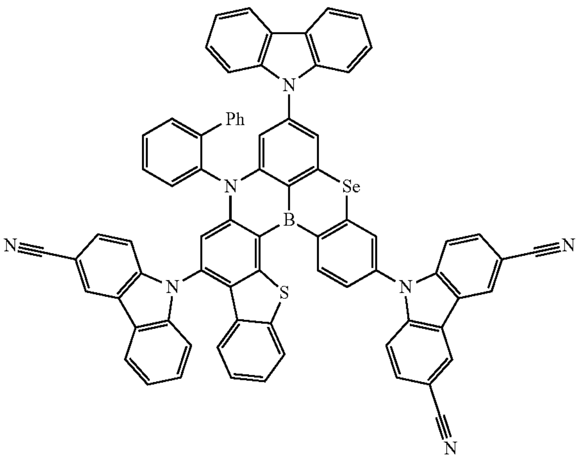

-continued
112
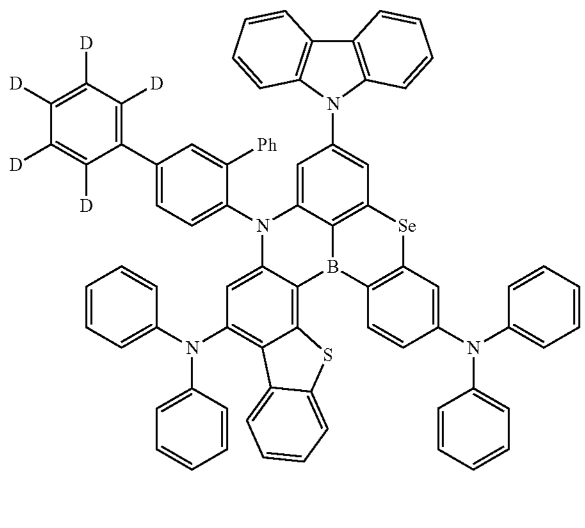
113
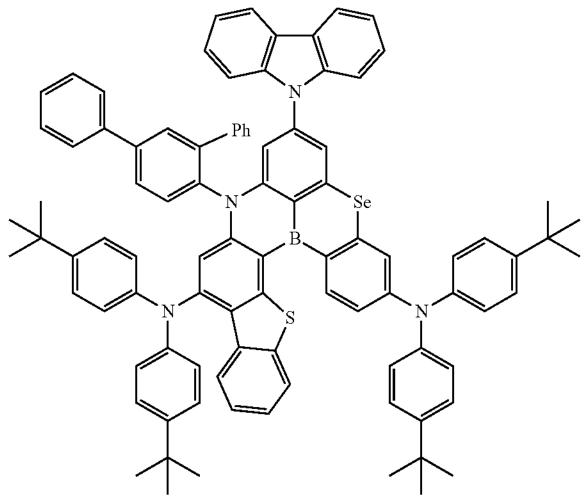
114
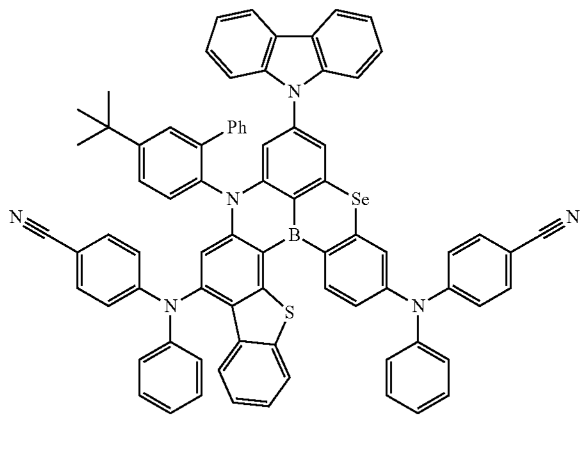
-continued
115
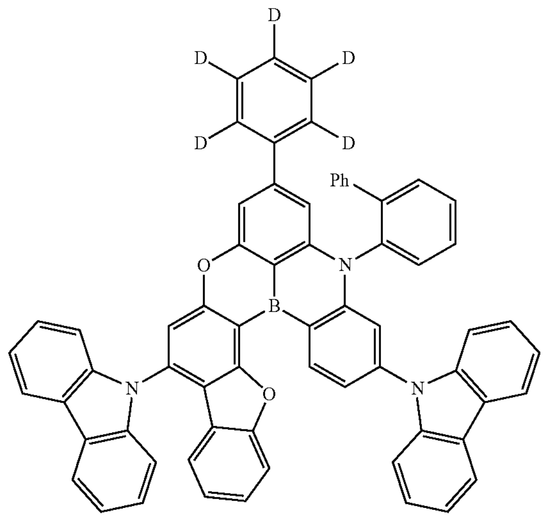
116
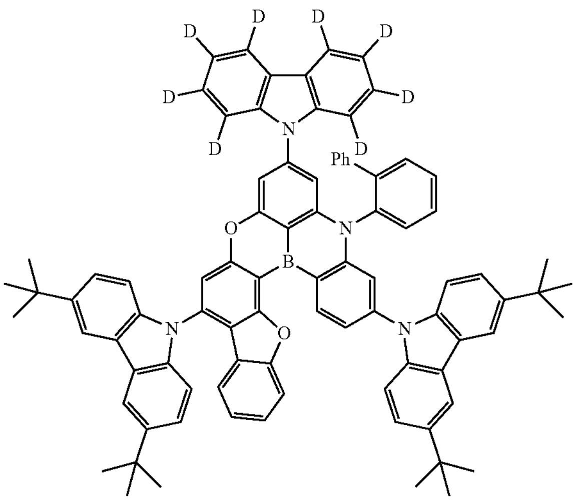
117
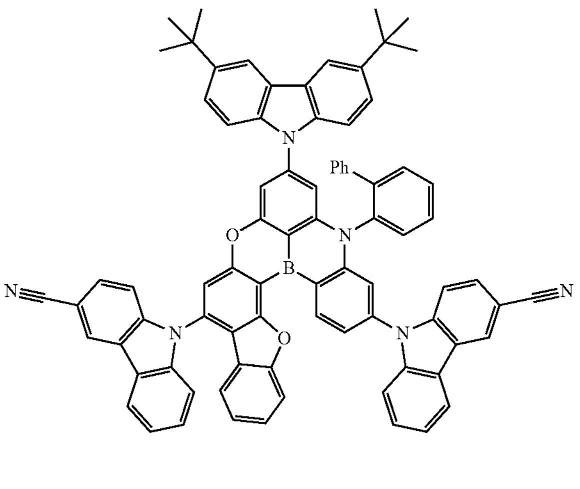

-continued
118
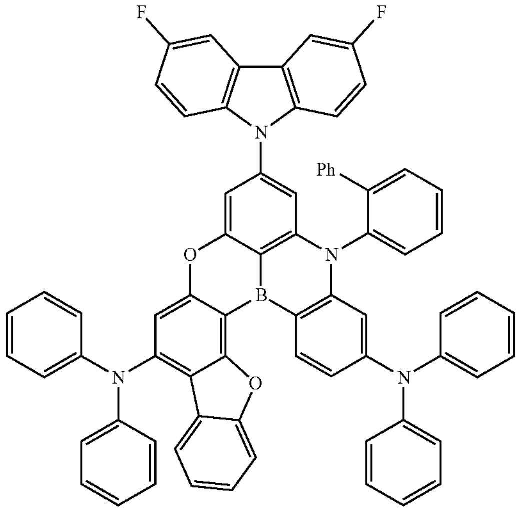
119
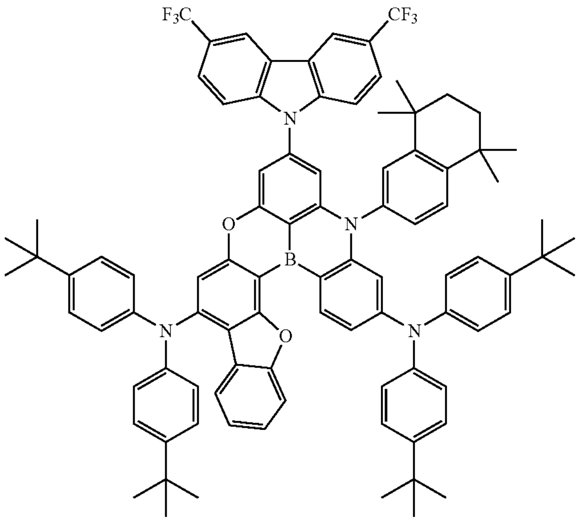
120
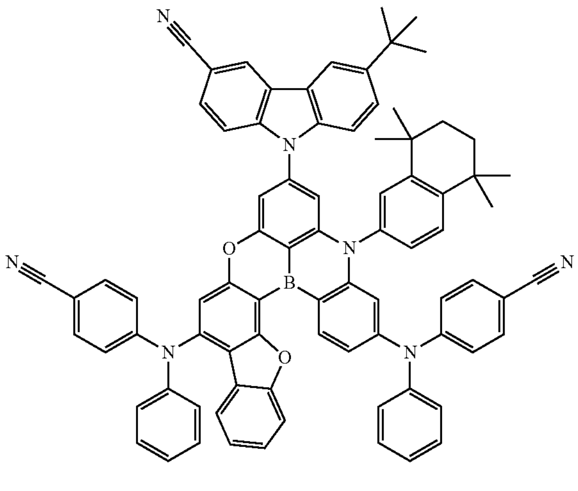
-continued
121
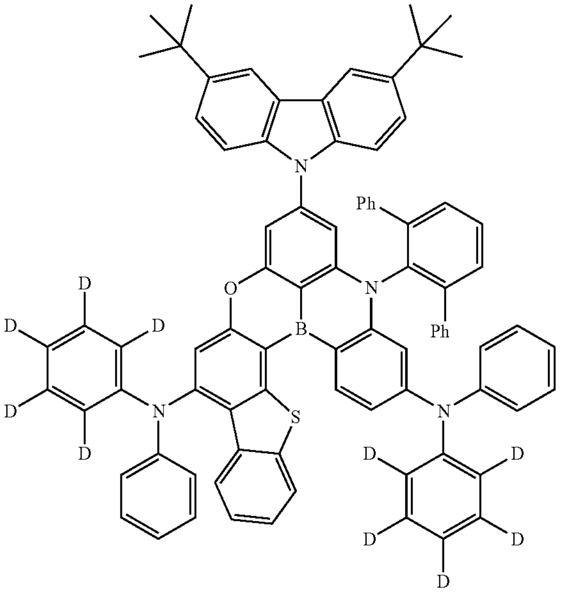
122
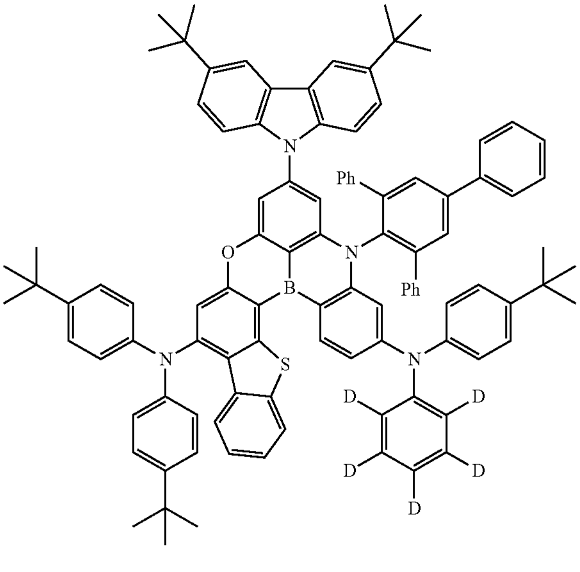

-continued
123
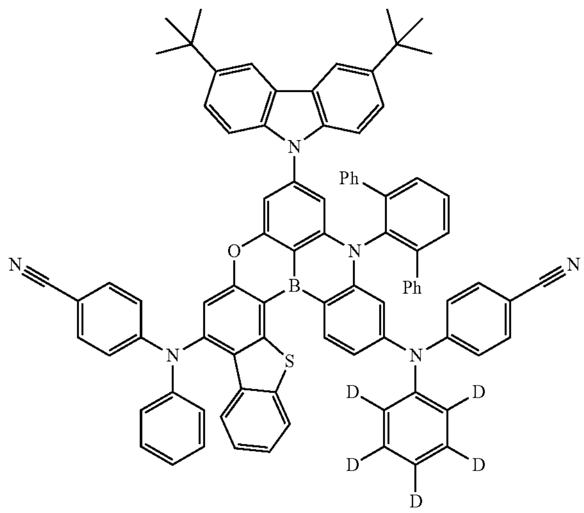
124
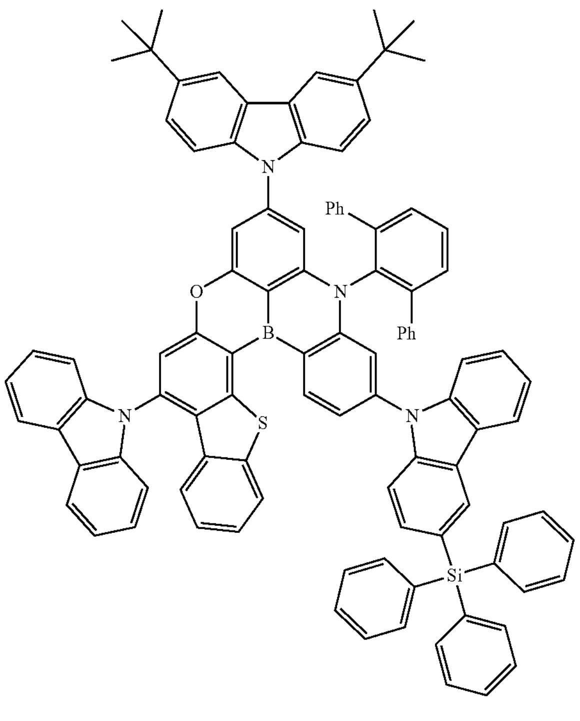
-continued
125
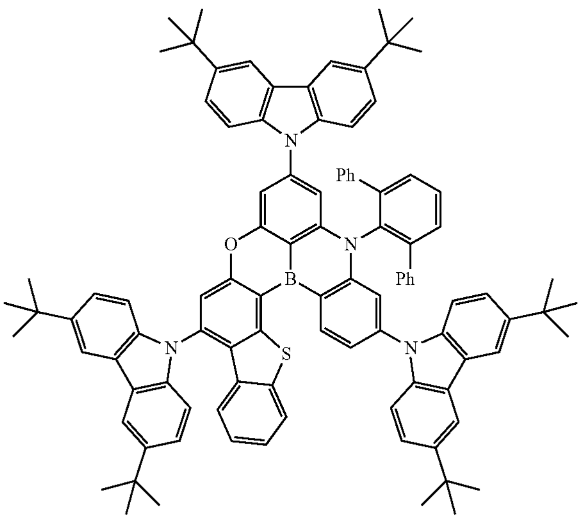
126
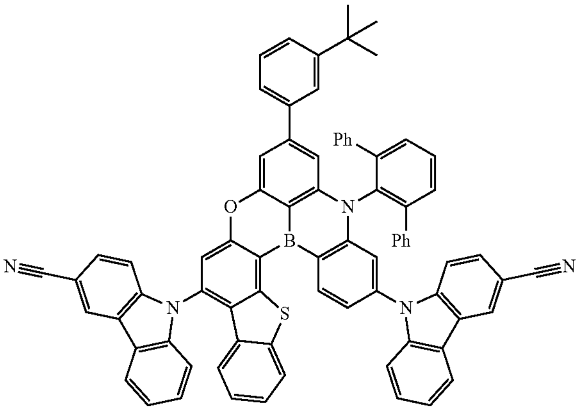
127
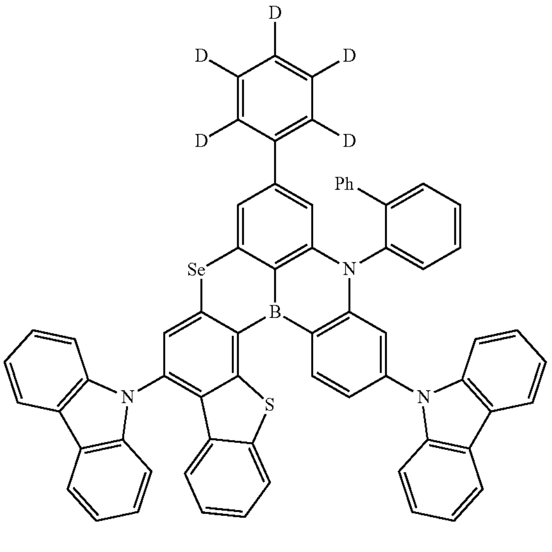

-continued
128
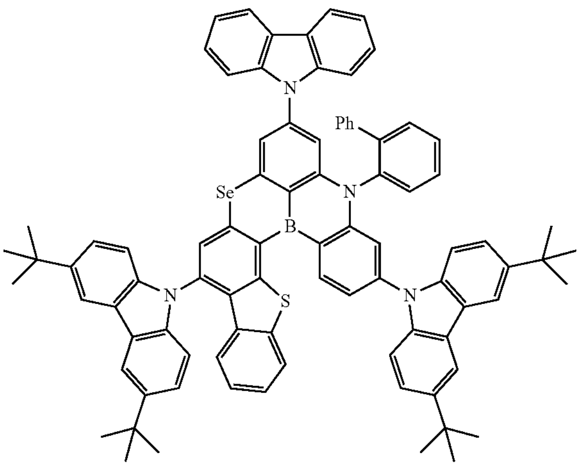
129
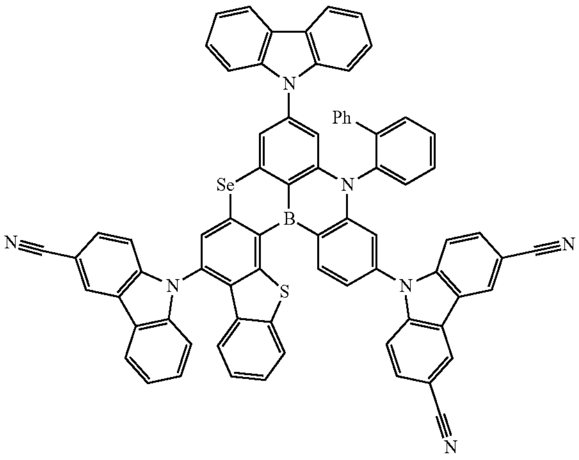
130
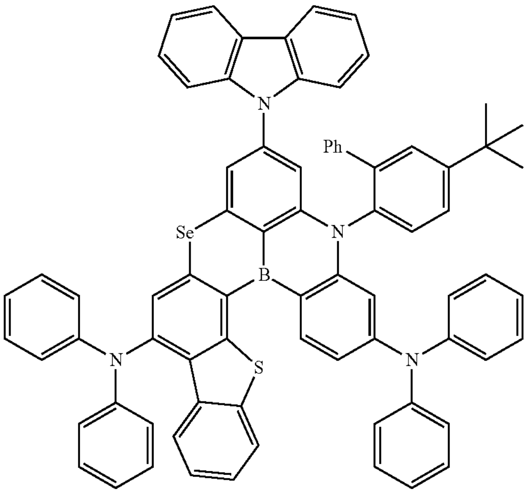
-continued
131
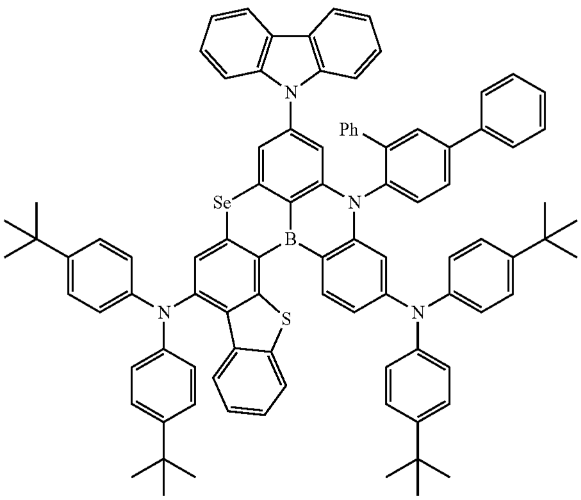
132
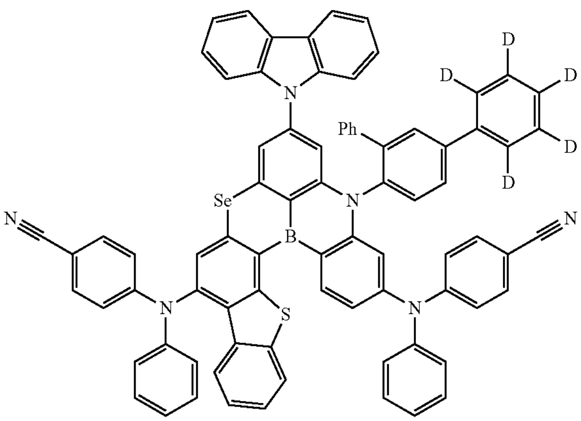
133
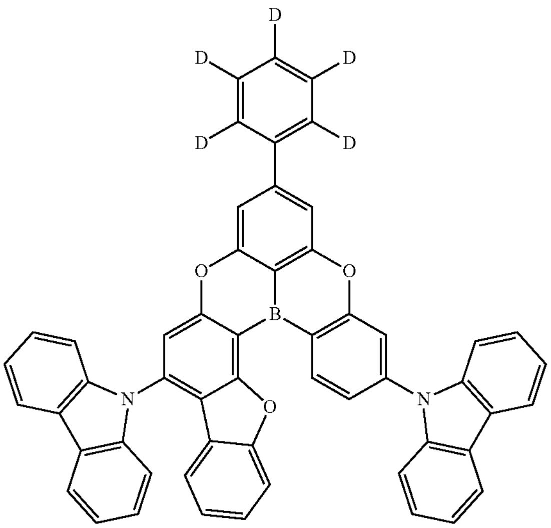

-continued
134
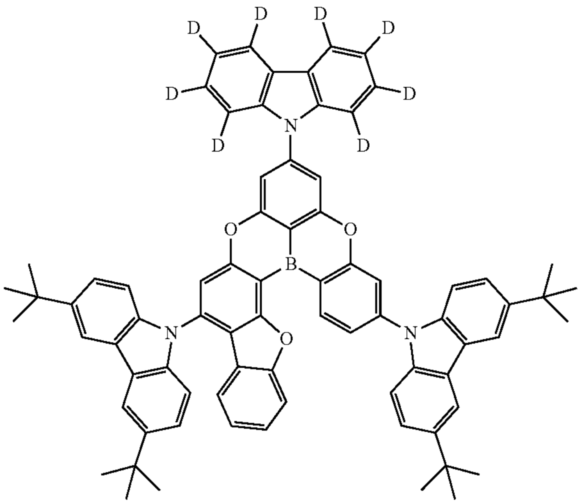
135
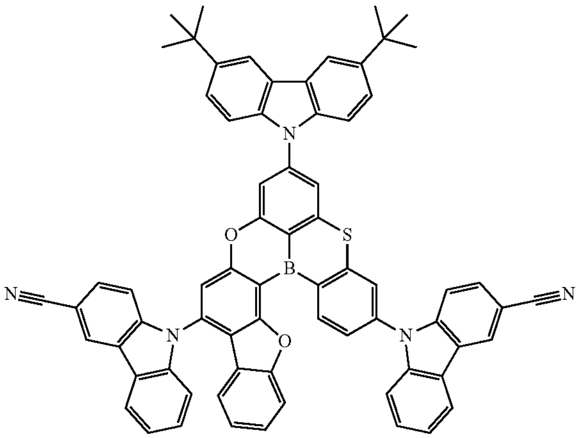
136
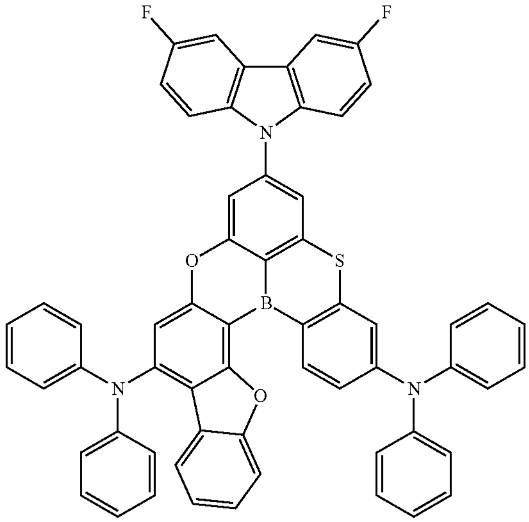
-continued
137
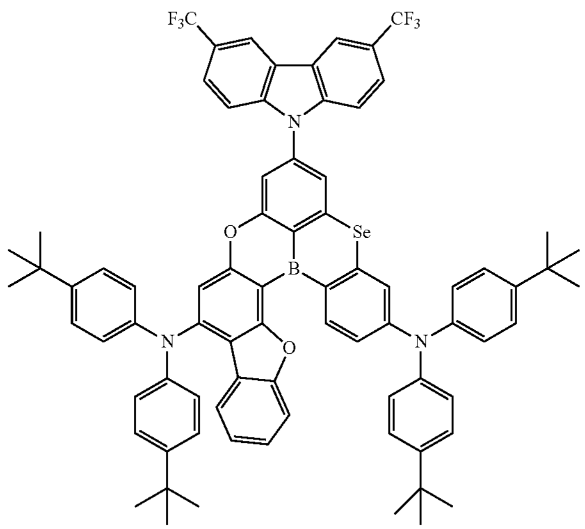
138
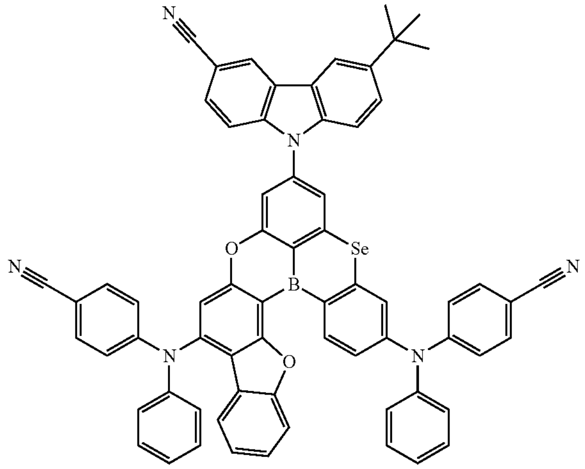
139
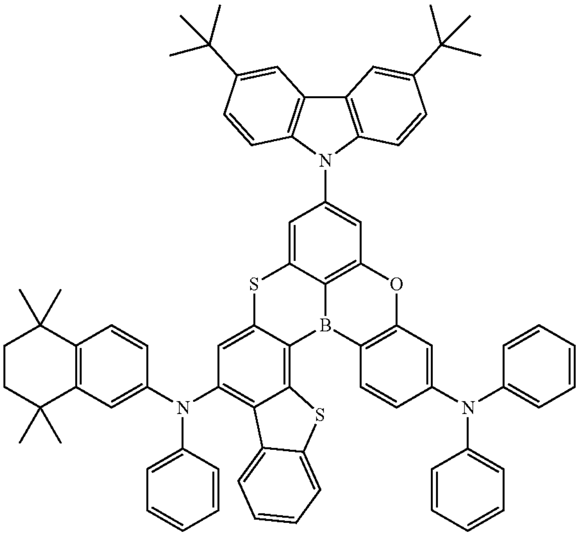

140
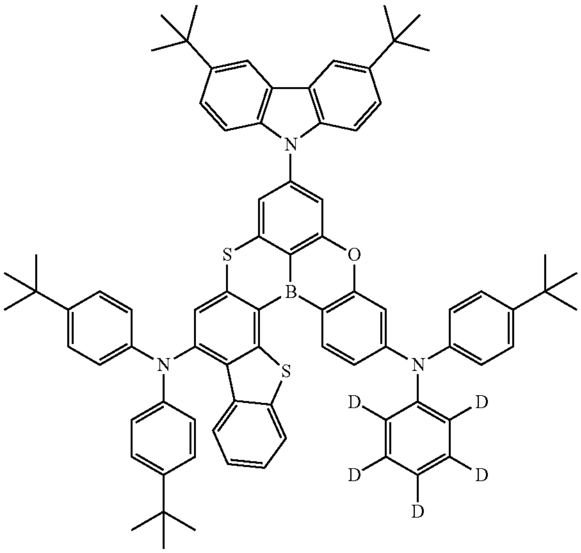
141
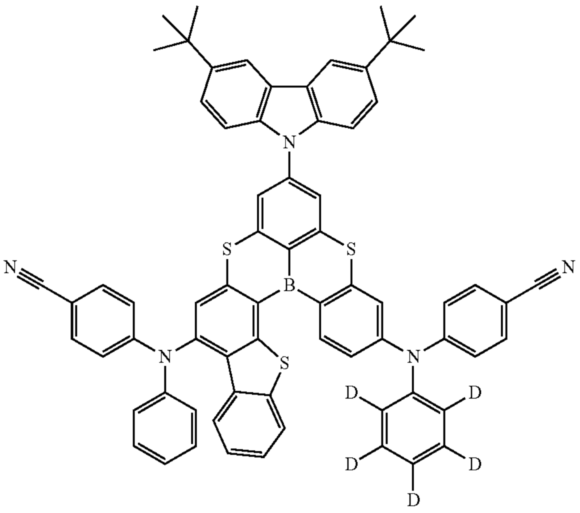
142
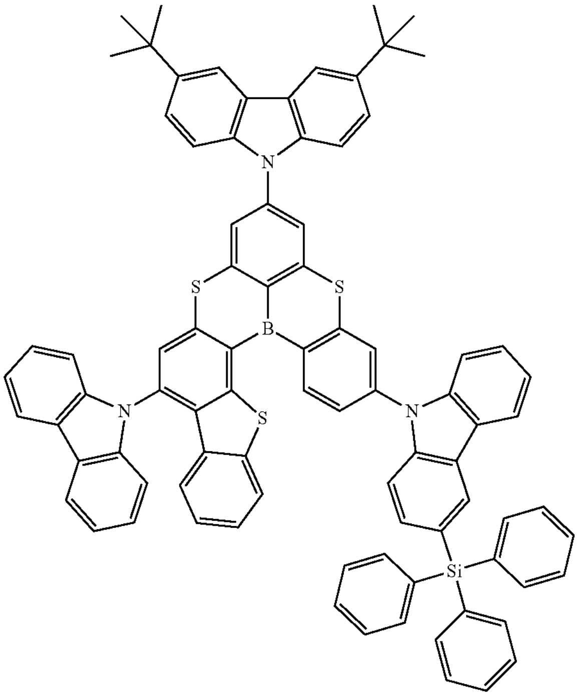
143
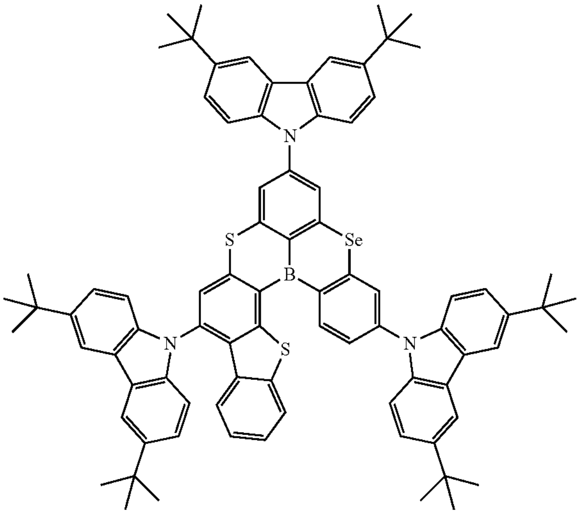
144
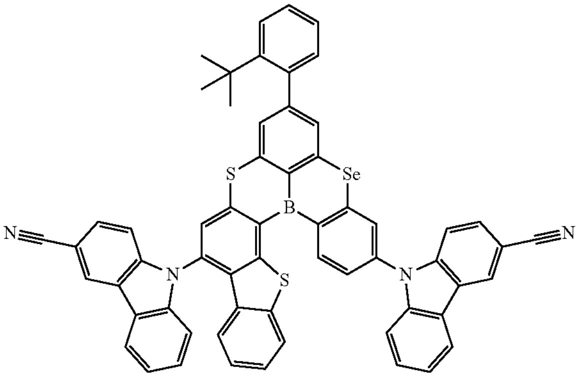

-continued
145
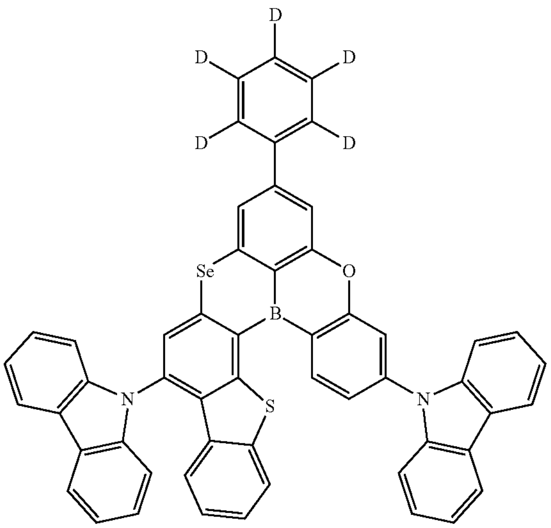
146
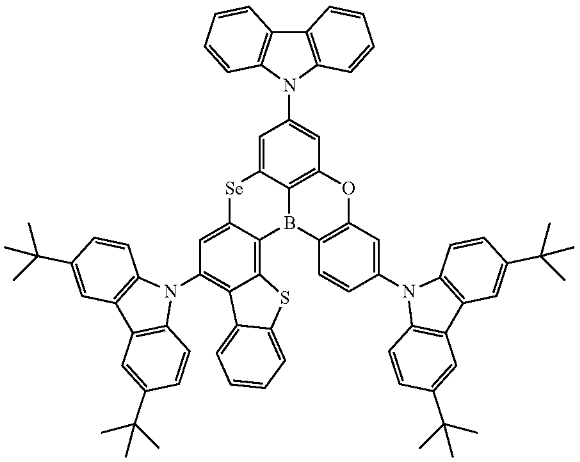
147
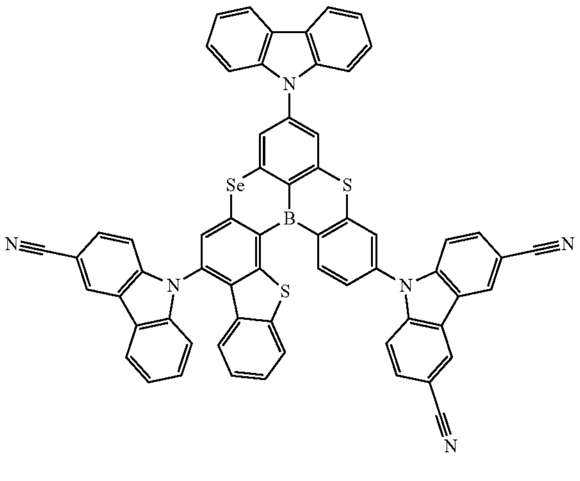
148
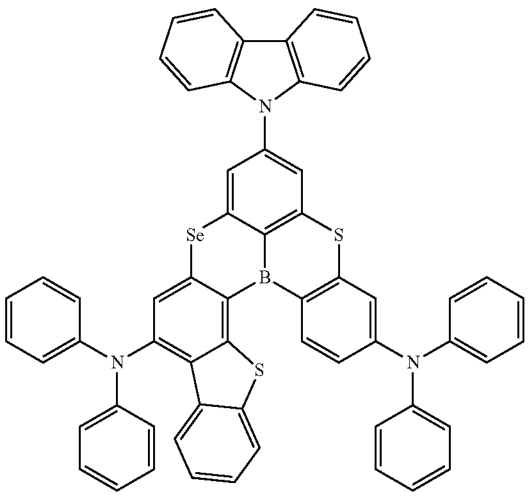
149
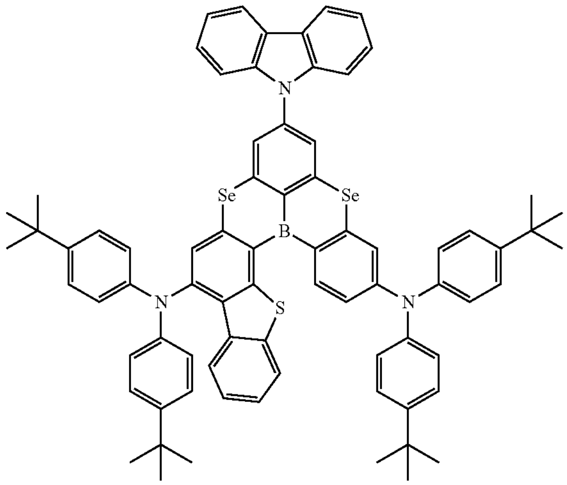
150
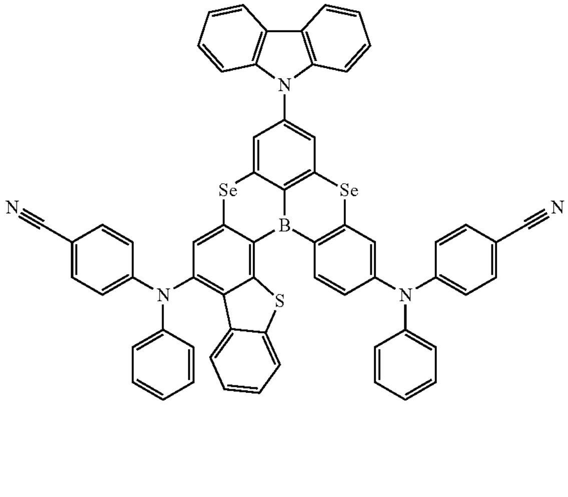

-continued
151
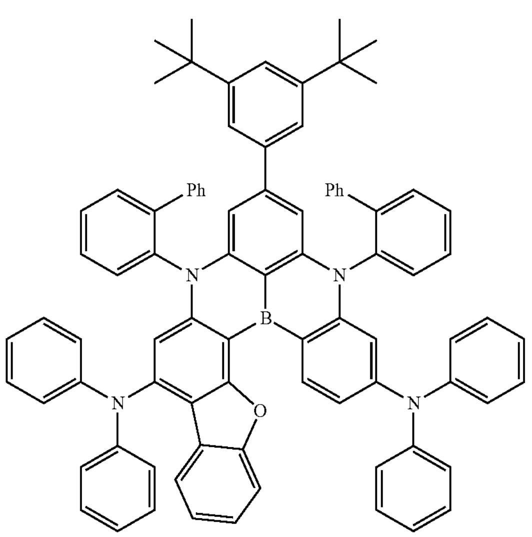
152
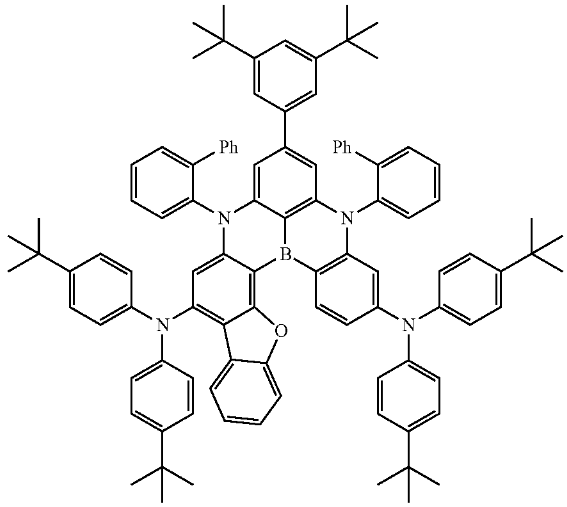
153
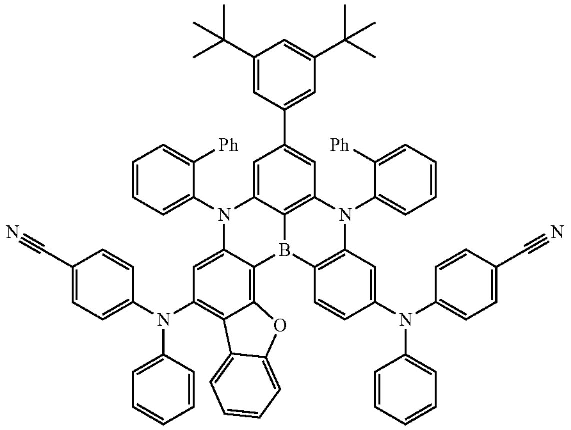
-continued
154
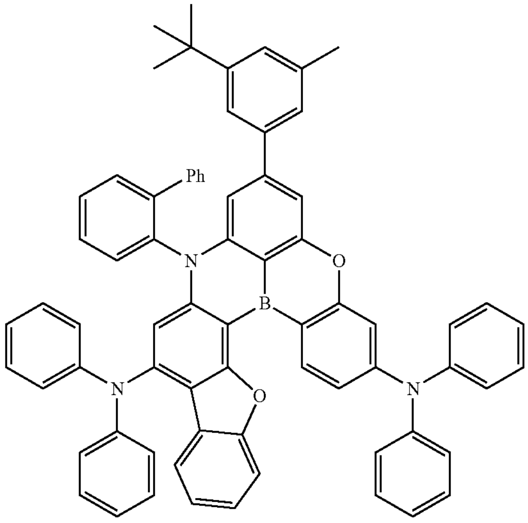
155
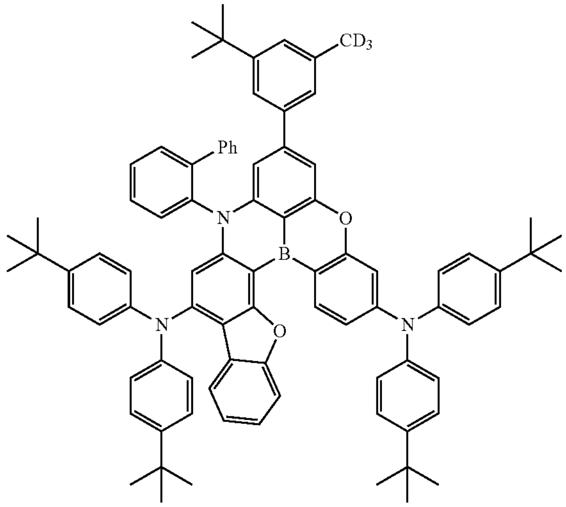
156
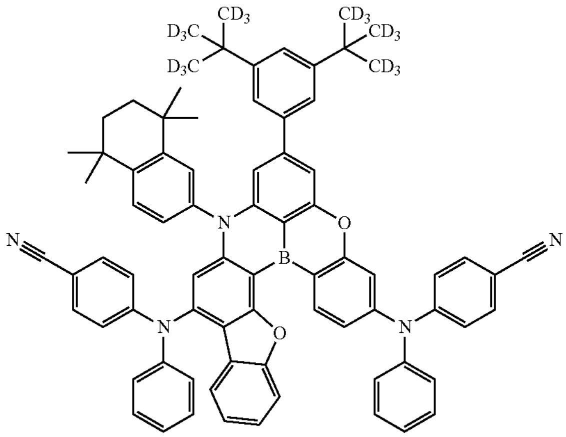

-continued
157
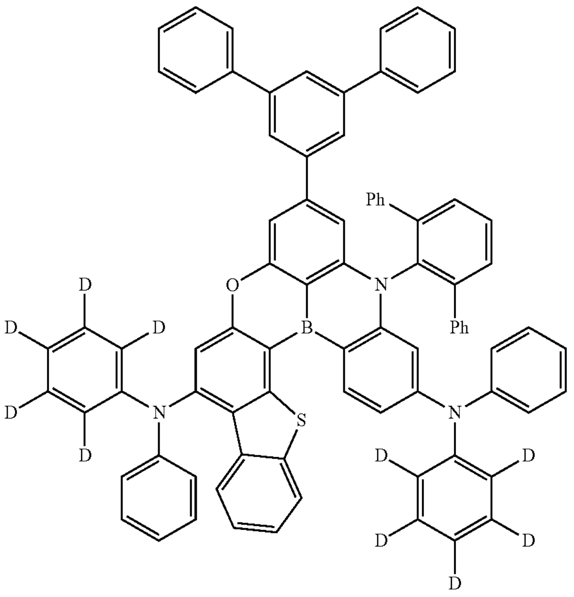
158
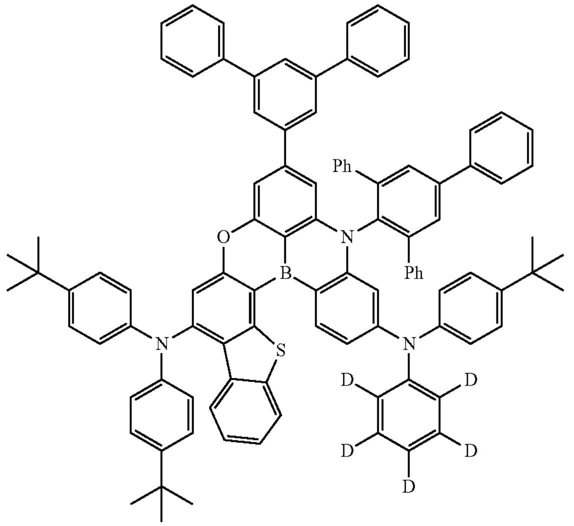
159
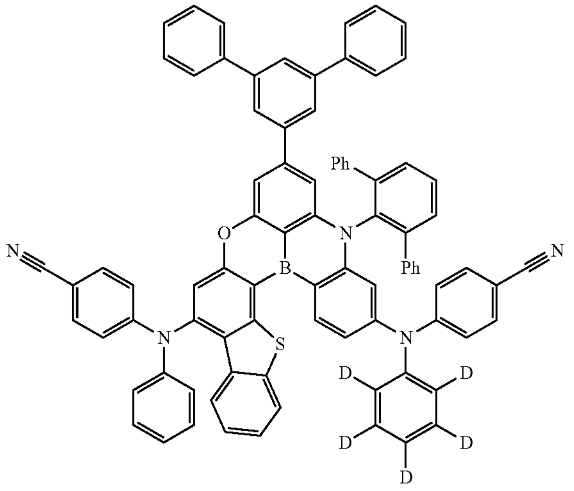
-continued
160
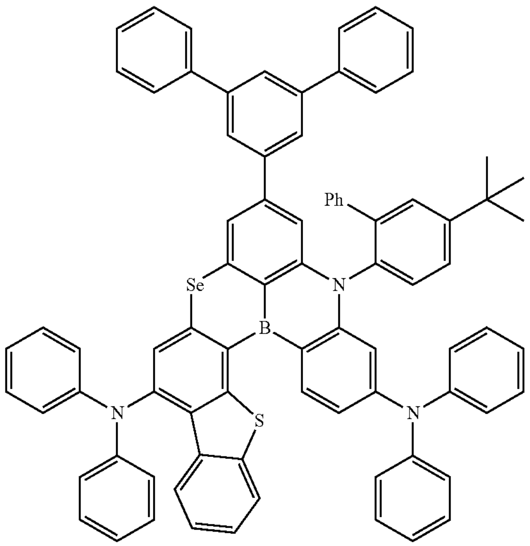
161
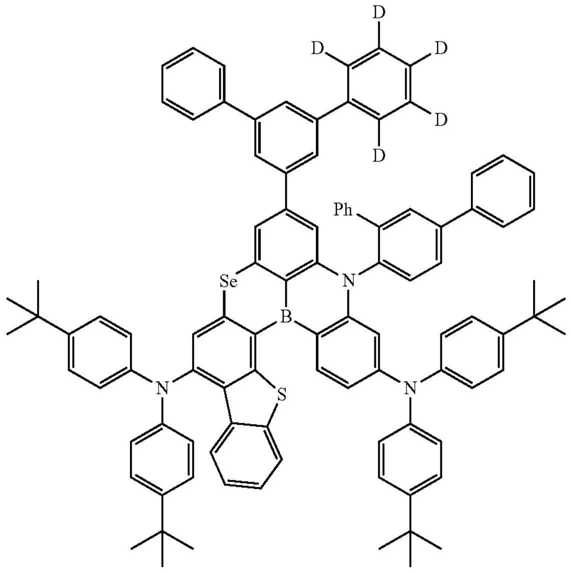

-continued

162

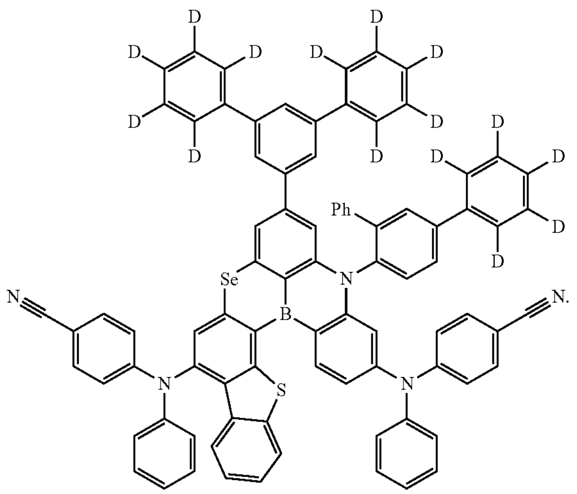

14. A fused polycyclic compound represented by Formula 1:

[Formula 1]

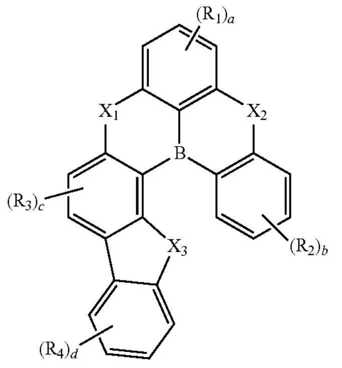

wherein in Formula 1, $X_1$ and $X_2$ are each independently $N(R_5)$, O, S, or Se, $X_3$ is O or S, $R_1$ and $R_2$ are each independently a substituted or unsubstituted amino group, a substituted or unsubstituted aryl group of 6 to 60 ring-forming carbon atoms, or a substituted or unsubstituted heteroaryl group of 2 to 60 ring-forming carbon atoms, $R_3$ is a substituted amino group or a substituted or unsubstituted heteroaryl group of 2 to 60 ring-forming carbon atoms, $R_4$ is a hydrogen atom, $R_5$ is a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, a, b, and c are each 1, and d is 0.

15. The fused polycyclic compound of claim 14, wherein the fused polycyclic compound represented by Formula 1 is represented by Formula 2-1 or Formula 2-2:

[Formula 2-1]

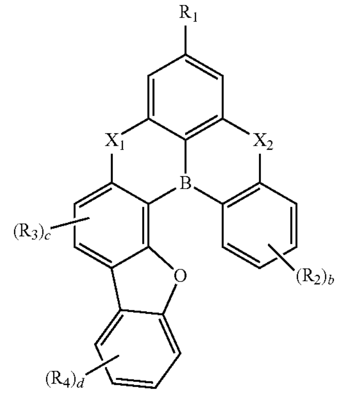

[Formula 2-2]

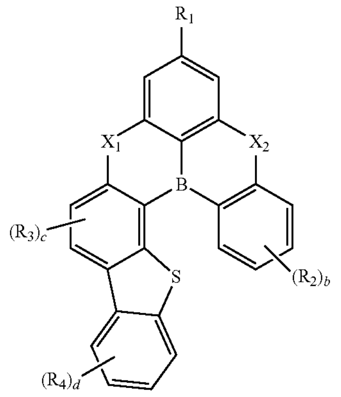

wherein in Formula 2-1 and Formula 2-2, $R_1$ is a substituted or unsubstituted amino group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, and $X_1$, $X_2$, $R_2$ to $R_4$, and b to d are the same as defined in Formula 1.

16. The fused polycyclic compound of claim 14, wherein the fused polycyclic compound represented by Formula 1 is represented by Formula 3-1 or Formula 3-2:

[Formula 3-1]

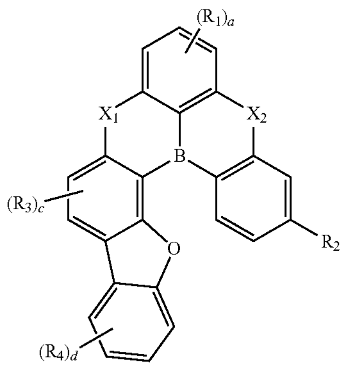

-continued

[Formula 3-2]

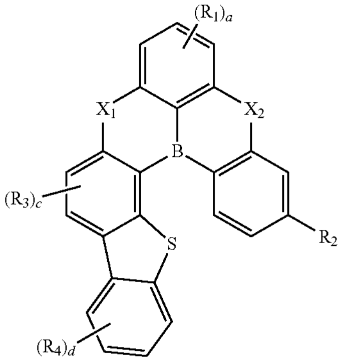

wherein in Formula 3-1 and Formula 3-2, $R_2$ is a substituted or unsubstituted amino group, a substituted or unsubstituted aryl group of 6 to 60 ring-forming carbon atoms, or a substituted or unsubstituted heteroaryl group of 2 to 60 ring-forming carbon atoms, and $X_1$, $X_2$, $R_1$, $R_3$, $R_4$, a, c, and d are the same as defined in Formula 1.

17. The fused polycyclic compound of claim 14, wherein the fused polycyclic compound represented by Formula 1 is represented by Formula 4-1 or Formula 4-2:

[Formula 4-1]

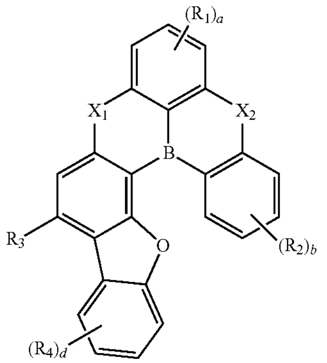

[Formula 4-2]

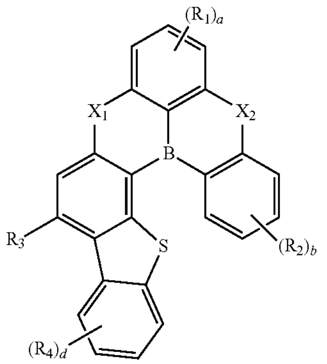

wherein in Formula 4-1 and Formula 4-2, $R_3$ is a substituted amino group or a substituted or unsubstituted heteroaryl group of 2 to 60 ring-forming carbon atoms, and $X_1$, $X_2$, $R_1$, $R_2$, $R_4$, a, b, and d are the same as defined in Formula 1.

18. The fused polycyclic compound of claim 14, wherein the fused polycyclic compound represented by Formula 1 is represented by Formula 5-1 or Formula 5-2:

[Formula 5-1]

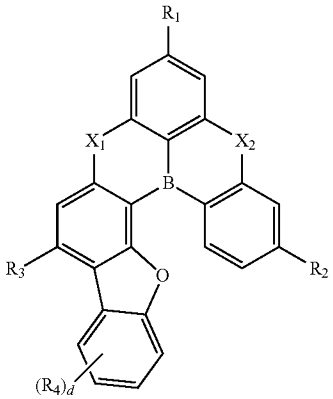

[Formula 5-2]

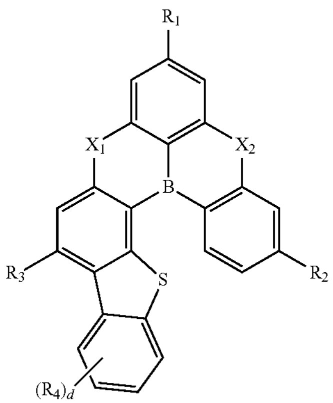

in Formula 5-1 and Formula 5-2, $R_1$ and $R_2$ are each independently a substituted or unsubstituted amino group, a substituted or unsubstituted aryl group of 6 to 60 ring-forming carbon atoms, or a substituted or unsubstituted heteroaryl group of 2 to 60 ring-forming carbon atoms, $R_3$ is a substituted amino group or a substituted or unsubstituted heteroaryl group of 2 to 60 ring-forming carbon atoms, and $X_1$, $X_2$, $R_4$, and d are the same as defined in Formula 1.

19. A fused polycyclic compound, wherein the fused polycyclic compound is one selected from Compound Group 1:
[Compound Group 1]
1
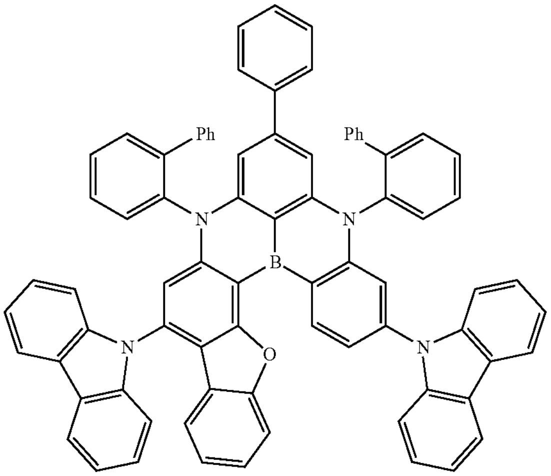
2
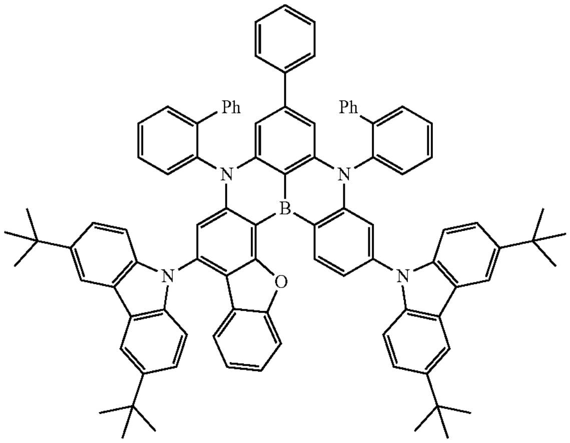
3
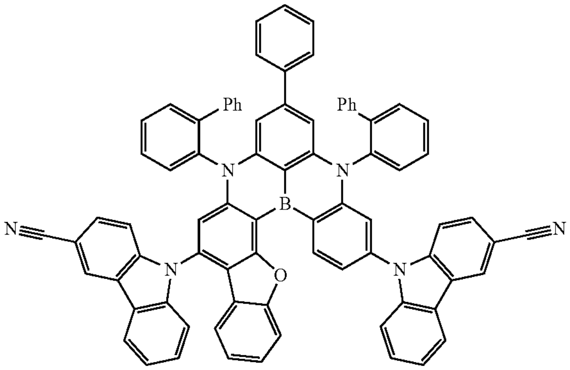
-continued
4
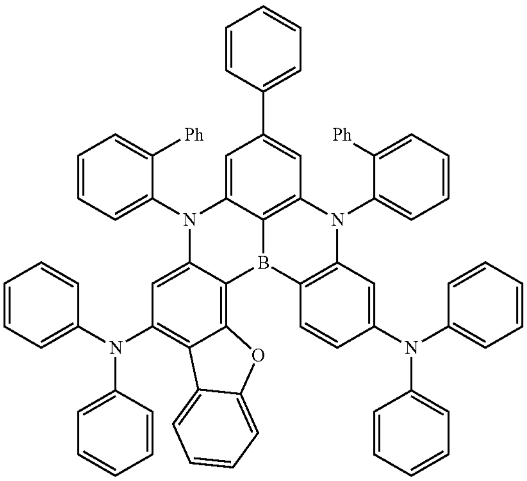
5
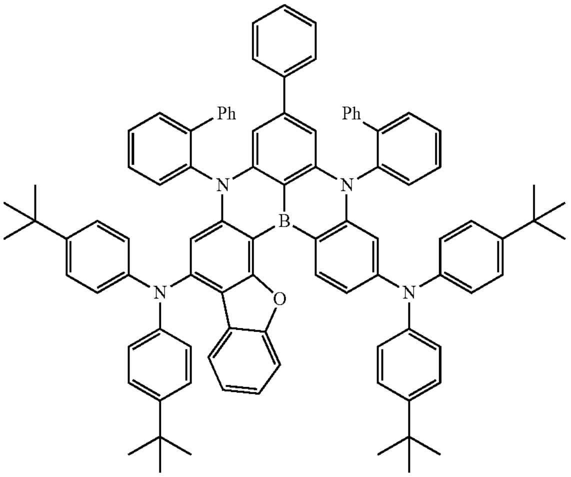
6
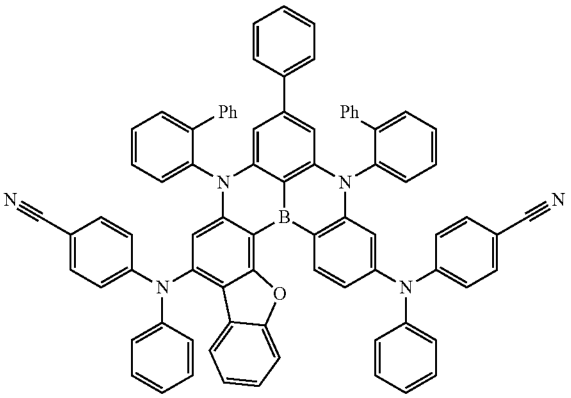

-continued
7
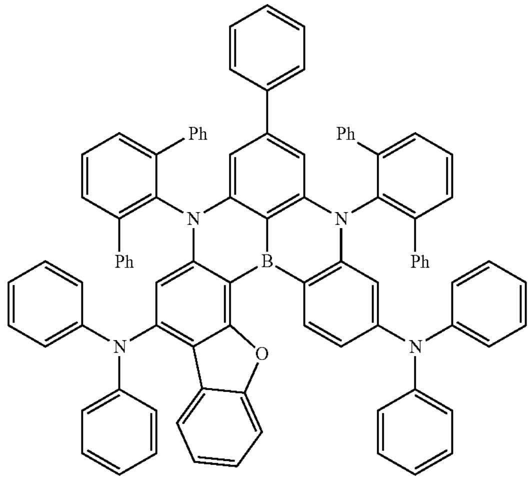
8
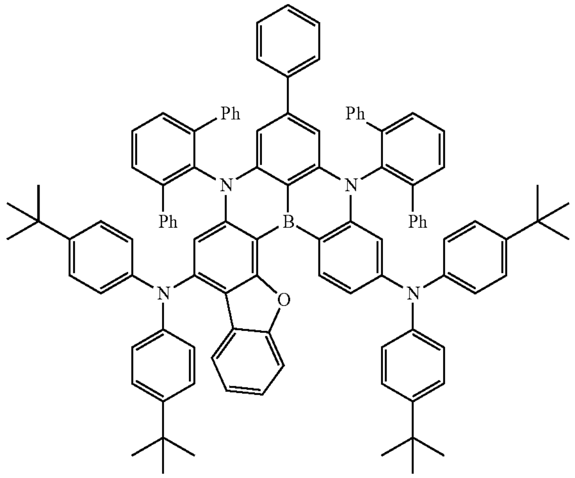
9
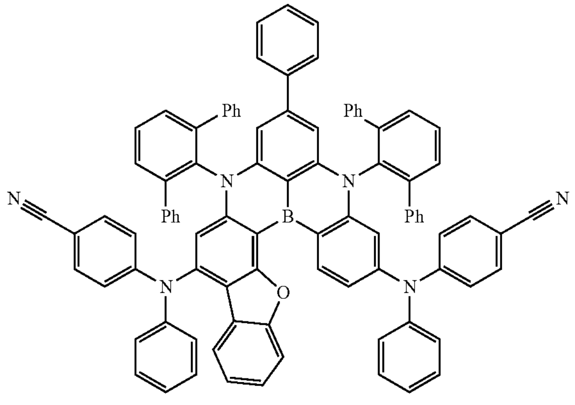
-continued
10
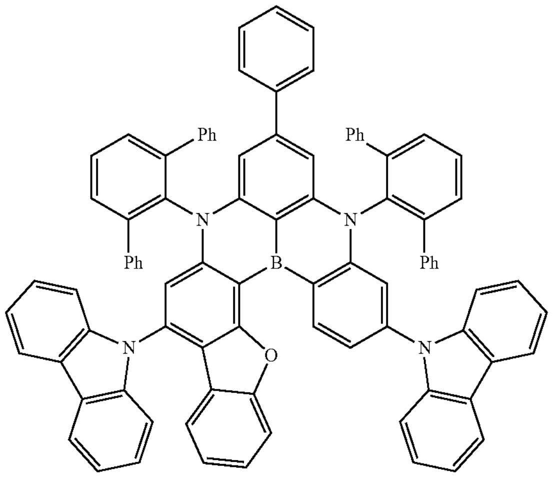
11
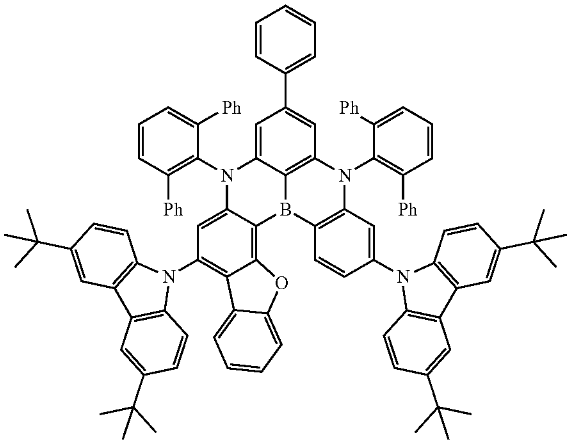
12
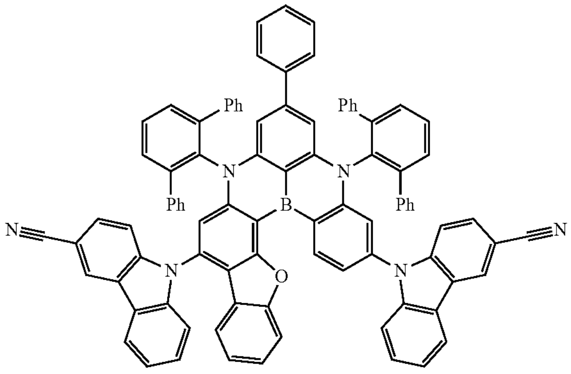

-continued
13
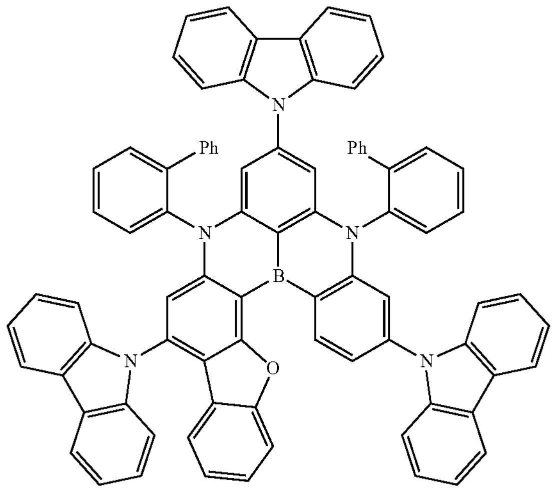
14
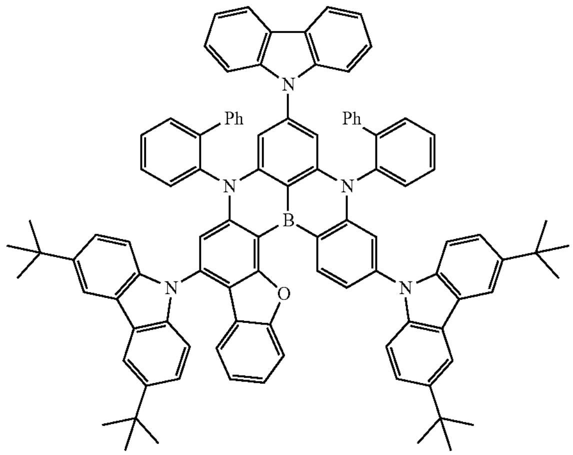
15
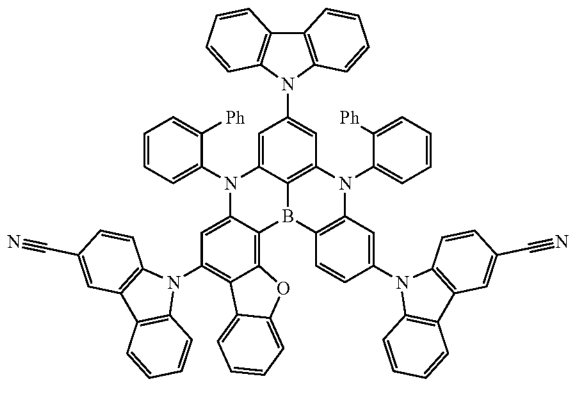
-continued
16
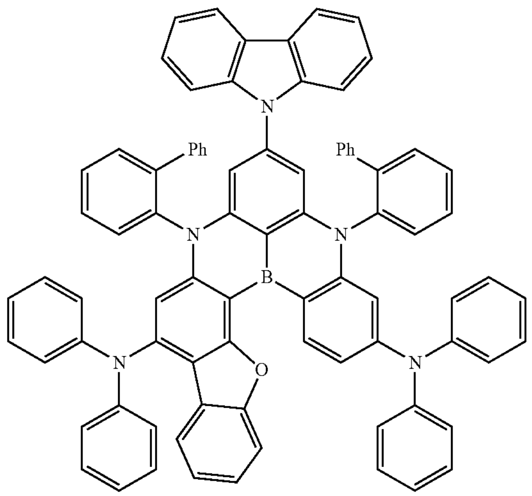
17
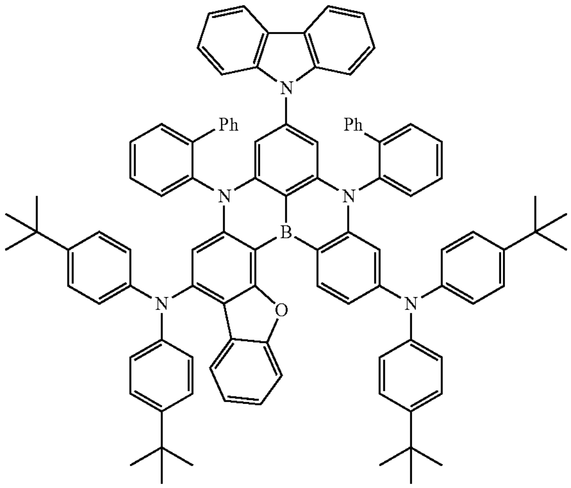
18
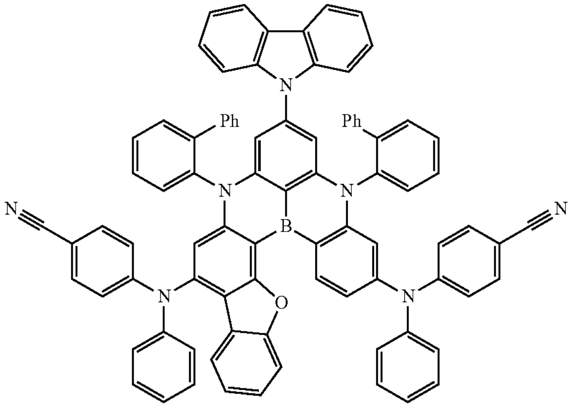

-continued
19
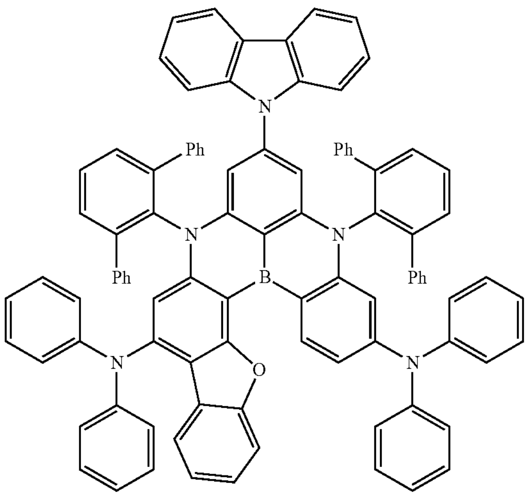
20
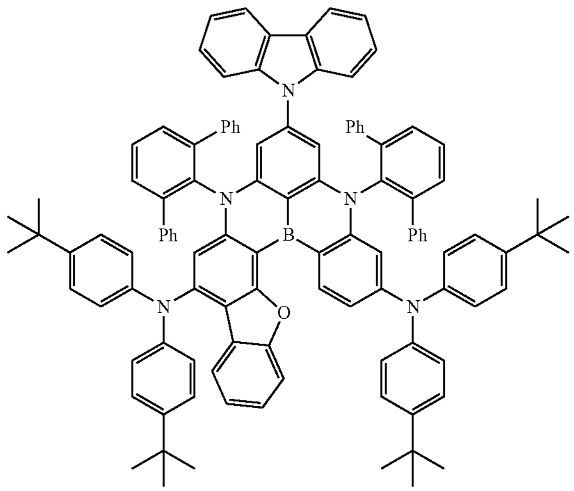
21
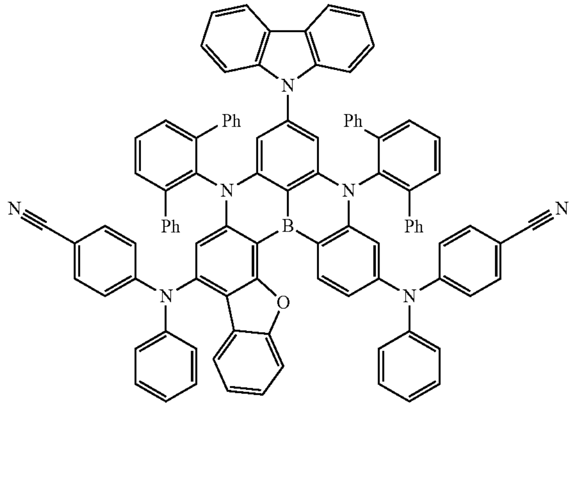
-continued
22
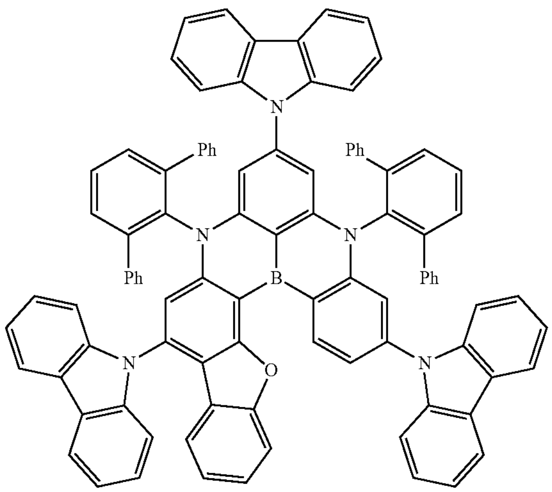
23
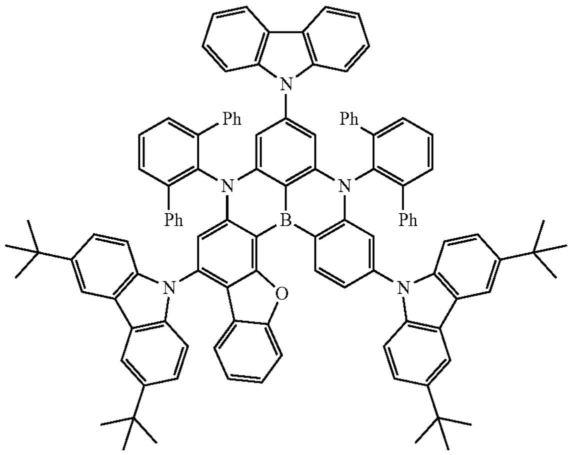
24
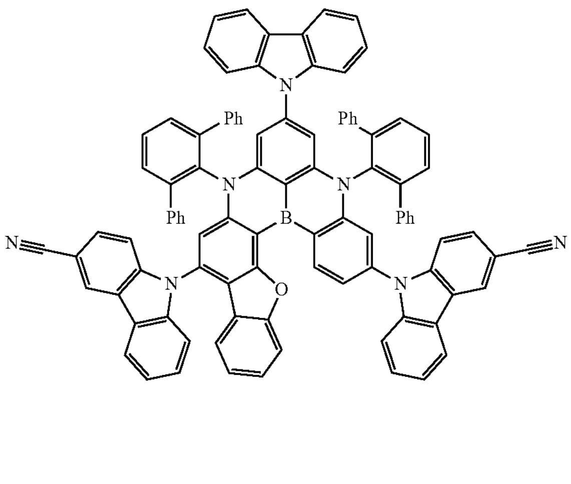

-continued
25
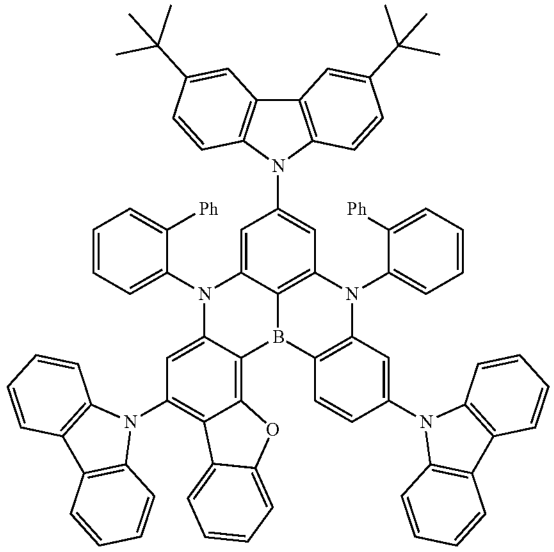
26
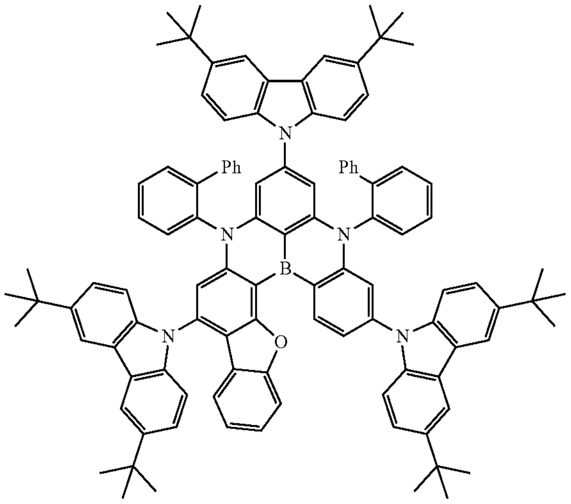
27
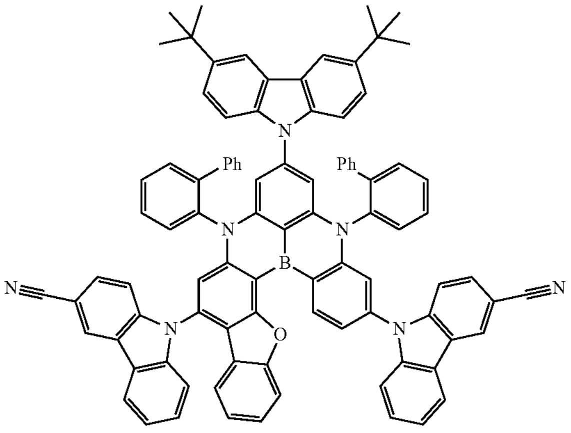
-continued
28
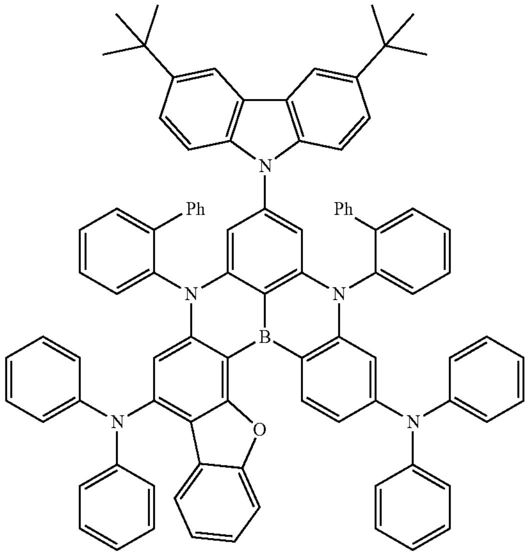
29
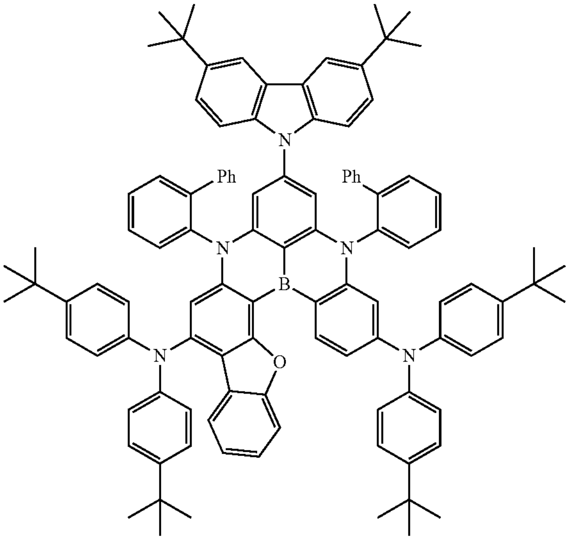
30
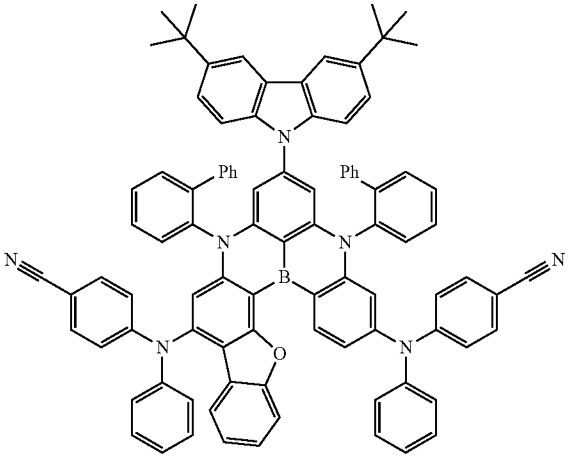

-continued
31
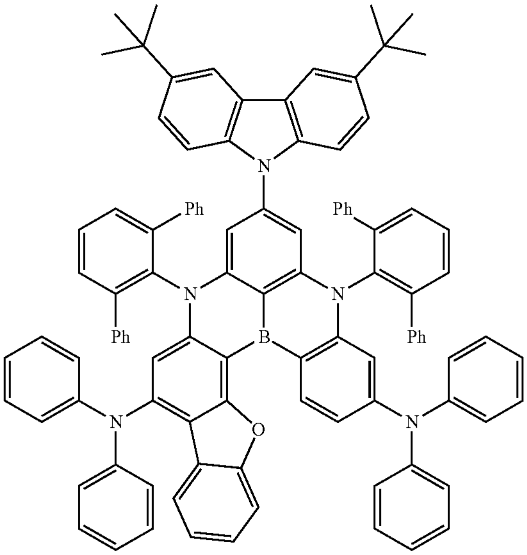
32
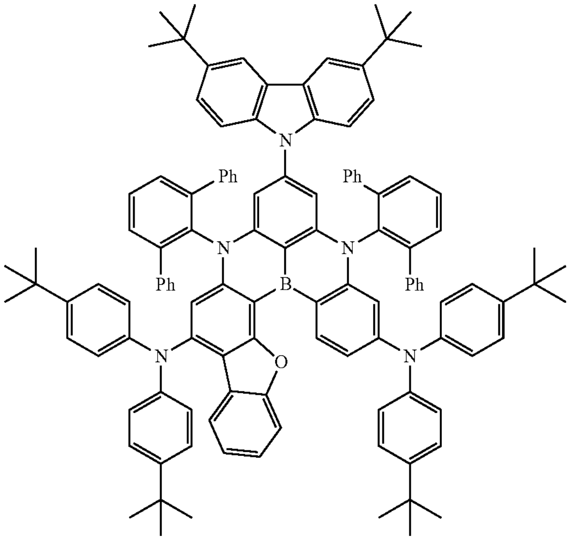
33
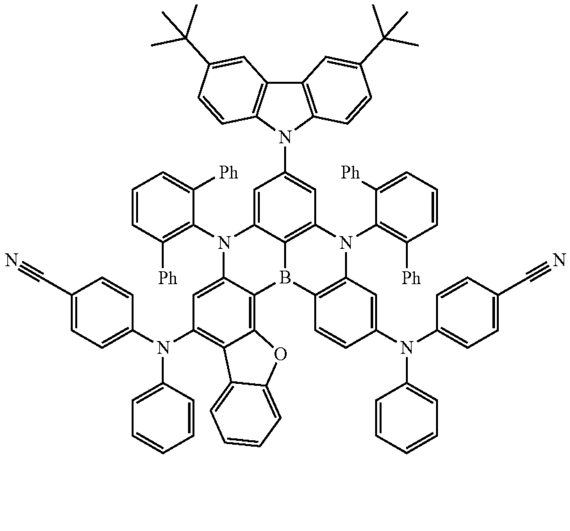
-continued
34
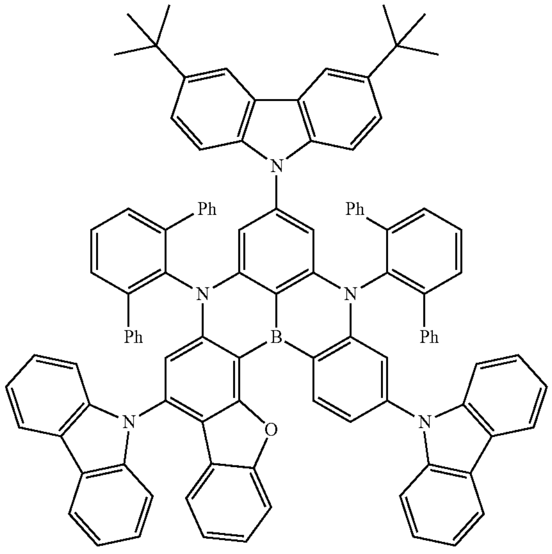
35
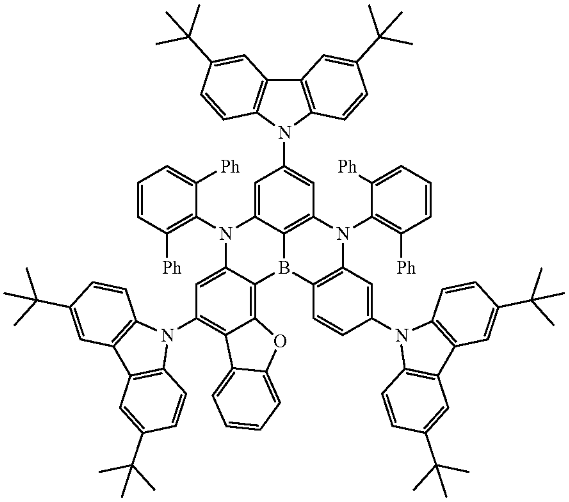
36
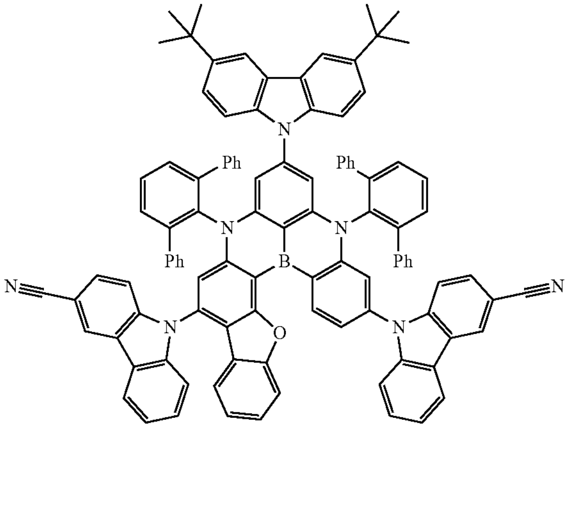

-continued
37
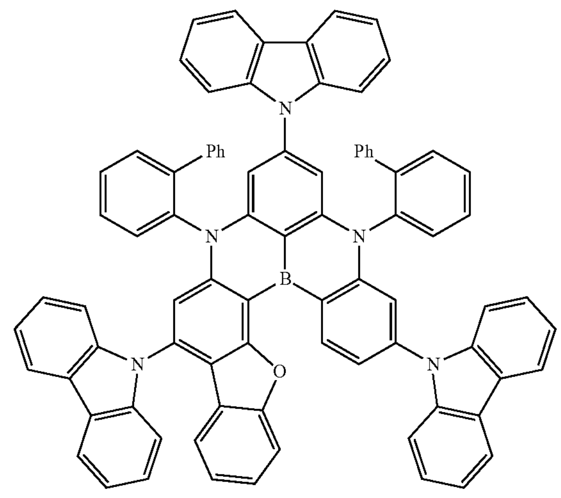
38
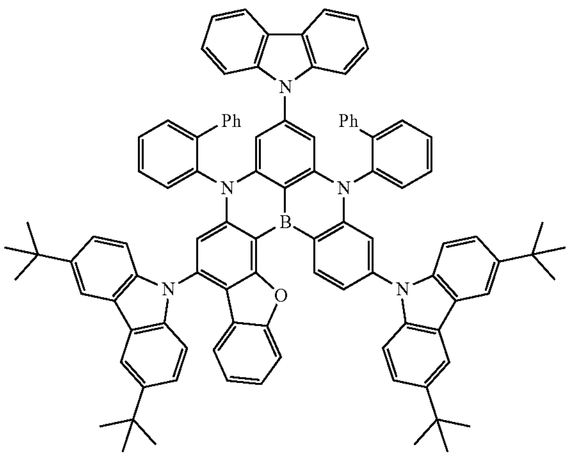
39
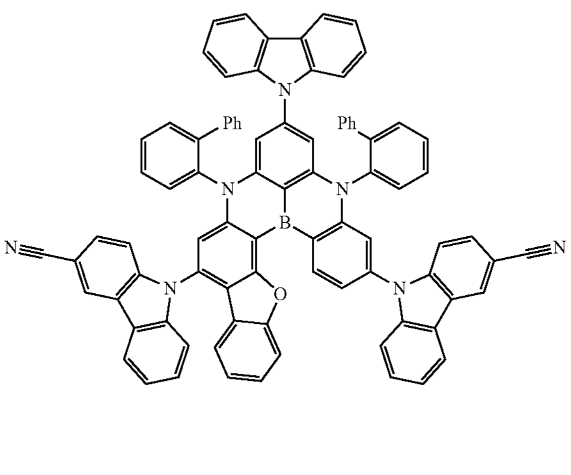
-continued
40
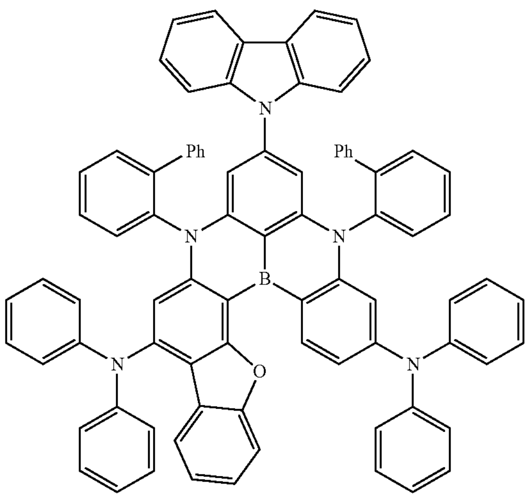
41
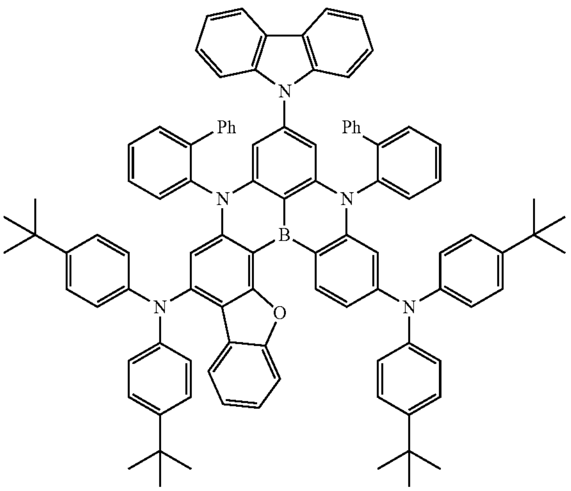
42
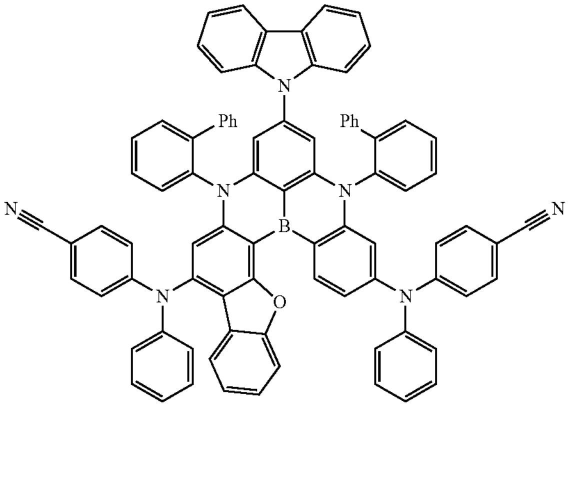

-continued
43
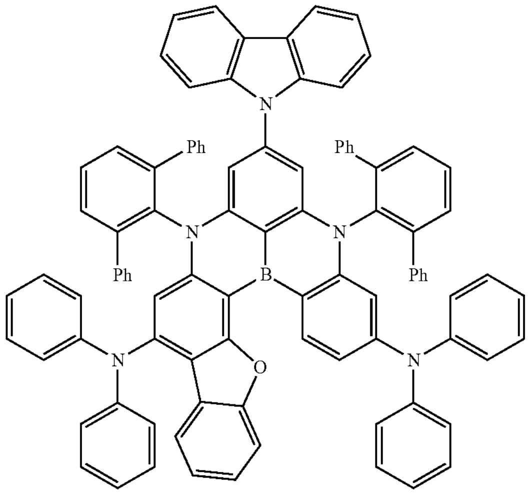
44
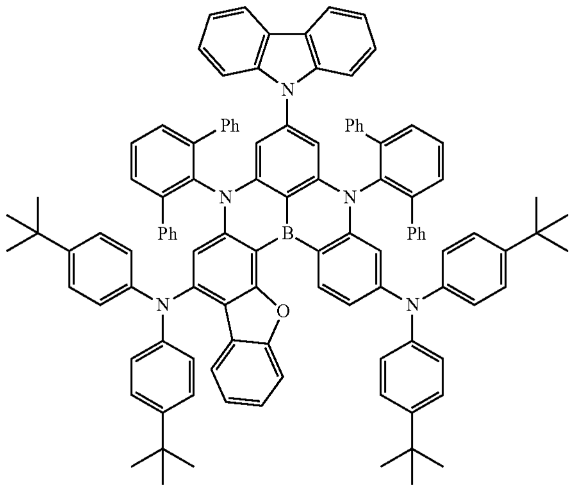
45
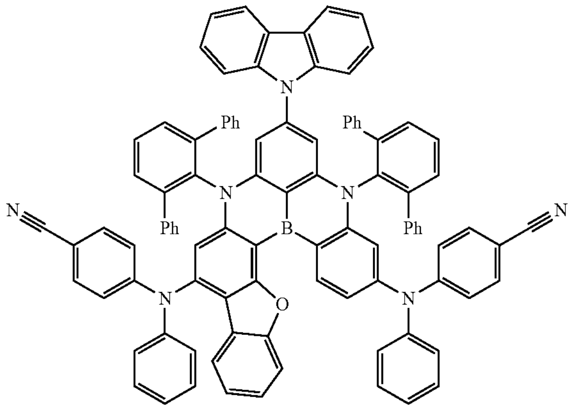
-continued
46
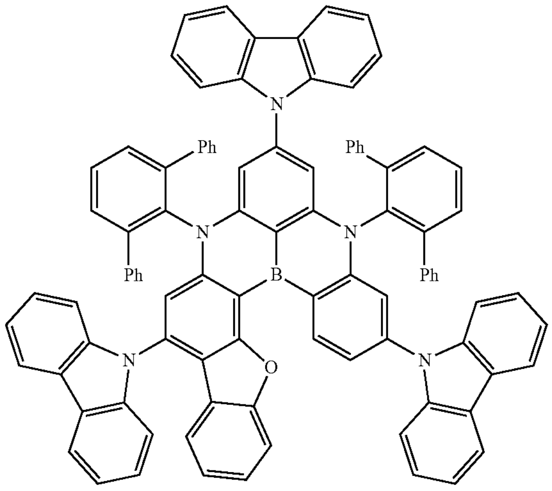
47
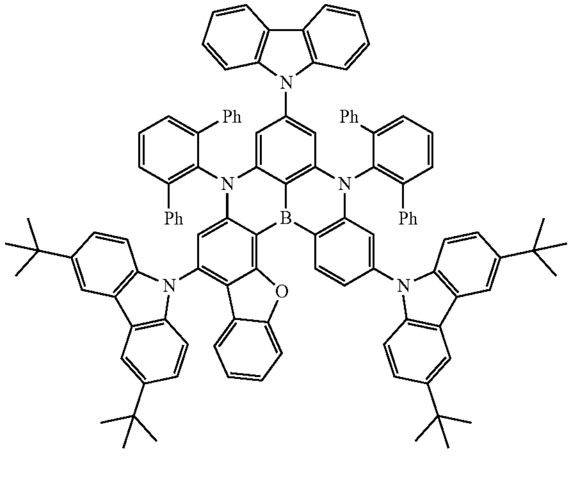
48
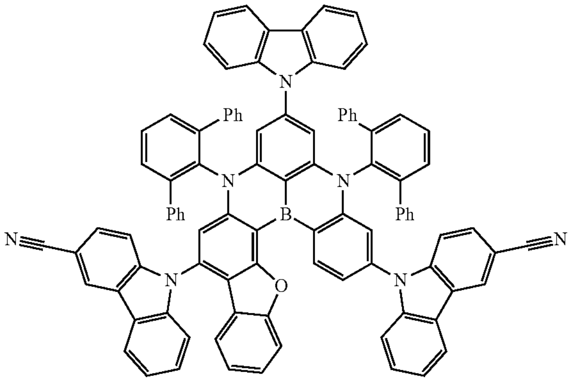

-continued
49
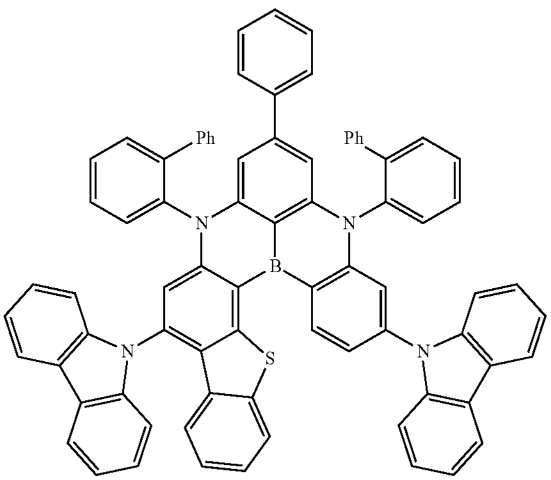
50
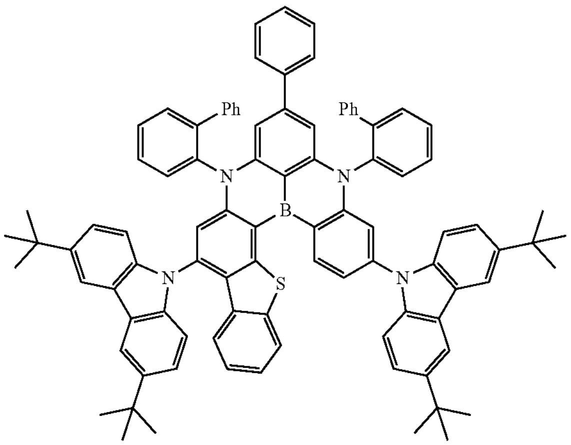
51
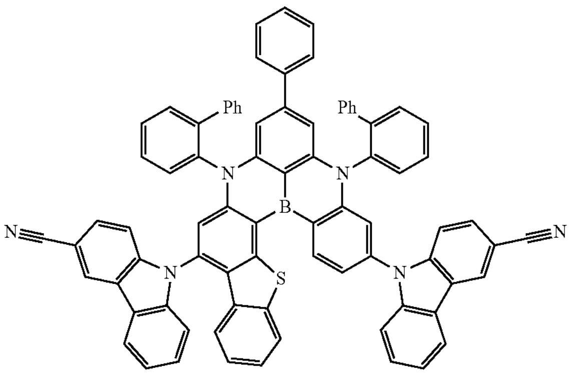
-continued
52
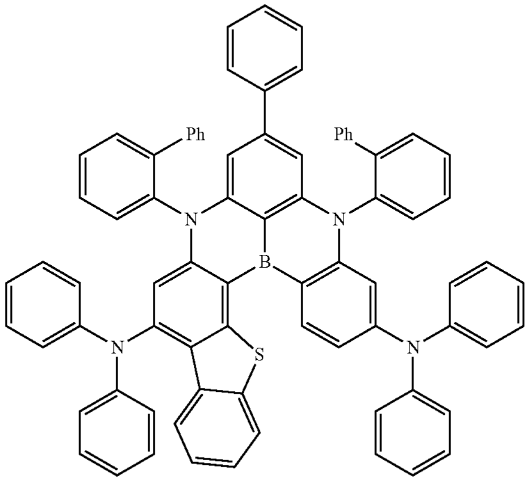
53
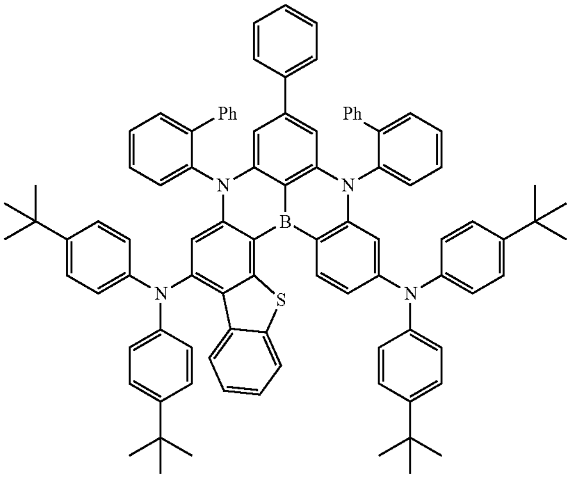
54
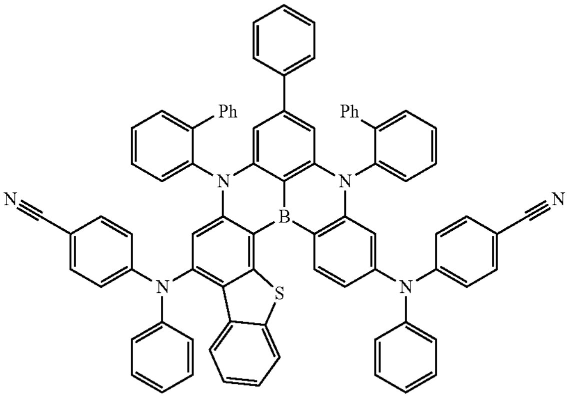

-continued
55
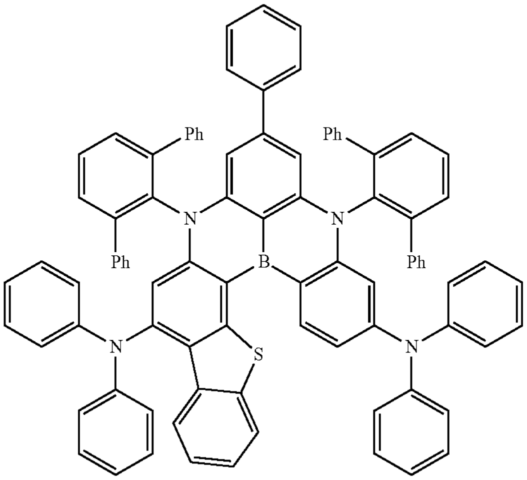
56
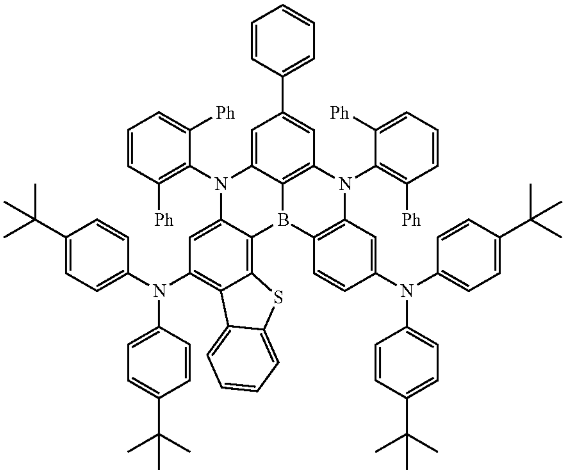
57
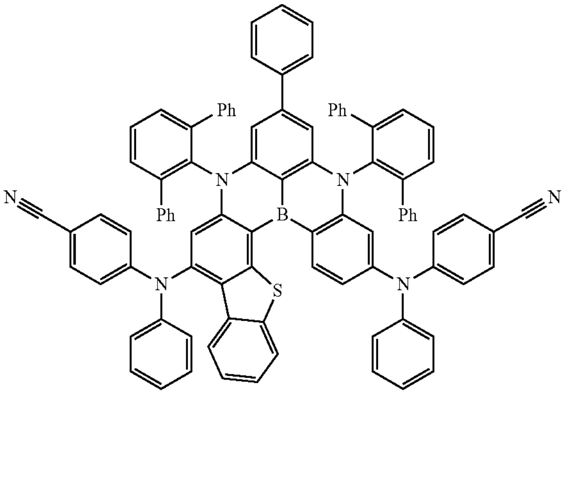
58
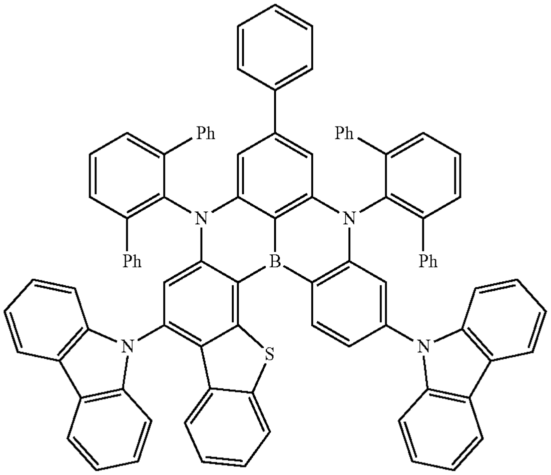
59
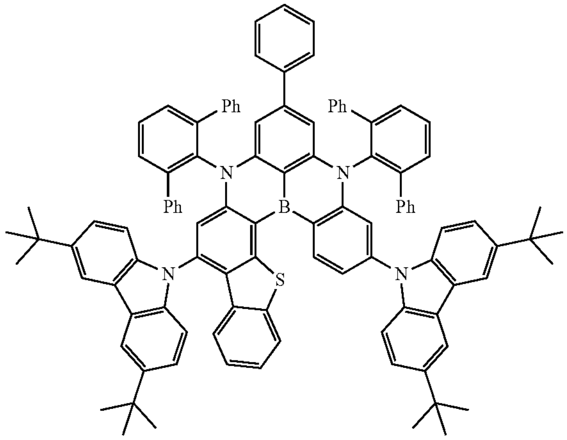
60
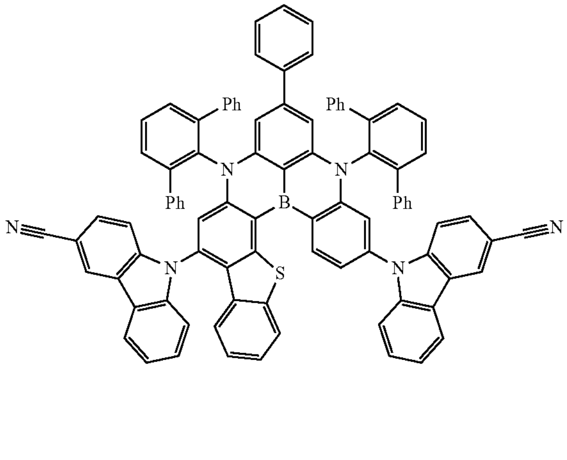

-continued
61
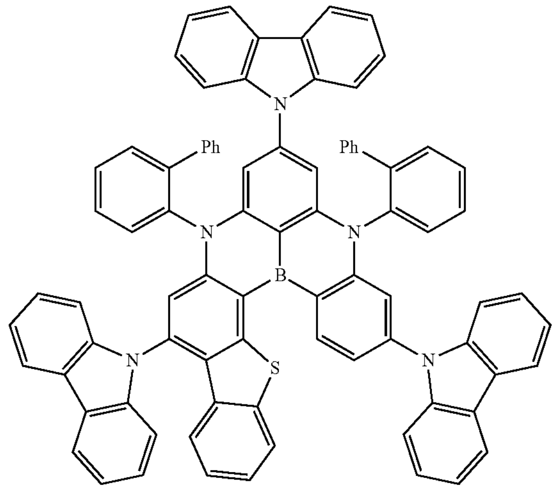
62
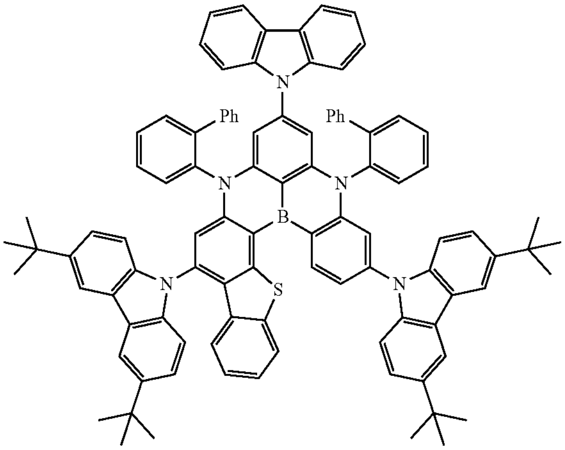
63
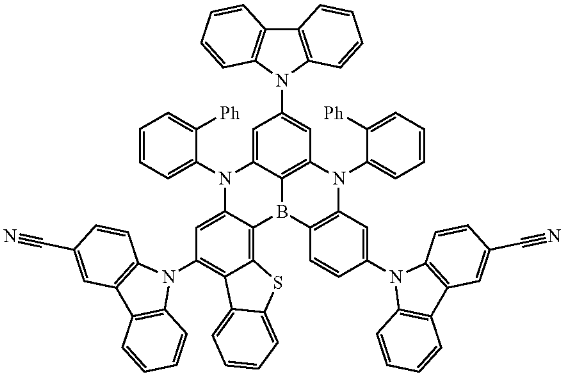
-continued
64
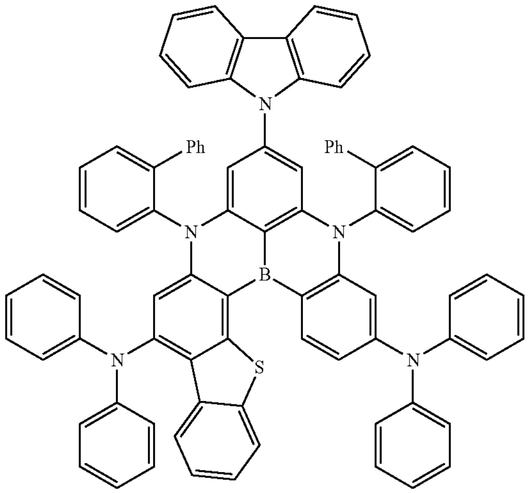
65
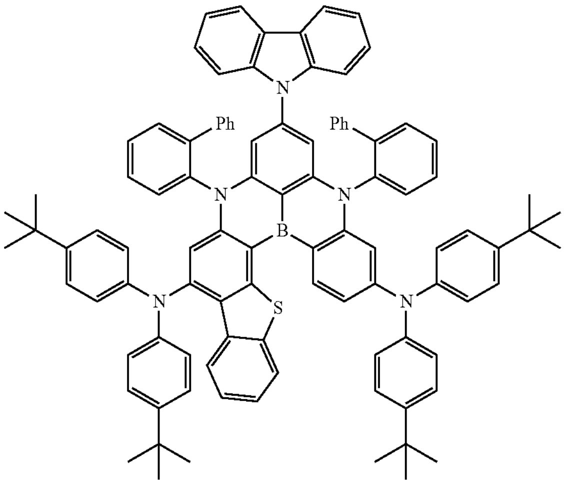
66
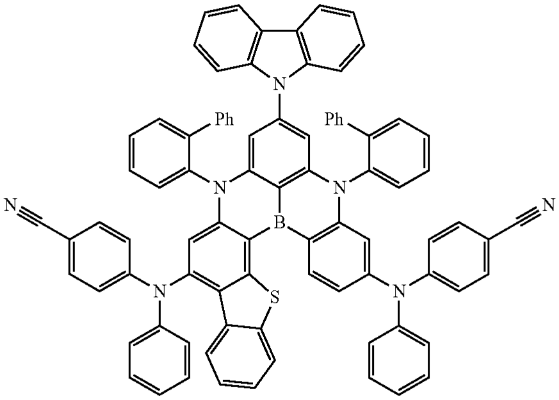

-continued
67
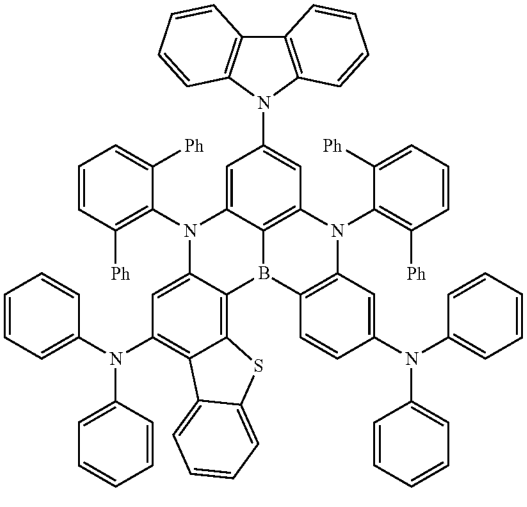
68
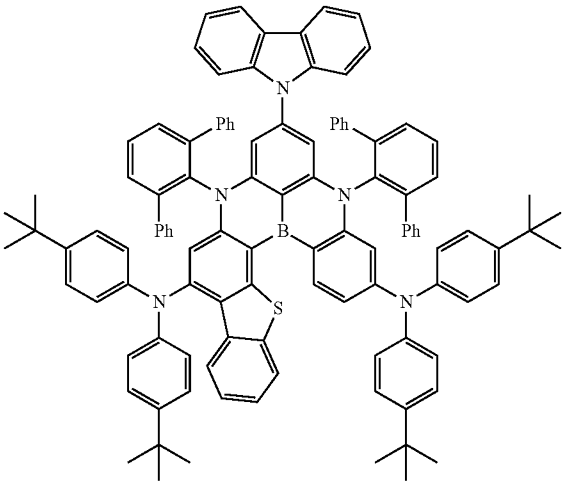
69
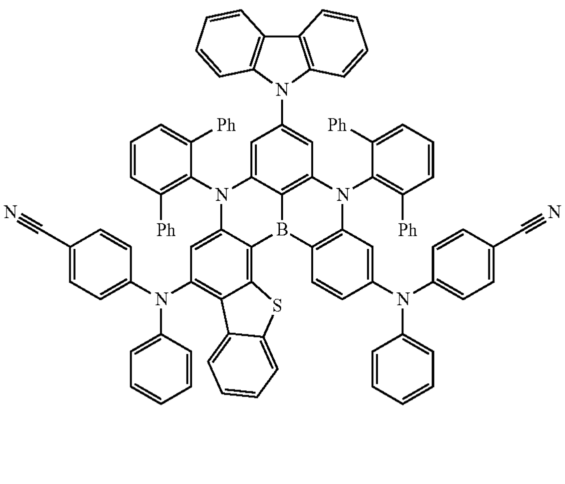
-continued
70
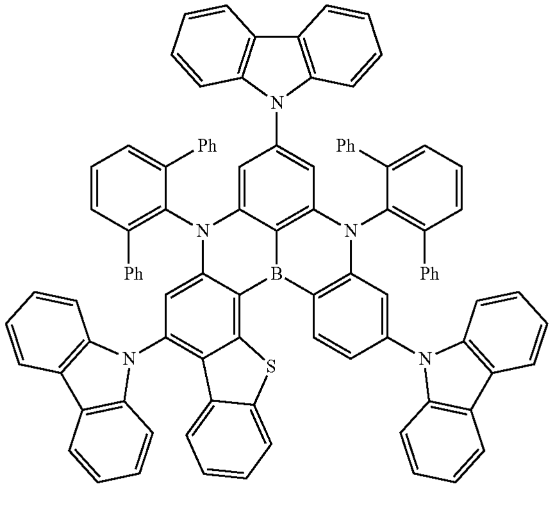
71
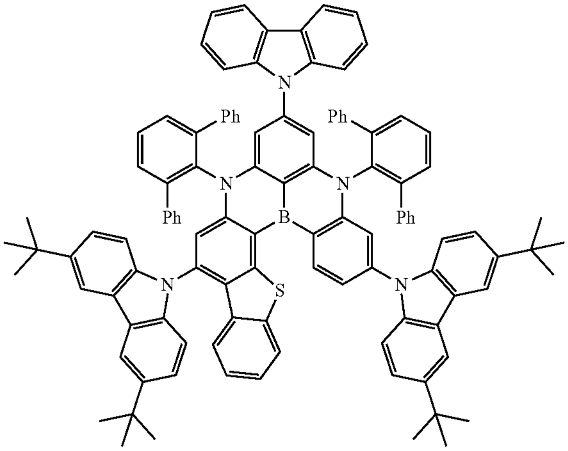
72
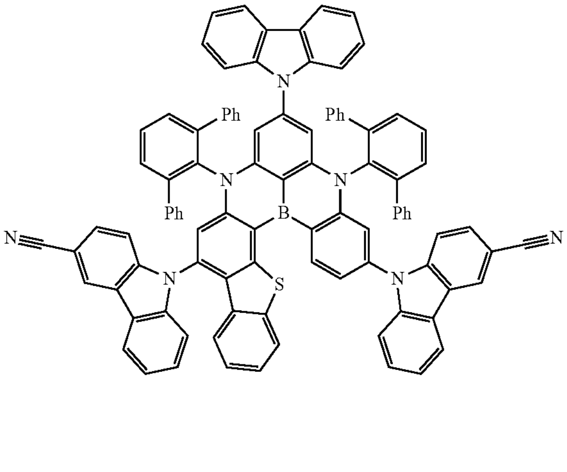

-continued
73
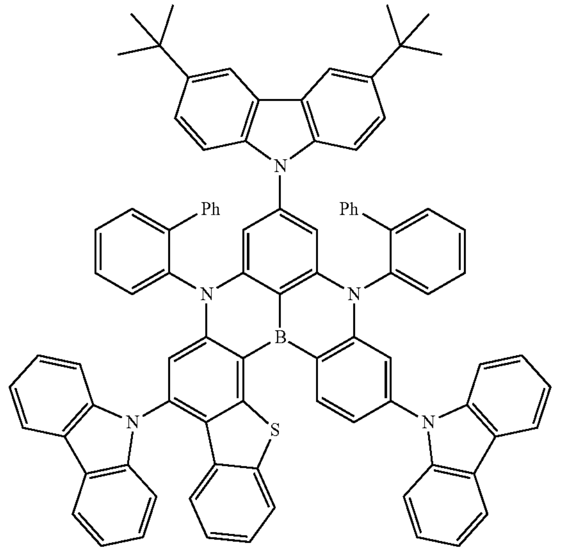
76
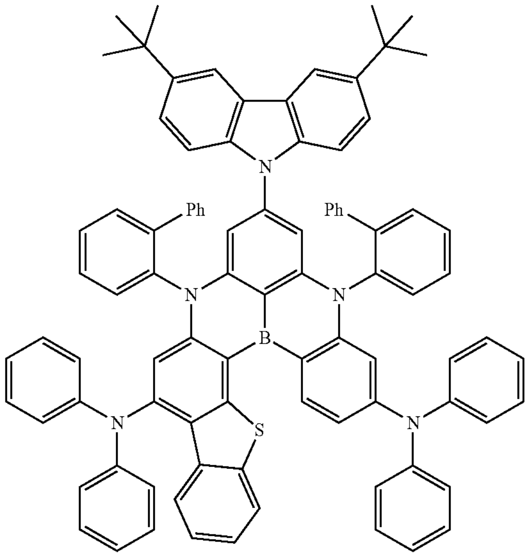
74
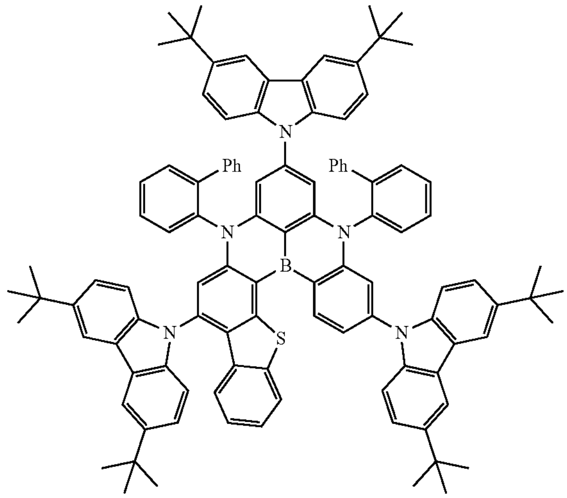
77
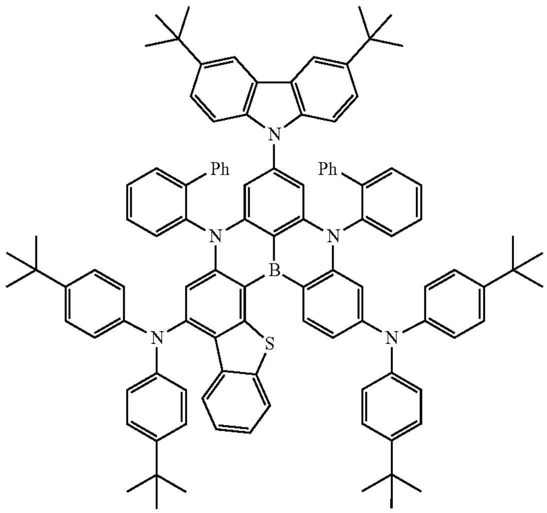
75
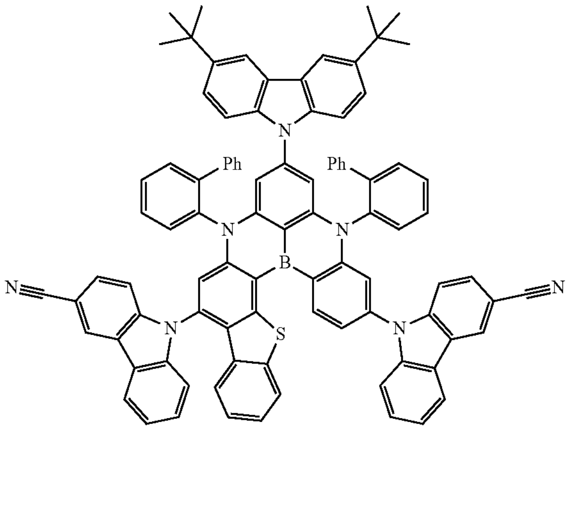
78
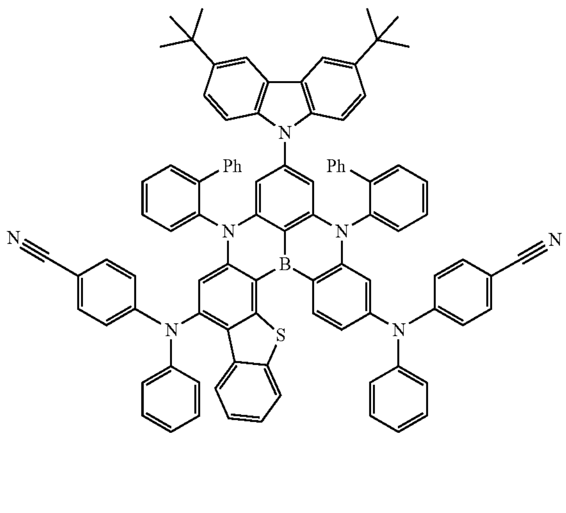

-continued
79
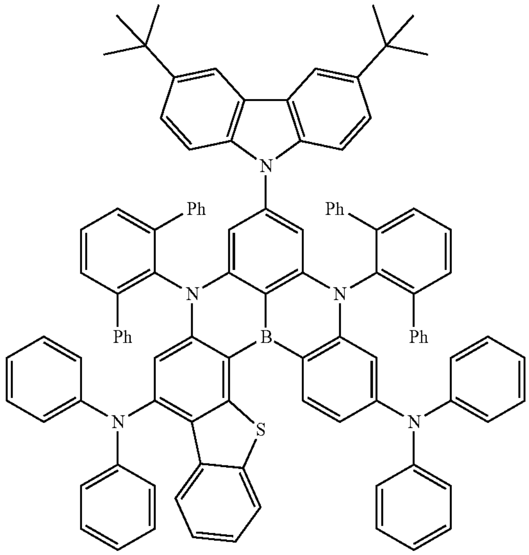
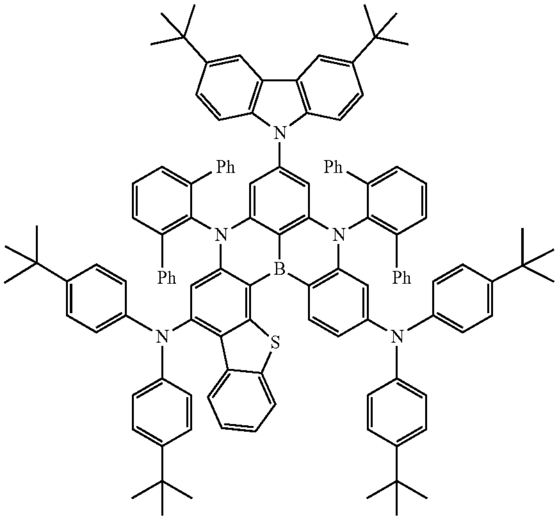
81
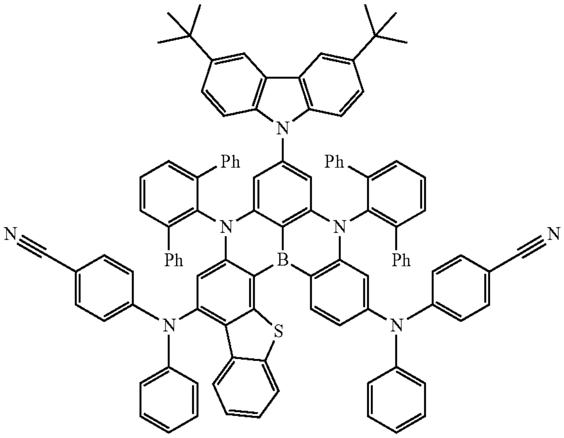
-continued
82
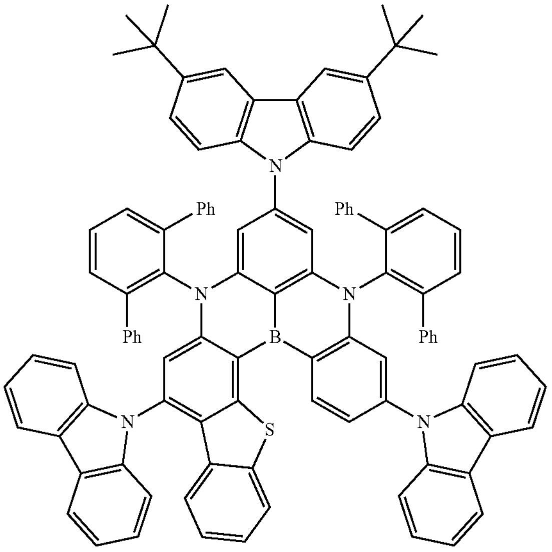
83
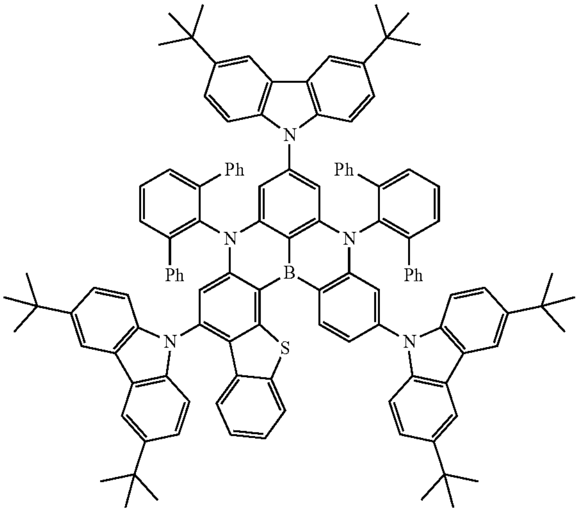
84
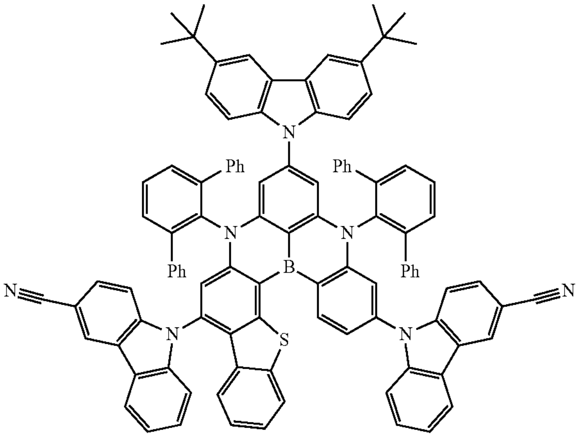

-continued
85
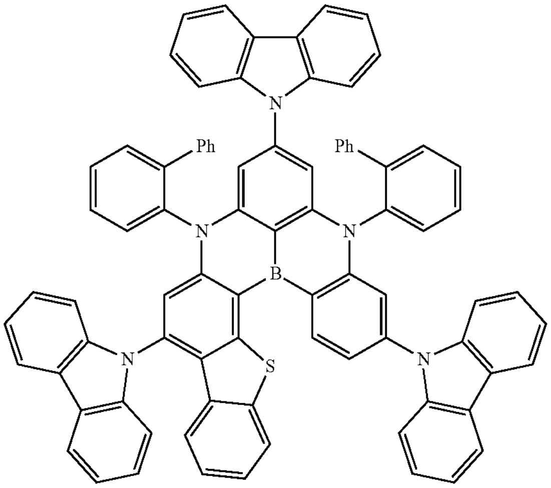
86
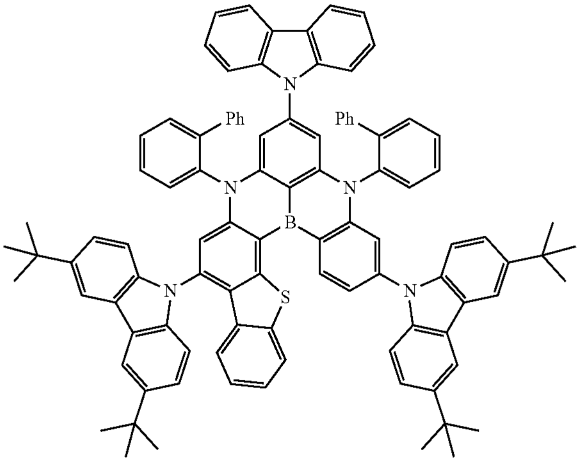
87
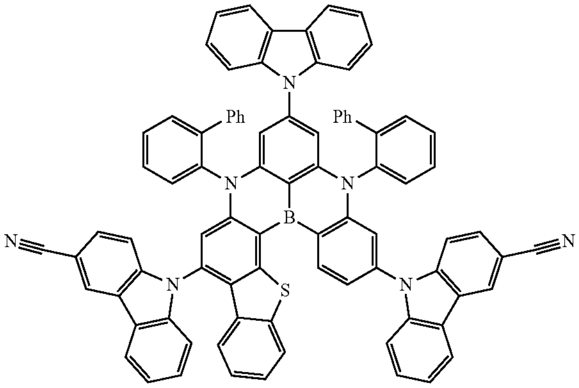
-continued
88
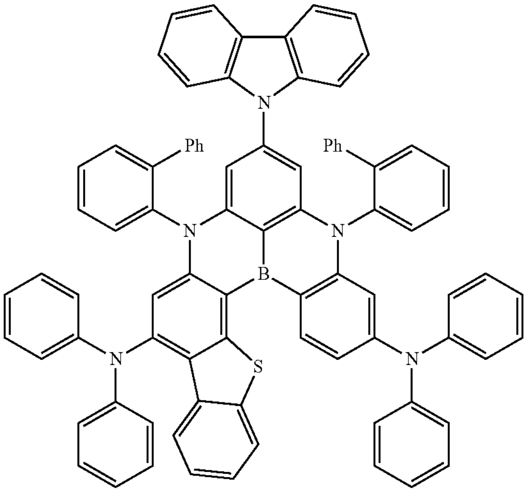
89
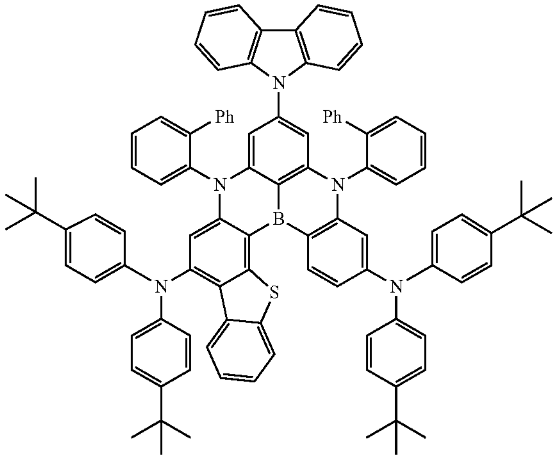
90
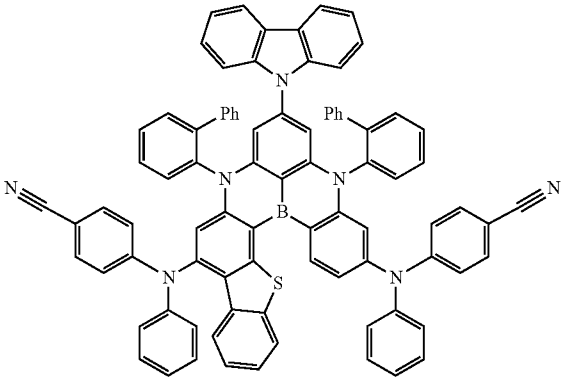

-continued
-continued
91
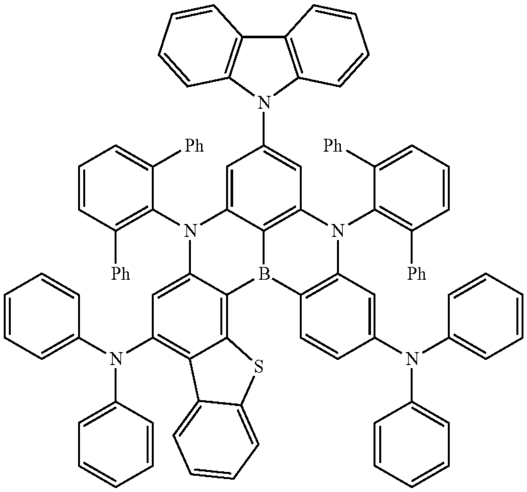
94
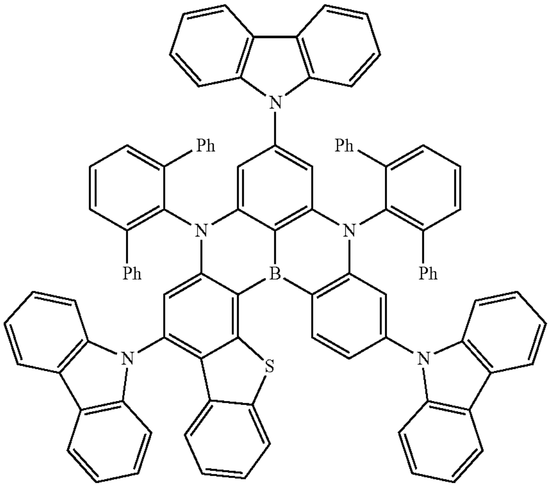
92
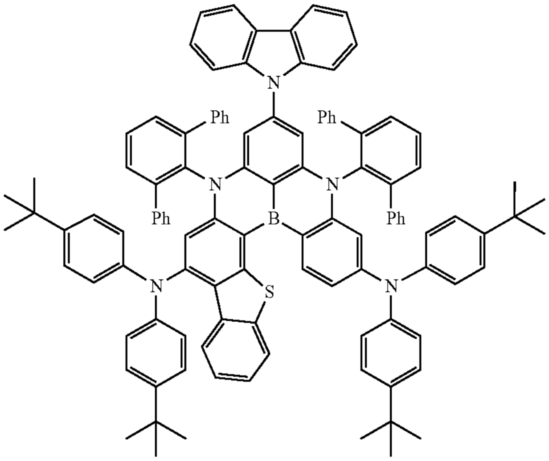
95
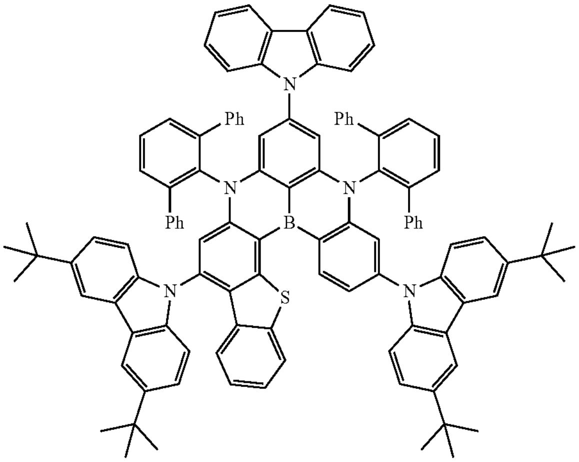
93
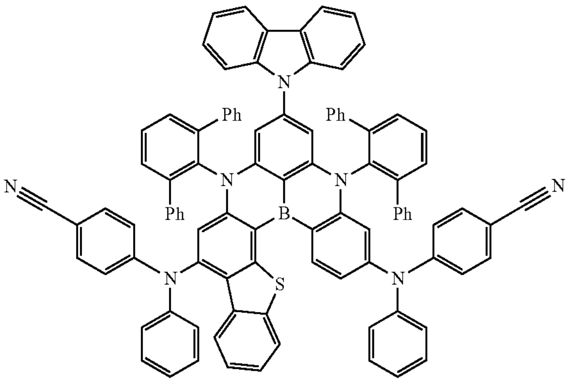
96
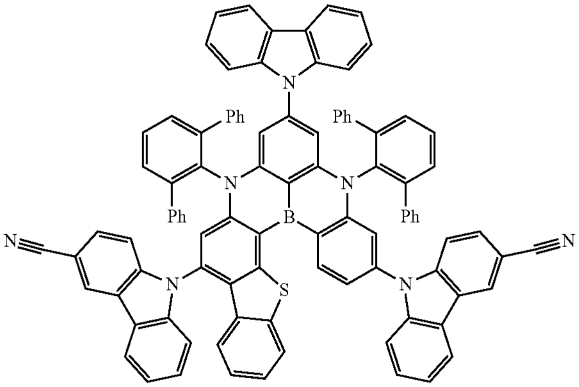

-continued
97
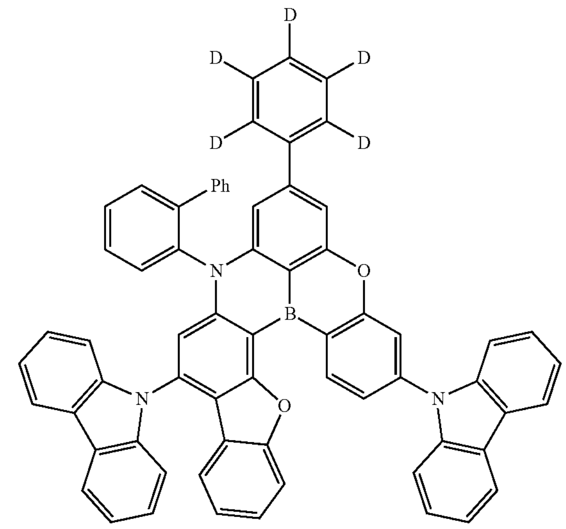
98
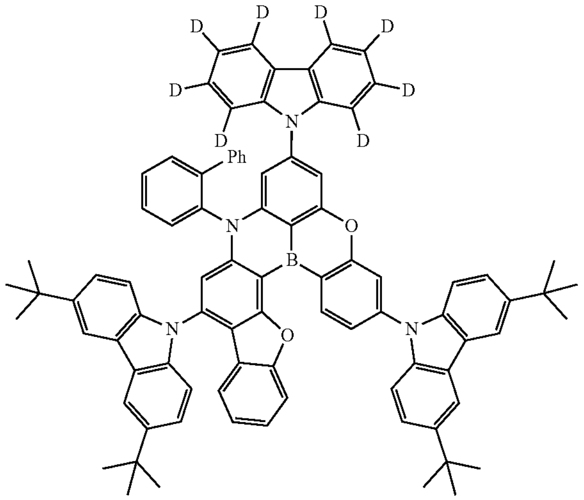
99
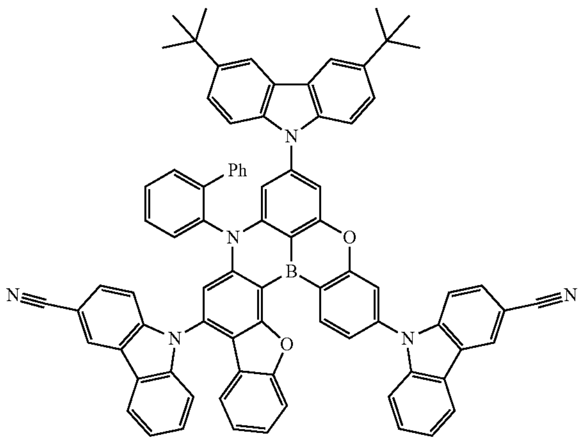
-continued
100
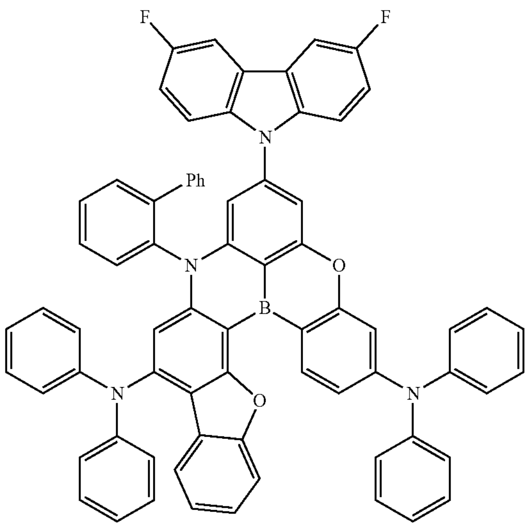
101
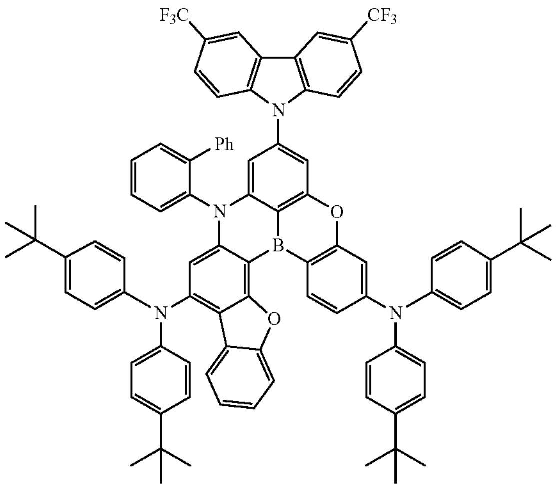
102
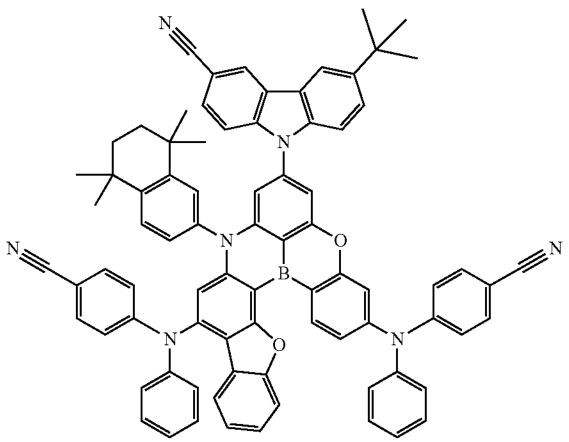

103
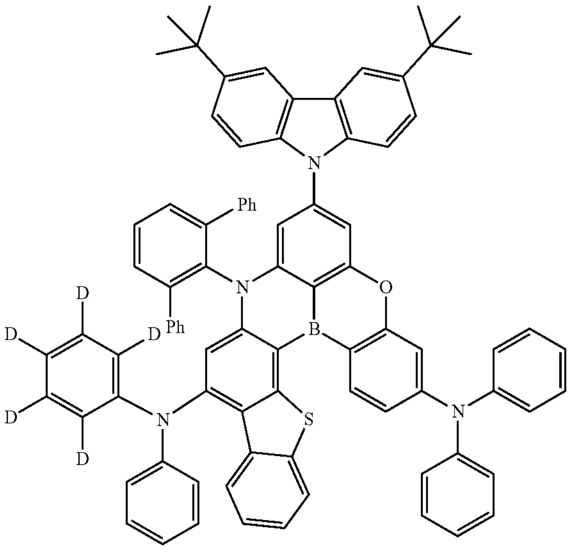
104
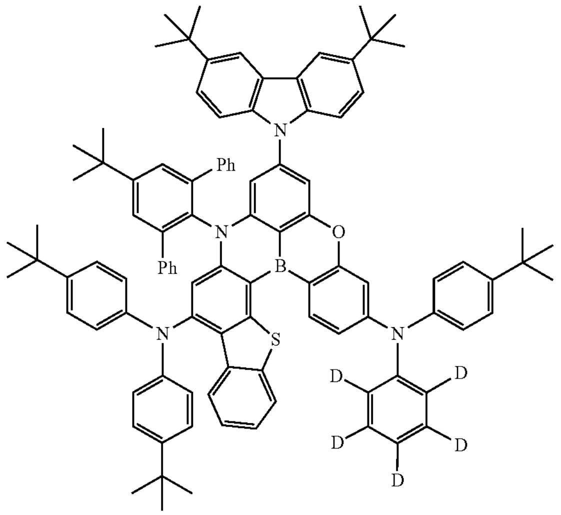
105
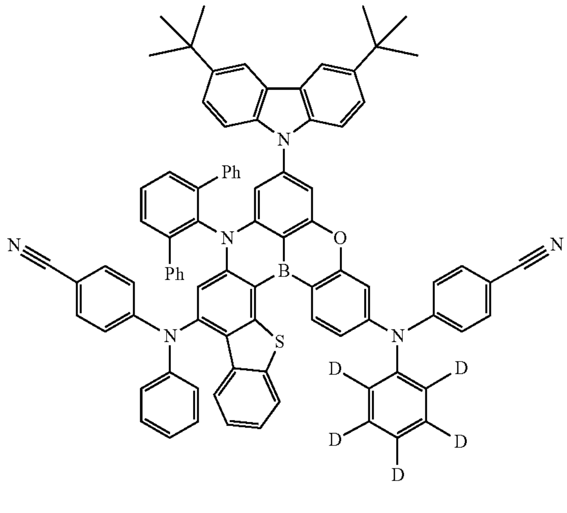
106
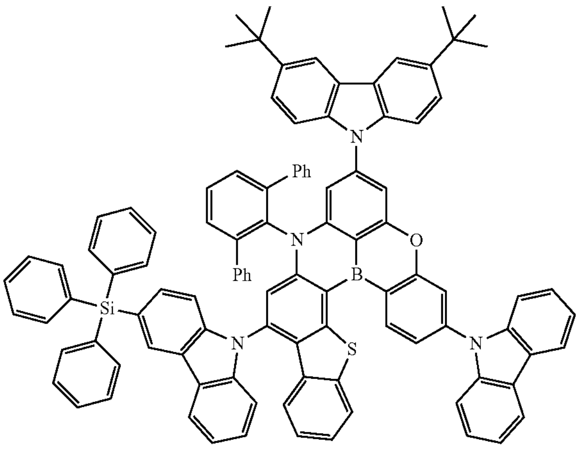
107
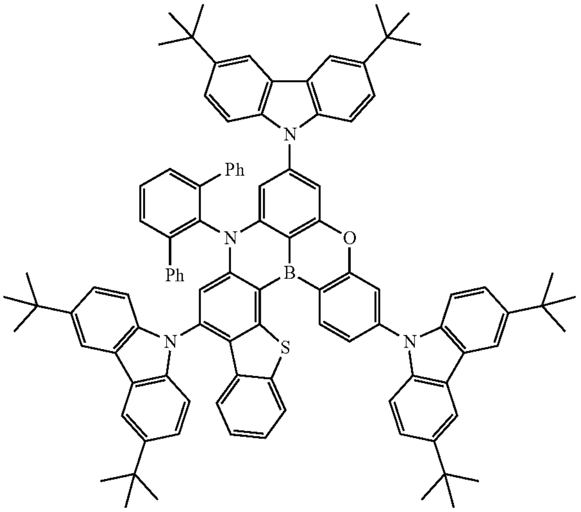
108
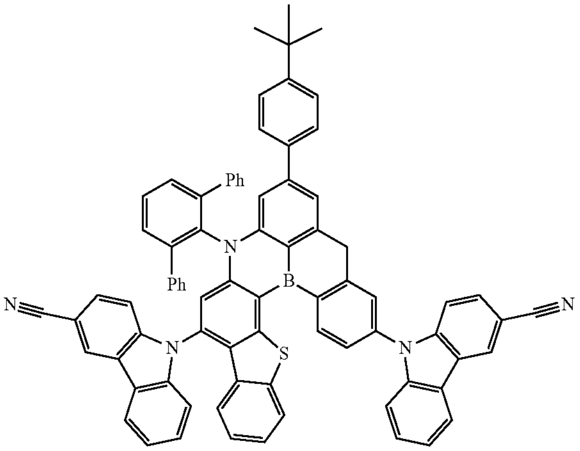

-continued
109
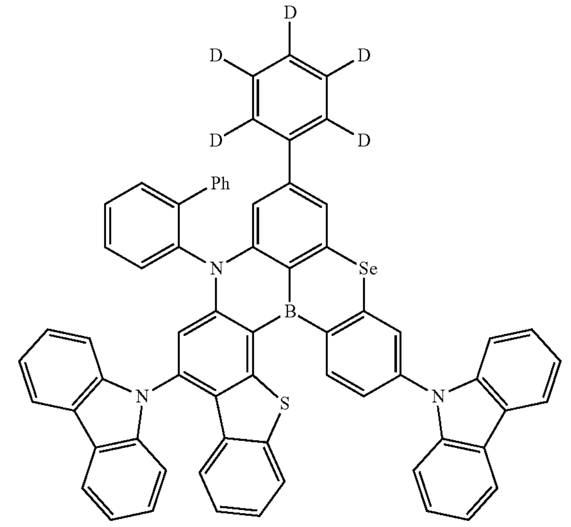
110
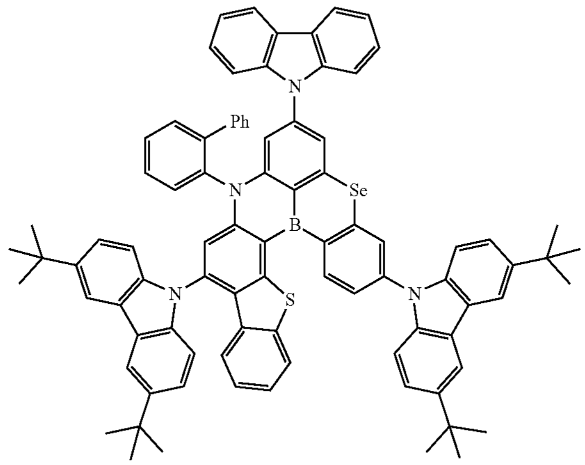
111
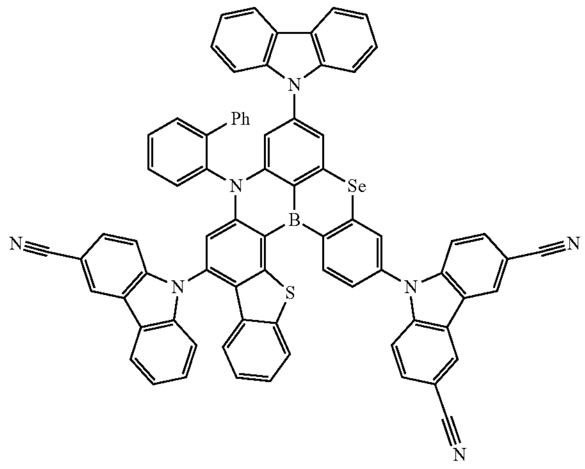
-continued
112
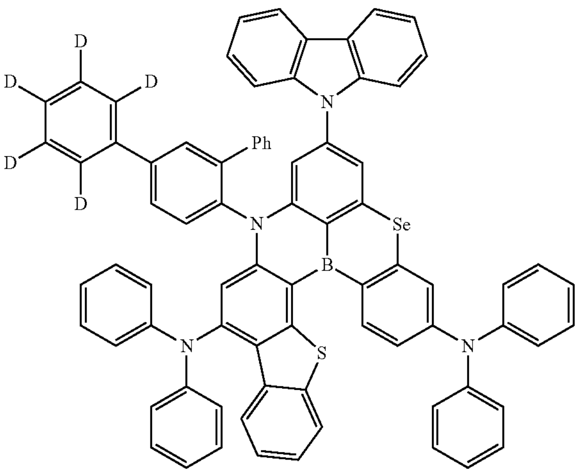
113
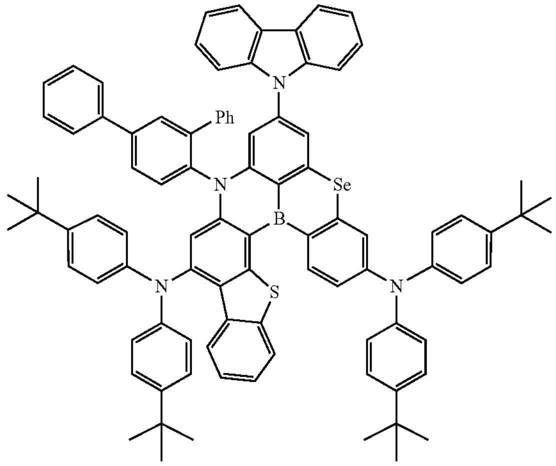
114
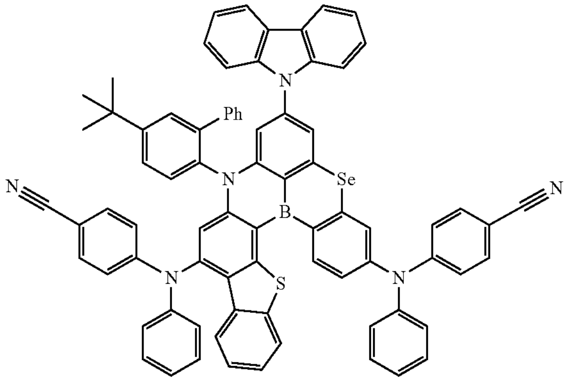

115
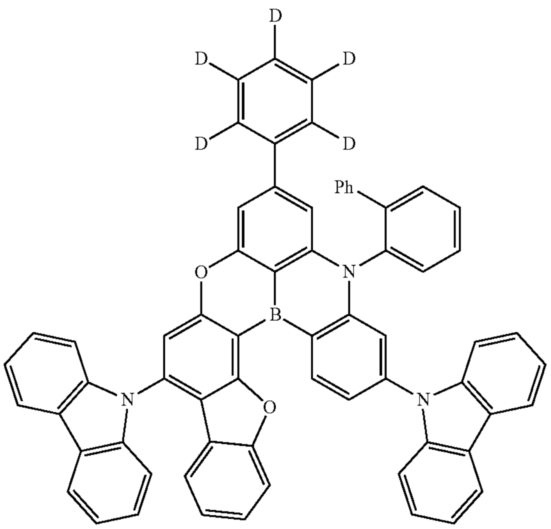
116
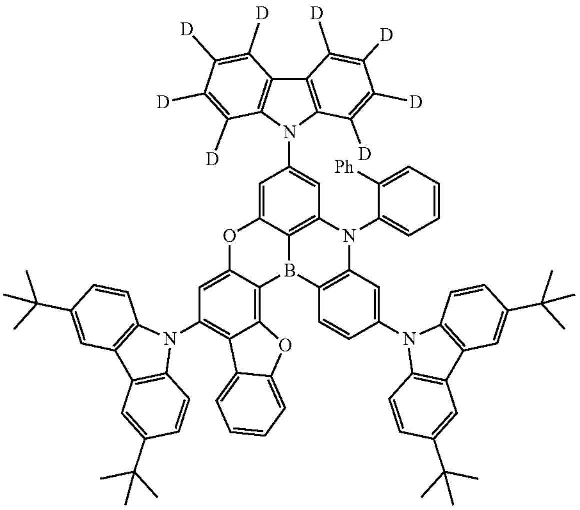
117
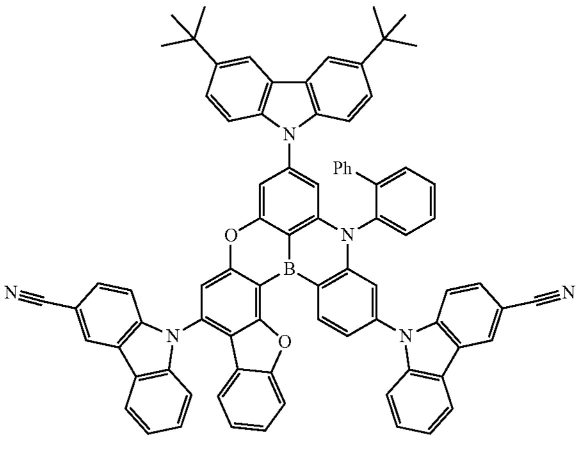
118
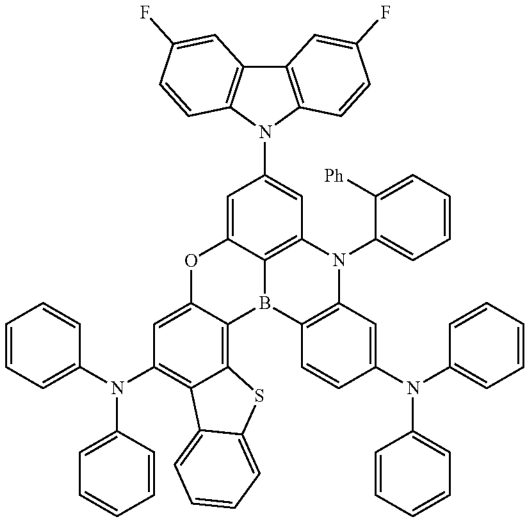
119
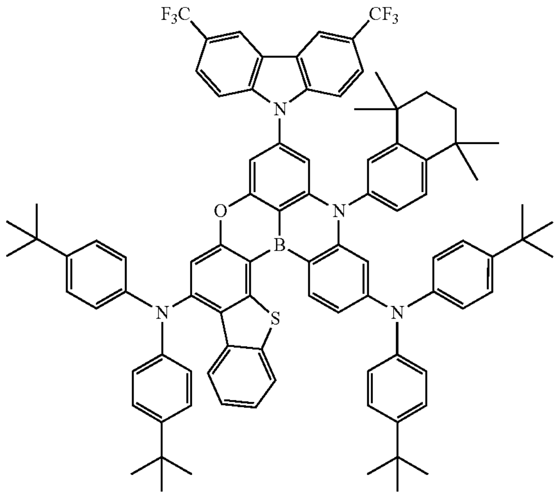
120
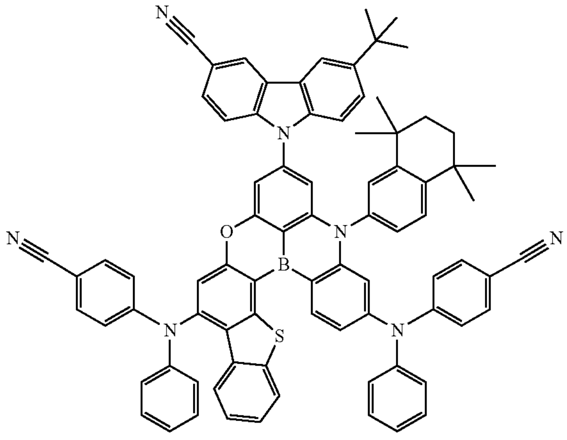

-continued
121
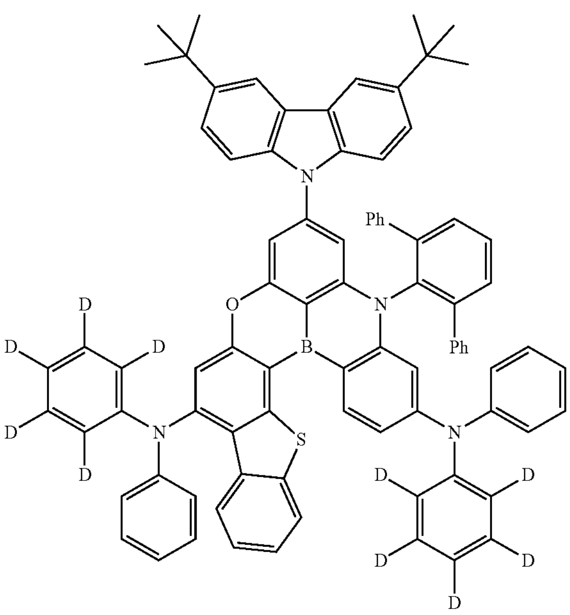
122
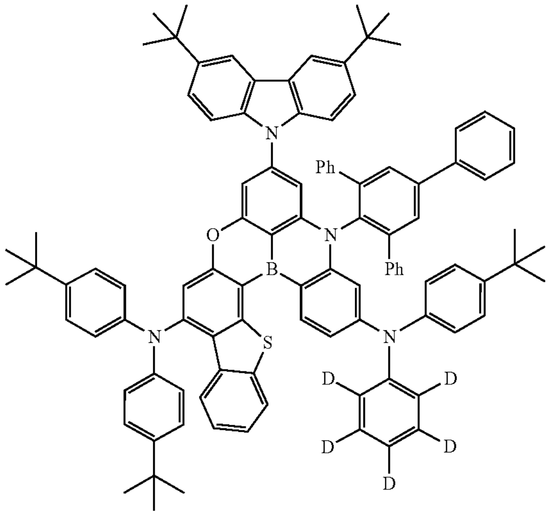
123
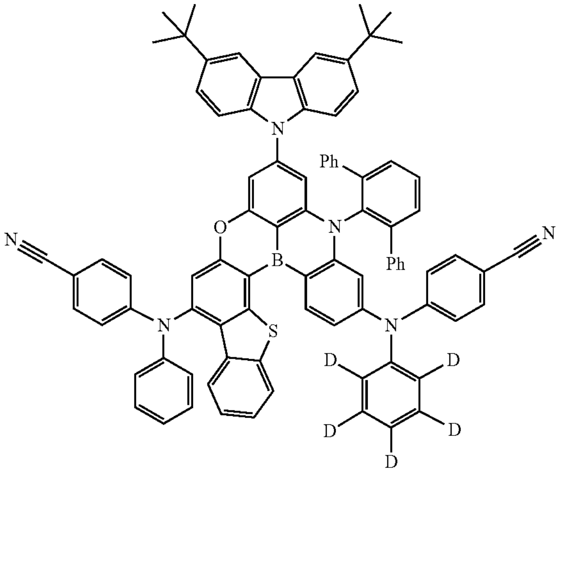
-continued
124
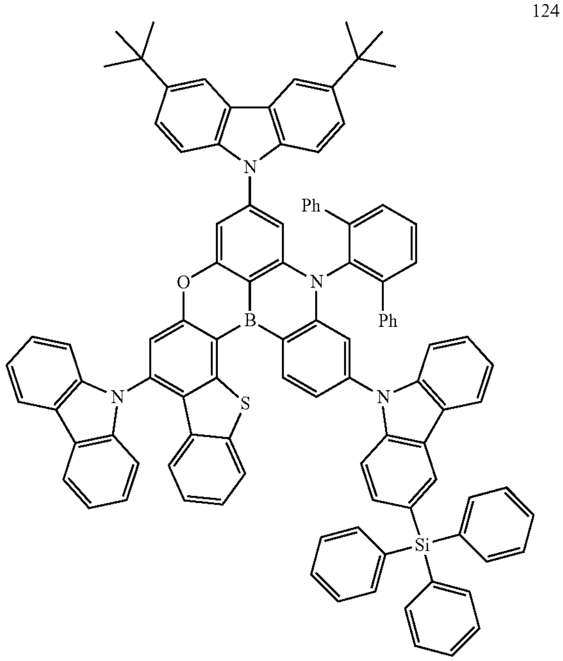
125
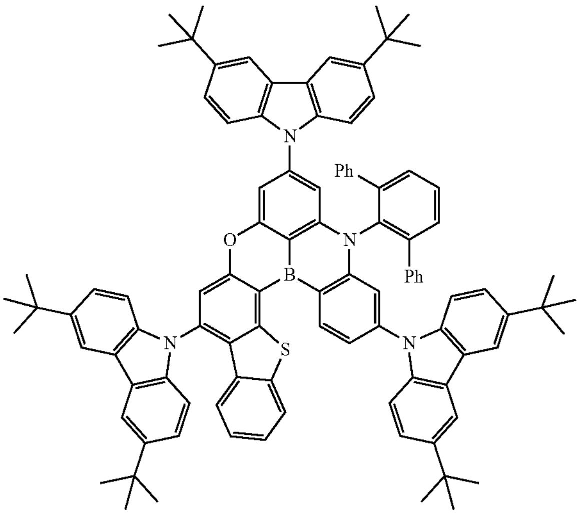
126
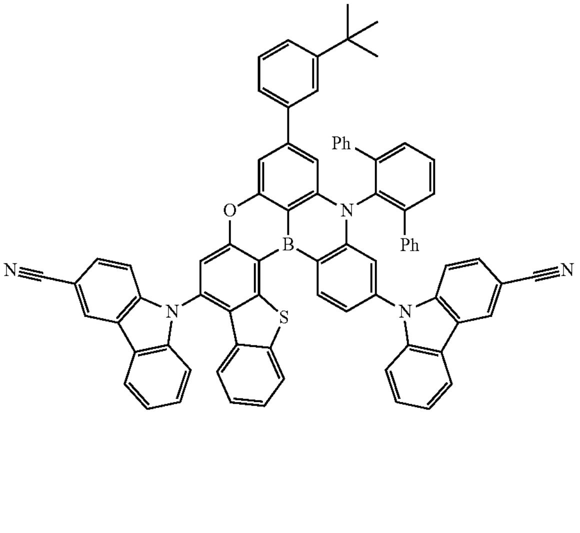

-continued
127
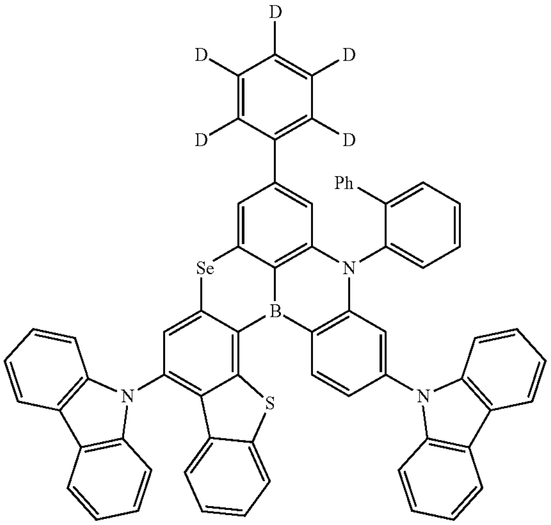
128
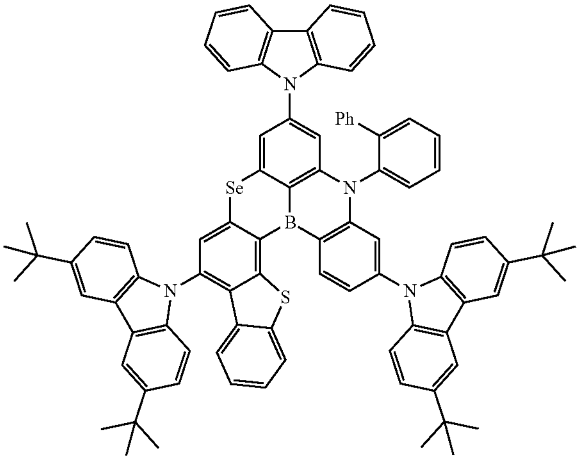
129
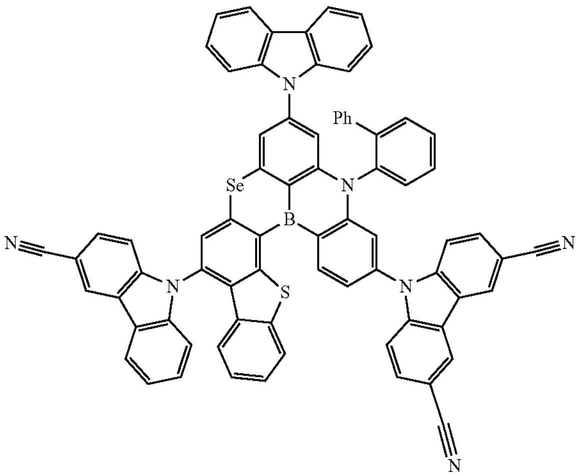
-continued
130
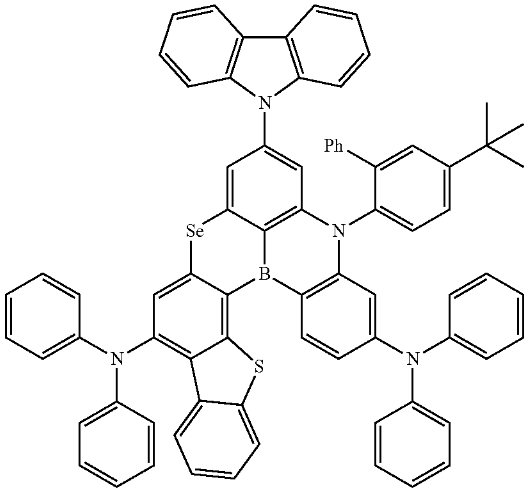
131
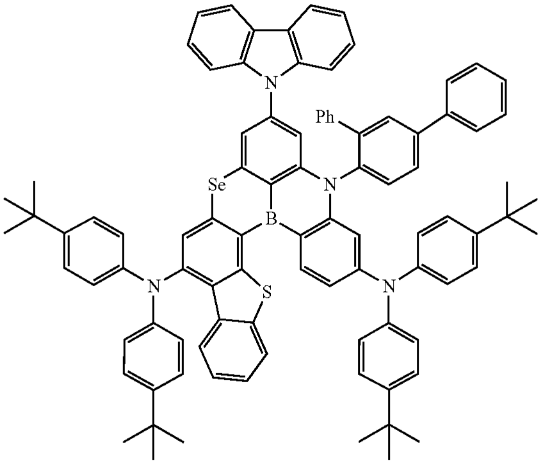
132
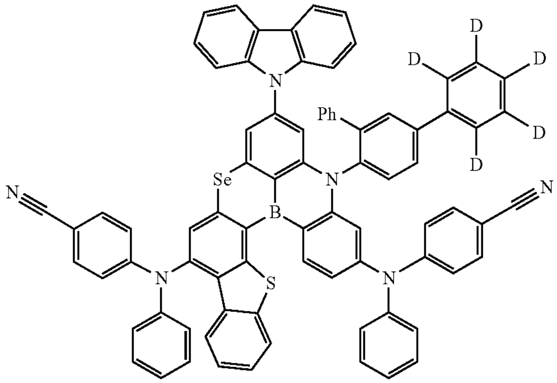

-continued
133
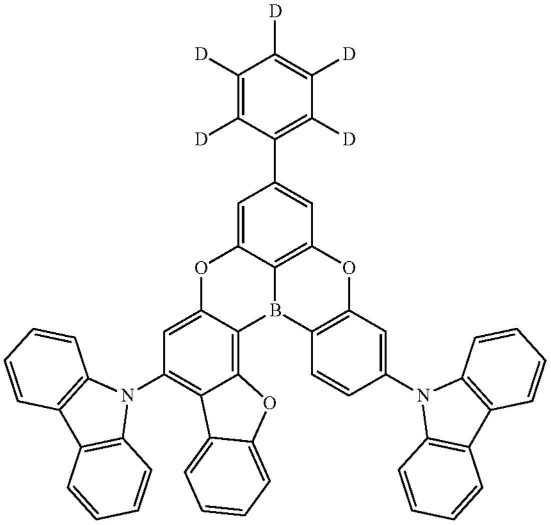
134
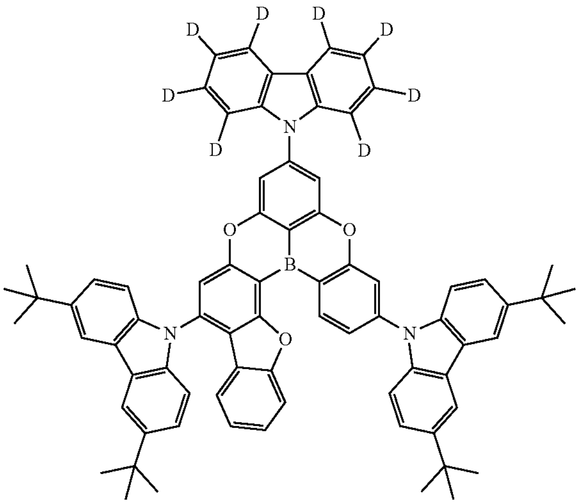
135
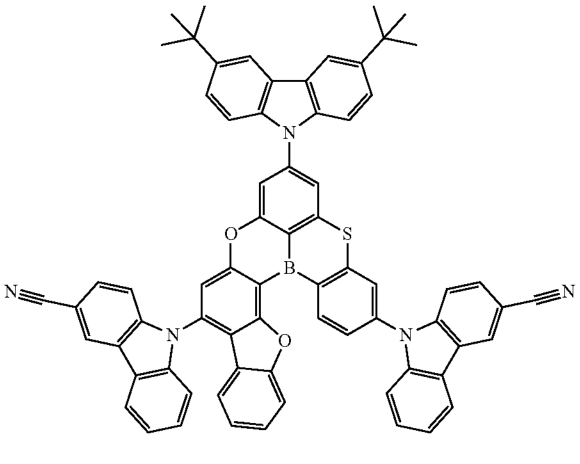
-continued
136
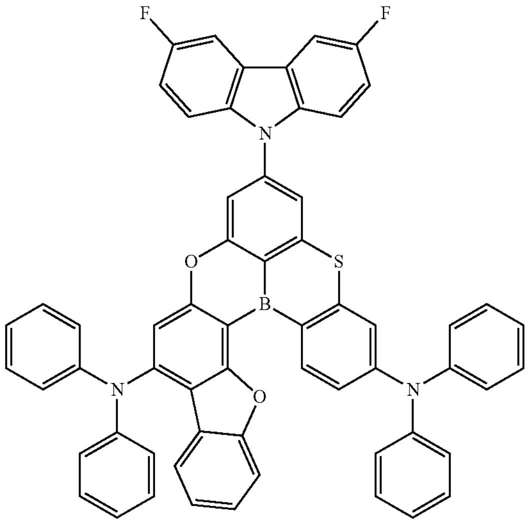
137
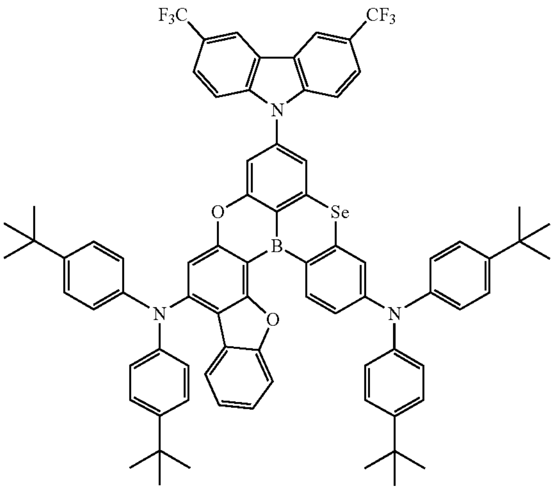
138
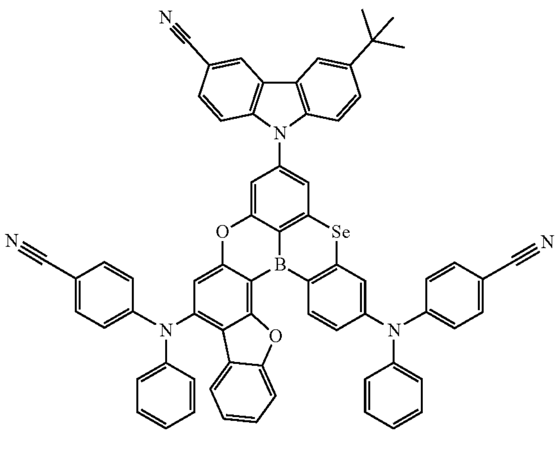

-continued
139
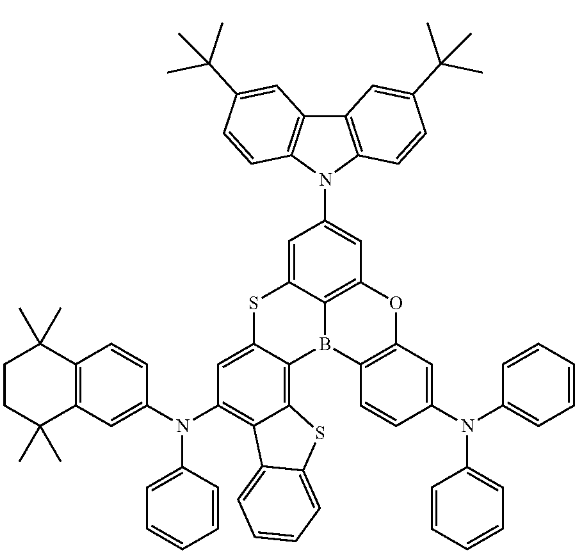
140
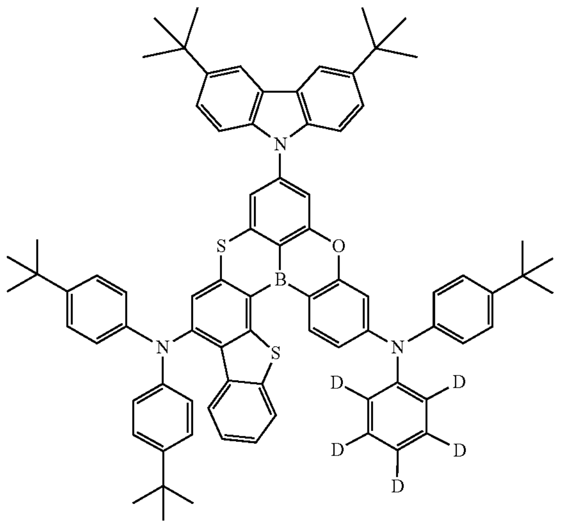
141
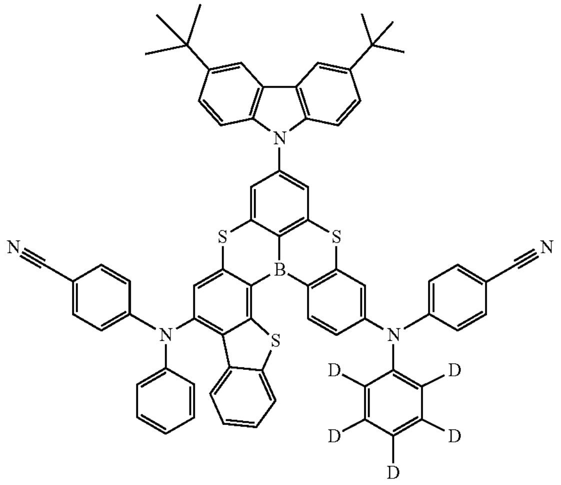
-continued
142
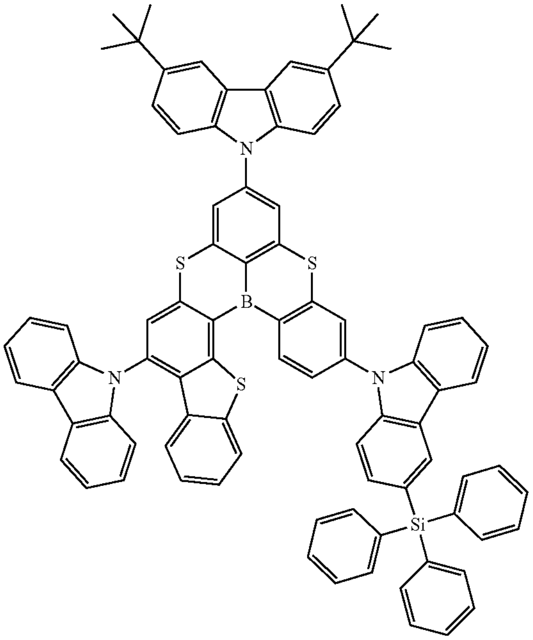
143
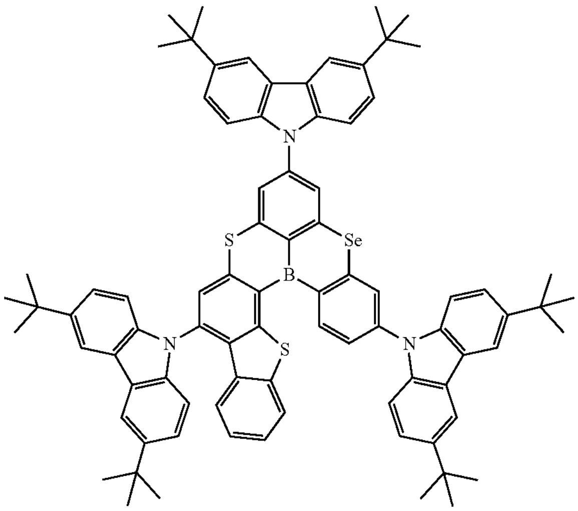
144
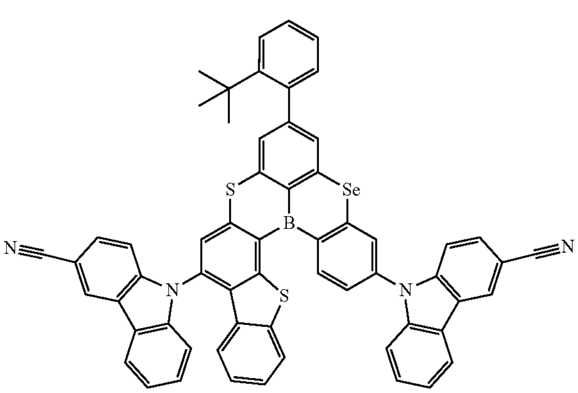

-continued
145
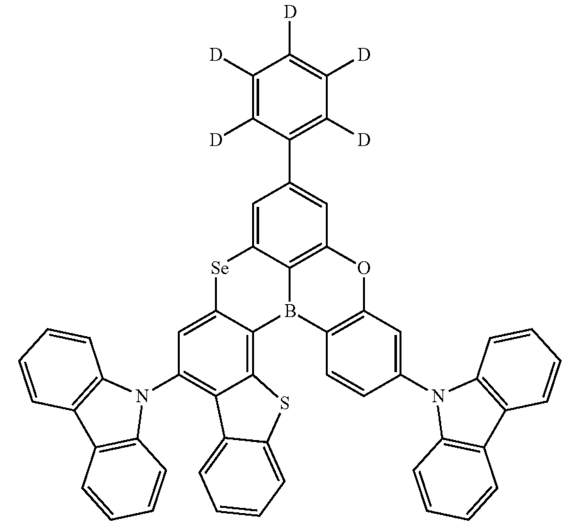
146
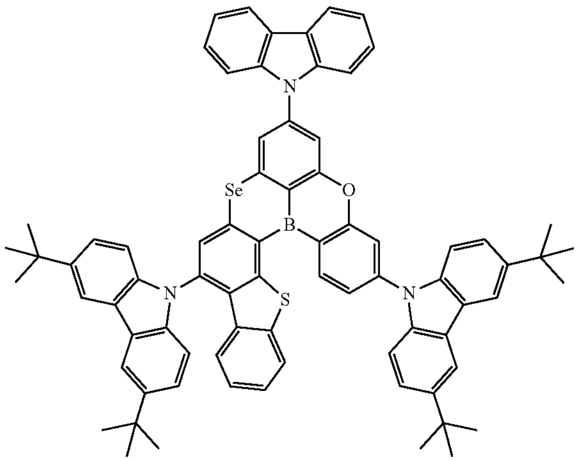
147
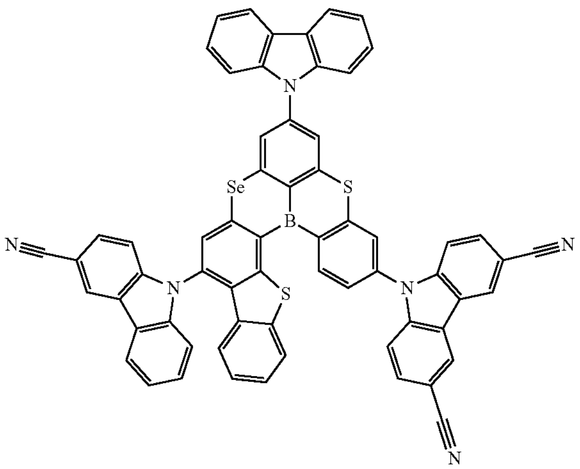
148
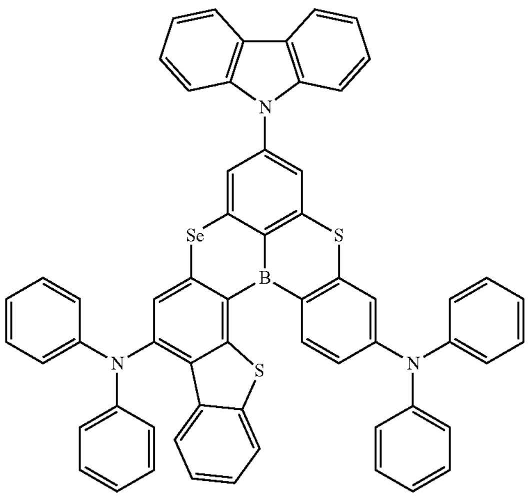
149
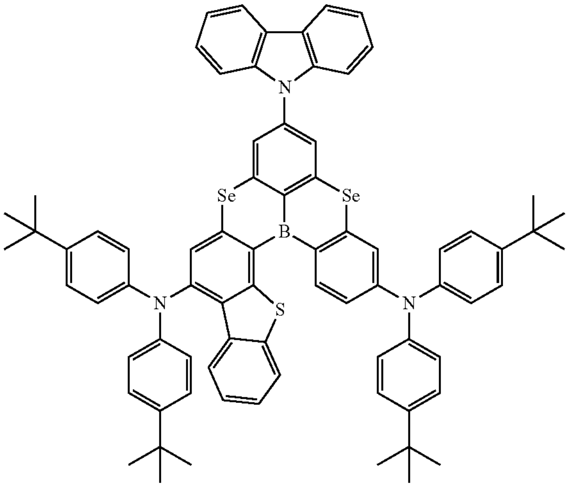
150
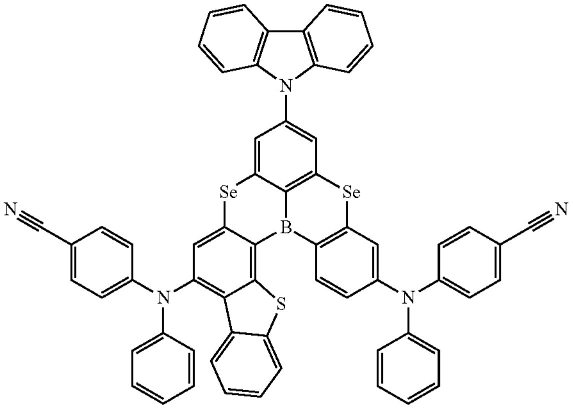

-continued
151
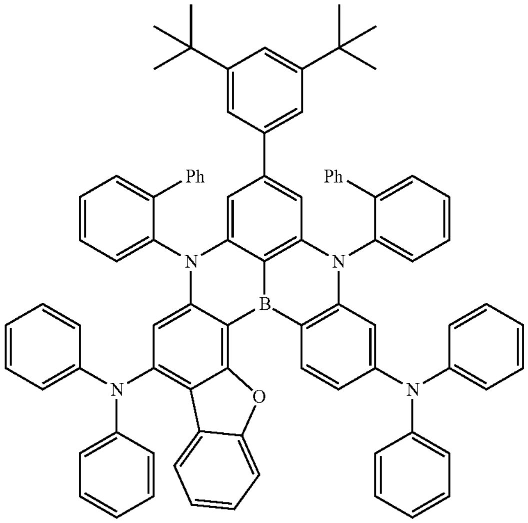
152
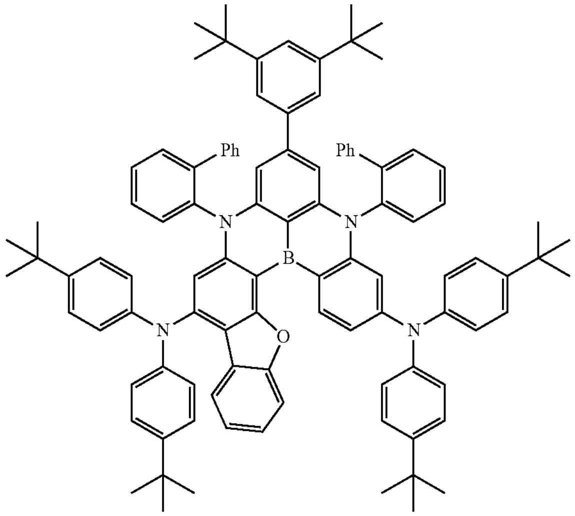
153
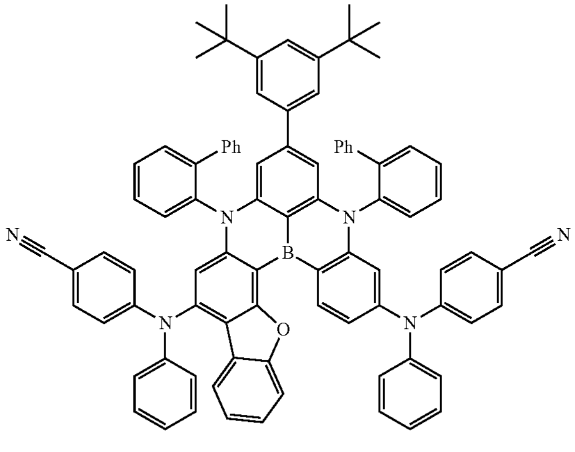
-continued
154
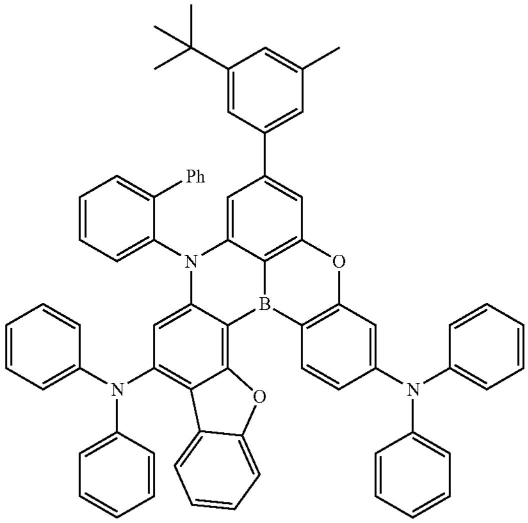
155
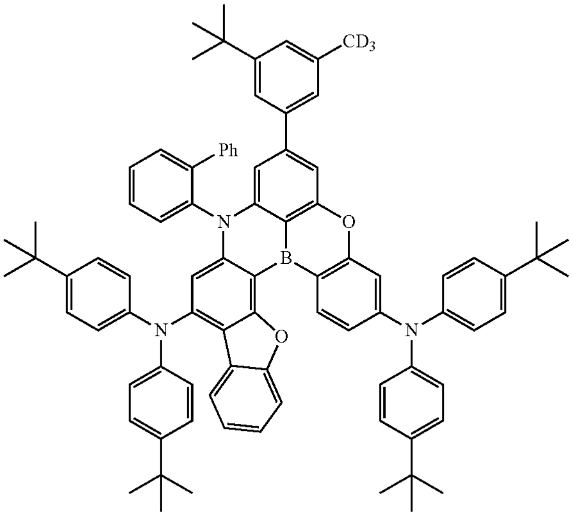
156
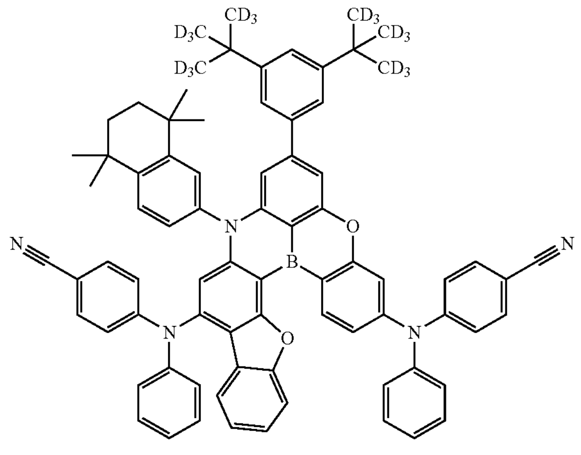

-continued
157
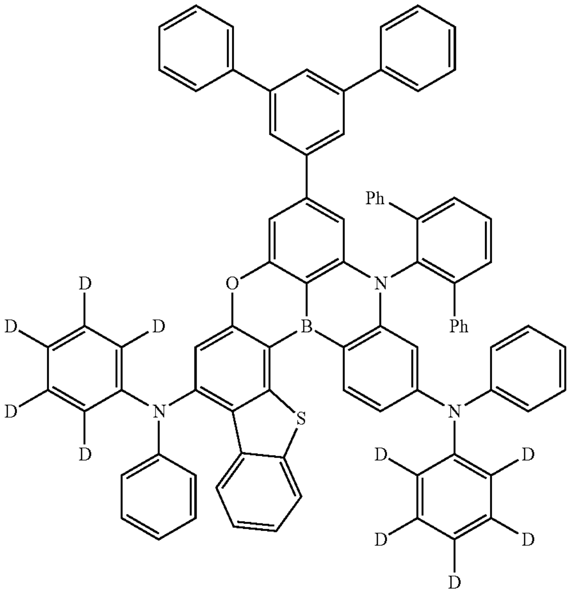
159
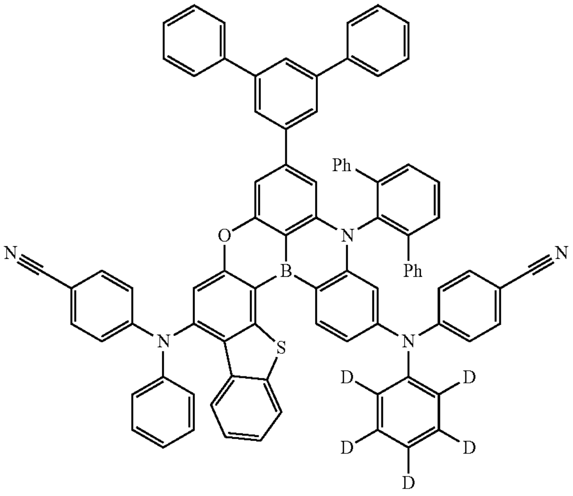
158
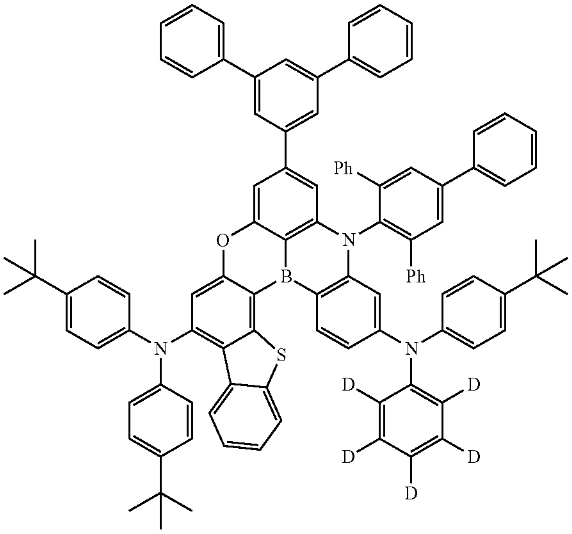
160
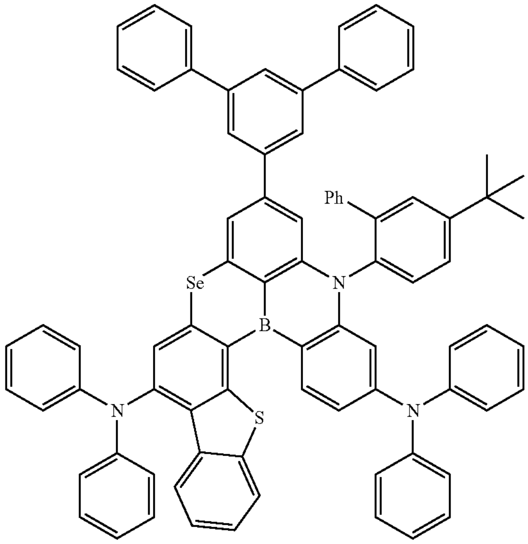

-continued

161

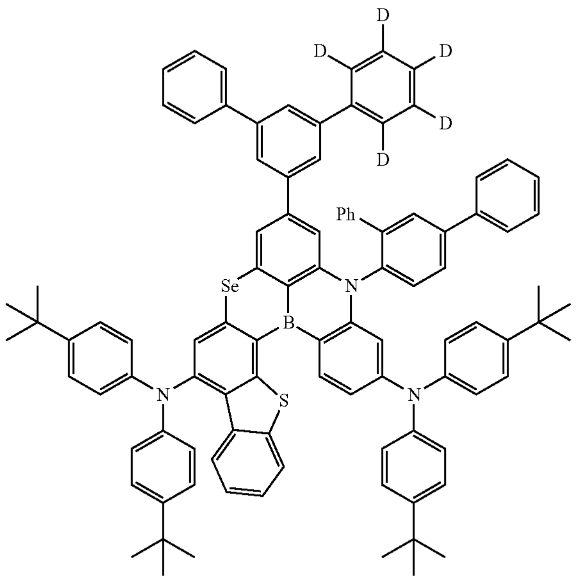

162

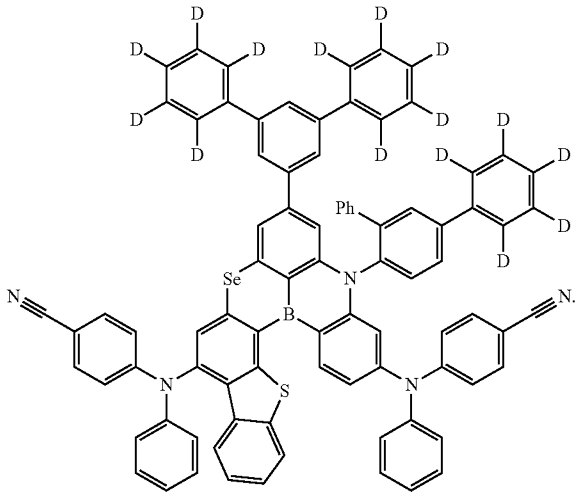

20. An organic electroluminescence device, comprising:

a first electrode;

a second electrode facing the first electrode; and a plurality of organic layers disposed between the first electrode and the second electrode, wherein the plurality of organic layers comprise:

at least one organic layer comprising a fused polycyclic compound represented by Formula 1, and at least one organic layer comprising an amine compound represented by Formula H-1:

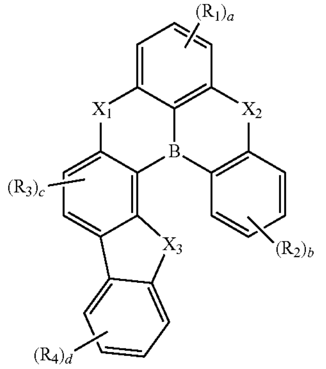

wherein in Formula 1, $X_1$ and $X_2$ are each independently $N(R_5)$, O, S, or Se, $X_3$ is O or S, $R_1$, $R_2$ and $R_4$ are each independently a hydrogen atom, a deuterium atom, a halogen atom, a cyano group, a trifluoromethyl group, a substituted or unsubstituted silyl group, a substituted or unsubstituted amino group, a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, $R_3$ is a substituted amino group or a substituted or unsubstituted heteroaryl group of 2 to 60 ring-forming carbon atoms, $R_5$ is a substituted or unsubstituted alkyl group of 1 to 20 carbon atoms, a substituted or unsubstituted aryl group of 6 to 60 ring-forming carbon atoms, or a substituted or unsubstituted heteroaryl group of 2 to 60 ring-forming carbon atoms, a is an integer from 0 to 3, b and d are each independently an integer from 0 to 4, and c is an integer from 1 to 2,

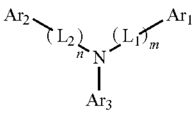

wherein in Formula H-1, $L_1$ and $L_2$ are each independently a direct linkage, a substituted or unsubstituted arylene group of 6 to 30 ring-forming carbon atoms, or a substituted or unsubstituted heteroarylene group of 2 to 30 ring-forming carbon atoms, m and n are each independently an integer from 0 to 10, $Ar_1$ and $Ar_2$ are each independently a substituted or unsubstituted aryl group of 6 to 30 ring-forming carbon atoms, or a substituted or unsubstituted heteroaryl group of 2 to 30 ring-forming carbon atoms, and $Ar_3$ is a substituted or unsubstituted aryl group of 6 to 30 ring-forming carbon atoms, and wherein the fused polycyclic compound is a dopant having a difference (ΔE_ST) between a lowest triplet excitation energy level (T1) and a lowest singlet excitation energy level (S1) equal to or less than about 0.2 eV.

* * * * *